US009235120B2

(12) United States Patent
Tsuchimura et al.

(10) Patent No.: US 9,235,120 B2

(45) Date of Patent: Jan. 12, 2016

(54) NEGATIVE ACTINIC RAY-SENSITIVE OR RADIATION-SENSITIVE RESIN COMPOSITION, RESIST FILM USING THE SAME, RESIST-COATED MASK BLANKS, RESIST PATTERN FORMING METHOD, AND PHOTOMASK

(71) Applicant: FUJIFILM Corporation, Minato-ku, Tokyo (JP)

(72) Inventors: Tomotaka Tsuchimura, Shizuoka (JP); Takeshi Inasaki, Shizuoka (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 14/193,183

(22) Filed: Feb. 28, 2014

(65) Prior Publication Data

US 2014/0178806 A1 Jun. 26, 2014

Related U.S. Application Data

(63) Continuation of application No. PCT/JP2012/071451, filed on Aug. 24, 2012.

(30) Foreign Application Priority Data

Sep. 2, 2011 (JP) ................................ 2011-191955

(51) Int. Cl.

| | |
|---|---|
| ***G03F 7/038*** | (2006.01) |
| ***G03F 7/30*** | (2006.01) |
| ***G03F 7/004*** | (2006.01) |
| ***G03F 7/20*** | (2006.01) |
| ***G03F 1/68*** | (2012.01) |

(52) U.S. Cl.

CPC ................ *G03F 7/0382* (2013.01); *G03F 1/68* (2013.01); *G03F 7/0045* (2013.01); *G03F 7/0046* (2013.01); *G03F 7/0388* (2013.01); *G03F 7/2063* (2013.01); *G03F 7/30* (2013.01)

(58) Field of Classification Search

None

See application file for complete search history.

(56) References Cited

U.S. PATENT DOCUMENTS

| | | | | |
|---|---|---|---|---|
| 6,511,783 | B1 * | 1/2003 | Uenishi | 430/270.1 |
| 2007/0149702 | A1 | 6/2007 | Ando et al. | |
| 2008/0020290 | A1 | 1/2008 | Hatakeyama et al. | |
| 2008/0102407 | A1 * | 5/2008 | Ohsawa et al. | 430/286.1 |
| 2008/0274422 | A1 * | 11/2008 | Masunaga et al. | 430/270.1 |
| 2011/0059396 | A1 * | 3/2011 | Wang et al. | 430/270.1 |
| 2011/0200942 | A1 * | 8/2011 | Masunaga et al. | 430/285.1 |
| 2011/0212390 | A1 | 9/2011 | Masunaga et al. | |
| 2012/0219887 | A1 | 8/2012 | Masunaga et al. | |
| 2012/0219888 | A1 | 8/2012 | Masunaga et al. | |

FOREIGN PATENT DOCUMENTS

| | | | |
|---|---|---|---|
| EP | 2 362 267 | A1 | 8/2011 |
| JP | 07-333851 | A | 12/1995 |
| JP | 2007-197718 | A | 8/2007 |
| JP | 2008-52254 | A | 3/2008 |
| JP | 2008-249951 | A | 10/2008 |
| JP | 2012-177834 | A | 9/2012 |
| JP | 2012-177836 | A | 9/2012 |
| KR | 10-2011-0098663 | A | 9/2011 |

OTHER PUBLICATIONS

International Search Report dated Sep. 25, 2012 issued in International Patent Application No. PCT/JP2012/071451 (PCT/ISA210).

Written Opinion dated Sep. 25, 2012 issued in International Application No. PCT/JP2012/071451 (PCT/ISA/237).

Office Action, Issued by the Japanese Patent Office, Dated Sep. 2, 2014, in counterpart Japanese Application No. 2011-191955.

Office Action from the Japanese Patent Office dated Feb. 3, 2015 in counterpart Japanese Application No. 2011-191955.

Office Action dated Jul. 22, 2015, issued by the Taiwanese Patent Office in counterpart Taiwanese Application No. 101131575.

Office Action issued Jul. 29, 2015, issued by the Korean Intellectual Property Office in counterpart Korean Patent Application No. 10-2014-7005096.

* cited by examiner

*Primary Examiner* — Sin Lee

(74) *Attorney, Agent, or Firm* — Sughrue Mion, PLLC

(57) ABSTRACT

As a negative actinic ray-sensitive or radiation-sensitive resin composition capable of forming a pattern excellent in sensitivity, resolution and pattern profile and reduced in line edge roughness (LER), scum and development defect, a negative actinic ray-sensitive or radiation-sensitive resin composition comprising (A) a polymer compound containing (a) a repeating unit capable of generating an acid upon irradiation with an actinic ray or radiation and (b) a repeating unit having a phenolic hydroxyl group, and (B) a crosslinking agent, is provided.

13 Claims, No Drawings

NEGATIVE ACTINIC RAY-SENSITIVE OR RADIATION-SENSITIVE RESIN COMPOSITION, RESIST FILM USING THE SAME, RESIST-COATED MASK BLANKS, RESIST PATTERN FORMING METHOD, AND PHOTOMASK

CROSS REFERENCE TO RELATED APPLICATION

This is a continuation of International Application No. PCT/JP2012/071451 filed on Aug. 24, 2012, and claims priority from Japanese Patent Application No. 2011-191955 filed on Sep. 2, 2011, the entire disclosures of which are incorporated therein by reference.

TECHNICAL FIELD

The present invention relates to a negative actinic ray-sensitive or radiation-sensitive resin composition capable of forming a highly defined pattern by using an electron beam or an extreme-ultraviolet ray, which is suitably used in the ultra-microlithography process applicable to, for example, a production process such as production of VLSI or a high-capacity microchip, a process for forming a nanoimprint mold, and a process for producing a high-density information recording medium, and in other photofabrication processes; a resist film using the same; a resist-coated mask blanks; a resist pattern forming method; and a photomask. More specifically, the present invention relates to a negative actinic ray-sensitive or radiation-sensitive resin composition for use in the process using a substrate having a specific underlying film; a resist film using the same; a resist-coated mask blanks; a resist pattern forming method; and a photomask.

BACKGROUND ART

In the process of producing a semiconductor device such as IC and LSI, microfabrication by lithography using a photoresist composition has been conventionally performed. The recent increase in the integration degree of an integrated circuit has created a demand for formation of an ultrafine pattern in the sub-micron or quarter-micron region and in turn, the exposure wavelength also tends to become shorter, for example, from g line to i line or further to KrF excimer laser light. At the present time, development of lithography using electron beam or X-ray is also being pursued.

Among others, the lithography using an electron beam or an extreme-ultraviolet ray is positioned as a next-generation or next-next-generation pattern formation technology and because of its high resolution, is widely used to form a photomask for use in semiconductor exposure. For example, in the step of forming the photomask by electron beam lithography, a resist film is formed on a shielding substrate obtained by providing a shielding layer containing chromium or the like as a main component on a transparent substrate, and the resist film is selectively exposed to an electron beam and then alkali-developed to form a resist pattern. The shielding layer is etched by using the resist pattern above as a mask to form a pattern in the shielding layer, whereby a photomask provided with a shielding layer having a predetermined pattern on a transparent substrate can be obtained.

However, unlike an ultraviolet ray, one-shot exposure is not available by an electron beam and therefore, a resist having high sensitivity is required so as to shorten the processing time. As the resist suitable for electron beam lithography, a so-called positive resist composition prepared by combining an acid-decomposable polymer compound and a photoacid generator, or a so-called negative resist composition prepared by combining a crosslinking polymer compound and a crosslinking agent, is effectively used, but an attempt to further increase the sensitivity of such a resist composition is likely to result in reduction of resolution, deterioration of pattern profile or generation of scum. Furthermore, worsening of the line edge roughness (a phenomenon where the edge of the interface between a resist pattern and a substrate varies irregularly in the direction perpendicular to a line to make the edge uneven and due to transcription of the unevenness in an etching step, the dimensional accuracy is lowered) also readily occurs. The improvement of line edge roughness is an important issue particularly in the ultrafine region of a line width of 0.25 μm or less.

As one approach to solve these problems, for example, Patent Document 1 discloses a resin having, in the same molecule, a photoacid generating group and a group capable of increasing the solubility in an alkali developer as a result of acid decomposition.

RELATED ART

Patent Document

Patent Document 1: JP-A-2007-197718 (the term "JP-A" as used herein means an "unexamined published Japanese patent application")

SUMMARY OF THE INVENTION

Problems that the Invention is to Solve

As for the resin having a photoacid generating acid, its use in a positive resist composition has been reported, but the resin has not been heretofore utilized in a negative resist composition.

The present inventors have made sincere studies, as a result, it has been found that a negative actinic ray-sensitive or radiation-sensitive resin composition containing the later-described polymer compound (A) and crosslinking agent (B) makes it possible not only to solve the problems above but also to improve a development defect which is likely with a negative resist composition obtained by combining a crosslinking polymer compound and a crosslinking agent.

That is, an object of the present invention is to provide a negative actinic ray-sensitive or radiation-sensitive resin composition capable of forming a pattern satisfying all of high sensitivity, high resolution (for example, excellent pattern profile and small line edge roughness (LER)), reduction in scum and reduction in development defect at the same time, a resist film using the same, a resist-coated mask blanks, a resist pattern forming method, and a photomask.

In particular, an object of the present invention is to provide a negative actinic ray-sensitive or radiation-sensitive resin composition capable of forming a pattern satisfying, in the formation of a fine pattern by exposure using an electron beam or an extreme-ultraviolet ray, all of high sensitivity, high resolution (for example, excellent pattern profile and small line edge roughness (LER)), reduction in scum and reduction in development defect at the same time, a resist film using the same, a resist-coated mask blanks, a resist pattern forming method, and a photomask.

Means for Solving the Problems

That is, the present invention is as follows.

[1] A negative actinic ray-sensitive or radiation-sensitive resin composition comprising:

(A) a polymer compound containing (a) a repeating unit capable of generating an acid upon irradiation with an actinic ray or radiation and (b) a repeating unit having a phenolic hydroxyl group, and (B) a crosslinking agent.

[2] The negative actinic ray-sensitive or radiation-sensitive resin composition as described in [1], wherein the polymer compound (A) further contains (c) an alkali-insoluble repeating unit.

[3] The negative actinic ray-sensitive or radiation-sensitive resin composition as described in [2], wherein the content of the alkali-insoluble repeating unit (c) is from 3 to 50 mol % based on all repeating units in the polymer compound (A).

[4] The negative actinic ray-sensitive or radiation-sensitive resin composition as described in any one of [1] to [3], wherein the polymer compound (A) contains, as the (a) repeating unit capable of generating an acid upon irradiation with an actinic ray or radiation, (a1) a repeating unit having an ionic structural moiety capable of producing an acid anion in the side chain upon irradiation with an actinic ray or radiation.

[5] The negative actinic ray-sensitive or radiation-sensitive resin composition as described in any one of [1] to [4], wherein the crosslinking agent (B) is a compound having two or more hydroxymethyl groups or alkoxymethyl groups in a molecule.

[6] The negative actinic my-sensitive or radiation-sensitive resin composition as described in any one of [2] to [5], wherein (a) the repeating unit capable of generating an acid upon irradiation with an actinic ray or radiation is a repeating unit represented by the following formula (I), (b) the repeating unit having a phenolic hydroxyl group is a repeating unit represented by the following formula (II), and (c) the alkali-insoluble repeating unit is a repeating unit represented by the following formula (III):

[Chem. 1]

(I)

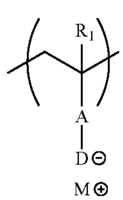

(II)

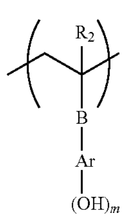

(III)

wherein each of $R_1$ and $R_2$ independently represents a hydrogen atom, an alkyl group or a halogen atom, A represents a divalent linking group, D represents a sulfonate anion, a sulfonimidate anion or a sulfonemethidate anion, M represents an onium cation, B represents a single bond or a divalent organic group, Ar represents an aromatic ring group, m represents an integer of 1 or more, and E represents an alkali-insoluble repeating unit.

[7]A resist film formed from the negative actinic ray-sensitive or radiation-sensitive resin composition as described in any one of [1] to [6].

[8] The resist film as described in [7], wherein the film thickness is from 10 to 150 nm.

[9]A resist-coated mask blanks coated with the resist film described in [7] or [8].

[10]A resist pattern forming method, comprising exposing the resist film described in [7] or [8], and developing the exposed film.

[11]A resist pattern forming method, comprising exposing the resist-coated mask blanks described in [9], and developing the exposed mask blanks.

[12] The resist pattern forming method as described in [10] or [11], wherein the exposure is performed using an electron beam or an extreme-ultraviolet ray.

[13]A photomask obtained by exposing and developing the resist-coated mask blanks described in [9].

Advantage of the Invention

According to the present invention, a negative actinic ray-sensitive or radiation-sensitive resin composition capable of forming a pattern satisfying all of high sensitivity, high resolution (for example, excellent pattern profile and small line edge roughness (LER)), reduction in scum and reduction in development defect at the same time, a resist film using the same, a resist-coated mask blanks, a resist pattern forming method, and a photomask can be provided.

Mode for Carrying Out the Invention

The mode for carrying out the present invention is described below.

In the description of the present invention, when a group (atomic group) is denoted without specifying whether substituted or unsubstituted, the group encompasses both a group having no substituent and a group having a substituent. For example, "an alkyl group" encompasses not only an alkyl group having no substituent (unsubstituted alkyl group) but also an alkyl group having a substituent (substituted alkyl group).

In the present invention, the "actinic ray" or "radiation" means, for example, a bright line spectrum of mercury lamp, a far ultraviolet ray typified by excimer laser, an extreme-ultraviolet ray (EUV light), an X-ray or an electron beam. Also, in the present invention, the "light" means an actinic ray or radiation. Unless otherwise indicated, the "exposure" as used in the description of the present invention encompasses not only exposure to a mercury lamp, a far ultraviolet ray typified by excimer laser, an X-ray, EUV light or the like but also lithography with a particle beam such as electron beam and ion beam.

The negative actinic ray-sensitive or radiation-sensitive resin composition according to the present invention comprises (A) a polymer compound containing (a) a repeating unit capable of generating an acid upon irradiation with an actinic ray or radiation and (b) a repeating unit having a phenolic hydroxyl group, and (B) a crosslinking agent.

The reason why by the negative actinic ray-sensitive or radiation-sensitive resin composition according to the present invention, all of high sensitivity, high resolution (for example, excellent pattern profile and small line edge roughness (LER)) and reduction in scum are satisfied at the same time and furthermore, the development defect can be reduced, is not completely elucidated but is presumed as follows.

The polymer compound (A) contains (a) a repeating unit capable of generating an acid upon irradiation with an actinic ray or radiation, and this is considered to allow for low diffusion of the acid generated and in turn, enable improving the resolution (for example, LER). Also, the moiety capable of generating an acid upon irradiation with an actinic ray or radiation is connected to a polymer compound, and this is considered to bring about an increase in the acid generation efficiency and provide for high sensitivity. The conventional negative actinic ray-sensitive or radiation-sensitive resin composition has a problem in the compatibility between a crosslinking polymer compound and a photoacid generator (PAG) and the propensity for surface localization. However, in the negative actinic ray-sensitive or radiation-sensitive resin composition according to the present invention, the polymer compound (A) contains both (a) a repeating unit expressing a function as a photoacid generator (PAG) and (b) a repeating unit participating in a crosslinking reaction, so that PAG units can be uniformly distributed in the polymer compound and after forming a resist film, PAG units can be uniformly present in the film. Therefore, uniform distribution of acid generation when generating an acid upon exposure and uniform proceeding of a crosslinking reaction are achieved, and this is considered to lead to solving the above-described problems and improving the profile. Furthermore, the presence of the repeating unit (a) makes the polymer compound to exhibit hydrophilic solubility, and scum is considered to be thereby improved. In the conventional blend system where a conventional crosslinking polymer compound and a crosslinking agent are combined, a development defect is often generated due to PAG-induced aggregation with the crosslinking polymer compound or crosslinking agent, but (a) a repeating unit expressing a function as a photoacid generator (PAG) combines with the polymer compound, and this is considered to cause enhancement of developability as well as suppression of aggregation with the crosslinking agent and in turn, improvement of development defect.

The negative actinic ray-sensitive or radiation-sensitive resin composition according to the present invention is typically a chemical amplification negative resist composition.

The negative actinic ray-sensitive or radiation-sensitive resin composition according to the present invention is preferably for electron beam or extreme-ultraviolet exposure.

The negative actinic ray-sensitive or radiation-sensitive resin composition of the present invention is described in detail below.

[1](A) Polymer compound containing (a) a repeating unit capable of generating an acid upon irradiation with an actinic ray or radiation and (b) a repeating unit having a phenolic hydroxyl group The negative actinic ray-sensitive or radiation-sensitive resin composition according to the present invention contains (A) a polymer compound containing (a) a repeating unit capable of generating an acid upon irradiation with an actinic ray or radiation and (b) a repeating unit having a phenolic hydroxyl group.

The polymer compound (A) preferably further contains the later-described (c) alkali-insoluble repeating unit. Also, it is more preferred that the (a) repeating unit capable of generating an acid upon irradiation with an actinic ray or radiation is a repeating unit represented by formula (I) described later, the (b) repeating unit having a phenolic hydroxyl group is a repeating unit represented by formula (II) described later, and the (c) alkali-insoluble repeating unit is a repeating unit represented by formula (III) described later.

The repeating units (a) and (b) are first described below.

((a) Repeating unit capable of generating an acid upon irradiation with an actinic ray or radiation)

The (a) repeating unit capable of generating an acid upon irradiation with an actinic ray or radiation (hereinafter, sometimes referred to as "repeating unit (a)", which is contained in the polymer compound (A) of the present invention, is not limited to a repeating unit capable of generating an acid upon irradiation with an actinic ray or radiation, but conventionally known repeating units can be used. The repeating unit (a) is preferably a repeating unit having an ionic structural moiety capable of generating an acid upon irradiation with an actinic ray or radiation, in the side chain of the polymer compound (A), and the ionic structural moiety is preferably composed of an ion pair (so-called onium salt) formed by an acid ion and an onium cation. The configuration of how the repeating unit having such an ionic structural moiety in the side chain of the polymer compound (A) is present in the polymer compound (A) is roughly classified into the following three groups according to whether the moiety introduced into the side chain of the polymer compound (A) through a covalent bond is either one or both of an acid anion and an onium cation:

(1) the polymer compound (A) contains, as the repeating unit (a), only (a1) a repeating unit having an ionic structural moiety capable of producing an acid anion in the side chain upon irradiation with an actinic ray or radiation (that is, an embodiment where only an acid anion is introduced into the side chain of the polymer compound (A) through a covalent bond);

(2) the polymer compound (A) contains, as the repeating unit (a), only (a2) a repeating unit having an ionic structural moiety capable of producing an onium cation in the side chain upon irradiation with an actinic ray or radiation (that is, an embodiment where only an onium cation is introduced into the side chain of the polymer compound (A) through a covalent bond); and (3) the polymer compound (A) contains, as the repeating unit (a), both the repeating units (a1) and (a2) (that is, an embodiment where each of an acid anion and an onium cation is introduced into the side chain of the polymer compound (A) through a covalent bond).

The polymer compound (A) of the present invention preferably contains, as the repeating unit (a), (a1) a repeating unit having an ionic structural moiety capable of producing an acid anion in the side chain upon irradiation with an actinic ray or radiation (that is, the embodiment of (1) or (3)), because good resolution is obtained. It is considered that thanks to containing the repeating unit (a1) in the polymer compound (A), the acid generated exhibits very low diffusion and the resolution performance (particularly resolving power) is greatly improved.

The acid anion is preferably a sulfonate anion, a sulfonimidate anion or a sulfonemethidate anion and in view of development defect, most preferably a sulfonate anion having high hydrophilicity.

The onium cation is preferably a sulfonium cation, an iodonium cation or a pyridinium cation, more preferably a sulfonium cation or an iodonium cation, and most preferably a sulfonium cation.

The repeating unit (a1) is preferably a repeating unit represented by the following formula (I):

[Chem. 2]

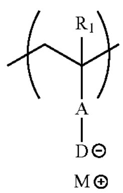

(I)

$R_1$ represents a hydrogen atom, an alkyl group or a halogen atom.

A represents a divalent linking group.

D represents a sulfonate anion, a sulfonimidate anion or a sulfonemethidate anion.

M represents an onium cation.

The alkyl group of $R_1$ is a linear or branched alkyl group which may have a substituent, preferably an alkyl group having a carbon number of 20 or less, which may have a substituent, such as methyl group, ethyl group, propyl group, isopropyl group, n-butyl group, sec-butyl group, hexyl group, 2-ethylhexyl group, octyl group and dodecyl group, more preferably an alkyl group having a carbon number of 8 or less, still more preferably an alkyl group having a carbon number of 3 or less.

Preferred substituents on the alkyl group above include a hydroxyl group, a halogen atom (fluorine, chlorine, bromine, iodine), a nitro group, a cyano group, an amido group, a sulfonamido group, the alkyl group recited in $R_1$, an alkoxy group such as methoxy group, ethoxy group, hydroxyethoxy group, propoxy group, hydroxypropoxy group and butoxy group, an alkoxycarbonyl group such as methoxycarbonyl group and ethoxycarbonyl group, an acyl group such as formyl group, acetyl group and benzoyl group, an acyloxy group such as acetoxy group and butyryloxy group, and a carboxy group. Among others, a hydroxyl group and a halogen atom are preferred.

The halogen atom of $R_1$ includes a fluorine atom, a chlorine atom, a bromine atom and an iodine atom, with a fluorine atom being preferred.

In formula (I), $R_1$ is preferably a hydrogen atom, a methyl group, an ethyl group, a trifluoromethyl group (—$CF_3$), a hydroxymethyl group (—$CH_2$—OH), a chloromethyl group (—$CH_2$—Cl) or a fluorine atom (—F), more preferably a hydrogen atom or a methyl group.

The divalent linking group of A includes any one selected from an alkylene group, a cycloalkylene group, an arylene group, —COO—, —OCO—, —CO—, —O—, —S—, —S(═O)—, —S(═O)$_2$—, —OS(═O)$_2$— and —$NR_0$—, and a group formed by combining two or more thereof. Here, $R_0$ represents a hydrogen atom, an alkyl group, a cycloalkyl group, an aryl group or an aralkyl group.

The alkylene group of A is preferably a linear or branched alkylene group having a carbon number of 1 to 20, more preferably a carbon number of 1 to 10, and examples thereof include a methylene group, an ethylene group and a propylene group.

The cycloalkylene group of A is preferably a cycloalkylene group having a carbon number of 3 to 20, more preferably a carbon number of 3 to 10, and examples thereof include a 1,4-cyclohexylene group. In the cycloalkylene group of A, a part of carbon atoms constituting the ring may be replaced by a heteroatom such as nitrogen atom.

In the alkylene group and cycloalkylene group of A, a part or all of hydrogen atoms bonded to carbon may be replaced by a substituent.

The arylene group of A is preferably an arylene group having a carbon number of 6 to 20, more preferably a carbon number of 6 to 10 (e.g., phenylene, naphthylene), and a part or all of hydrogen atom bonded to carbon may be replaced by a substituent.

The substituent which the alkylene group, cycloalkylene group and arylene group of A may have includes, for example, a halogen group such as fluorine atom, chlorine atom, bromine atom and iodine atom; an alkoxy group such as methoxy group, ethoxy group and tert-butoxy group; an aryloxy group such as phenoxy group and p-tolyloxy group; an alkoxycarbonyl group such as methoxycarbonyl group and butoxycarbonyl group; an aryloxycarbonyl group such as phenoxycarbonyl group and p-tolyloxycarbonyl group; an acyloxy group such as acetoxy group, propionyloxy group and benzoyloxy group; an acyl group such as acetyl group, benzoyl group, isobutyryl group, acryloyl group, methacryloyl group and methoxalyl group; an alkylsulfanyl group such as methylsulfanyl group and tert-butylsulfanyl group; an arylsulfanyl group such as phenylsulfanyl group and p-tolylsulfanyl group; an alkyl- or cycloalkyl-amino group such as methylamino group and cyclohexylamino group; a dialkylamino group such as dimethylamino group, diethylamino group, morpholino group and piperidino group; an arylamino group such as phenylamino group and p-tolylamino group; an alkyl group such as methyl group, ethyl group, tert-butyl group and dodecyl group; an aryl group such as phenyl group, p-tolyl group, xylyl group, cumenyl group, naphthyl group, anthryl group and phenanthryl group; a hydroxy group; a carboxy group; a formyl group; a mercapto group; a sulfo group; a mesyl group; a p-toluenesulfonyl group; an amino group; a nitro group; a cyano group; a perfluoroalkyl group; and a trialkylsilyl group.

As the divalent linking group of A, the compound preferably has an arylene group, more preferably two or more arylene groups. Thanks to having an arylene group as the divalent linking group of A, the glass transition temperature (Tg) becomes high and the acid diffusion is advantageously suppressed.

The alkyl group of $R_0$ is preferably a linear or branched alkyl group having a carbon number of 1 to 20, more preferably a carbon number of 1 to 10, and examples thereof include a methyl group, an ethyl group, a propyl group, and isopropyl group.

The cycloalkyl group of $R_0$ is preferably a cycloalkyl group having a carbon number of 3 to 20, more preferably a carbon number of 3 to 10, and examples thereof include a cyclohexyl group. In the cycloalkyl group of $R_0$, a part of carbon atoms constituting the ring may be replaced by a heteroatom such as nitrogen atom.

In the alkyl group and cycloalkyl group of $R_0$, a part or all of hydrogen atoms bonded to carbon may be replaced by a substituent.

The aryl group of $R_0$ is preferably an aryl group having a carbon number of 6 to 20, more preferably a carbon number of 6 to 10 (e.g., phenyl, naphthyl), and a part or all of hydrogen atoms bonded to carbon may be replaced by a substituent.

The aralkyl group of $R_0$ is preferably an aralkyl group having a carbon number of 7 to 20, more preferably a carbon number of 7 to 10 (e.g., benzyl, phenethyl), and a part or all of hydrogen atoms bonded to carbon may be replaced by a substituent.

Examples of the substituent which the alkyl group, cycloalkyl group, aryl group and aralkyl group of $R_0$ may have are the same as those of the substituent which the alkylene group, cycloalkylene group and arylene group of A above may have.

D represents a sulfonate anion, a sulfonimidate anion or a sulfonemethidate anion and is preferably a sulfonate anion.

D is an anion moiety forming an ion pair with the onium cation represented by M and dissociates from the onion cation upon irradiation with an actinic ray or radiation to act as a free sulfonate anion, sulfonimidate anion or sulfonemethidate anion. D is preferably a structure represented by the following formulae (DI) to (DIII):

[Chem. 3]

(DI)

(DII)

(DIII)

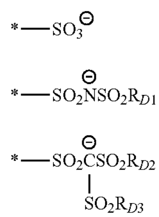

Each of $R_{D1}$, $R_{D2}$ and $R_{D3}$ independently represents an alkyl group, a cycloalkyl group, an aryl group or an aralkyl group. As for these groups, an embodiment where a part or all of hydrogen atoms are replaced by a fluorine atom or a fluoroalkyl group (more preferably a perfluoroalkyl group) is preferred, and an embodiment where from 30 to 100% by number of hydrogen atoms are replaced by a fluorine atom is more preferred.

* indicates the bonding position to A in formula (I).

The alkyl group may be linear or branched and is preferably, for example, an alkyl group having a carbon number of 1 to 8, such as methyl group, ethyl group, propyl group, butyl group, hexyl group and octyl group. An alkyl group having a carbon number of 1 to 6 is more preferred, and an alkyl group having a carbon number of 1 to 4 is still more preferred.

The cycloalkyl group is preferably, for example, a cycloalkyl group having a carbon number of 3 to 10, such as cyclobutyl group, cyclopentyl group and cyclohexyl group, more preferably a cycloalkyl group having a carbon number of 3 to 6.

The aryl group is preferably an aryl group having a carbon number of 6 to 18, more preferably an aryl group having a carbon number of 6 to 10, still more preferably a phenyl group.

The aralkyl group is preferably, for example, an aralkyl group formed by combining an alkylene group having a carbon number of 1 to 8 and the above-described aryl group, more preferably an aralkyl group formed by combining an alkylene group having a carbon number of 1 to 6 and the above-described aryl group, still more preferably an aralkyl group formed by combining an alkylene group having a carbon number of 1 to 4 and the above-described aryl group.

In formula (DII) or (DIII), each of $R_{D1}$, $R_{D2}$ and $R_{D3}$ is independently preferably an alkyl group, more preferably an alkyl group with a part or all of hydrogen atoms being replaced by a fluorine atom or a fluoroalkyl group (more preferably a perfluoroalkyl group), still more preferably an alkyl group where from 30 to 100% by number of hydrogen atoms are replaced by a fluorine atom, and most preferably a perfluoroalkyl group. The perfluoroalkyl group of $R_{D1}$, $R_{D2}$ and $R_{D3}$ may be linear or branched and is preferably a perfluoroalkyl group having a carbon number of 1 to 8, more preferably a perfluoroalkyl group having a carbon number of 1 to 6, still more preferably a perfluoroalkyl group having a carbon number of 1 to 4.

The onium cation represented by M in the repeating unit of formula (I) is preferably an onium cation represented by the following formula (IV) or (V):

[Chem. 4]

(IV)

(V)

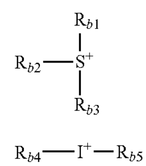

In formulae (IV) and (V), each of $R_{b1}$, $R_{b2}$, $R_{b3}$, $R_{b4}$ and $R_{b5}$ independently represents an organic group.

The sulfonium cation represented by formula (IV) is described in more detail below.

Each of $R_{b1}$1 to $R_{b3}$ in formula (IV) independently represents an organic group, and the sulfonium cation is preferably an arylsulfonium cation where at least one of $R_{b1}$ to $R_{b3}$ is an aryl group. The aryl group is preferably a phenyl group or a naphthyl group, more preferably a phenyl group.

In the arylsulfonium cation, all of $R_{b1}$ to $R_{b3}$ may be an aryl group, or a part of $R_{b1}$ to $R_{b3}$ may be an aryl group with the remaining being an alkyl group, and examples thereof include triarylsulfonium cation, diarylalkylsulfonium cation, aryldialkylsulfonium cation, diarylcycloalkylsulfonium cation and aryldicycloalkylsulfonium cation.

The aryl group of the arylsulfonium cation is preferably an aryl group such as phenyl group and naphthyl group, or a heteroaryl group such as indole residue and pyrrole residue, more preferably a phenyl group or an indole residue. In the case of having two or more aryl groups, the aryl groups may be the same as or different from each other.

The group other than the aryl group of the arylsulfonium cation is, in the case of an alkyl group, preferably a linear or branched alkyl group having a carbon number of 1 to 15 or a cycloalkyl group having a carbon number of 3 to 15, and the examples thereof include a methyl group, an ethyl group, a propyl group, an n-butyl group, a sec-butyl group, a tert-butyl group and a cyclohexyl group.

The aryl group and alkyl group of $R_{b1}$ to $R_{b3}$ may have a substituent, and preferred substituents are an alkyl group having a carbon number of 1 to 4, and an alkoxy group having a carbon number of 1 to 4. In the case where $R_{b1}$ to $R_{b3}$ are an aryl group, the substituent is preferably substituted on the p-position of the aryl group.

In formula (IV), two members out of $R_{b1}$ to $R_{b3}$ may combine to form a ring structure, and the ring may contain an oxygen atom, a sulfur atom, an ester bond, an amide bond, or a carbonyl group.

The iodonium cation represented by formula (V) is described in detail below.

In formula (V), each of $R_{b4}$ and $R_{b5}$ independently represents an organic group, and each of these members independently preferably represents an aryl group or an alkyl group.

More preferably, the iodonium cation represented by formula (V) is an aryliodonium cation where at least one of $R_{b4}$ and $R_{b5}$ is an aryl group.

The aryl group of $R_{b4}$ and $R_{b5}$ is preferably a phenyl group or a naphthyl group, more preferably a phenyl group.

The alkyl group as $R_{b4}$ and $R_{b5}$ may be either linear or branched and is preferably a linear or a branched alkyl group having a carbon number of 1 to 10, or a cycloalkyl group having a carbon number of 3 to 10 (for example, a methyl group, an ethyl group, a propyl group, a butyl group, a pentyl group or a cyclohexyl group).

The substituent which $R_{b4}$ and $R_{b5}$ may have includes, for example, an alkyl group, an aryl group, an alkoxy group, a halogen atom, a hydroxyl group, and phenylthio group.

The repeating unit represented by formula (I) is, more specifically, in view of resolution, preferably a repeating unit represented by the following formula (VI) or (VII). Furthermore, in these repeating units, $L_{11}$ and $L_{22}$ adjacent to D as an acid anion are preferably substituted with a specific electron-withdrawing group, and this is considered to cause a rise in the acid strength of acid generated, allowing successful progress of a crosslinking reaction and in turn, increasing the contrast between the exposed area and the unexposed area, and thereby contribute to more enhancement of the resolution.

[Chem. 5]

(VI)

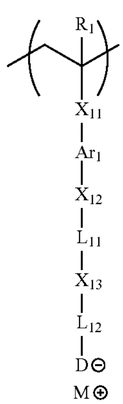

(VII)

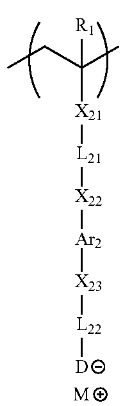

In formulae (VI) and (VII), $R_1$, D and M have the same meanings respectively as $R_1$, D and M in formula (I), and preferred ranges are also the same. Above all, in formulae (VI) and (VII), in view of development defect, D is preferably a structure represented by formula (DI) because of its good affinity for developer.

In formula (VI), each of $X_{11}$, $X_{12}$ and $X_{13}$ independently represents a single bond, —O—, —S—, —CO—, —$SO_2$—, —NR— (R is a hydrogen atom or an alkyl group), a divalent nitrogen-containing non-aromatic heterocyclic group, or a group formed by combining two or more thereof.

The alkyl group represented by R in —NR— is a linear or branched alkyl group which may have a substituent, and specific examples thereof are the same as those of the alkyl group in $R_1$. Among others, R is preferably a hydrogen atom, a methyl group or an ethyl group.

The divalent nitrogen-containing non-aromatic heterocyclic group means preferably a 3- to 8-membered non-aromatic heterocyclic group having at least one nitrogen atom and specifically includes, for example, divalent linking groups of the following structures.

[Chem. 6]

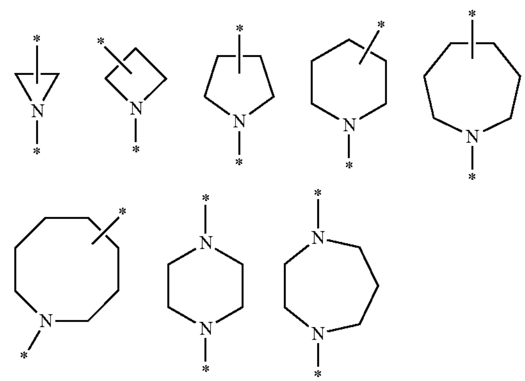

$X_{11}$ is preferably a single bond, —COO—, —CONR— (R is a hydrogen atom or an alkyl group), more preferably a single bond or —COO—.

$X_{12}$ is preferably a single bond, —O—, —CO—, —$SO_2$—, —NR— (R is a hydrogen atom or an alkyl group) or a group formed by combining two or more thereof, more preferably a single bond, —OCO— or —$OSO_2$—.

$X_{13}$ is preferably a single bond, —O—, —CO—, —$SO_2$—, —NR— (R is a hydrogen atom or an alkyl group) or a group formed by combining two or more thereof, more preferably a single bond, —OCO— or —$OSO_2$—.

$L_{11}$ represents a single bond, an alkylene group, an alkenylene group, a cycloalkylene group, a divalent aromatic ring group, or a group formed by combining two or more thereof. In the group formed by combination, two or more groups combined may be the same as or different from each other and may be connected through, as the linking group, —O—, —S—, —CO—, —$SO_2$—, —NR— (R is a hydrogen atom or an alkyl group), a divalent nitrogen-containing non-aromatic heterocyclic group, or a group formed by combining two or more thereof.

The alkylene group of $L_{11}$ may be linear or branched and is preferably, for example, an alkylene having a carbon number of 1 to 8, such as methylene group, ethylene group, propylene group, butylene group, hexylene group and octylene group, more preferably an alkylene group having a carbon number of 1 to 6, still more preferably an alkylene group having a carbon number of 1 to 4.

The alkenylene group includes a group having a double bond at an arbitrary position of the alkylene group described above for $L_{11}$.

The cycloalkylene group may be either monocyclic or polycyclic and is preferably, for example, a cycloalkylene group having a carbon number of 3 to 17, such as cyclobutylene group, cyclopentylene group, cyclohexylene group, norbornanylene group, adamantylene group and diamantanylene group, more preferably a cycloalkylene group having a carbon number of 5 to 12, still more preferably a cycloalkylene group having a carbon number of 6 to 10.

The divalent aromatic ring group includes, for example, an arylene group having a carbon number of 6 to 14, which may have a substituent, such as phenylene group, tolylene group and naphthylene group, and a divalent aromatic ring group containing a heterocyclic ring such as thiophene, furan, pyrrole, benzothiophene, benzofuran, benzopyrrole, triazine, imidazole, benzimidazole, triazole, thiadiazole and thiazole.

Specific examples of —NR— and divalent nitrogen-containing non-aromatic heterocyclic group are the same as those of respective groups in $X_{11}$ above, and preferred examples are also the same.

$L_{11}$ is preferably a single bond, an alkylene group or a cycloalkylene group, more preferably a single bond or an alkylene group.

$L_{12}$ represents a single bond, an alkylene group, an alkenylene group, a cycloalkylene group, a divalent aromatic ring group, or a group formed by combining two or more thereof, and in these groups, a part or all of hydrogen atoms are preferably replaced by a substituent selected from a fluorine atom, an alkyl fluoride group, a nitro group and a cyano group. In the group formed by combination, two or more groups combined may be the same as or different from each other and may be connected through, as the linking group, —O—, —S—, —CO—, —$SO_2$—, —NR— (R is a hydrogen atom or an alkyl group), a divalent nitrogen-containing non-aromatic heterocyclic group, or a group formed by combining two or more thereof.

$L_{12}$ is preferably an alkylene group, a divalent aromatic ring group, or a group formed by combining two or more thereof, where a part or all of hydrogen atoms are replaced by a fluorine atom or an alkyl fluoride group (preferably a perfluoroalkyl group), more preferably an alkylene group where a part or all of hydrogen atoms are replaced by a fluorine atom. $L_{12}$ is most preferably an alkylene group where from 30 to 100% by number of hydrogen atoms are replaced by a fluorine atom.

The alkylene group in $L_{12}$ may be linear or branched and is preferably, for example, an alkylene group having a carbon number of 1 to 8, such as methylene group, ethylene group, propylene group, butylene group, hexylene group and octylene group, more preferably an alkylene group having a carbon number of 1 to 6, still more preferably an alkylene group having a carbon number of 1 to 4.

The alkenylene group includes a group having a double bond at an arbitrary position of the above-described alkylene group.

The cycloalkylene group may be either monocyclic or polycyclic and is preferably, for example, a cycloalkylene group having a carbon number of 3 to 17, such as cyclobutylene group, cyclopentylene group, cyclohexylene group, norbornanylene group, adamantylene group and diamantanylene group.

Specific examples of the divalent aromatic ring group are the same as specific examples of the divalent aromatic ring group as the linking group of $L_{11}$.

Specific examples of —NR— as a linking group in $L_{12}$ and the divalent nitrogen-containing non-aromatic heterocyclic group are the same as those of respective groups in $X_{11}$ above, and preferred examples are also the same.

Specific preferred examples of $L_{12}$ are illustrated below, but the present invention is not limited thereto. In specific examples, * indicates a bond to $X_{13}$ (when $X_{13}$ is a single bond, $L_{11}$) or D.

[Chem. 7]

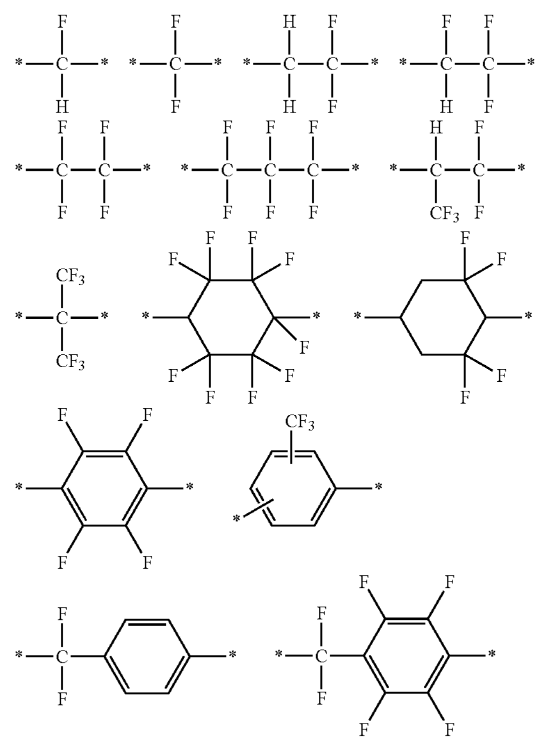

$Ar_1$ represents a divalent aromatic ring group or a group formed by combining a divalent aromatic ring group and an alkylene group.

The divalent aromatic ring group may have a substituent and preferably includes, for example, an arylene group having a carbon number of 6 to 18, such as phenylene group, tolylene group and naphthylene group, and a divalent aromatic ring group containing a heterocyclic ring such as thiophene, furan, pyrrole, benzothiophene, benzofuran, benzopyrrole, triazine, imidazole, benzimidazole, triazole, thiadiazole and thiazole.

Preferred substituents on each of the groups above include the alkyl group recited for $R_1$, an alkoxy group such as methoxy group, ethoxy group, hydroxyethoxy group, propoxy group, hydroxypropoxy group and butoxy group, and an aryl group such as phenyl group.

Preferred examples of the group formed by combining a divalent aromatic ring group and an alkylene group include an aralkylene group formed by combining the above-described divalent aromatic ring group and an alkylene group (which may be linear or branched) having a carbon number of 1 to 8, such as methylene group, ethylene group, propylene group, butylene group, hexylene group and octylene group.

$Ar_1$ is preferably an arylene group having a carbon number of 6 to 18, which may have a substituent, more preferably a phenylene group, a naphthylene group, a biphenylene group, or a phenylene group substituted with a phenyl group.

Furthermore, in view of resolution, the repeating unit represented by formula (VI) is preferably a repeating unit represented by the following formula (VIII):

[Chem. 8]

(VIII)

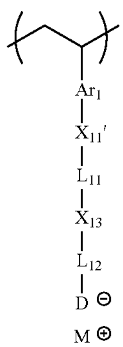

In formula (VIII), $Ar_1$, $L_{11}$, $L_{12}$, $X_{13}$, D and M have the same meanings respectively as $Ar_1$, $L_{11}$, $L_{12}$, $X_{13}$, D and M in formula (VI), and preferred ranges are also the same.

$X_{11}'$ represents —O—, —OCO— or —$OSO_2$—. $X_{11}'$ most preferably represents —$OSO_2$—.

Formula (VII) is described below.

$X_{21}$ represents —O—, —S—, —CO—, —$SO_2$—, —NR— (R is a hydrogen atom or an alkyl group), a divalent nitrogen-containing non-aromatic heterocyclic group, or a group formed by combining two or more thereof.

The alkyl group represented by R in —NR— is a linear or branched alkyl group which may have a substituent, and specific examples thereof are the same as those of the alkyl group in $R_1$ above. Among others, R is preferably a hydrogen atom, a methyl group or an ethyl group.

The divalent nitrogen-containing non-aromatic heterocyclic group means preferably a 3- to 8-membered non-aromatic heterocyclic group having at least one nitrogen atom and specifically includes, for example, structures illustrated for $X_{11}$, to $X_{13}$ in formula (VI).

$X_{21}$ is preferably —O—, —CO—, —NR— (R is a hydrogen atom or an alkyl group), or a group formed by combining two or more thereof, more preferably —COO— or —CONR— (R is a hydrogen atom or an alkyl group).

$L_{21}$ represents an alkylene group, an alkenylene group, a cycloalkylene group, or a group formed by combining two or more thereof. In the group formed by combination, two or more groups combined may be the same as or different from each other and may be connected through, as the linking group, —O—, —S—, —CO—, —$SO_2$—, —NR— (R is a hydrogen atom or an alkyl group), a divalent nitrogen-containing non-aromatic heterocyclic group, a divalent aromatic ring group, or a group formed by combining two or more thereof.

The alkylene group in $L_{21}$ may be linear or branched, and is preferably, for example, an alkylene group having a carbon number of 1 to 8, such as methylene group, ethylene group, propylene group, butylene group, hexylene group and octylene group, more preferably an alkylene group having a carbon number of 1 to 6, still more preferably an alkylene group having a carbon number of 1 to 4.

The alkenylene group includes a group having a double bond at an arbitrary position of the alkylene group described above for $L_{21}$.

The cycloalkylene group may be either monocyclic or polycyclic and is preferably, for example, a cycloalkylene group having a carbon number of 3 to 17, such as cyclobutylene group, cyclopentylene group, cyclohexylene group, norbornanylene group, adamantylene group and diamantanylene group, more preferably a cycloalkylene group having a carbon number of 5 to 12, still more preferably a cycloalkylene group having a carbon number of 6 to 10.

The divalent aromatic ring group as the linking group includes, for example, an arylene group having a carbon number of 6 to 14, which may have a substituent, such as phenylene group, tolylene group and naphthylene group, and a divalent aromatic ring group containing a heterocyclic ring such as thiophene, furan, pyrrole, benzothiophene, benzofuran, benzopyrrole, triazine, imidazole, benzimidazole, triazole, thiadiazole and thiazole.

Specific examples of —NR— and divalent nitrogen-containing non-aromatic heterocyclic group are the same as those of respective groups in $X_{21}$ above, and preferred examples are also the same.

$L_{21}$ is preferably an alkylene group, a cycloalkylene group, or a group formed by combining an alkylene group and a cycloalkylene group through —OCO—, —O— or —CONH— (for example, -alkylene group-O-alkylene group-, -alkylene group-OCO-alkylene group-, -cycloalkylene group-O-alkylene group-, or -alkylene group-CONH-alkylene group-).

Each of $X_{22}$ and $X_{23}$ independently represents a single bond, —O—, —S—, —CO—, —$SO_2$—, —NR— (R is a hydrogen atom or an alkyl group), a divalent nitrogen-containing non-aromatic heterocyclic group, or a group formed by combining two or more thereof.

Specific examples of —NR— and divalent nitrogen-containing non-aromatic heterocyclic group in $X_{22}$ and $X_{23}$ are the same as those of respective groups in $X_{21}$ above, and preferred examples are also the same.

$X_{22}$ is preferably a single bond, —S—, —O—, —CO—, —$SO_2$— or a group formed by combining two or more thereof, more preferably a single bond, —S—, —OCO— or —$OSO_2$—.

$X_{23}$ is preferably —O—, —CO—, —SO— or a group formed by combining two or more thereof, more preferably —$OSO_2$—.

$Ar_2$ represents a divalent aromatic ring group or a group formed by combining a divalent aromatic group and an alkylene group.

The divalent aromatic ring group may have a substituent and preferably includes, for example, an arylene group having a carbon number of 6 to 18, such as phenylene group, tolylene group and naphthylene group, and a divalent aromatic ring group containing a heterocyclic ring such as thiophene, furan, pyrrole, benzothiophene, benzofuran, benzopyrrole, triazine, imidazole, benzimidazole, triazole, thiadiazole and thiazole.

Preferred substituents on each of the groups above include the alkyl group described for $R_1$, an alkoxy group such as methoxy group, ethoxy group, hydroxyethoxy group, propoxy group, hydroxypropoxy group and butoxy group, and an aryl group such as phenyl group.

Preferred examples of the group formed by combining a divalent aromatic ring group and an alkylene group include an aralkylene group formed by combining the above-described divalent aromatic ring group and an alkylene group (which may be linear or branched) having a carbon number of 1 to 8, such as methylene group, ethylene group, propylene group, butylene group, hexylene group and octylene group.

$Ar_2$ is preferably an arylene group having a carbon number of 6 to 18, which may have a substituent, more preferably an aralkylene group formed by combining an arylene group having a carbon number of 6 to 18 and an alkylene group having a carbon number of 1 to 4, still more preferably a phenylene group, a naphthylene group, a biphenylene group, or a phenylene group substituted with a phenyl group.

$L_{22}$ represents an alkylene group, an alkenylene group, a cycloalkylene group, a divalent aromatic ring group, or a group formed by combining two or more thereof, and in these groups, a part or all of hydrogen atoms are replaced by a substituent selected from a fluorine atom, an alkyl fluoride group, a nitro group and a cyano group. In the group formed by combination, two or more groups combined may be the same as or different from each other and may be connected through, as the linking group, —O—, —S—, —CO—, —$SO_2$—, —NR— (R is a hydrogen atom or an alkyl group), a divalent nitrogen-containing non-aromatic heterocyclic group, or a group formed by combining two or more thereof.

$L_{22}$ is preferably an alkylene group, a divalent aromatic ring group, or a group formed by combining two or more thereof, where a part or all of hydrogen atoms are replaced by a fluorine atom or an alkyl fluoride group (preferably a perfluoroalkyl group), more preferably an alkylene group or a divalent aromatic ring group, where at least a part or all of hydrogen atoms are replaced by a fluorine atom. $L_{22}$ is most preferably an alkylene group or a divalent aromatic ring group, where from 30 to 100% by number of hydrogen atoms are replaced by a fluorine atom.

The alkylene group in $L_{22}$ may be linear or branched, and is preferably, for example, an alkylene group having a carbon number of 1 to 8, such as methylene group, ethylene group, propylene group, butylene group, hexylene group and octylene group, more preferably an alkylene group having a carbon number of 1 to 6, still more preferably an alkylene group having a carbon number of 1 to 4.

The alkenylene group includes a group having a double bond at an arbitrary position of the above-described alkylene group.

The cycloalkylene group may be either monocyclic or polycyclic and is preferably, for example, a cycloalkylene group having a carbon number of 3 to 17, such as cyclobutylene group, cyclopentylene group, cyclohexylene group, norbornanylene group, adamantylene group and diamantanylene group.

Specific examples of the divalent aromatic ring group are the same as specific examples of the divalent aromatic ring group as the linking group of $L_{21}$.

Specific examples of —NR— as a linking group in $L_{22}$ and the divalent nitrogen-containing non-aromatic heterocyclic group are the same as those of respective groups in $X_{21}$ above, and preferred examples are also the same.

Specific preferred examples of $L_{22}$ include the structures illustrated above for $L_{12}$ in formula (VI).

In another embodiment, the repeating unit (a) may be a repeating unit containing an aromatic ring in the side chain, other than those represented by formulae (I), (VI), (VII) and (VIII).

Examples of the polymerizable monomer unit corresponding to such a repeating unit (a) are illustrated below as a sulfonic acid, imide acid or methide acid unit produced by leaving from the onium cation upon irradiation with an actinic ray or radiation.

[Chem. 9]

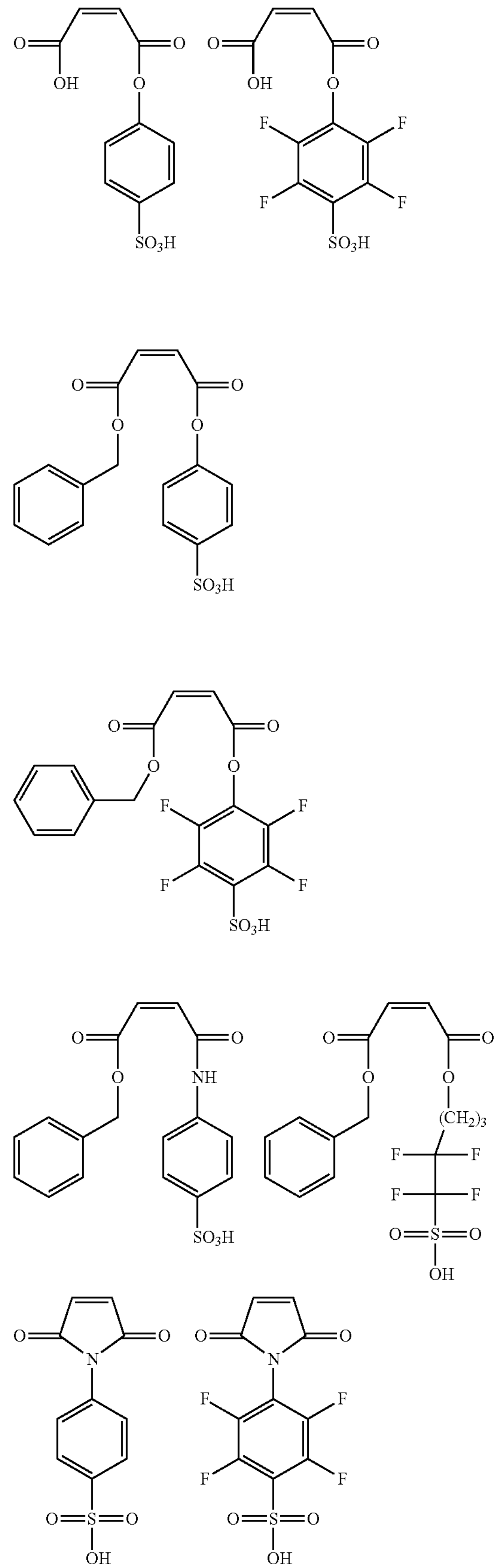

-continued

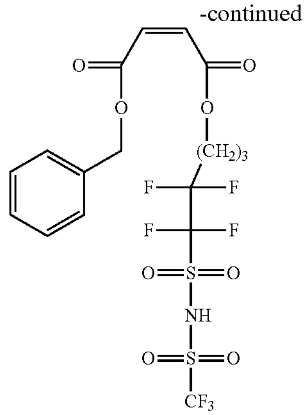

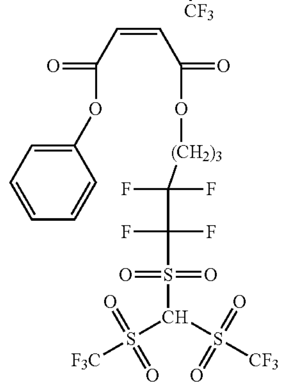

In view of resolution, it is also preferred that the repeating unit represented by formula (I) is a repeating unit represented by the following formula (IX). Also in this repeating unit, as described above in formulae (VI) and (VII), $L_{32}$ adjacent to D as an acid anion is substituted with a specific electron-withdrawing group and for the same reason, this is considered to contribute to enhancement of the resolution.

[Chem. 10]

(IX)

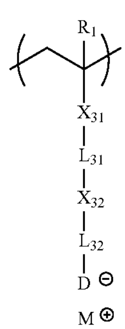

In formula (IX), $R_1$, D and M have the same meanings respectively as $R_1$, D and M in formula (I), and preferred ranges are also the same. Above all, in formula (IX), in view of development defect, D is preferably a structure represented by formula (DI) because of its good affinity for developer.

Each of $X_{31}$ and $X_{32}$ independently represents a single bond, —O—, —S—, —CO—, —$SO_2$—, —NR— (R is a hydrogen atom or an alkyl group), a divalent nitrogen-containing non-aromatic heterocyclic group, or a group formed by combining two or more thereof.

The alkyl group represented by R in —NR— is a linear or branched alkyl group which may have a substituent, and specific examples thereof are the same as those of the alkyl group in $R_1$ above. Among others, R is preferably a hydrogen atom, a methyl group or an ethyl group.

The divalent nitrogen-containing non-aromatic heterocyclic group means preferably a 3- to 8-membered non-aromatic heterocyclic group having at least one nitrogen atom and specifically includes, for example, the structures illustrated above for $X_{11}$ to $X_{13}$ in formula (VI).

$X_{31}$ is preferably a single bond, —O—, —CO—, —NR— (R is a hydrogen atom or an alkyl group), or a group formed by combining two or more thereof, more preferably —COO— or —CONR— (R is a hydrogen atom or an alkyl group).

$X_{32}$ is preferably a single bond, —O—, —CO—, —$SO_2$—, a divalent nitrogen-containing non-aromatic heterocyclic group, or a group formed by combining two or more thereof, more preferably a single bond, —OCO—, —$OSO_2$—, or a group formed by combining a divalent nitrogen-containing non-aromatic heterocyclic group and —$SO_2$—.

$L_{31}$ represents a single bond, an alkylene group, an alkenylene group, a cycloalkylene group, or a group formed by combining two or more thereof. In the group formed by combination, two or more groups combined may be the same as or different from each other and may be connected through, as the linking group, —O—, —S—, —CO—, —$SO_2$—, —NR— (R is a hydrogen atom or an alkyl group), a divalent nitrogen-containing non-aromatic heterocyclic group, or a group formed by combining two or more thereof.

The alkylene group in $L_{31}$ may be linear or branched and preferably includes, for example, an alkylene group having a carbon number of 1 to 8, such as methylene group, ethylene group, propylene group, butylene group, hexylene group and octylene group, more preferably an alkylene group having a carbon number of 1 to 6, still more preferably an alkylene group having a carbon number of 1 to 4.

The alkenylene group includes a group having a double bond at an arbitrary position of the alkylene group described above for $L_{31}$.

The cycloalkylene group may be either monocyclic or polycyclic and is preferably, for example, a cycloalkylene group having a carbon number of 3 to 17, such as cyclobutylene group, cyclopentylene group, cyclohexylene group, norbornanylene group, adamantylene group and diamantanylene group, more preferably a cycloalkylene group having a carbon number of 5 to 12, still more preferably a cycloalkylene group having a carbon number of 6 to 10.

Specific examples of —NR— and divalent nitrogen-containing non-aromatic heterocyclic group are the same as those of respective groups in $X_{31}$ above, and preferred examples are also the same.

$L_{31}$ is preferably a single bond, an alkylene group, a cycloalkylene group, or a group formed by combining an alkylene group and a cycloalkylene group through —OCO—, —O— or —CONH— (for example, -alkylene group-O-alkylene group-, -alkylene group-OCO-alkylene group-, -cycloalkylene group-O-alkylene group-, or -alkylene group-CONH-alkylene group-).

$L_{32}$ represents an alkylene group, an alkenylene group, a cycloalkylene group, or a group formed by combining two or more thereof, and in these groups, a part or all of hydrogen atoms are replaced by a substituent selected from a fluorine atom, an alkyl fluoride group, a nitro group and a cyano group. In the group formed by combination, two or more groups combined may be the same as or different from each other and may be connected through, as the linking group, —O—, —S—, —CO—, —$SO_2$—, —NR— (R is a hydrogen atom or an alkyl group), a divalent nitrogen-containing non-aromatic heterocyclic group, or a group formed by combining two or more thereof.

$L_{32}$ is preferably an alkylene group where a part or all of hydrogen atoms are replaced by a fluorine atom or an alkyl fluoride group (preferably a perfluoroalkyl group), more preferably an alkylene group where a part or all of hydrogen atoms are replaced by a fluorine atom. $L_{32}$ is most preferably an alkylene group where from 30 to 100% by number of hydrogen atoms are replaced by a fluorine atom.

The alkylene group in $L_{32}$ may be linear or branched and is preferably, for example, an alkylene group having a carbon number of 1 to 8, such as methylene group, ethylene group, propylene group, butylene group, hexylene group and octylene group, more preferably an alkylene group having a carbon number of 1 to 6, still more preferably an alkylene group having a carbon number of 1 to 4.

The alkenylene group includes a group having a double bond at an arbitrary position of the above-described alkylene group.

The cycloalkylene group may be either monocyclic or polycyclic and is preferably, for example, a cycloalkylene group having a carbon number of 3 to 17, such as cyclobutylene group, cyclopentylene group, cyclohexylene group, norbornanylene group, adamantylene group and diamantanylene group.

Specific examples of —NR— as a linking group in $L_{32}$ and the divalent nitrogen-containing non-aromatic heterocyclic group are the same as those of respective groups in $X_{31}$ above, and preferred examples are also the same.

Specific preferred examples of $L_{32}$ include the structures illustrated above for $L_{12}$ in formula (VI).

The polymerizable precursors corresponding to the repeating units represents by formulae (VI) to (IX) can be synthesized using a general sulfonic acid esterification reaction or a sulfonamidation reaction. For example, a lithium, sodium, potassium or ammonium salt of an organic acid, which is a polymerizable precursor corresponding to the repeating units represented by formulae (VI) to (IX), can be obtained by a method of selectively reacting one sulfonyl halide moiety of a bis-sulfonyl halide compound with an amine, an alcohol or the like to form a sulfonamide bond or a sulfonic acid ester bond and then hydrolyzing the other sulfonyl halide moiety, or a method of ring-opening a cyclic sulfonic anhydride by an amine or an alcohol. These salts may also be easily synthesized using the methods described in U.S. Pat. No. 5,554,664, *J. Fluorine Chem.*, 105, 129-136 (2000), and *J. Fluorine Chem.*, 116, 45-48 (2002).

In view of resolution, it is also preferred that the repeating unit represented by formula (I) is, more specifically, a repeating unit represented by the following formula (X). By virtue of containing this repeating unit, the glass transition temperature (Tg) of the polymer compound (A) rises, leading to suppression of the acid diffusion, and at the same time, the presence of spacers of site $L^{21}$ and site $Ar^{22}$ makes it possible to maintain the minimum diffusion necessary for reaction and keep the acid diffusion distance optimal, which is considered to contribute to the enhancement of resolution. The repeating unit represented by formula (X) has good affinity for developer and is also preferred in view of development defect.

[Chem. 11]

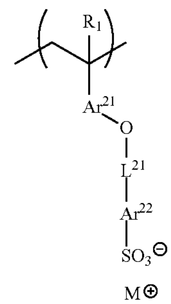

(X)

In formula (X), $R_1$ and M have the same meanings respectively as $R_1$ and M in formula (I), and preferred ranges are also the same.

$Ar^{21}$ represents an arylene group.

$L^{22}$ represents a divalent organic group.

$Ar^{22}$ represents an unsubstituted aromatic ring or an aromatic ring substituted with an alkyl group or an alkoxy group.

The compound preferably used as the repeating unit represented by formula (X) in the present invention is described below.

In the repeating unit represented by formula (X), $Ar^{21}$ represents an arylene group and may have a substituent. The arylene group of $Ar^{21}$ is preferably an arylene group having a carbon number of 6 to 18, which may have a substituent, more preferably a phenylene group or a naphthylene group, which may have a substituent, and most preferably a phenylene group which may have a substituent. The substituent which may be substituted on $Ar^{21}$ includes, for example, an alkyl group, a halogen atom, a hydroxyl group, an alkoxy group, a carboxyl group, and an alkoxycarbonyloxy group.

In the repeating unit represented by formula (X), when $Ar^{21}$ is a phenylene group, the bonding position of —O-$L^{21}$-$Ar^{22}$—$SO_3^-M^+$ to the benzene ring of $Ar^{21}$ may be the para-, meta- or ortho-position relative to the bonding position of the benzene ring to the polymer main chain but is preferably the para- or meta-position, more preferably the para-position. On the other hand, when the polymer compound (A) does not contain (c) an alkali-insoluble repeating unit described later, the bonding position is preferably the meta-position. Thanks to this configuration, appropriate solubility is maintained.

The divalent linking group of $L^{21}$ in formula (X) includes, for example, an alkylene group, an alkenylene group, —O—, —CO—, —$NR^{14}$—, —S—, —CS—, and a combination thereof. Here, $R^{14}$ represents a hydrogen atom, an alkyl group, a cycloalkyl group, an aryl group or an aralkyl group. The total carbon number of the divalent organic group of $L^{21}$ is preferably from 1 to 15, more preferably from 1 to 10.

The alkylene group is preferably an alkylene group having a carbon number of 1 to 8, more preferably an alkylene group having a carbon number of 1 to 4, and includes, for example, a methylene group, an ethylene group, a propylene group, a butylene group, a hexylene group and an octylene group.

The alkenylene group is preferably an alkenylene group having a carbon number of 2 to 8, more preferably a carbon number of 2 to 4.

Specific examples and preferred ranges of the alkyl group, cycloalkyl group, aryl group and aralkyl group represented by $R^{14}$ are the same as specific examples and preferred ranges of the alkyl group, cycloalkyl group, aryl group and aralkyl group represented by $R_0$ in A of formula (I).

The group as $L^{21}$ is preferably a carbonyl group, a methylene group, —CO—($CH_2$)—O—, —CO—($CH_2$)—O—CO—, —$(CH_2)_n$—COO—, —$(CH_2)_n$—$CONR^1$— or —CO—$(CH_2)_n$—$NR^1$—, more preferably a carbonyl group, —$CH_2$—COO—, —CO—$CH_2$—O—, —CO—$CH_2$—O—CO—, —$CH_2$—$CONR^1$— or —CO—$CH_2$—$NR^1$—. Here, $R^1$ represents a hydrogen atom, an alkyl group, an aryl group or an aralkyl group, and n represents an integer of 1 to 10.

Specific examples and preferred ranges of an alkyl group, aryl group and aralkyl group represented by $R^1$ are the same as specific examples and preferred ranges of the alkyl group, aryl group and aralkyl group represented by $R_0$ in formula (I).

n is preferably an integer of 1 to 6, more preferably an integer of 1 to 3, and most preferably 1.

$Ar^{22}$ represents an unsubstituted aromatic ring or an aromatic ring substituted with an alkyl group or an alkoxy group. When $Ar^{22}$ is an unsubstituted aromatic ring, this means that $Ar^{22}$ does not have a substituent other than -$L^{21}$- and —$SO_3^-M^+$ connected thereto. Also, when $Ar^{22}$ is an aromatic ring substituted with an alkyl group or an alkoxy group, this means that $Ar^{22}$ has an alkyl group or an alkoxy group as a substituent, in addition to -$L^{21}$- and —$SO_3$-$M^+$ connected thereto. In this way, $Ar^{22}$ is an aromatic ring not having, as a substituent, an electron-withdrawing group such as fluorine atom. Thanks to this configuration, the strength of the acid generated can be kept from excessive increase, and the acid generated can have an appropriate strength.

The alkyl group when $Ar^{22}$ has an alkyl group is preferably an alkyl group having a carbon number of 1 to 8, more preferably a carbon number of 1 to 4. The alkoxy group when $Ar^{22}$ has an alkoxy group is preferably an alkoxy group having a carbon number of 1 to 8, more preferably a carbon number of 1 to 4. The aromatic ring of $Ar^{22}$ may be an aromatic hydrocarbon ring (for example, a benzene ring or a naphthalene ring) or may be an aromatic heterocyclic ring (for example, a quinoline ring) and preferably has a carbon number of 6 to 18, more preferably a carbon number of 6 to 12.

$Ar^{22}$ is an unsubstituted aromatic ring or an aromatic ring substituted with an alkyl group or an alkoxy group. The aromatic ring is preferably an aromatic hydrocarbon ring, and the aromatic hydrocarbon ring is preferably a benzene ring or a naphthalene ring. $Ar^{22}$ is preferably an unsubstituted aromatic ring.

M represents an onium cation and is preferably sulfonium cation or iodonium cation, more preferably sulfonium cation.

As described above, in formula (X), thanks to the presence of site $L^{21}$ and site $Ar^{21}$ in the side chain, the acid diffusion distance is kept optimal. However, if the linking length is too long, the acid generated is allowed to readily diffuse and therefore, the roughness properties and resolution are reduced. The number of minimum linking atoms ($L^{21}$-$Ar^{22}$), which is an indicator of the linking length, is preferably from 3 to 20, more preferably from 3 to 15, still more preferably from 3 to 10.

Incidentally, the number of minimum linking atoms is a numeral determined as follows. That is, among atoms constituting $L^{21}$-$Ar^{22}$, the atomic row connecting an atom combining with an oxygen atom bonded to $Ar^{21}$ and an atom combining with —$SO_3^-M^+$ is imagined and after determining the number of atoms contained in each of these rows, the minimum number of atoms is taken as the minimum number of linking atoms.

For example, in the case of the following formula ($N_L$–1), the minimum number of linking atoms is 3, and in the case of the following formula ($N_L$–2), the number is 7. In the formulae, $R_1$, $Ar^{21}$ and M have the same meanings as those in formula (X).

[Chem. 12]

($N_L$-1)

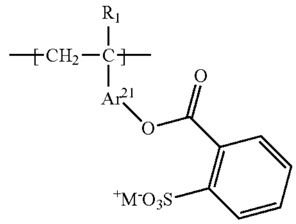

($N_L$-2)

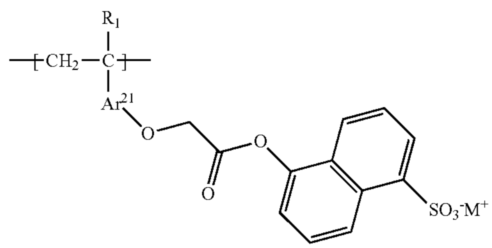

Specific examples of formula (I) are illustrated below as a sulfonate anion, a sulfonimidate anion or a sulfonemethidate anion in the state after leaving from the onium cation represented by M.

[Chem. 13]

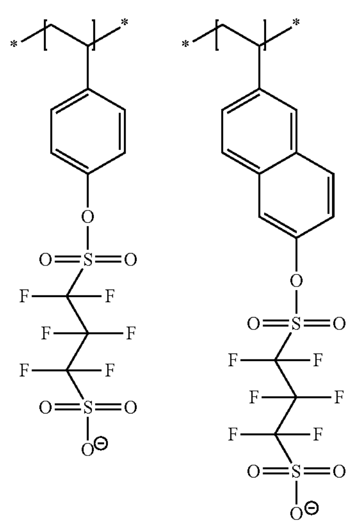

-continued
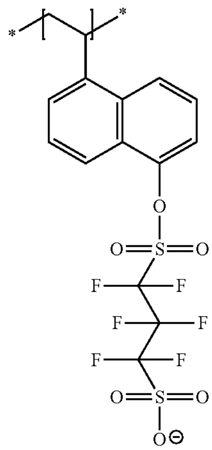
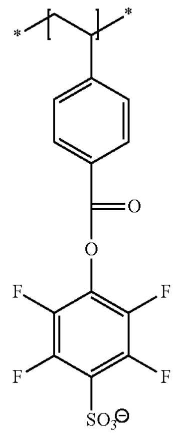
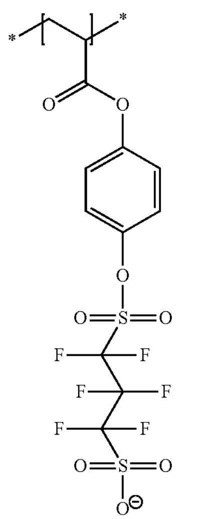
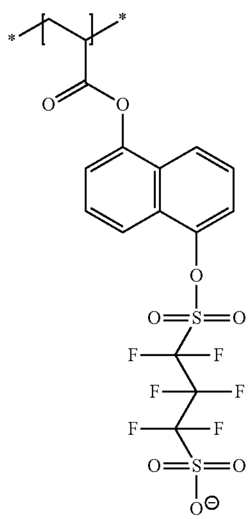
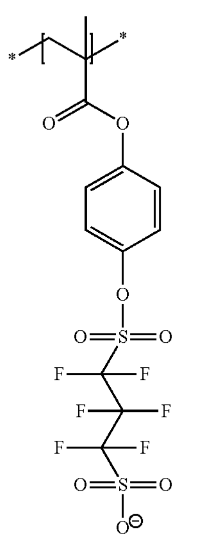
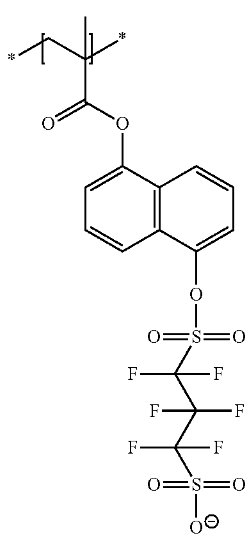
-continued
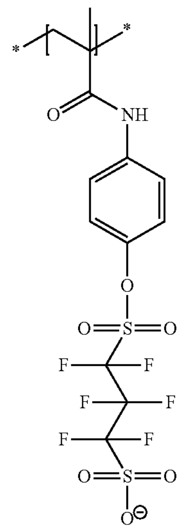
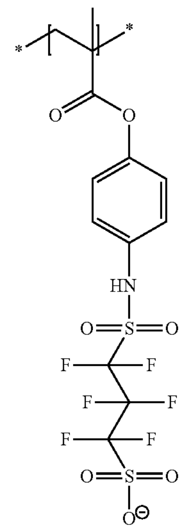
[Chem. 14]
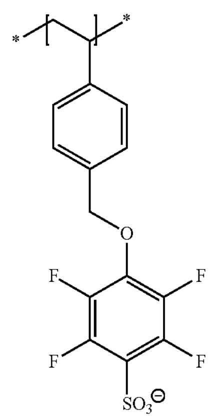
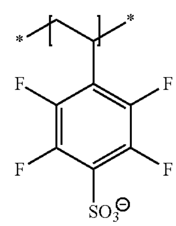
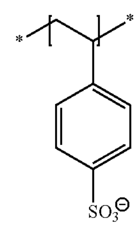
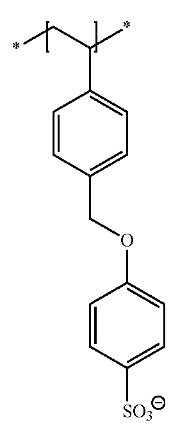
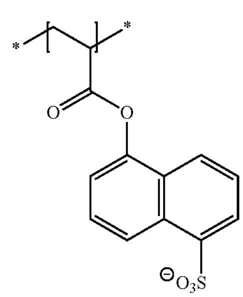

-continued
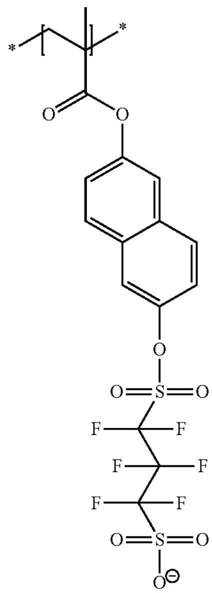
-continued
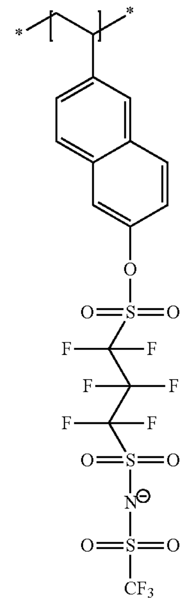
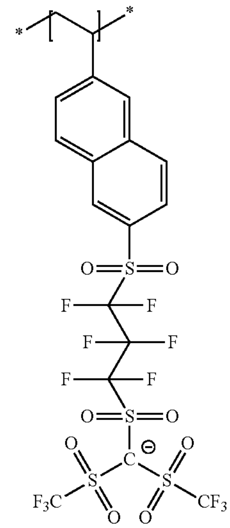
[Chem. 15]
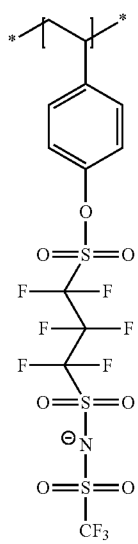
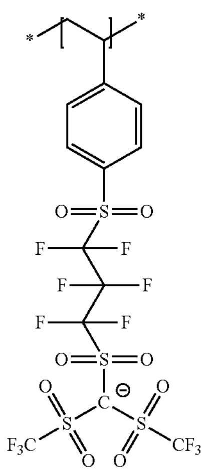
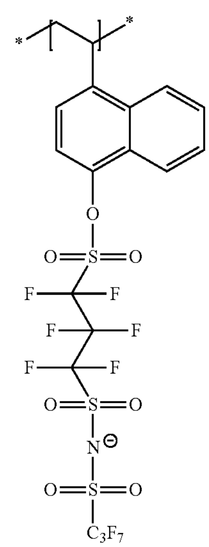
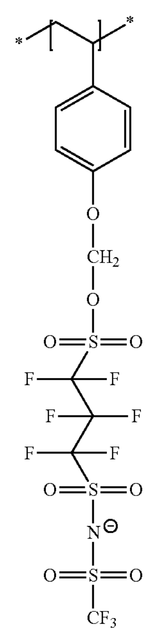

-continued
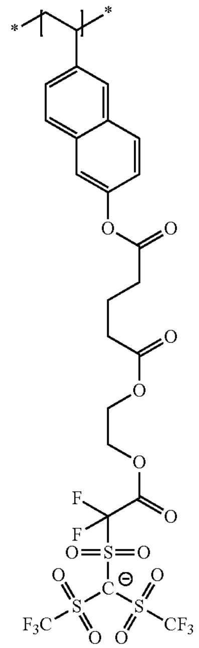
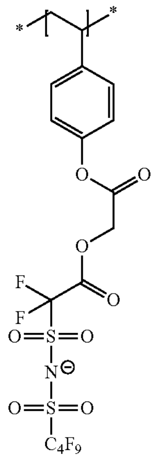
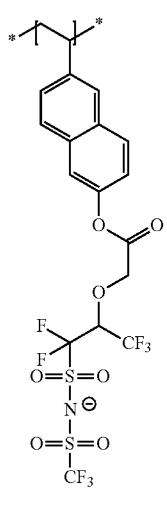
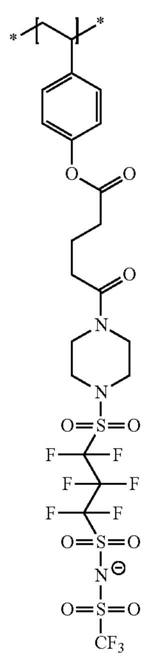
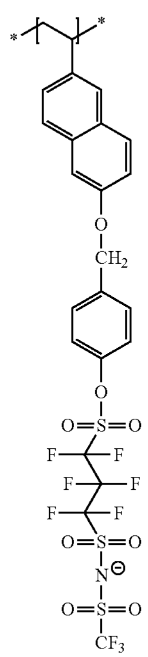
-continued
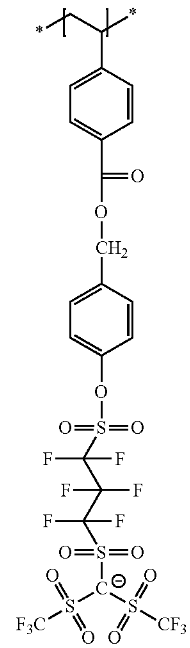
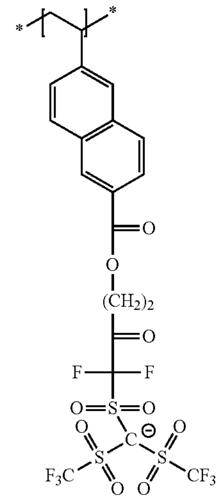
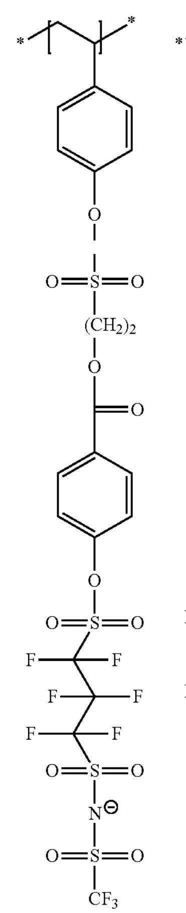
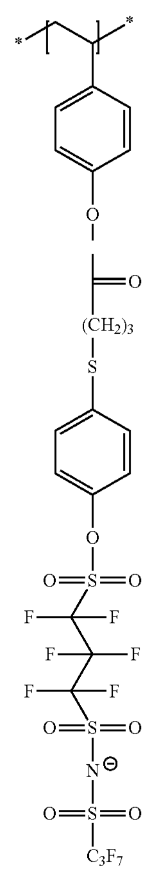
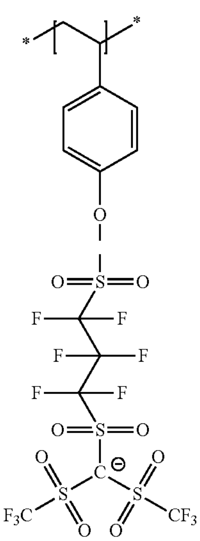

[Chem. 16]
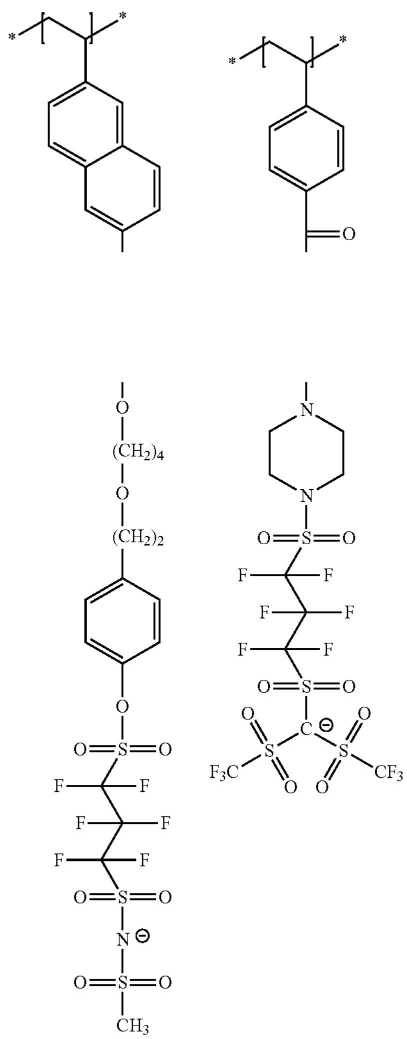
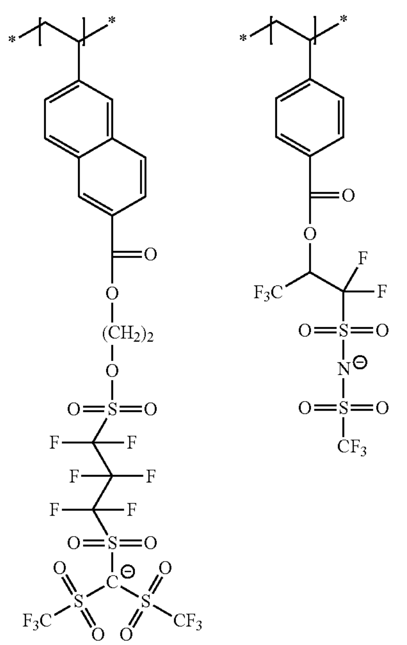
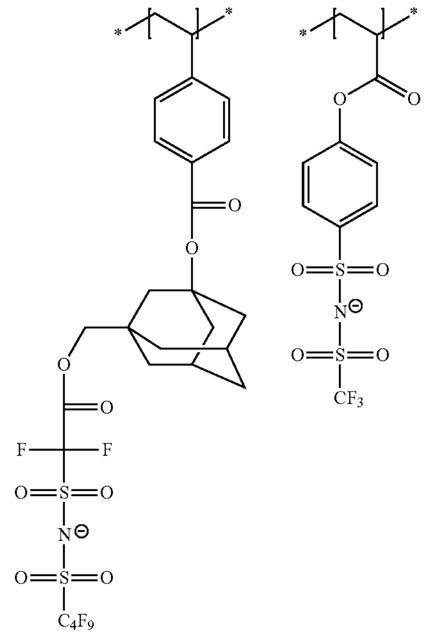
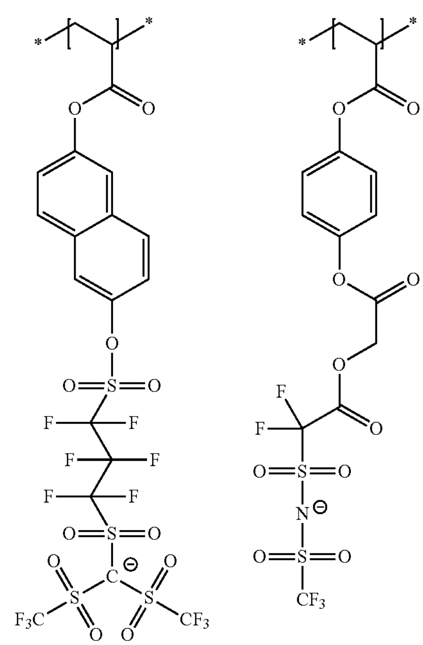

-continued
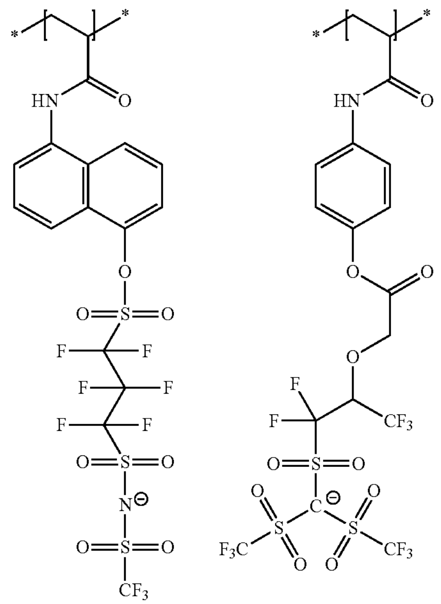
[Chem. 17]
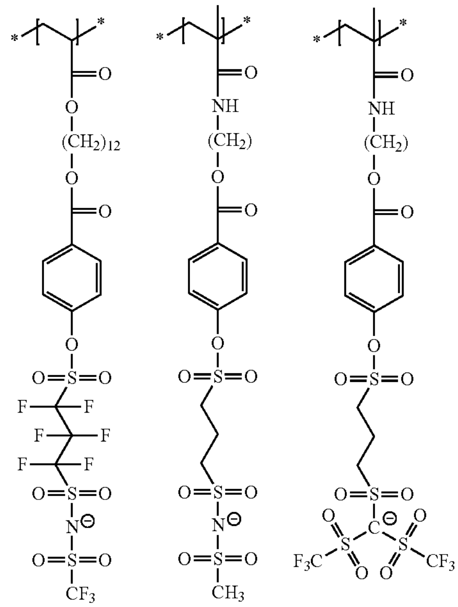
-continued
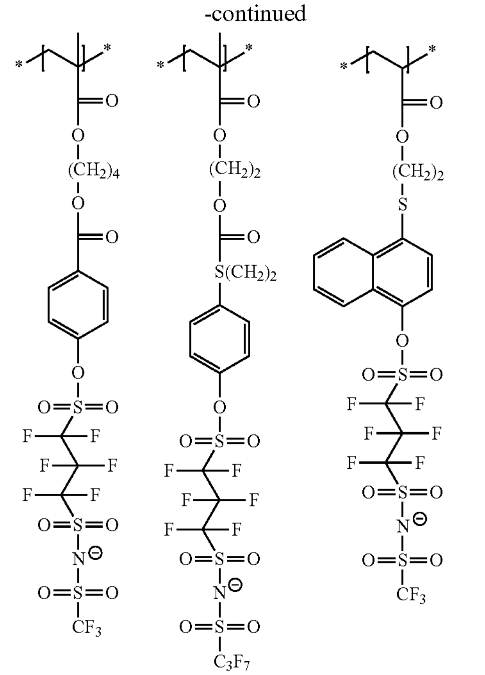
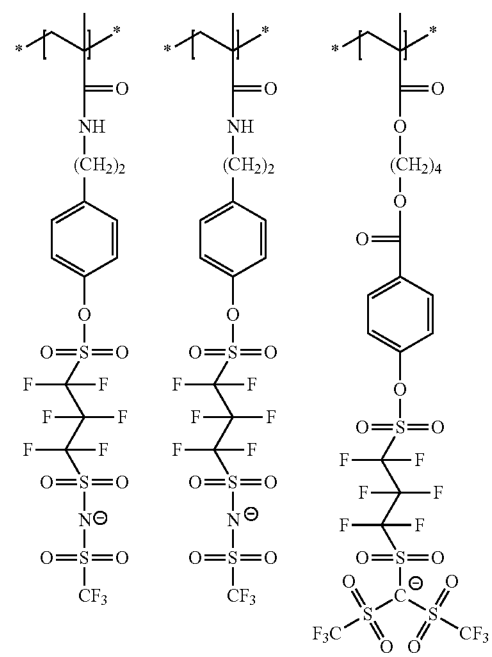
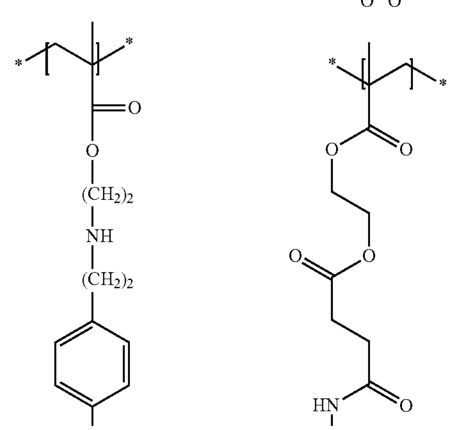

-continued
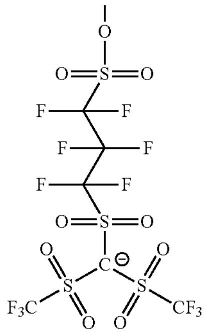
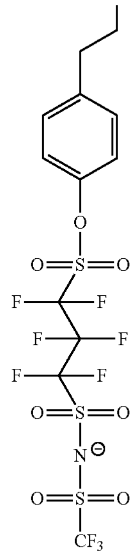
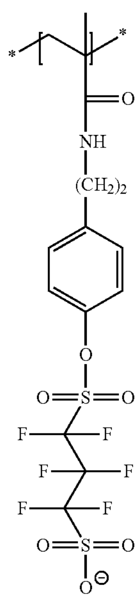
[Chem. 18]
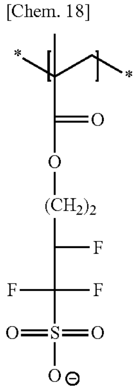
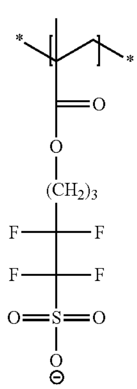
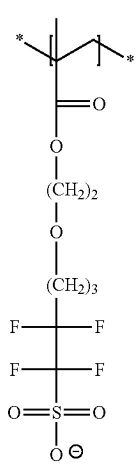
-continued
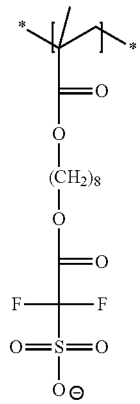
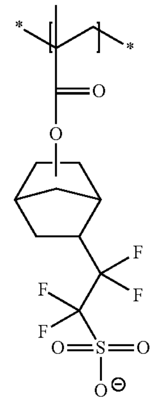
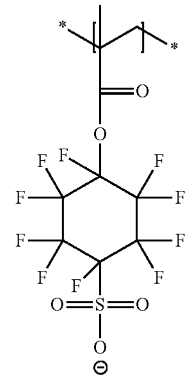
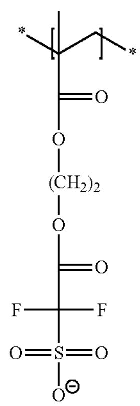
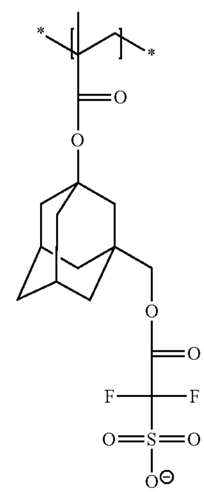
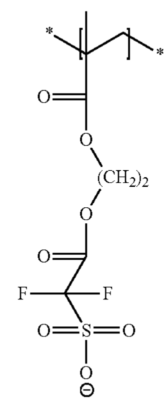
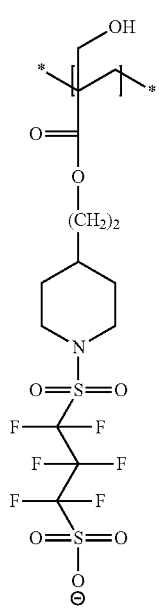
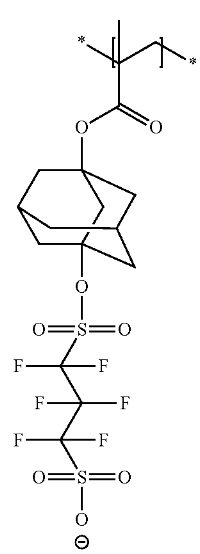

-continued
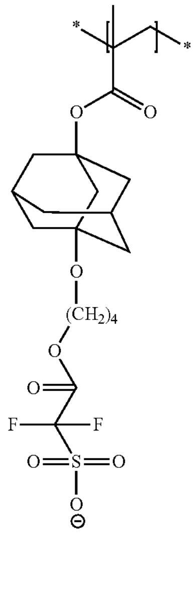
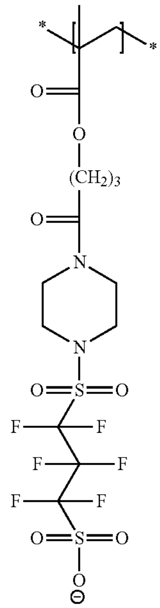
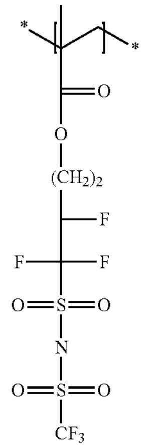
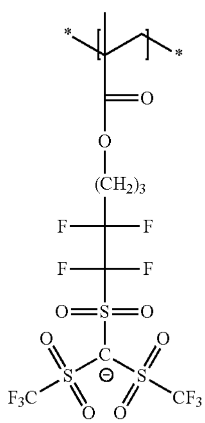
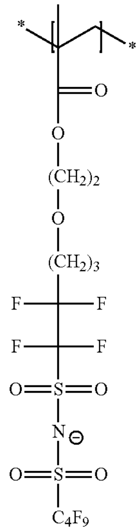
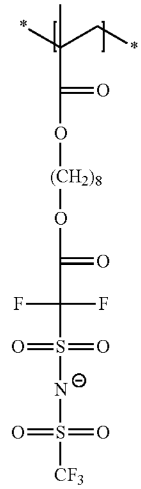
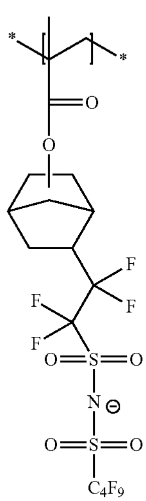
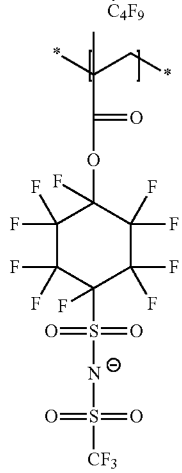
-continued
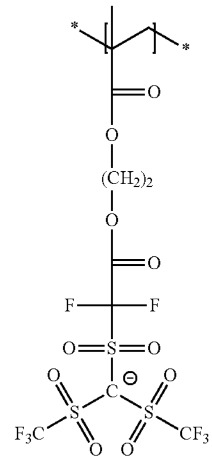
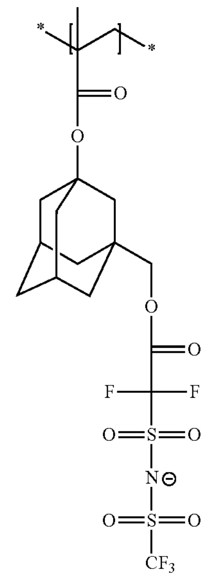
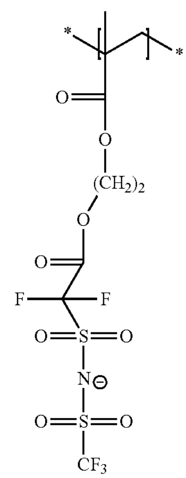
[Chem. 19]
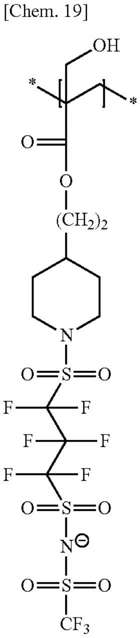
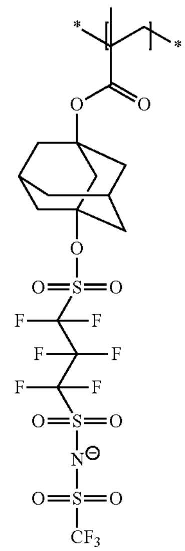

-continued
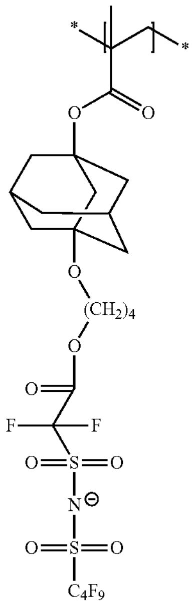
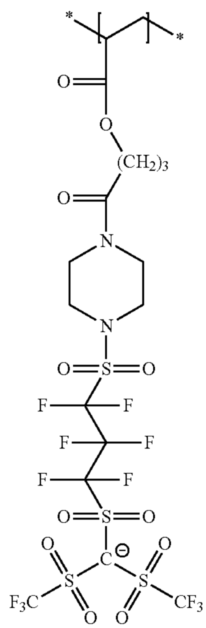
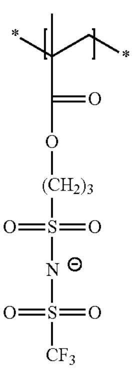
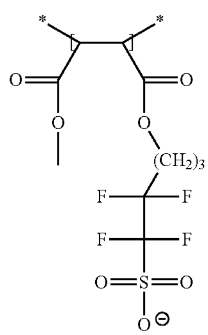
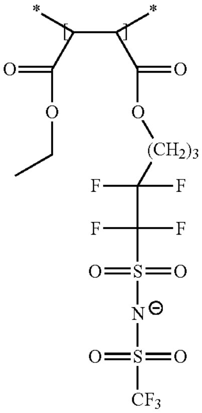
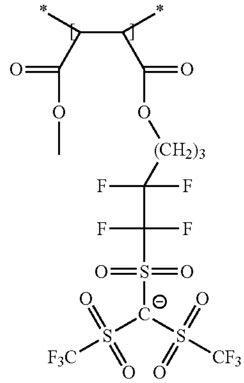
-continued
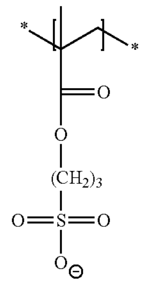
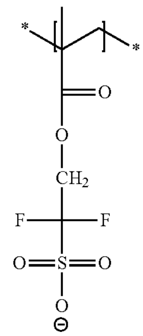
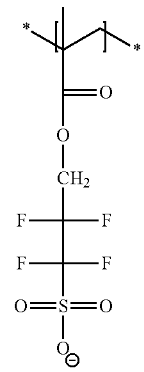
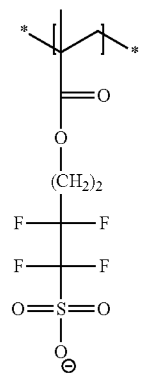
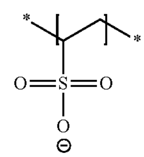
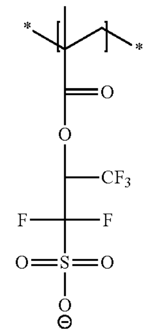
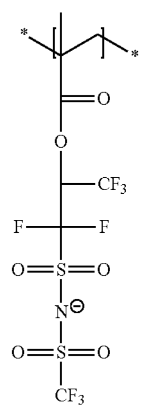
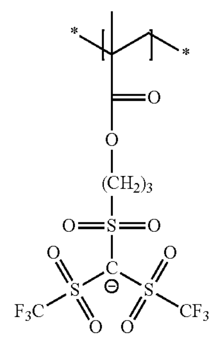
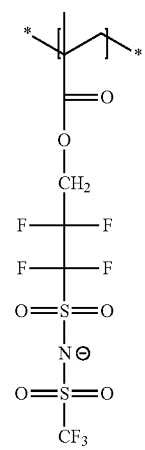
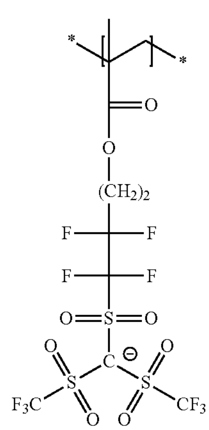
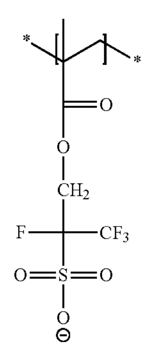

-continued
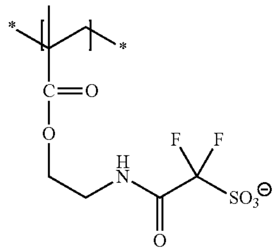
[Chem. 20]
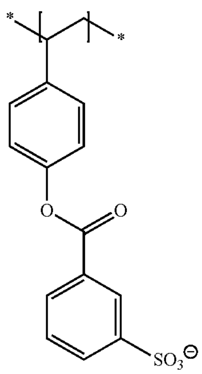
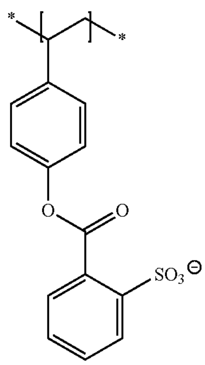
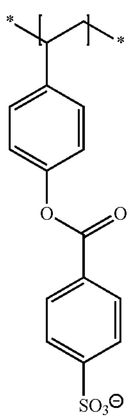
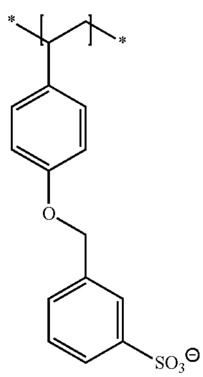
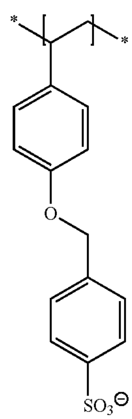
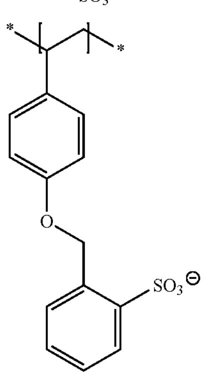
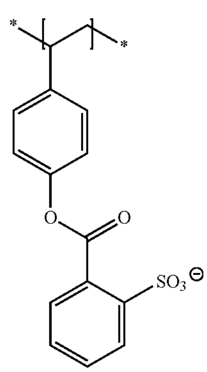
-continued
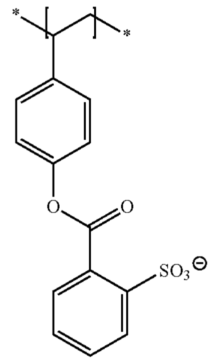
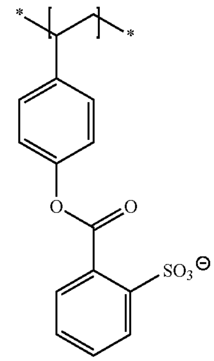
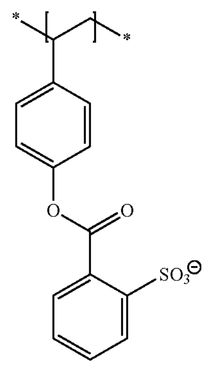
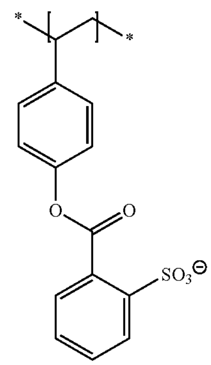
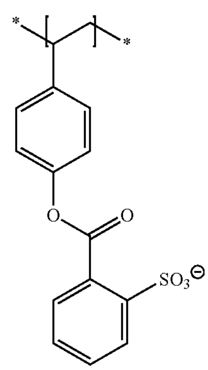
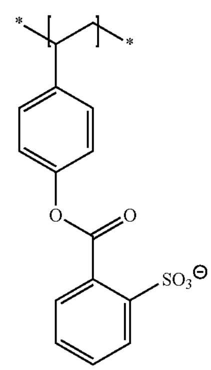
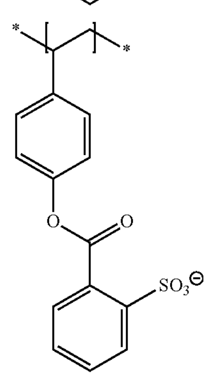
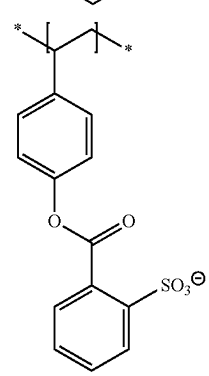

-continued
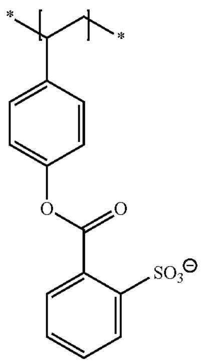
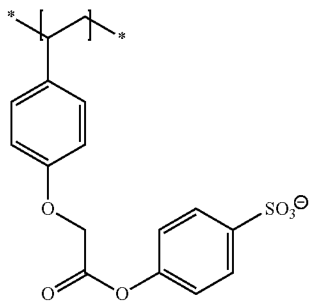
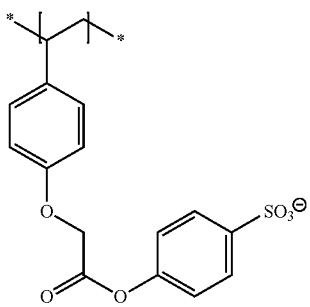
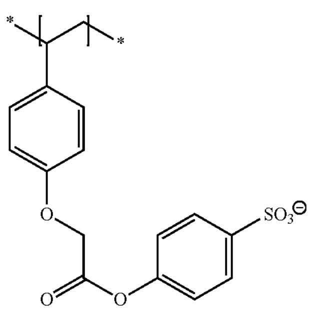
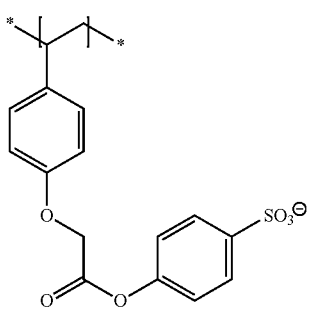
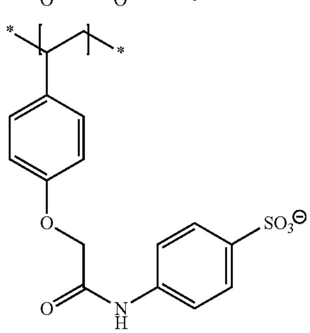
-continued
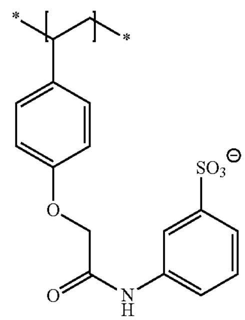
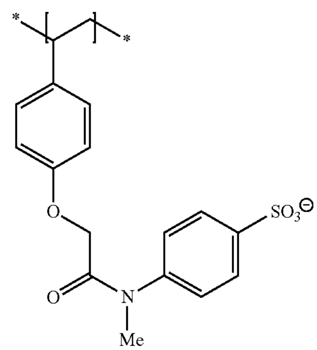
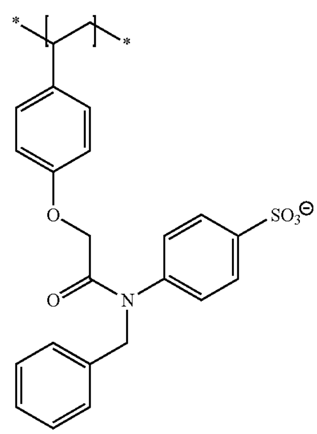
[Chem. 21]
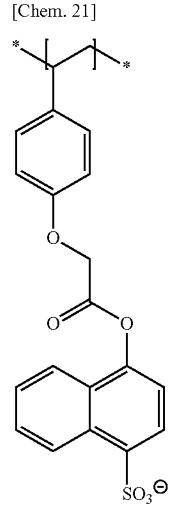
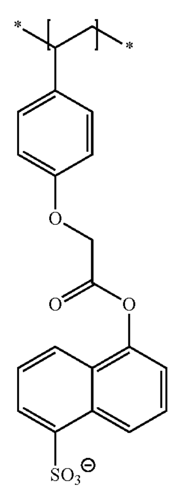

-continued
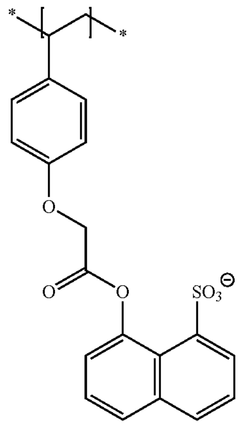
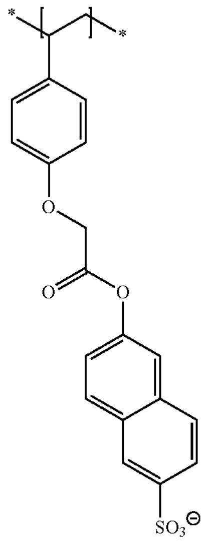
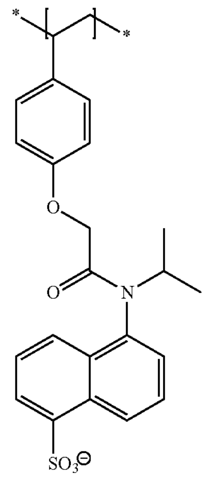
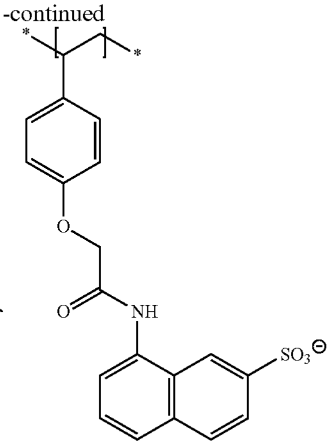
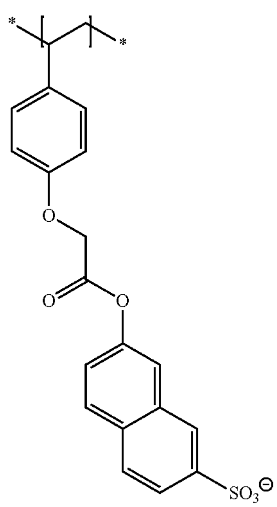
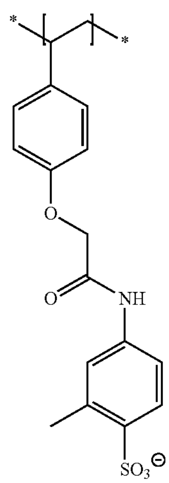
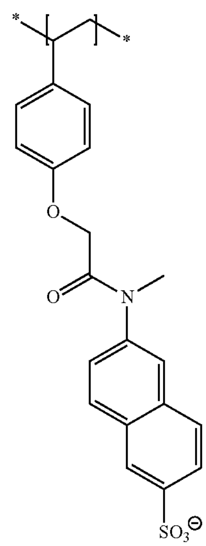
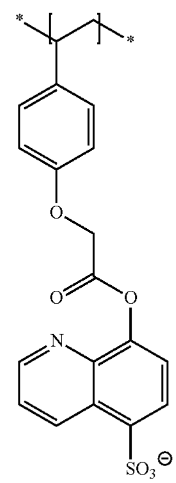
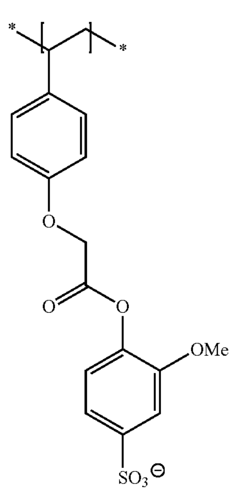
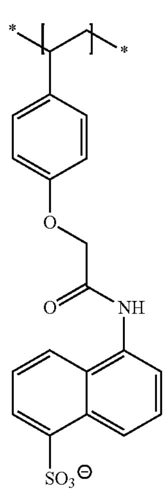
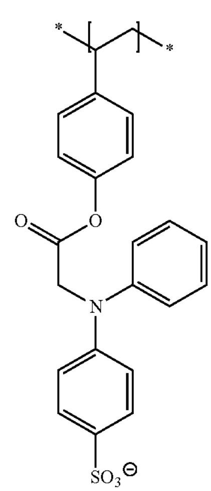
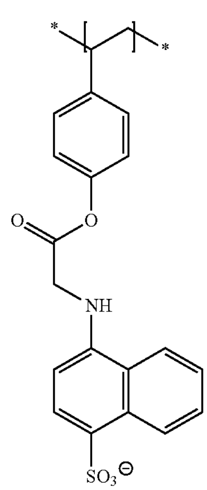

-continued
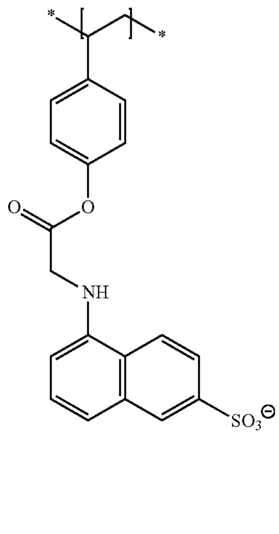
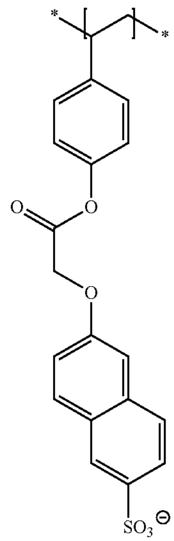
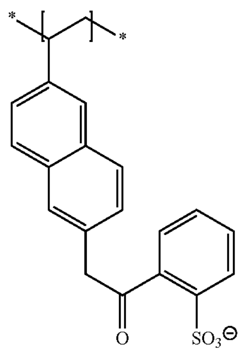
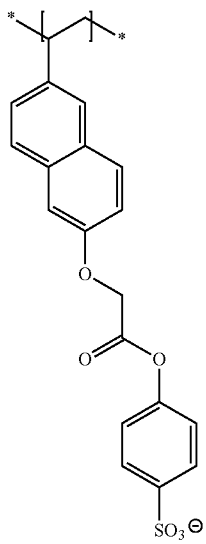
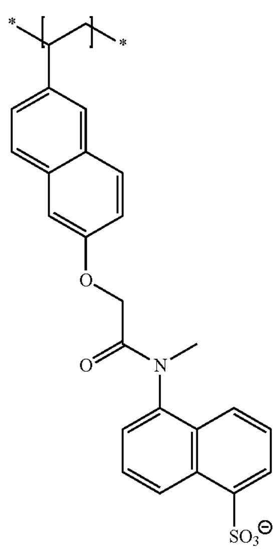
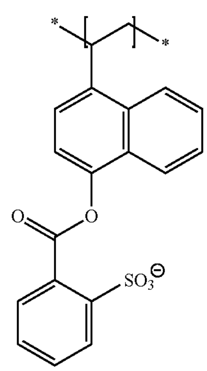
-continued
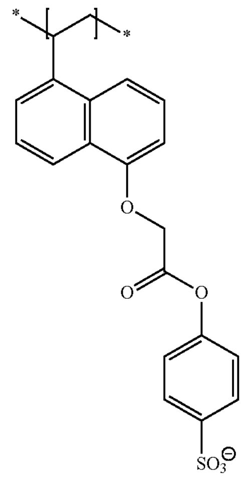
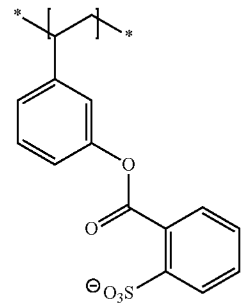
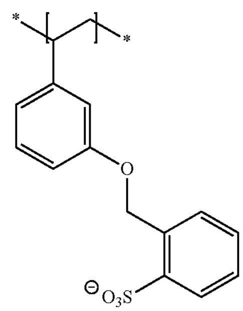
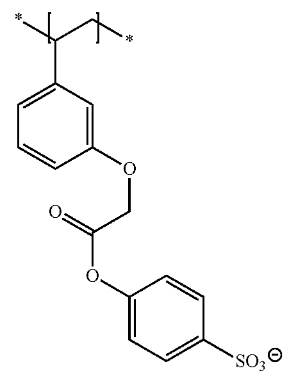
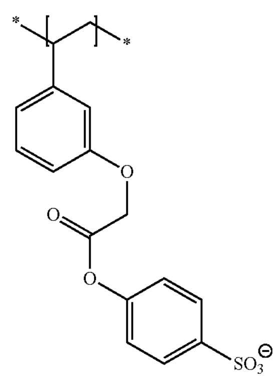
[Chem. 22]
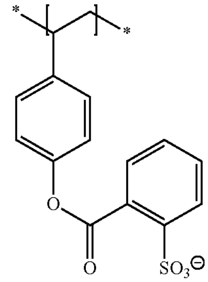
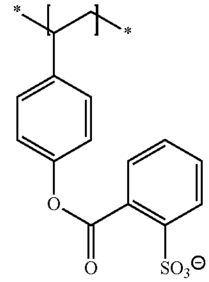

-continued
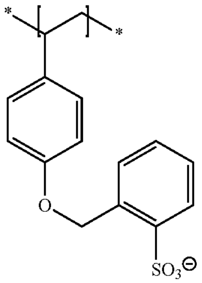
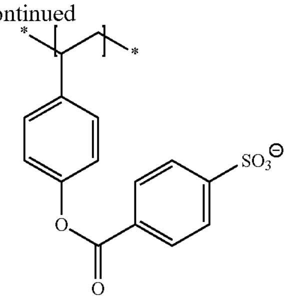
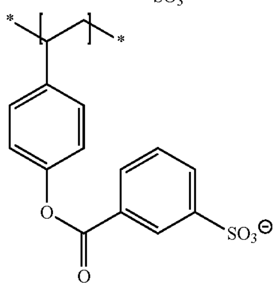
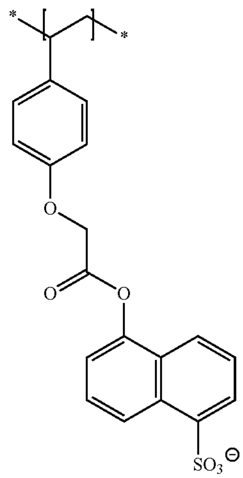
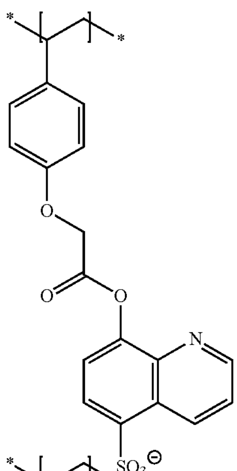
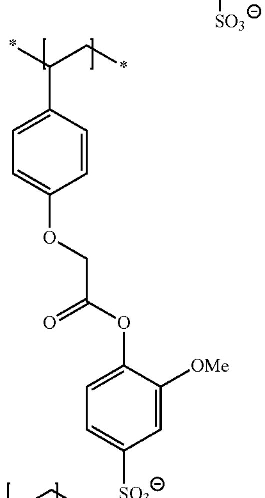
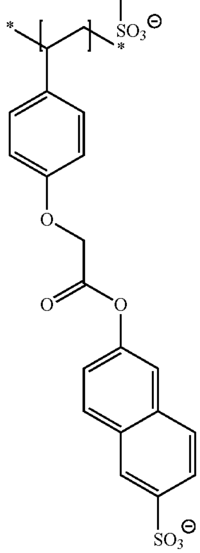
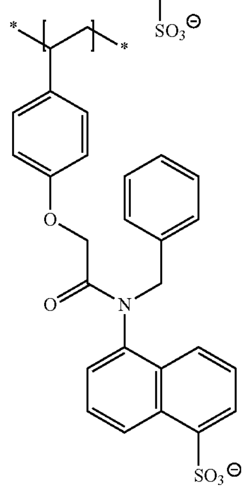
-continued
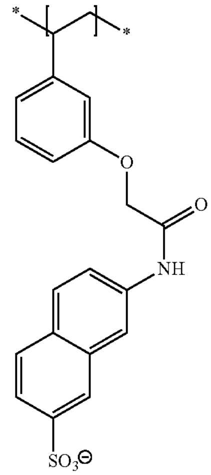
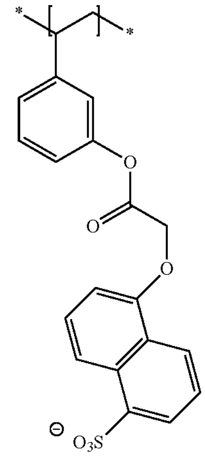
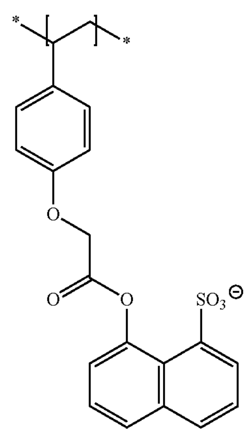
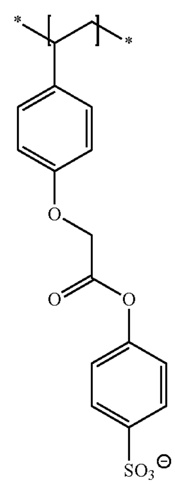
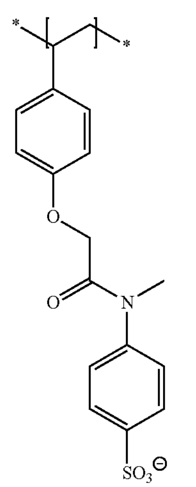
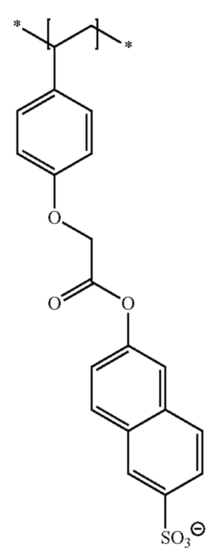

-continued
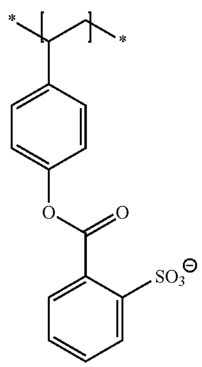
[Chem. 23]
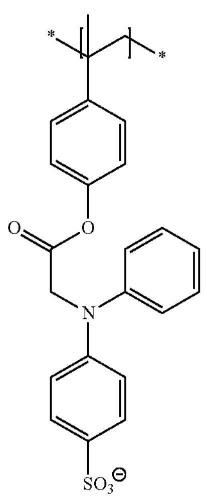
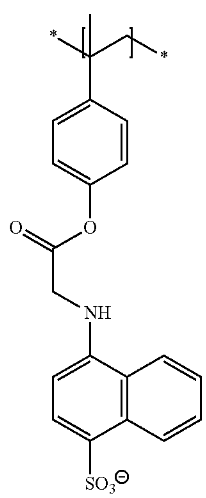
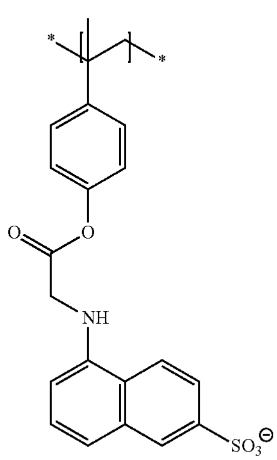
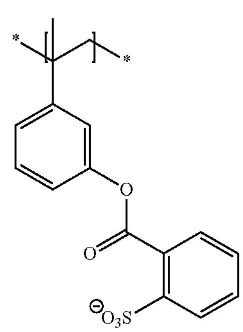
-continued
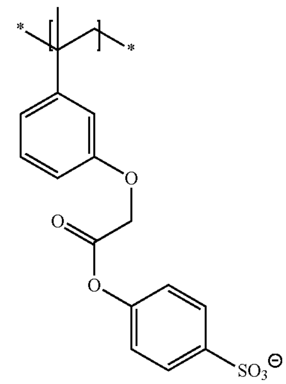
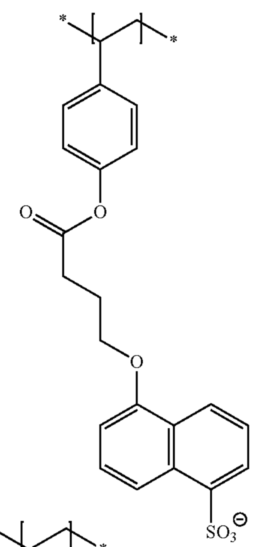
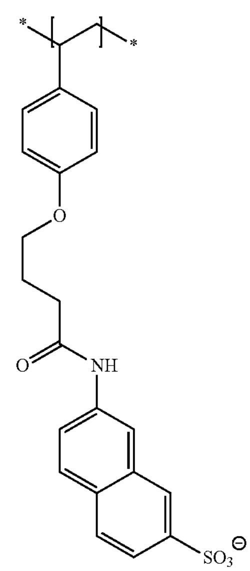
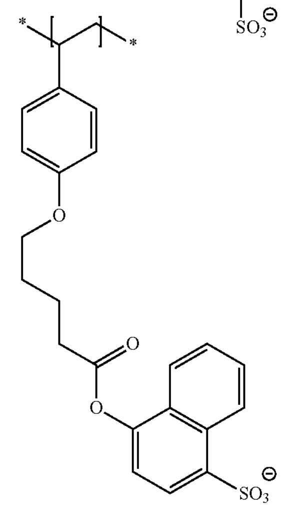
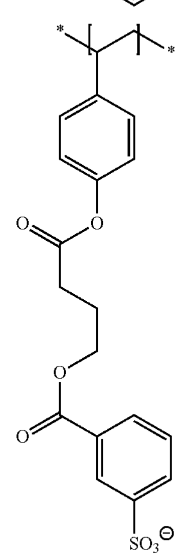
The repeating unit (a2) is preferably a repeating unit having an ionic structural moiety capable of producing a sulfonium cation, an iodonium cation or a pyridinium cation in the side chain upon irradiation with an actinic ray or radiation.

Among others, a repeating unit represented by the following formula (XI) or (XII) is more preferred.

[Chem. 24]

(XI)

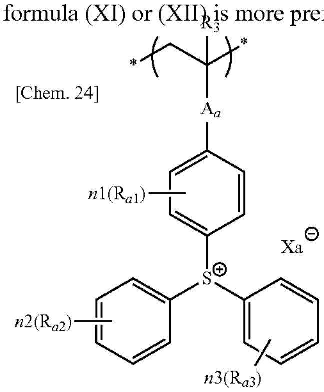

(XII)

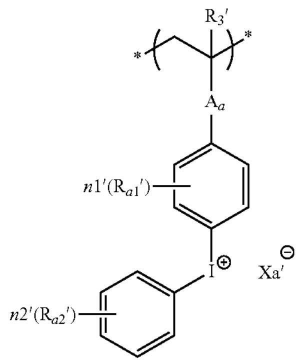

In formula (XI), $R_3$ represents a hydrogen atom, an alkyl group or a halogen atom.

Aa represents a divalent linking group.

Each of $Ra_1$, $Ra_2$ and $Ra_3$ independently represents a monovalent substituent. Each $Ra_1$ may be the same as or different from every other $Ra_1$, and a plurality of $Ra_1$ may combine with each other to form a ring (for example, an aromatic or non-aromatic hydrocarbon ring or a heterocyclic ring). Each $Ra_2$ may be the same as or different from every other $Ra_2$, and a plurality of $Ra_2$ may combine with each other to form a ring (for example, an aromatic or non-aromatic hydrocarbon ring or a heterocyclic ring). Each $Ra_3$ may be the same as or different from every other $Ra_3$, and a plurality of $Ra_3$ may combine with each other to form a ring (for example, an aromatic or non-aromatic hydrocarbon ring or a heterocyclic ring). Two members out of $Ra_1$, $Ra_2$ and $Ra_3$ may form a ring (for example, an aromatic or non-aromatic hydrocarbon ring or a heterocyclic ring) in cooperation.

n1 represents an integer of 0 to 4.

Each of n2 and n3 independently represents an integer of 0 to 5.

Xa represents an acid anion.

In formula (XII), $R_3'$ represents a hydrogen atom, an alkyl group or a halogen atom.

Aa' represents a divalent linking group.

Each of $Ra_1'$ and $Ra_2'$ independently represents a monovalent substituent. Each $Ra_1'$ may be the same as or different from every other $Ra_1'$, and a plurality of $Ra_1'$ may combine with each other to form a ring (for example, an aromatic or non-aromatic hydrocarbon ring or a heterocyclic ring). Each $Ra_2'$ may be the same as or different from every other $Ra_2'$, and a plurality of $Ra_2'$ may combine with each other to form a ring (for example, an aromatic or non-aromatic hydrocarbon ring or a heterocyclic ring). $Ra_1'$ and $Ra_2'$ may form a ring (for example, an aromatic or non-aromatic hydrocarbon ring or a heterocyclic ring) in cooperation.

n1' represents an integer of 0 to 4.

n2' represents an integer of 0 to 5.

Xa' represents an acid anion.

$R_3$ has the same meaning as $R_1$ in formula (I), and specific examples and preferred examples of $R_3$ are the same as specific examples and preferred examples of $R_1$ in formula (I).

Aa has the same meaning as A in formula (I), and specific examples and preferred examples of Aa are the same as specific examples and preferred examples of A in formula (I).

The divalent linking group of Aa is preferably —COO— or —CONH—, more preferably —COO—.

Specific examples and preferred examples of the monovalent substituent of $Ra_1$, $Ra_2$ and $Ra_3$ are the same as specific examples and preferred examples of the monovalent substituent described later for $R_1a$ to $R_{12}a$ in formula (XIII).

n1 is preferably an integer of 0 to 2. n2 and n3 are preferably an integer of 0 to 4.

Xa represents an acid anion, and specific examples and preferred examples of the acid anion of Xa are the same as specific examples and preferred examples of the organic anion of $X^-$ in formulae (1) and (2) described later in Acid Generator (C).

$R_3'$, Aa', $Ra_1'$, $Ra_2'$, n1', n2' and Xa' have the same meanings as $R_3$, Aa, $Ra_1$, $Ra_2$, n1, n2 and Xa, respectively, and specific examples and preferred examples are also the same.

From the standpoint of suppressing the outgas problem (a problem that when irradiated with a high-energy ray such as EUV light, a compound in the resist film is fractured by fragmentation and volatizes as a low molecular component during exposure to contaminate the environment in the exposure machine), the structure of the repeating unit (a2) is more preferably formula (XIII):

[Chem. 25]

(XIII)

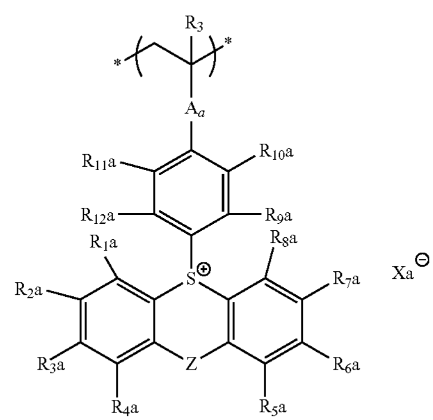

In formula (XIII), each of $R_1a$ to $R_{12}a$ independently represents a hydrogen atom or a monovalent substituent, and these members may combine together to form a ring. Z is a single bond or a divalent linking group. $R_3$, Aa and Xa have the same meaning respectively as $R_3$, Aa and Xa in formula (XI), and specific examples and preferred examples are also the same.

Each of $R_1a$ to $R_{12}a$ is independently a hydrogen atom or a monovalent substituent, and the monovalent substituent is not particularly limited but includes, for example, a halogen atom, an alkyl group (including a cycloalkyl group, a bicycloalkyl group and a tricycloalkyl group), an alkenyl group (including a cycloalkenyl group and a bicycloalkenyl group), an alkynyl group, an aryl group, a heterocyclic group (may be called a heterocycle group), a cyano group, a hydroxyl group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl- or aryl-sulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imido group, a phosphino group, a phosphinyl group, a phosphinyloxy group, a phosphinylamino group, a phosphono group, a silyl group, a hydrazino group, a ureido group, a boronic acid group (—$B(OH)_2$), a phosphato group (—$OPO(OH)_2$), a sulfato group (—$OSO_3H$), and other known substituents.

Each of $R_1$a to $R_{12}$a is preferably a hydrogen atom, a halogen atom, an alkyl group (including a cycloalkyl group), an alkenyl group (including a cycloalkenyl group and a bicycloalkenyl group), an alkynyl group, an aryl group, a cyano group, a carboxyl group, an alkoxy group, an aryloxy group, an acyloxy group, a carbamoyloxy group, an acylamino group, an aminocarbonylamino group, an alkoxycarbonylamino group, an aryloxycarbonylamino group, a sulfamoylamino group, an alkyl- or aryl-sulfonylamino group, an alkylthio group, an arylthio group, a sulfamoyl group, an alkyl- or aryl-sulfonyl group, an aryloxycarbonyl group, an alkoxycarbonyl group, a carbamoyl group, an imido group, a silyl group or a ureido group.

Each of $R_1$a to $R_{12}$a is more preferably a hydrogen atom, a halogen atom, an alkyl group (including a cycloalkyl group), a cyano group, an alkoxy group, an acyloxy group, an acylamino group, an aminocarbonylamino group, an alkoxycarbonylamino group, an alkyl- or aryl-sulfonylamino group, an alkylthio group, a sulfamoyl group, an alkyl- or aryl-sulfonyl group, an alkoxycarbonyl group or a carbamoyl group.

Each of $R_1$a to $R_{12}$a is still more preferably a hydrogen atom, an alkyl group (including a cycloalkyl group), a halogen atom or an alkoxy group.

Two members out of $R_1$a to $R_{12}$a may form a ring (an aromatic or non-aromatic hydrocarbon ring or a heterocyclic ring) in cooperation. The combination of two or more members out of $R_{1a}$ to $R_{12a}$ to form a ring includes, for example, $R_{2a}$ and $R_{3a}$, and $R_{6a}$ and $R_{7a}$.

The ring formed may be a polycyclic condensed ring, and specific examples of the ring include a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, and a phenazine ring.

The monovalent substituent as $R_1$a to $R_{12}$a and the ring which may be formed by two members out of $R_1$a to $R_{12}$a, may further have a substituent, and specific examples of the further substituent are the same as specific examples of the monovalent substituent above.

The monovalent substituent as $R_1$a to $R_{12}$a preferably has a carbon number of 20 or less, more preferably a carbon number of 15 or less.

Z represents a single bond or a divalent linking group, and the divalent linking group includes, for example, an ether group, a thioether group, an alkylene group, an arylene group, a carbonyl group, a sulfonyl group, a carbonyloxy group, a carbonylamino group, a sulfonylamido group, an amino group, a disulfide group, an acyl group, an alkylsulfonyl group, —CH═CH—, —C≡C—, an aminocarbonylamino group, and an aminosulfonylamino group. These groups may have a substituent, and examples of the substituent thereon are the same as those of the substituent recited for $R_{1a}$ to $R_{12a}$. Z is preferably a single bond or a substituent not having an electron-withdrawing group, such as ether group, thioether group, alkylene group, arylene group, amino group, —CH═CH—, —C≡C—, aminocarbonylamino group and aminosulfonylamino group, more preferably a single bond, an ether group or a thioether group, still more preferably a single bond.

Specific examples of the repeating unit (a2) are illustrated below as a cation unit in the state after leaving from the acid anion, but the present invention is not limited thereto.

[Chem. 26]

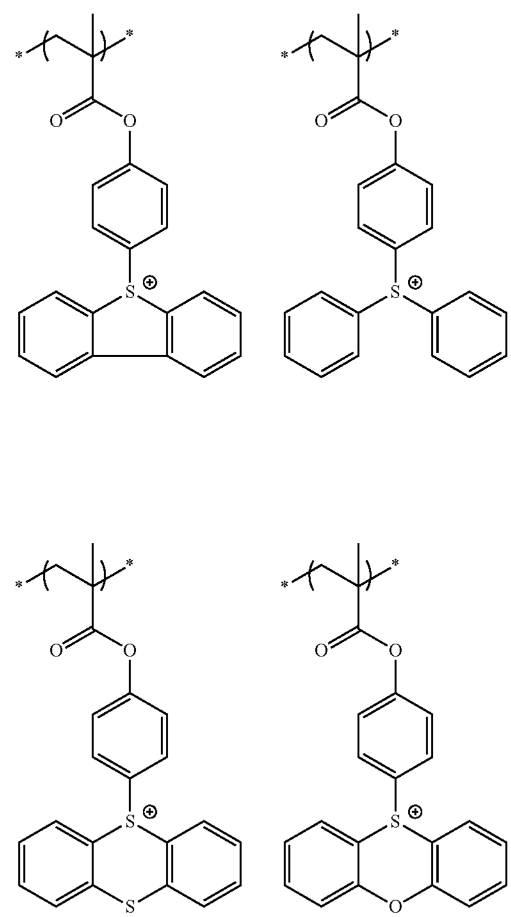

-continued
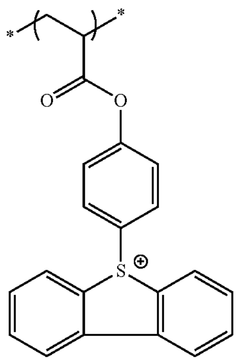
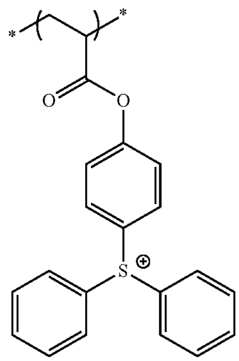
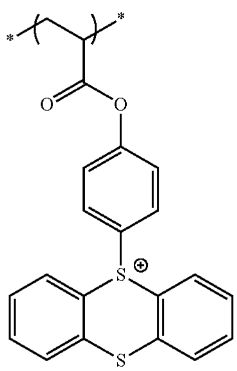
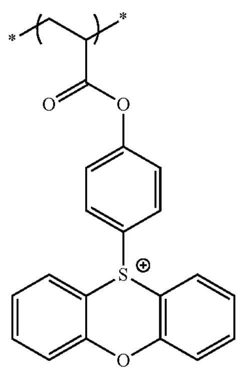
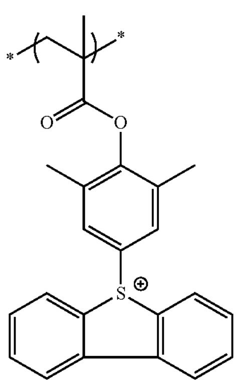
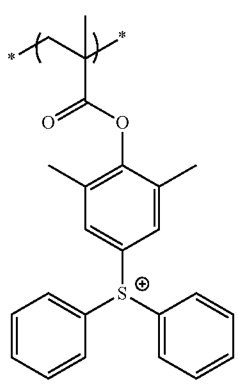
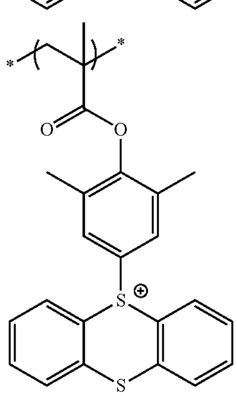
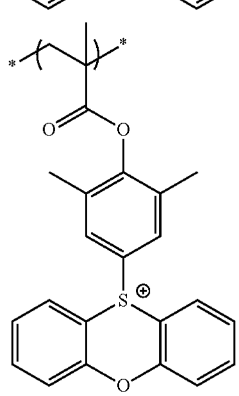
-continued
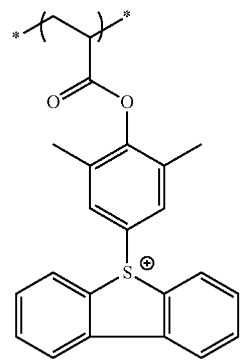
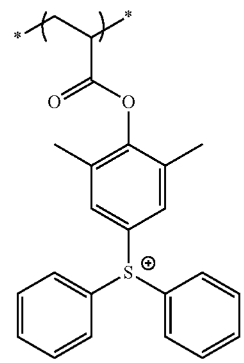
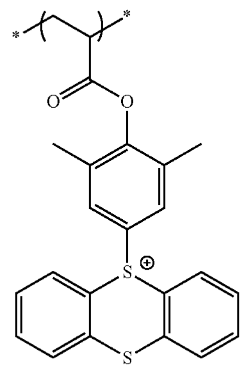
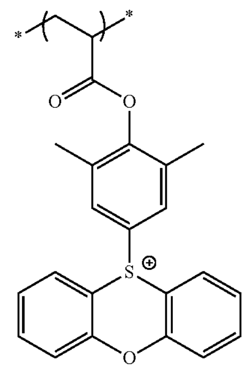
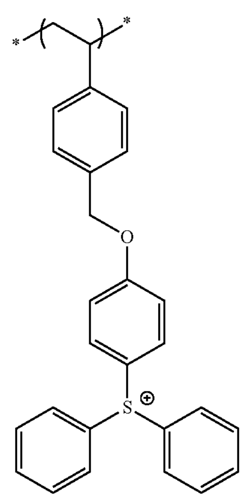
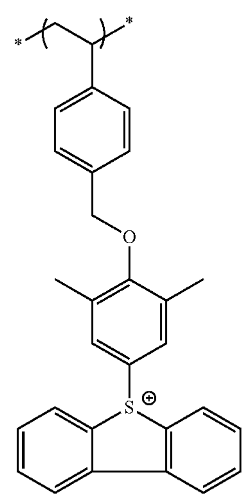
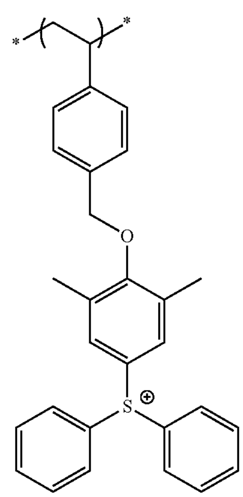
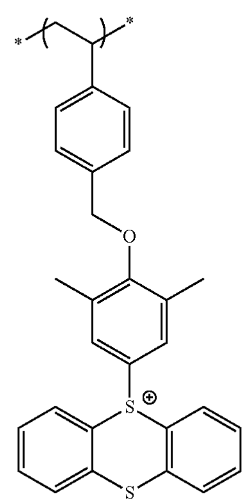

-continued
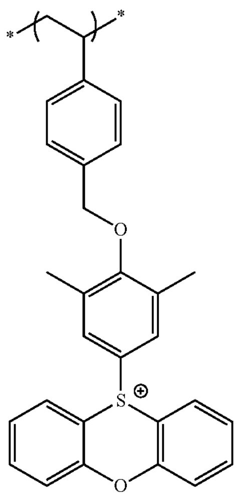
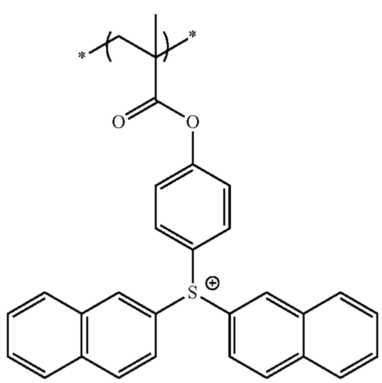
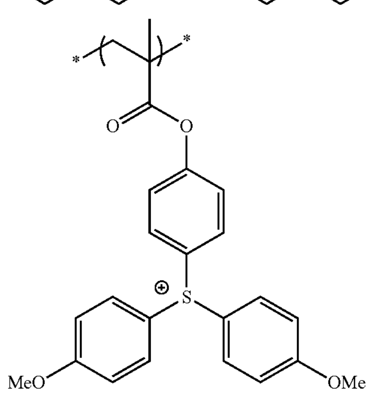
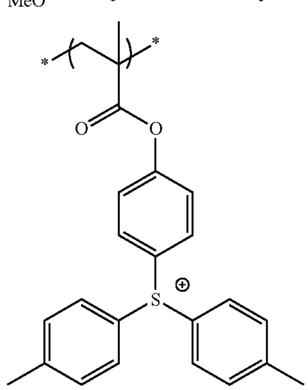
-continued
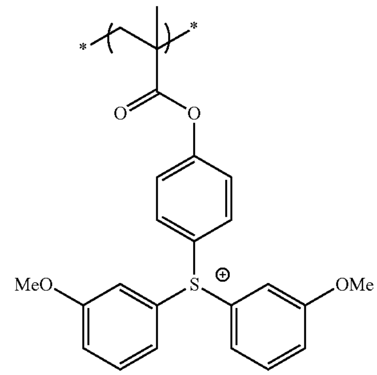
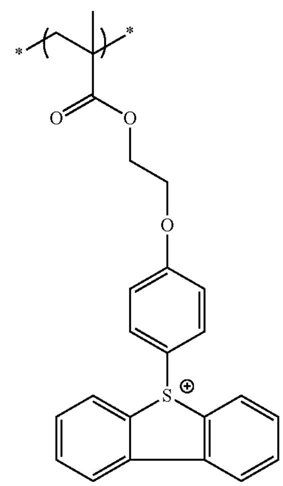
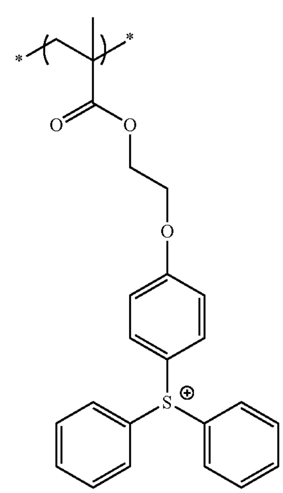

-continued
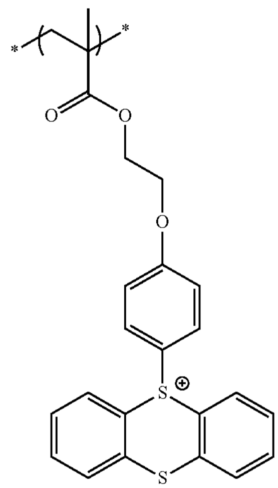
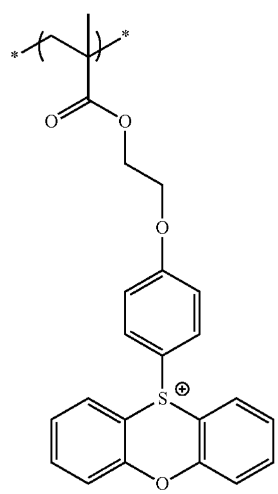
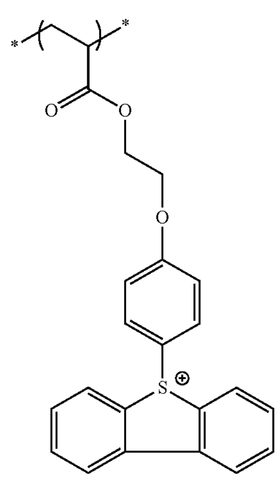
-continued
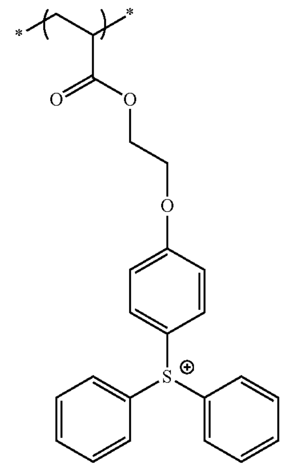
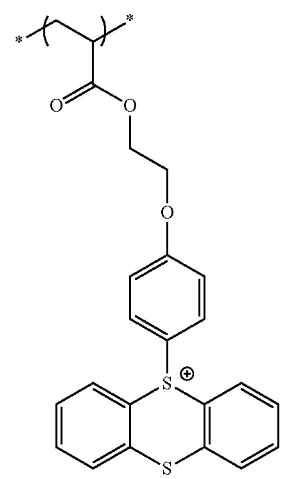
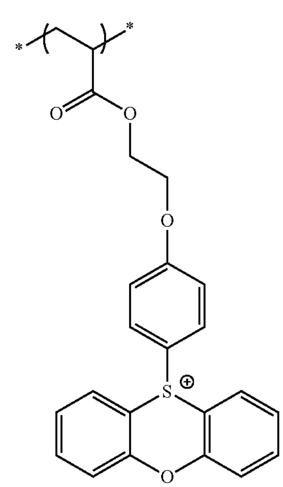

-continued
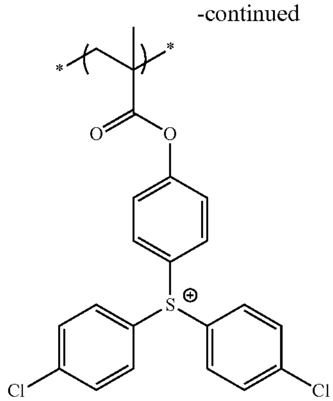
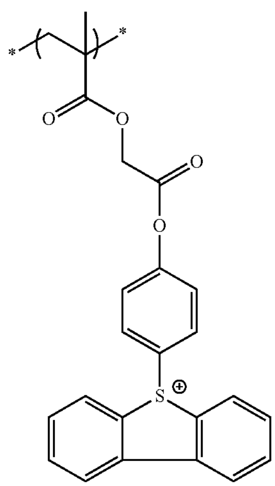
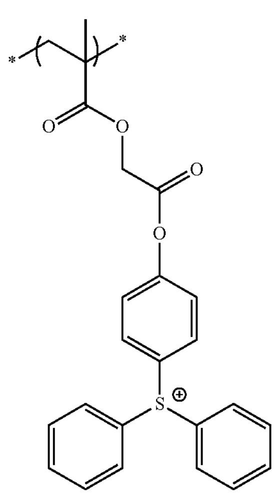
-continued
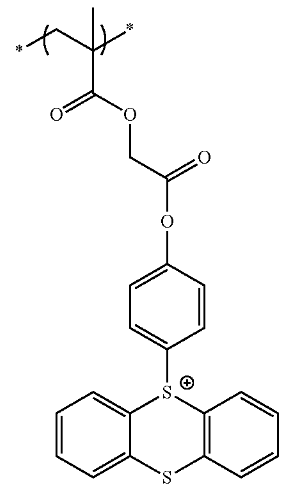
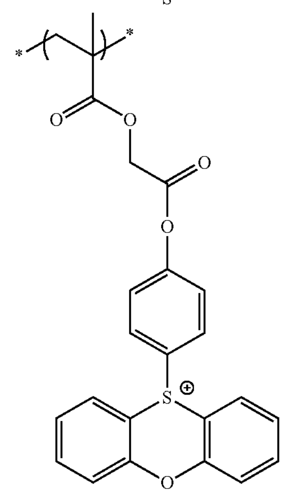
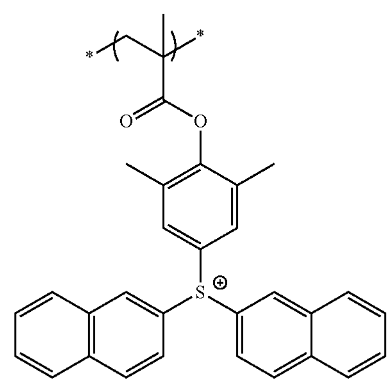
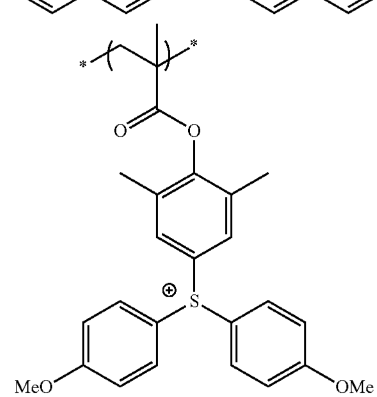

-continued
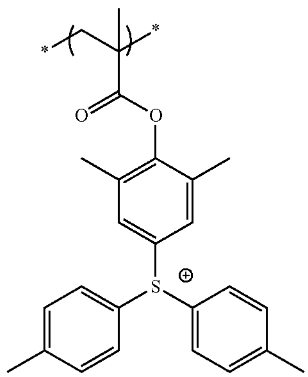
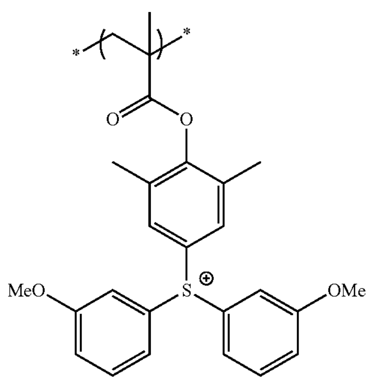
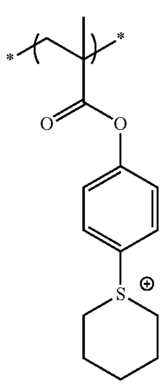
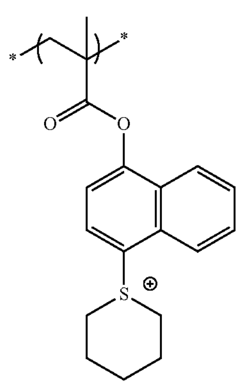
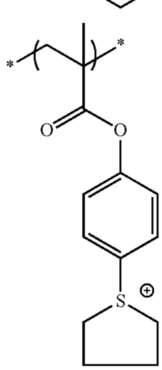
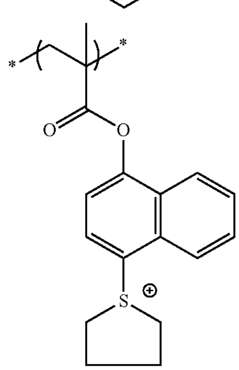
-continued
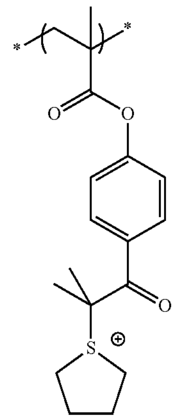
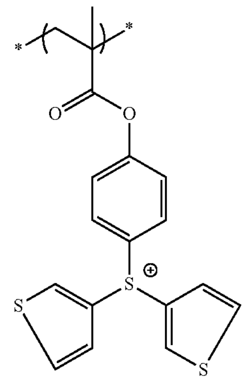
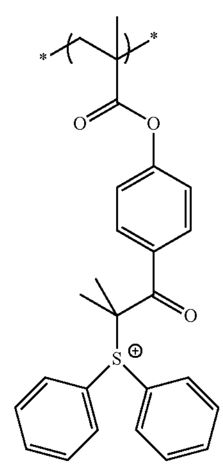
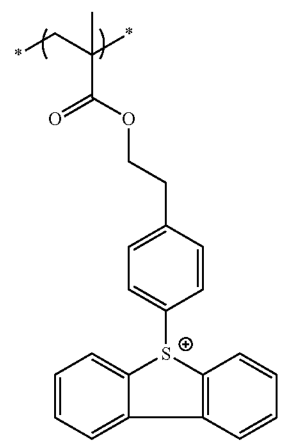
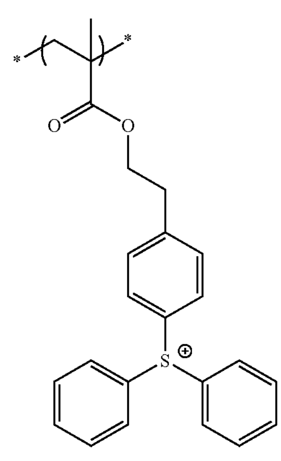

-continued
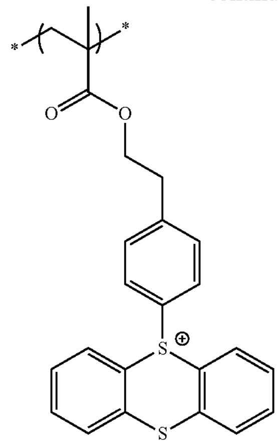
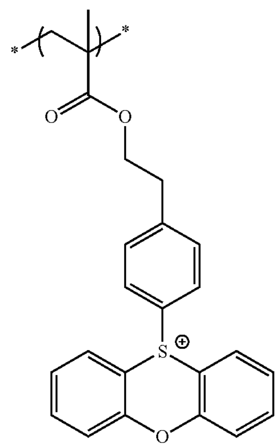
[Chem. 27]
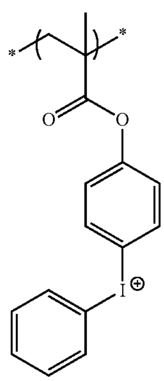
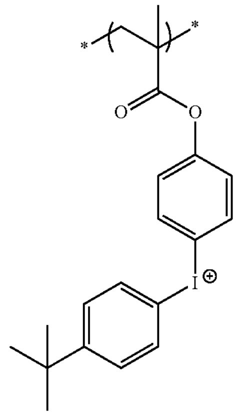
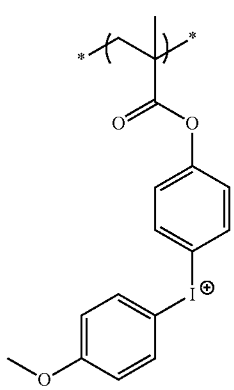
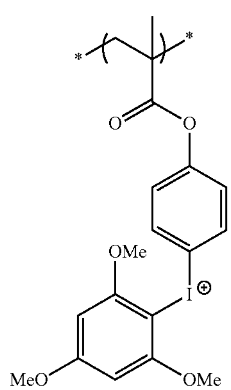
-continued
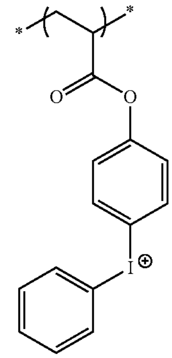
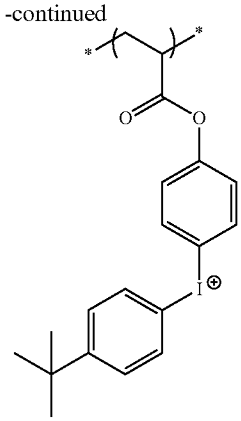
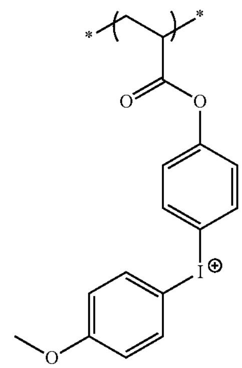
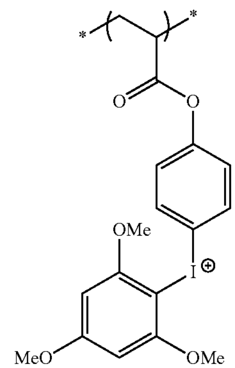
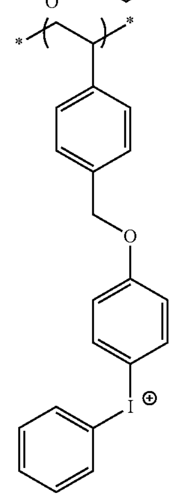
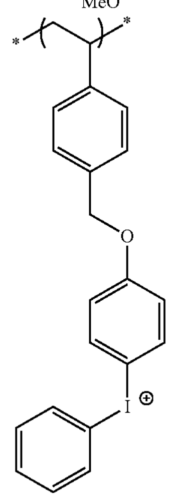
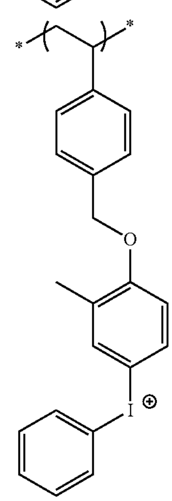
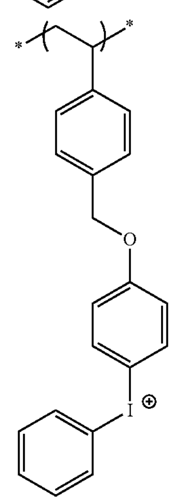

-continued
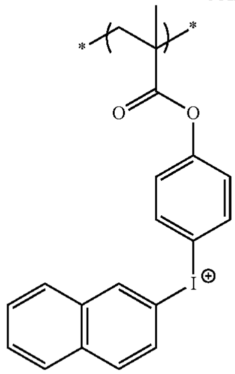
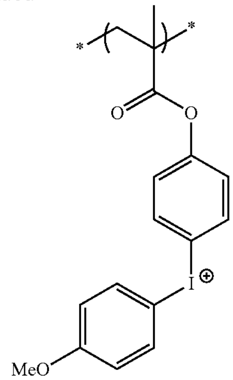
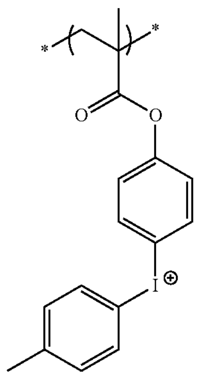
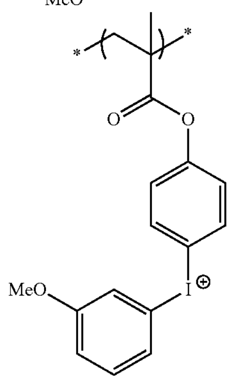
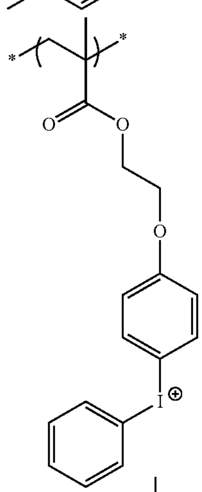
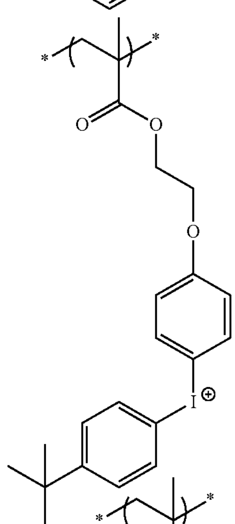
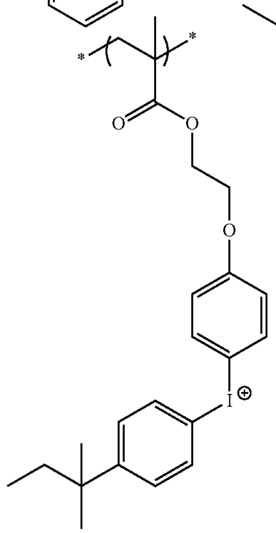
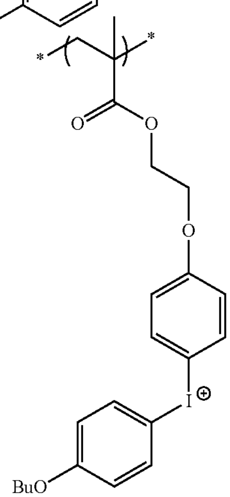
-continued
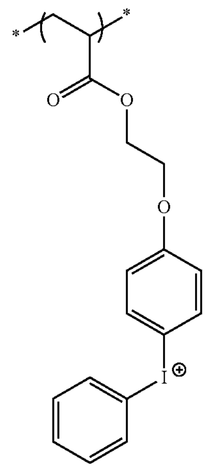
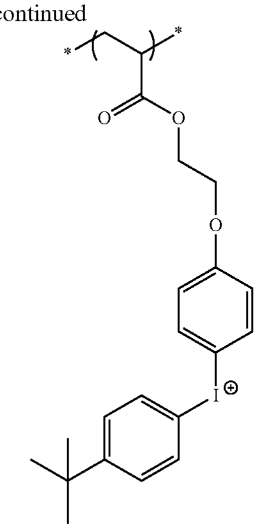
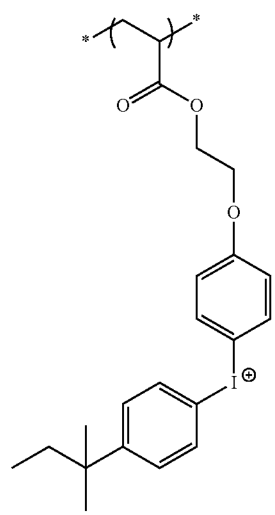
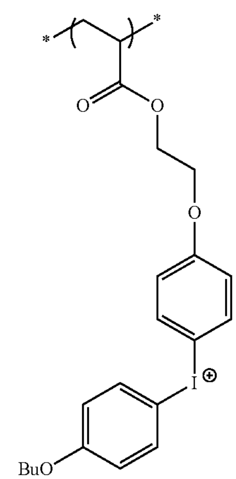
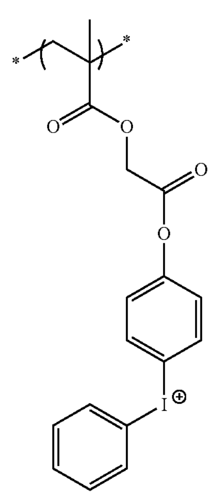
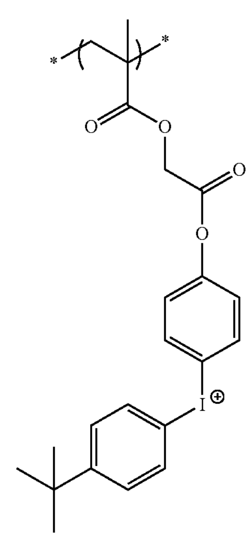

-continued
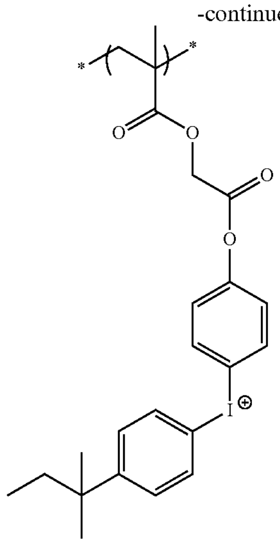
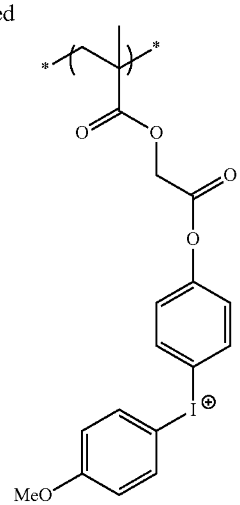
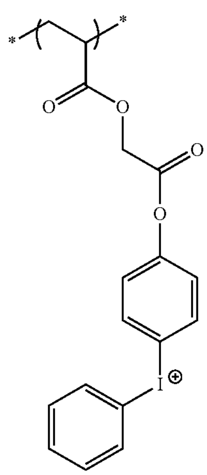
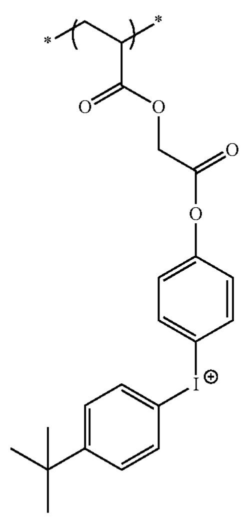
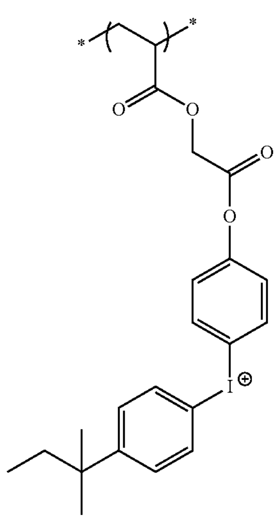
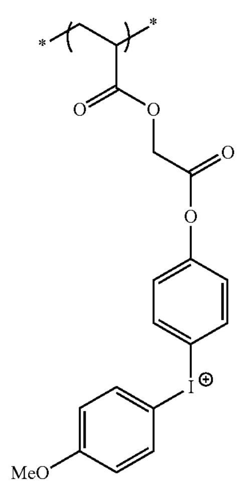
-continued
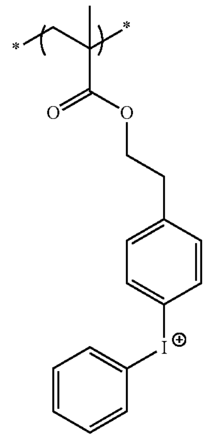
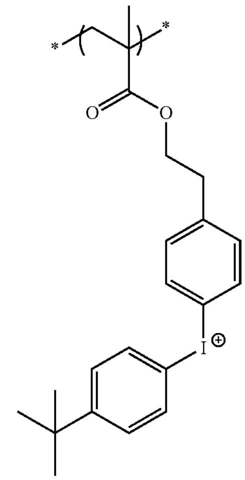
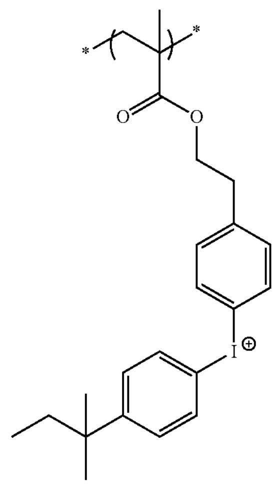
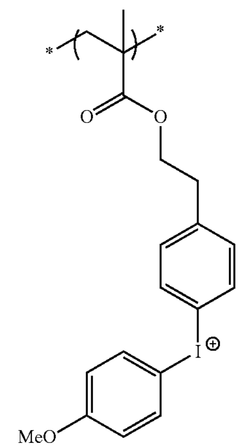
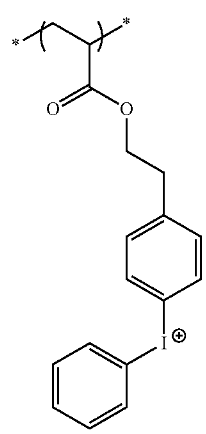
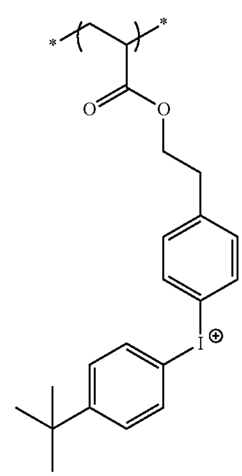

-continued

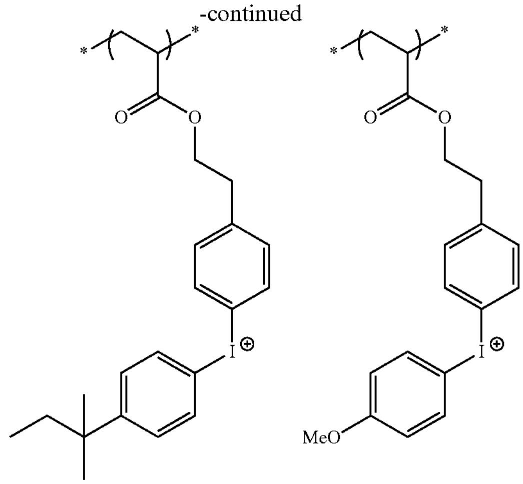

The polymerizable precursors corresponding to the repeating unit (a2) can be synthesized using a general esterification, etherification or sulfonylation reaction. For example, a hydroxide, bromide, chloride or the like of an onium salt of a polymerizable precursor corresponding to the repeating unit (a2) can be obtained by a method of reacting a (methyl)acrylic anhydride of (methyl)acrylic acid halide to perform transesterification, or a method of reacting a hydroxyl group-containing onium salt and a polymerizable group-containing halide compound to perform etherification.

In the embodiment of (3) above, the polymer compound (A) contains both the repeating units (a1) and (a2). At this time, the repeating units (a1) and (a2) may form an ion pair. For example, the onium cation of M in the repeating unit represented by formula (I) may be the cation in the repeating unit represented by formula (XI) or (XII) (that is, in this case, the acid anion of Xa or Xa' in the repeating unit represented by formula (XI) or (XII) is the acid anion in the repeating unit represented by formula (I)). The ion pair formation by the repeating unit (a1) and the repeating unit (a2) encompasses not only ion pair formation in a unit molecule of the polymer in the polymer compound (A) but also ion pair formation among a plurality of polymer molecules.

As for the ion pair formation by the cation of a polymerizable precursor corresponding to the repeating unit (a2) and the anion of a polymerizable precursor corresponding to the repeating unit represented by formulae (VI) to (IX), the ion pair can be easily formed from a lithium, sodium or potassium salt or the like of the organic acid corresponding to the repeating unit represented by formulae (VI) to (IX) synthesized above and a hydroxide, bromide, chloride or the like of an onium salt of the precursor corresponding to the repeating unit (a2) synthesized above, by utilizing the salt exchange method described in JP-T-1-501909 (the term "JP-T" as used herein means a "published Japanese translation of a PCT patent application") or JP-A-2003-246786 or the salt exchange method described in JP-A-10-232490, Japanese Patent 4,025,039 and the like.

The monomer pair of a monomer corresponding to the repeating unit (a2) and a monomer corresponding to the repeating unit represented by formulae (VI) to (IX), which is obtained by the ion pair formation above, can be suitably used for the production of the polymer compound (A) by subjecting the monomer pair to the later-described polymerization reaction.

In the polymer compound (A) of the present invention, the content of the (a) repeating unit capable of generating an acid upon irradiation with an actinic ray or radiation is preferably 0.5 to 30 mol %, more preferably from 1 to 25 mol %, still more preferably from 2 to 20 mol %, based on all repeating units in the polymer compound (A).

In the embodiment of (3) above, when the repeating unit (a1) and the repeating unit (a2) form an ion pair, the content of the repeating units (a1) and (a2) in the polymer compound (A) for use in the present invention is, in terms of charge amount of the monomer pair corresponding to the repeating units (a1) and (a2) at the synthesis of the polymer compound (A), preferably from 0.5 to 50 mol %, more preferably from 1 to 40 mol %, still more preferably from 2 to 30 mol %, based on all polymerizable compounds at the synthesis of the polymer compound (A).

In the polymer compound (A) of the present invention, the content molar ratio or charge amount ratio of the repeating units (a1) and (a2) is preferably from 20:80 to 80:20, more preferably from 30:70 to 70:30, still more preferably from 40:60 to 60:40.

((b) Repeating unit having a phenolic hydroxyl group)

The (b) repeating unit having a phenolic hydroxyl group is not particularly limited as long as it is a repeating unit having a phenolic hydroxyl group, and conventionally known repeating units can be used. The phenolic hydroxyl group as used in the present application is a group formed by replacing a hydrogen atom of an aromatic ring group by a hydroxyl group. The aromatic ring is a monocyclic or polycyclic aromatic ring and includes a benzene ring, a naphthalene ring, and the like.

The (b) repeating unit having a phenolic hydroxyl group is preferably a repeating unit represented by the following formula (II):

[Chem. 28]

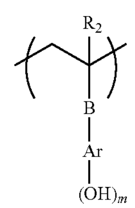

(II)

In formula (II), $R_2$ represents a hydrogen atom, an alkyl group or a halogen atom.

B represents a single bond or a divalent organic group.

Ar represents an aromatic ring group.

m represents an integer of 1 or more.

$R_2$ has the same meaning as $R_1$ in formula (I), and specific examples and preferred range are also the same. Among others, $R_2$ is preferably a hydrogen atom.

B is preferably a single bond, a carbonyl group, an alkylene group, a sulfonyl group, —O—, —NH—, or a group formed by combining these, more preferably a single bond, a carbonyloxy group (—C(═O)O—) or —C(═O)—NH—, still more preferably a single bond or a carbonyloxy group (—C(═O)O—), and most preferably a single bond.

The aromatic ring in the aromatic ring group of Ar is a monocyclic or polycyclic aromatic ring and includes an aromatic hydrocarbon ring having a carbon number of 6 to 18 which may have a substituent, such as benzene ring, naphthalene ring, anthracene ring, fluorene ring and phenanthrene ring, and an aromatic heterocyclic ring containing a heterocyclic ring such as thiophene ring, furan ring, pyrrole ring, benzothiophene ring, benzofuran ring, benzopyrrole ring, triazine ring, imidazole ring, benzimidazole ring, triazole ring, thiadiazole ring and thiazole ring. Among these, a benzene ring and a naphthalene ring are preferred in view of resolution, and a benzene ring is most preferred.

m is preferably an integer of 1 to 5 and most preferably 1. When m is 1 and Ar is a benzene ring, the substitution position of —OH may be the para-, meta- or ortho-position relative to the bonding position of the benzene ring to the polymer main chain but is preferably the meta- or para-position, more preferably the para-position. On the other hand, when the polymer compound (A) does not contain (c) an alkali-insoluble repeating unit described later, the bonding position is preferably the meta-position. Thanks to this configuration, appropriate solubility is maintained and at the same time, the crosslinking reaction readily proceeds.

The aromatic ring in the aromatic ring group of Ar may have a substituent other than the group represented by —OH, and the substituent includes, for example, an alkyl group, a halogen atom, a hydroxyl group, an alkoxy group, a carboxyl group, an alkoxycarbonyl group, an alkylcarbonyl group, an alkylcarbonyloxy group, an alkylsulfonyloxy group, and an arylcarbonyl group.

In the polymer compound (A) of the present invention, the content of the (b) repeating unit having a phenolic hydroxyl group is preferably from 10 to 99 mol %, more preferably from 30 to 97 mol %, still more preferably from 40 to 95 mol %, based on all repeating units in the polymer compound (A). Within this range, particularly when the resist film is a thin film (for example, when the thickness of the resist film is from 10 to 150 nm), the dissolution rate of the unexposed area in the resist film of the present invention formed using the polymer compound (A) for an alkali developer can be more unfailingly reduced (that is, the dissolution rate of the resist film using the polymer compound (A) can be more unfailingly controlled to be an optimal dissolution rate). As a result, the sensitivity can be more reliably enhanced.

Examples of the (b) repeating unit having a phenolic hydroxyl group are illustrated below, but the present invention is not limited thereto.

[Chem. 29]

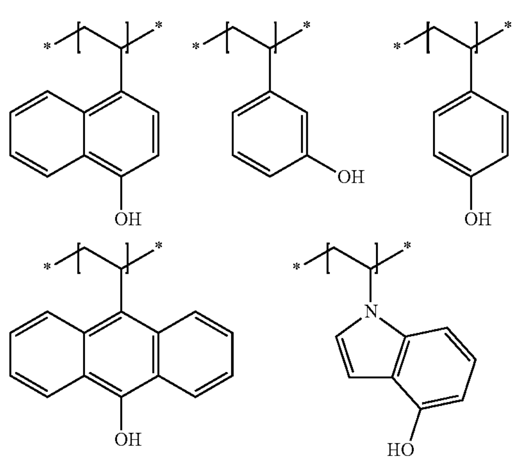

-continued

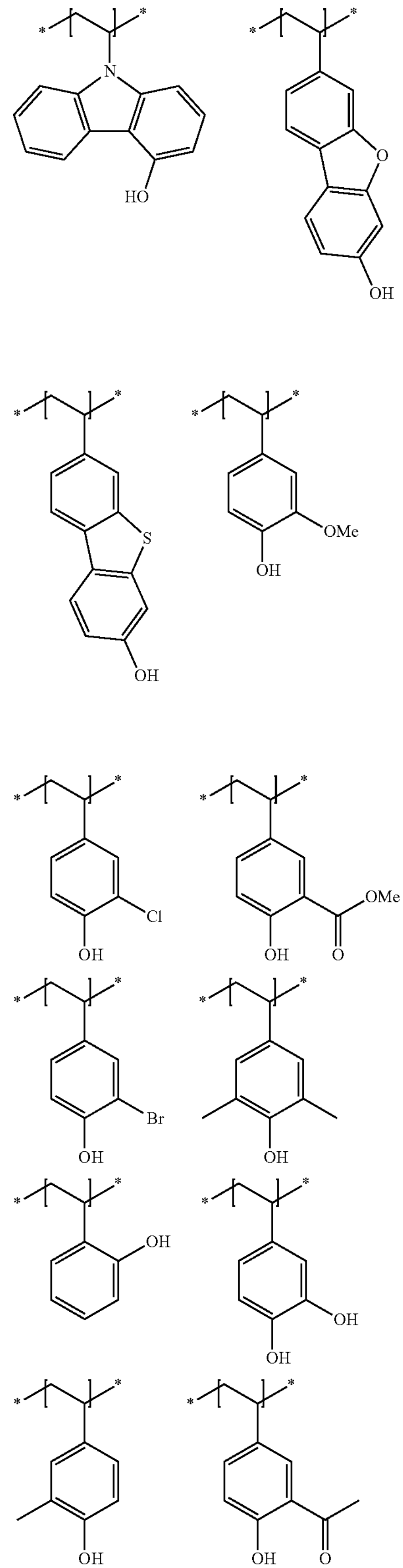

-continued
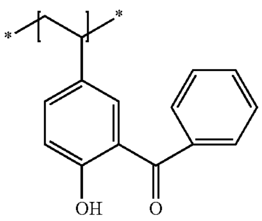
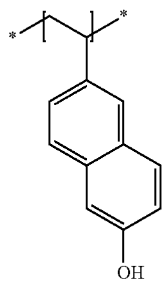
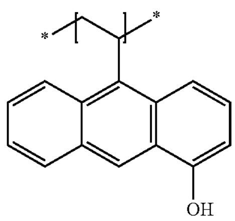
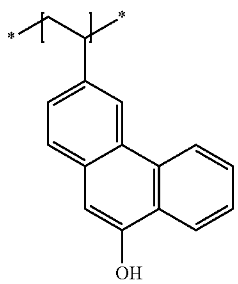
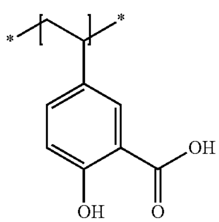
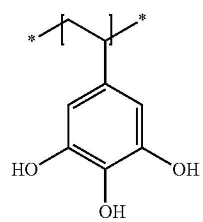
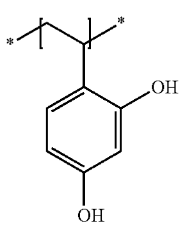
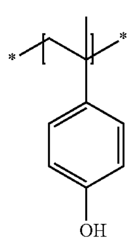
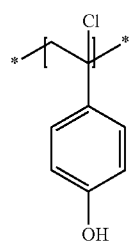
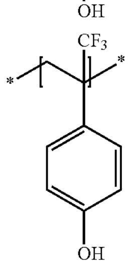
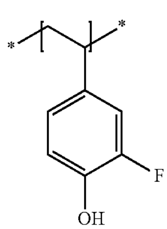
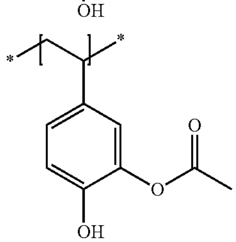
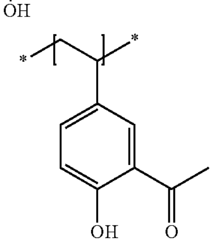
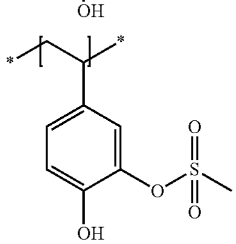
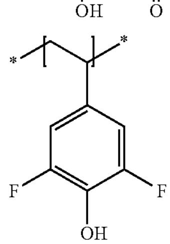
-continued
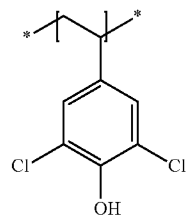
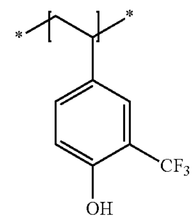
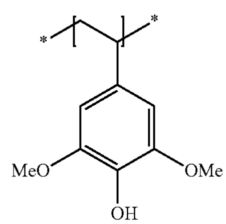
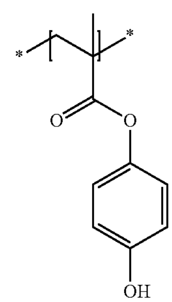
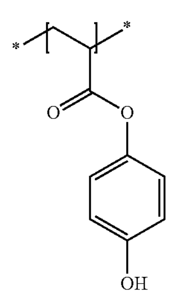
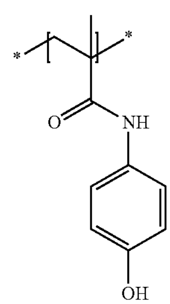
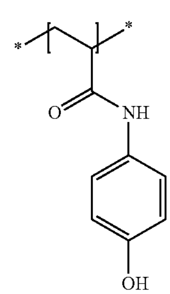
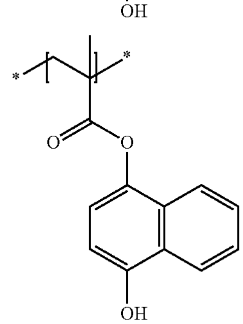
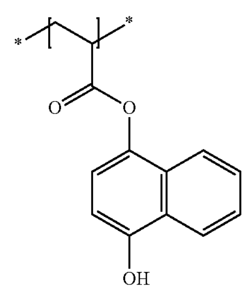
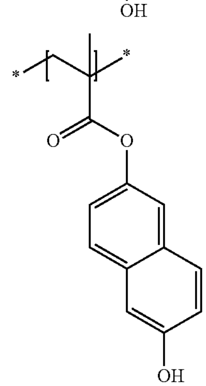
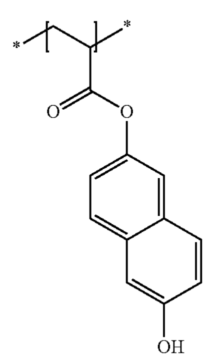

-continued

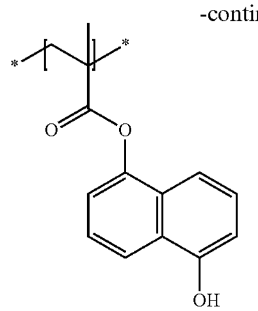

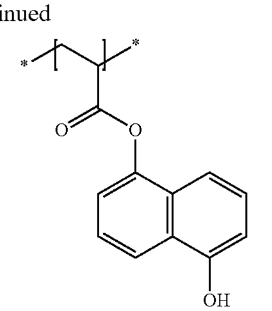

The polymer compound (A) preferably further contains (c) an alkali-insoluble repeating unit as a repeating unit other than the above-described repeating units. By virtue of containing (c) an alkali-insoluble repeating unit, the solubility of the exposed are for an alkali developer is appropriately adjusted and the resolution is advantageously improved. In particular, as the pattern formed becomes finer, the film tends to be thinner, and the control of solubility is more important then ever before. Incidentally, the "alkali-insoluble" as used in this application means not to have an acid group, an acid-decomposable group or an onium cation.

The acid group includes, for example, an acidic group (a group capable of dissociating in an aqueous 2.38 mass % tetramethylammonium hydroxide solution which is being used as the developer for a resist) such as carboxyl group, sulfonic acid group and phenolic hydroxyl group, and an alcoholic hydroxyl group.

The alcoholic hydroxyl group is a hydroxyl group bonded to a hydrocarbon group and indicates a hydroxyl group except for a hydroxyl group directly bonded on an aromatic ring (phenolic hydroxyl group).

The acid-decomposable group includes, for example, a group where a hydrogen atom of the group above is replaced by a group capable of leaving by the action of an acid.

Examples of the onium cation are the same as those recited for M in formula (I).

The alkali-insoluble repeating unit (c) preferably contained in the polymer compound (A) of the present invention is described below.

((c) Alkali-Insoluble Repeating Unit)

The alkali-insoluble repeating unit (c) is preferably a repeating unit represented by the following formula (III):

[Chem. 30]

$$-(E)- \qquad \text{(III)}$$

In formula (III), E represents an alkali-insoluble repeating unit.

Examples of the polymerizable monomer for forming an alkali-insoluble repeating unit represented by E include styrene, an alkyl-substituted styrene, an alkoxy-substituted styrene, an O-alkylated styrene, an O-acylated styrene, an acrylic acid ester derivative, a methacrylic acid ester derivative, an N-substituted maleimide, acrylonitrile, methacrylonitrile, vinylnaphthalene, vinylanthracene, an indene which may have a substituent, and an acenaphthylene which may have a substituent. Among these, an O-acylated styrene is preferred, and an O-acylated styrene substituted with a polycyclic hydrocarbon structure is preferred.

The alkali-insoluble repeating unit represented by E is more preferably a repeating unit represented by the following formula (XIV):

[Chem. 31]

(XIV)

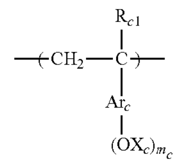

(wherein $R_{C1}$ represents a hydrogen atom or a methyl group, Xc represents a group having a non-acid-decomposable polycyclic alicyclic hydrocarbon structure, $Ar_C$ represents an aromatic ring, and me is an integer of 1 or more).

In formula (XIV), $R_{C1}$ represents a hydrogen atom or a methyl group and is preferably a hydrogen atom.

The aromatic ring of $Ar_C$ in formula (XIV) includes, for example, an aromatic hydrocarbon ring having a carbon number of 6 to 18 which may have a substituent, such as benzene ring, naphthalene ring, anthracene ring, fluorene ring and phenanthrene ring, and an aromatic heterocyclic ring containing a heterocyclic ring such as thiophene ring, furan ring, pyrrole ring, benzothiophene ring, benzofuran ring, benzopyrrole ring, triazine ring imidazole ring, benzimidazole ring, triazole ring, thiadiazole ring and thiazole ring. Among these, a benzene ring and a naphthalene ring are preferred in view of resolution, and a benzene ring is most preferred.

The aromatic ring of $Ar_C$ may have a substituent other than the group represented by —$OX_C$, and the substituent includes, for example, an alkyl group, a halogen atom, a hydroxyl group, an alkoxy group, a carboxyl group and an alkoxycarbonyl group and is preferably an alkyl group, an alkoxy group or an alkoxycarbonyl group, more preferably an alkoxy group.

$X_C$ represents a group having a non-acid-decomposable polycyclic alicyclic hydrocarbon structure. In the present invention, the "non-acid-decomposable" means a property of not causing a decomposition reaction by the action of an acid generated from the repeating unit (a) or the later-described (C) compound capable of generating an acid upon irradiation with an actinic ray or radiation.

In the present invention, the group having a polycyclic alicyclic hydrocarbon structure is not particularly limited as long as it is a monovalent group having a polycyclic alicyclic hydrocarbon structure, but the total carbon number thereof is preferably from 5 to 40, more preferably from 7 to 30.

The polycyclic alicyclic hydrocarbon structure in the group having a polycyclic alicyclic hydrocarbon structure means a structure having a plurality of monocyclic alicyclic hydrocarbon groups, or a polycyclic alicyclic hydrocarbon structure and may be of a bridged type. The monocyclic alicyclic hydrocarbon structure is preferably a cycloalkyl group having a carbon number of 3 to 8 and includes, for example, a cyclopropyl group, a cyclopentyl group, a cyclohexyl group, a cyclobutyl group, and a cyclooctyl group, and the structure having a plurality of monocyclic alicyclic hydrocarbon groups has a plurality of these groups. The structure having a plurality of monocyclic alicyclic hydrocarbon groups preferably has from 2 to 4, more preferably 2, monocyclic alicyclic hydrocarbon groups. The polycyclic alicyclic hydrocarbon structure includes, for example, bicyclo, tricyclo and tetracyclo structures having a carbon number of 5 or more and is preferably a polycyclic cyclo structure having a carbon number of 6 to 30, and examples thereof include an adamantane structure, a decalin structure, a norbornane structure, a cedrol structure, an isoboronane structure, a bornane structure, a dicyclopentane structure, a bicyclohexane structure, a bicycloheptane structure, a bicyclooctane structure, a bicyclodecane structure, a bicyclododecane structure, an α-pinene structure, a tricyclodecane structure, a totracyclododecane structure and an androstane structure. Incidentally, a part of carbon atoms in the monocyclic or polycyclic cycloalkyl group may be substituted with a heteroatom such as oxygen atom.

Among these polycyclic alicyclic hydrocarbon structures, an adamantane structure, a decalin structure, a norbornane structure, a cedrol structure, a bicyclohexane structure, a bicycloheptane structure, a bicyclooctane structure, a bicyclodecane structure, a bicyclododecane structure and a tricyclodecane structure are preferred, and an adamantane structure is most preferred in view of dry etching resistance. Chemical formulae of these polycyclic alicyclic hydrocarbon structures are illustrated below.

[Chem. 32]

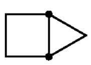
(1)

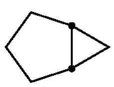
(2)

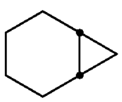
(3)

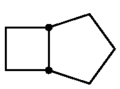
(4)

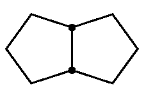
(5)

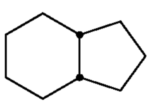
(6)

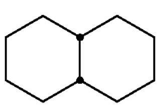
(7)

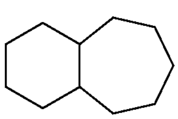
(8)

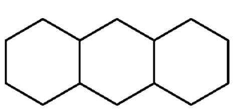
(9)

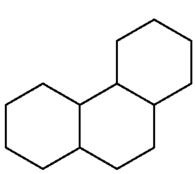
(10)

-continued

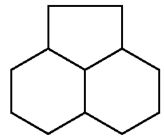
(11)

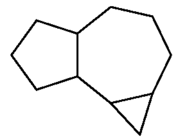
(12)

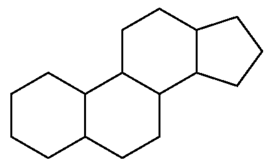
(13)

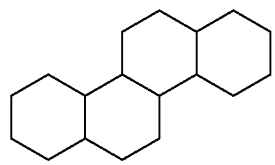
(14)

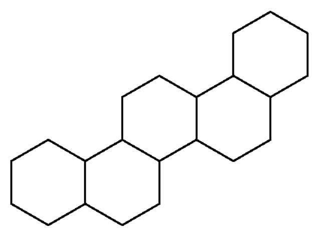
(15)

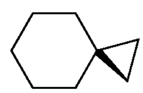
(16)

(17)

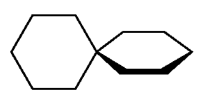
(18)

(19)

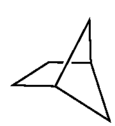
(20)

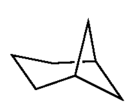
(21)

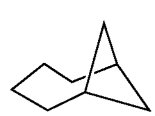
(22)

-continued
(23)
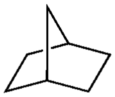
(24)
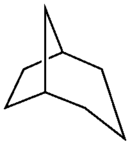
(25)
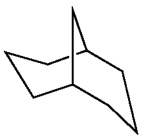
(26)
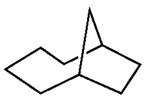
(27)
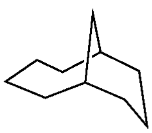
(28)
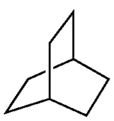
(29)
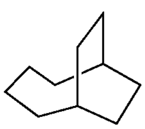
(30)
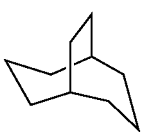
(31)
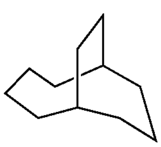
(32)
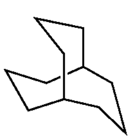
(33)
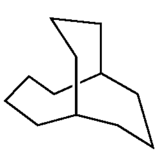
-continued
(34)
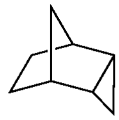
(35)
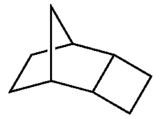
(36)
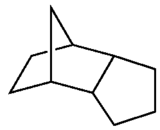
(37)
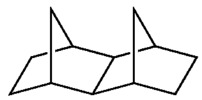
(38)
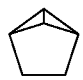
(39)
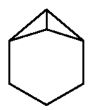
(40)
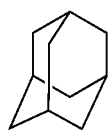
(41)
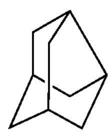
(42)
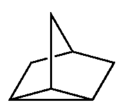
(43)
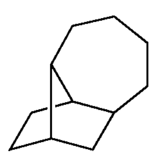
(44)
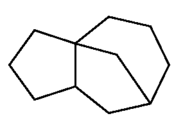
(45)
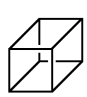
(46)
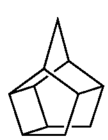

-continued (47)

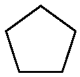

(48)

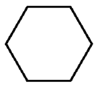

(49)

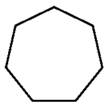

(50)

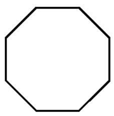

Furthermore, the polycyclic alicyclic hydrocarbon structure may have a substituent, and the substituent includes, for example, an alkyl group, a halogen atom, a hydroxyl group, an alkoxy group, a carboxyl group, a carbonyl group, and an alkoxycarbonyl group.

$m_C$ is preferably an integer of 1 to 5 and most preferably 1. When $m_C$ is 1 and $Ar_C$ is a benzene ring, the substitution position of —$OX_C$ may be the para-, meta- or ortho-position relative to the bonding position of the benzene ring to the polymer main chain but is preferably the para-position.

In the present invention, the repeating unit represented by formula (XIV) is preferably a repeating unit represented by the following formula (XV).

When a polymer compound containing a repeating unit represented by formula (XV) is used, Tg of the polymer compound becomes high, and a very hard resist film is formed, so that acid diffusion and dry etching resistance can be more reliably controlled.

[Chem. 33]

(XV)

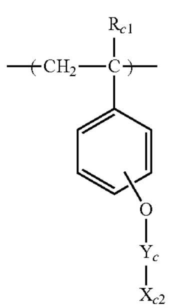

(wherein $R_{C1}$ represents a hydrogen atom or a methyl group, $Y_C$ represents a single bond or a divalent linking group, and $X_{C2}$ represents a non-acid-decomposable polycyclic alicyclic hydrocarbon group).

As to the repeating unit represented by formula (XV), preferred embodiments used in the present invention are described below.

In formula (XV), $R_{C1}$ represents a hydrogen atom or a methyl group but among others, is preferably a hydrogen atom.

In formula (XV), $Y_C$ is preferably a divalent linking group. The groups preferred as the divalent linking group of $Y_C$ are a carbonyl group, a thiocarbonyl group, an alkylene group (preferably having a carbon number of 1 to 10, more preferably a carbon number of 1 to 5), a sulfonyl group, —$COCH_2$—, —NH—, and a divalent linking group formed by combining these (preferably having a total carbon number of 1 to 20, more preferably a total carbon number of 1 to 10), and the group is more preferably a carbonyl group, a sulfonyl group, —CONH— or —CSNH—, still more preferably a carbonyl group.

$X_{C2}$ represents a polycyclic alicyclic hydrocarbon group and is non-acid-decomposable. The polycyclic alicyclic hydrocarbon group is a group having a plurality of monocyclic alicyclic hydrocarbon groups, or a polycyclic alicyclic hydrocarbon group and may be of a bridged type. The monocyclic alicyclic hydrocarbon group is preferably a cycloalkyl group having a carbon number of 3 to 8 and includes, for example, a cyclopropyl group, a cyclopentyl group, a cyclohexyl group, a cyclobutyl group, and a cyclooctyl group, and the polycyclic alicyclic hydrocarbon group has a plurality of these groups. The group having a plurality of monocyclic alicyclic hydrocarbon groups preferably has from 2 to 4, more preferably 2, monocyclic alicyclic hydrocarbon groups. The polycyclic alicyclic hydrocarbon group includes, for example, a group containing a bicyclo, tricyclo or tetracyclo structure having a carbon number of 5 or more and is preferably a group containing a polycyclic cyclo group having a carbon number of 6 to 30, and examples thereof include an adamantyl group, a norbornyl group, an isoboronyl group, a camphanyl group, a dicyclopentyl group, an α-pinel group, a tricyclodecanyl group, a tetracyclododecyl group, and an androstanyl group. Incidentally, a part of carbon atoms in the monocyclic or polycyclic cycloalkyl group may be substituted with a heteroatom such as oxygen atom.

Among these polycyclic alicyclic hydrocarbon groups of $X_{C2}$, an adamantyl group, a decalin group, a norbornyl group, a cedrol group, a bicyclohexyl group, a bicycloheptyl group, a bicyclooctyl group, a bicyclodecanyl group, a bicyclododecanyl group and a tricyclodecanyl group are preferred, and an adamantyl group is most preferred in view of dry etching resistance. Chemical formulae of these preferred $X_{C2}$ are the same as chemical formulae of the polycyclic alicyclic hydrocarbon structure in the group having a polycyclic alicyclic hydrocarbon structure.

Furthermore, the alicyclic hydrocarbon group above may have a substituent, and the substituent includes, for example, an alkyl group, a halogen atom, a hydroxyl group, an alkoxy group, a carboxyl group, a carbonyl group, and an alkoxycarbonyl group.

In formula (XV), the substitution position of —O—$Y_C$—$X_{C2}$ may be the para-, meta- or ortho-position relative to the bonding position of the benzene ring to the polymer main chain but is preferably the para-position.

In the present invention, the repeating unit represented by formula (XIV) is most preferably a repeating unit represented by the following formula (XV'):

[Chem. 34]

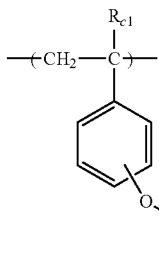

(XV')

(wherein $R_{C1}$ represents a hydrogen atom or a methyl group)

In formula (XV'), $R_{C1}$ represents a hydrogen atom or a methyl group and is preferably a hydrogen atom.

In formula (XV'), the substitution position of the adamantyl ester group may be the para-, meta- or ortho-position relative to the bonding position of the benzene ring to the polymer main chain but is preferably the para-position.

Specific examples of the repeating unit represented by formula (XIV) or (XV) include the followings.

[Chem. 35]

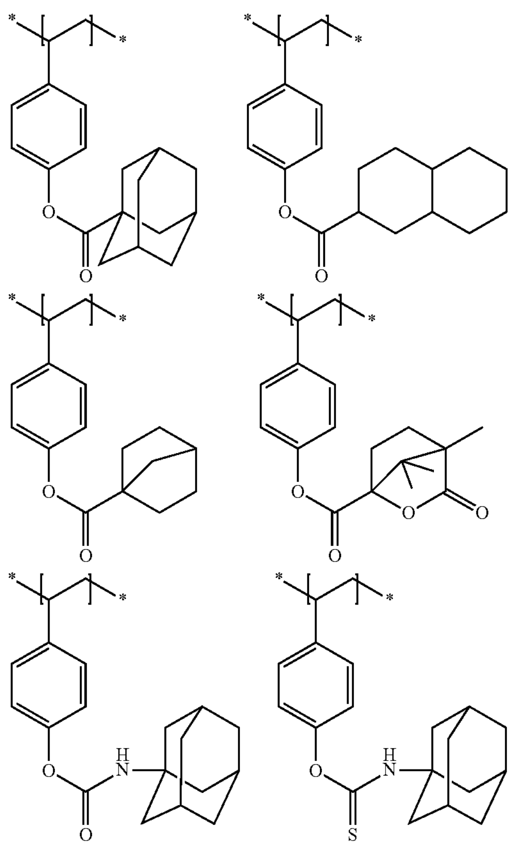

-continued

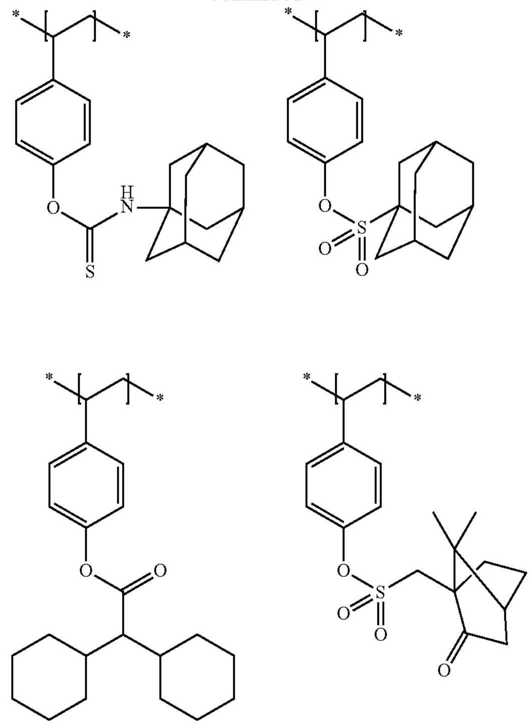

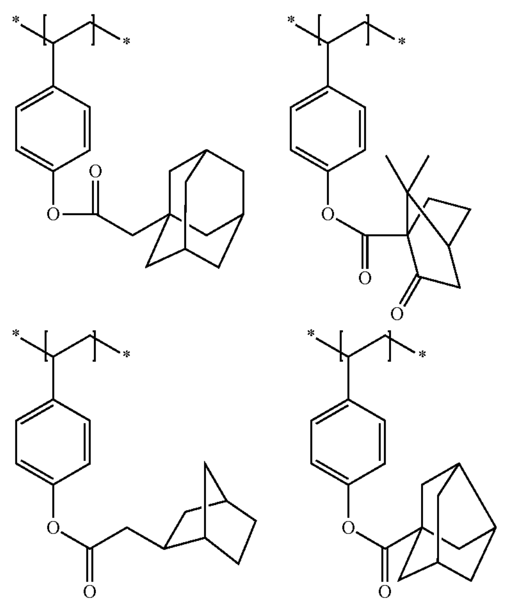

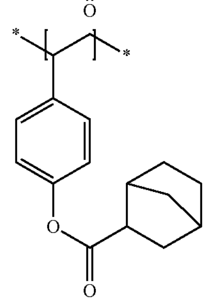

[Chem. 36]

-continued
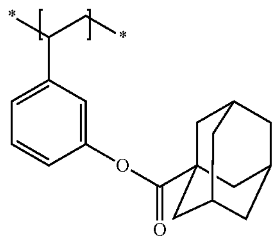
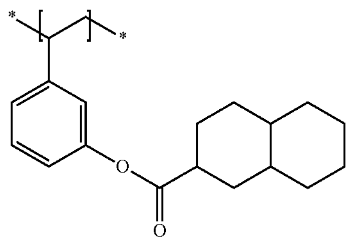
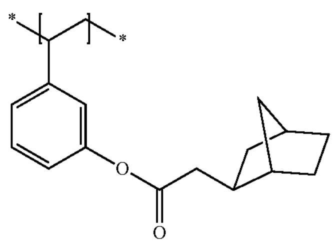
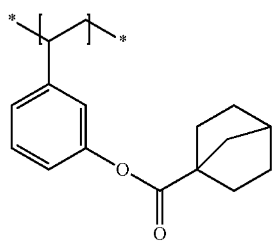
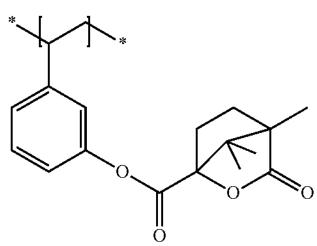
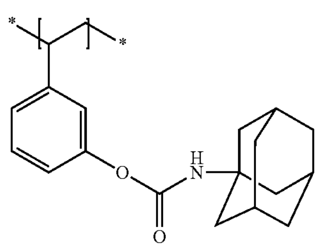
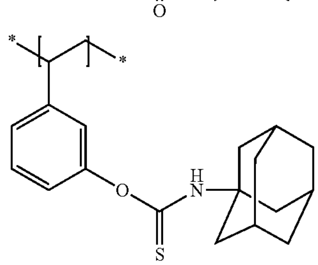
-continued
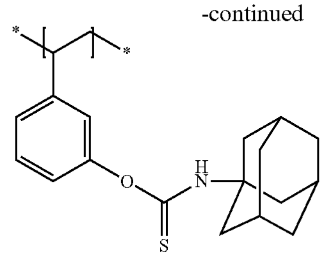
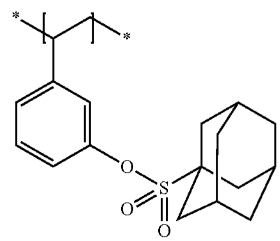
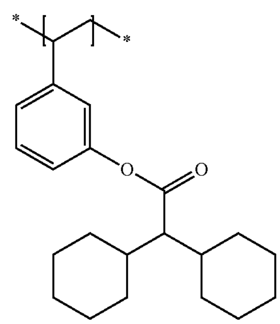
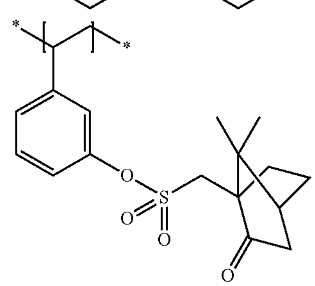
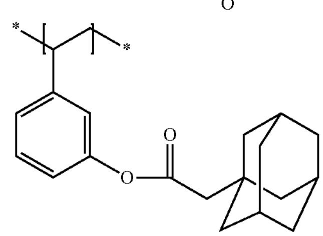
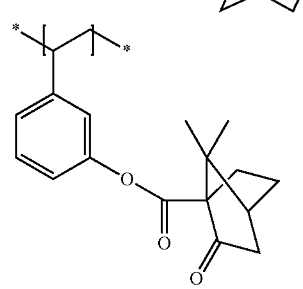

-continued

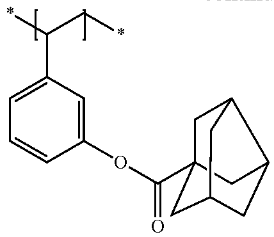

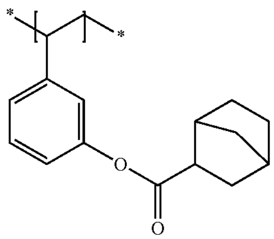

[Chem. 37]

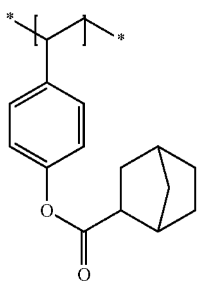

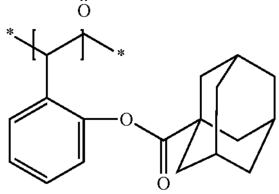

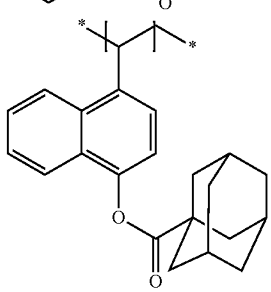

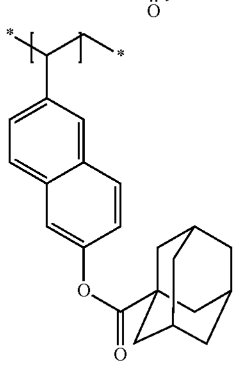

-continued

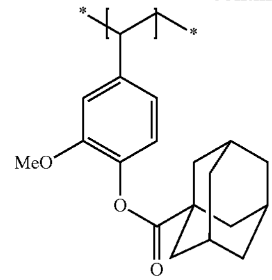

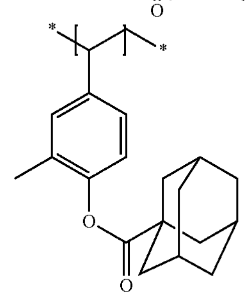

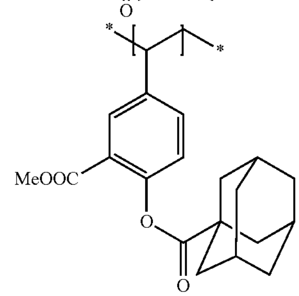

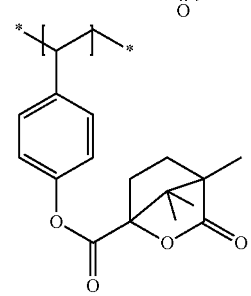

The polymer compound (A) of the present invention may or may not contain the alkali-soluble repeating unit (c), but in the case of containing the alkali-soluble repeating unit (c), the content thereof in the polymer compound (A) of the present invention is preferably from 3 to 50 mol %, more preferably from 5 to 40 mol %, still more preferably from 10 to 30 mol %, based on all repeating units in the polymer compound (A).

In addition, as a repeating unit other than the repeating units (a) to (c), the polymer compound may further contain a repeating unit having a group capable of decomposing by the action of an alkali developer to increase the dissolution rate in the alkali developer.

The repeating unit having a group capable of decomposing by the action of an alkali developer to increase the dissolution rate in an alkali developer includes, for example, a repeating unit having a lactone structure or a phenyl ester structure and is preferably a repeating unit having a 5- to 7-membered ring lactone structure, more preferably a 5- to 7-membered ring lactone structure to which another ring structure is fused in the form of forming a bicyclo structure or a spiro structure. Specific examples of the repeating unit having a group capable of decomposing by the action of an alkali developer to increase the dissolution rate in the alkali developer are illustrated below. In the formulae, Rx represents H, $CH_3$, $CH_2OH$ or $CF_3$.
[Chem. 38]
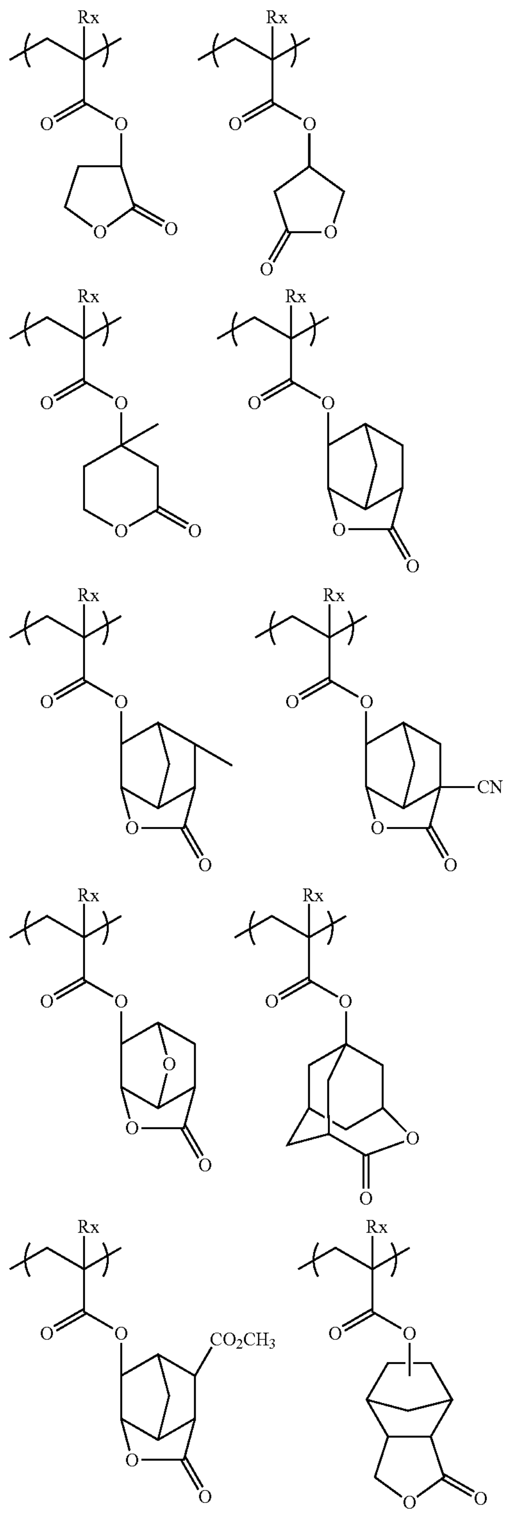
-continued
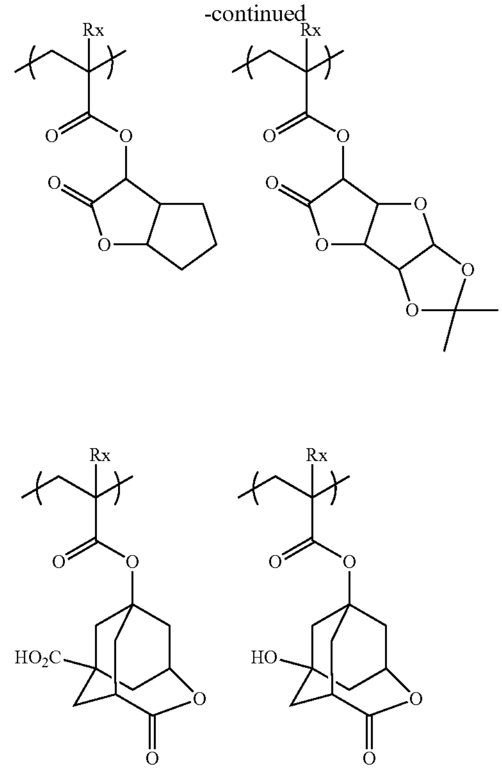
[Chem. 39]
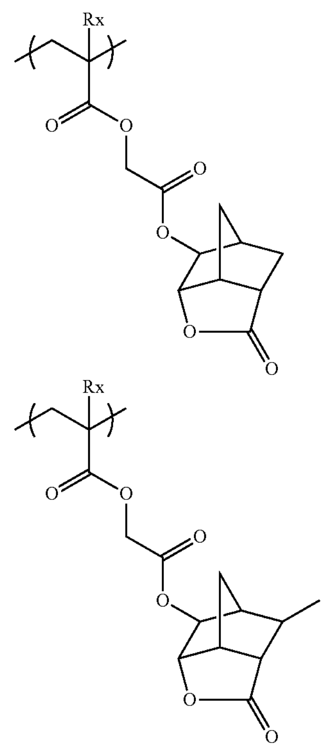

-continued
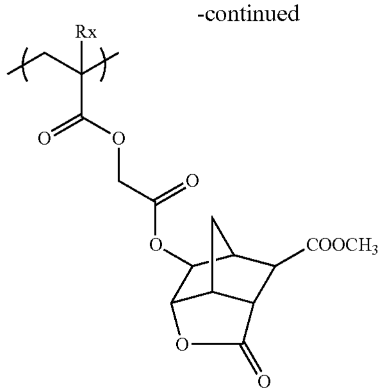
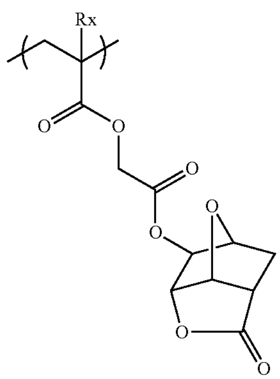
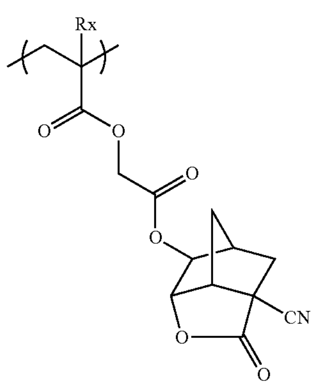
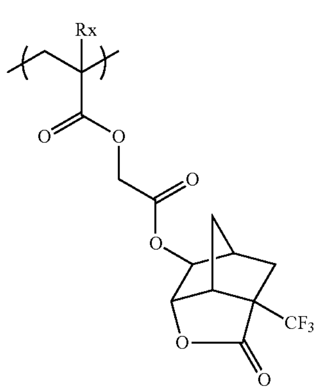
-continued
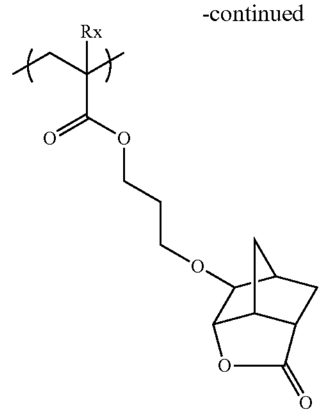
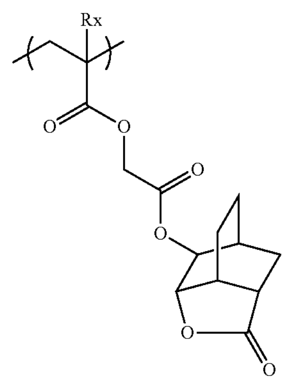
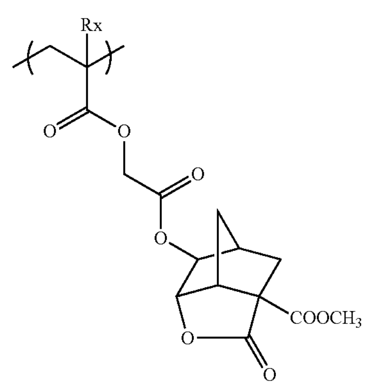
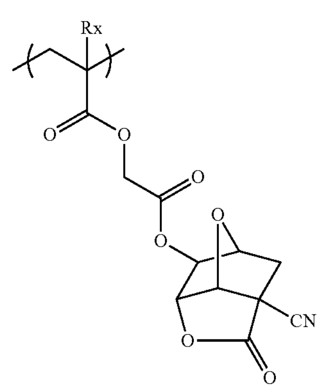

-continued

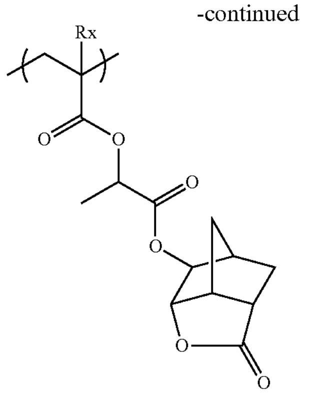

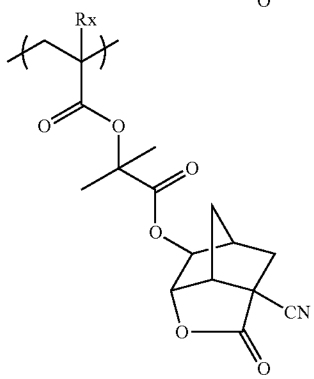

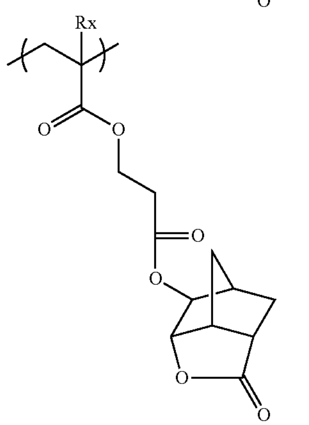

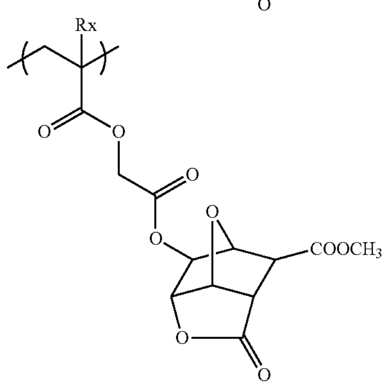

The polymer compound (A) may or may not contain a repeating unit having a group capable of decomposing by the action of an alkali developer to increase the dissolution rate in the alkali developer, but in the case of containing a repeating unit having a group capable of decomposing by the action of an alkali developer to increase the dissolution rate in the alkali developer, the content thereof is preferably from 3 to 50 mol %, more preferably from 5 to 40 mol %, still more preferably from 10 to 30 mol %, based on all repeating units in the polymer compound (A).

Specific examples of the polymer compound (A) for use in the present invention are illustrated below, but the present invention is not limited thereto.

[Chem. 40]

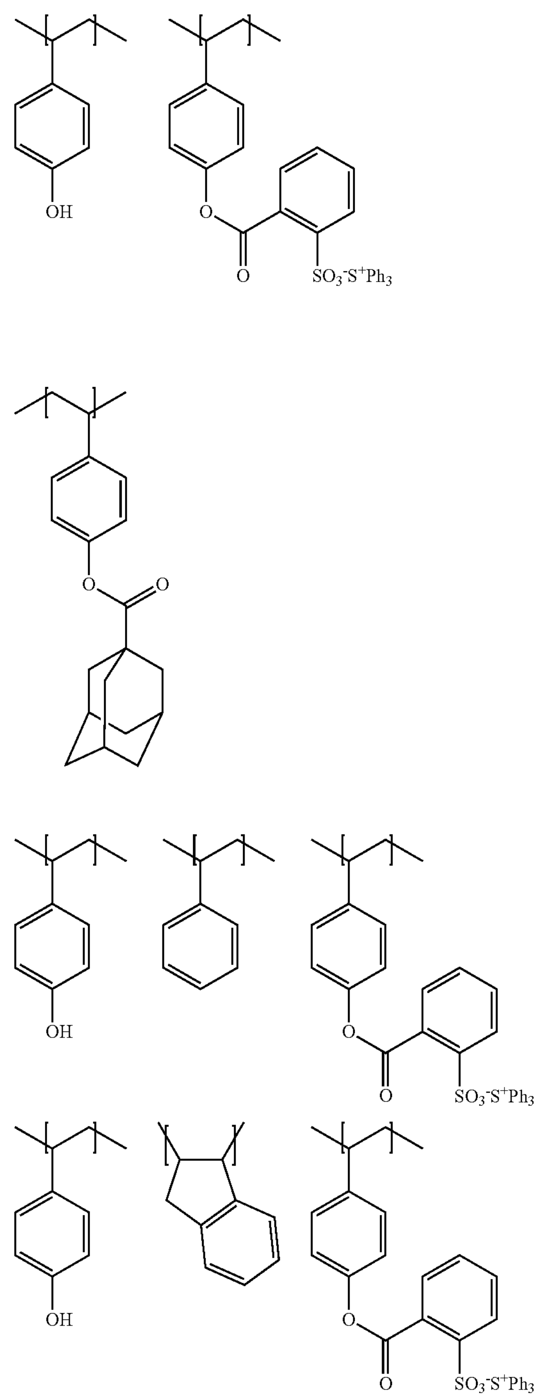

-continued
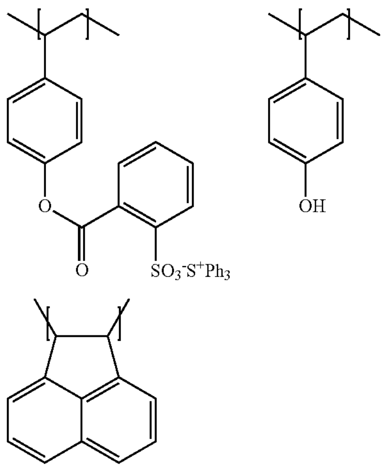
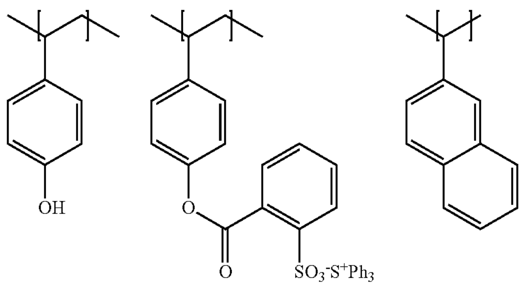
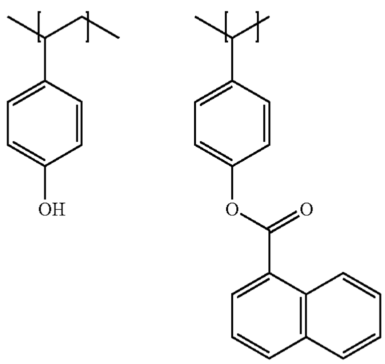
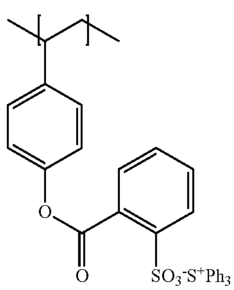
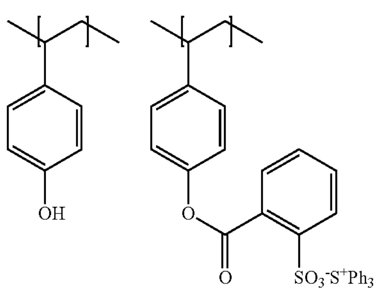
-continued
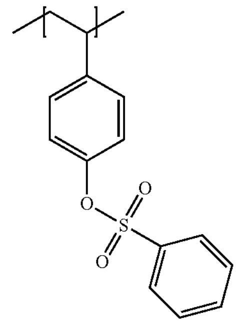
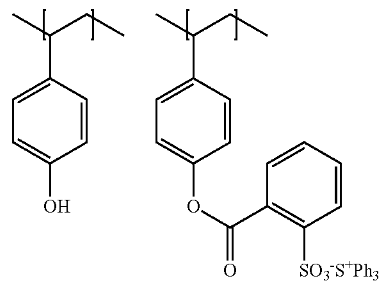
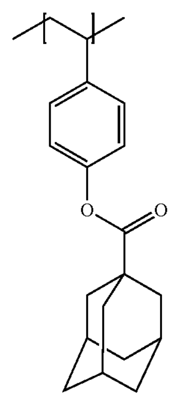
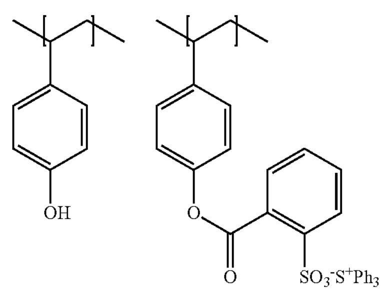
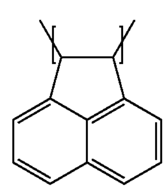

-continued
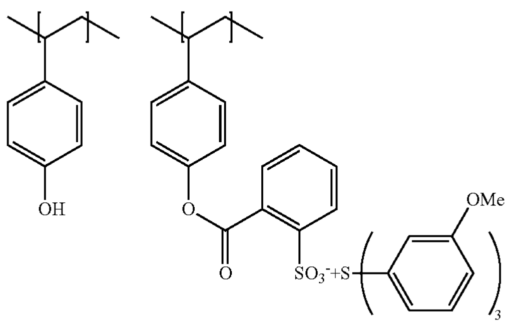
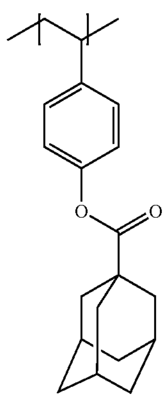
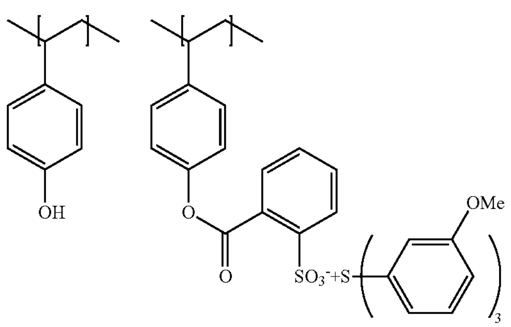
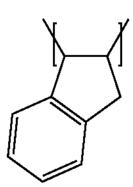
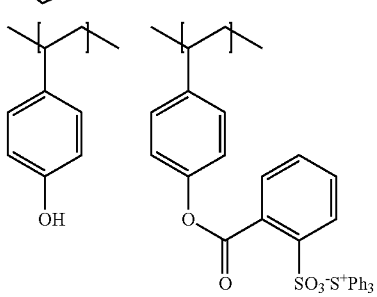
-continued
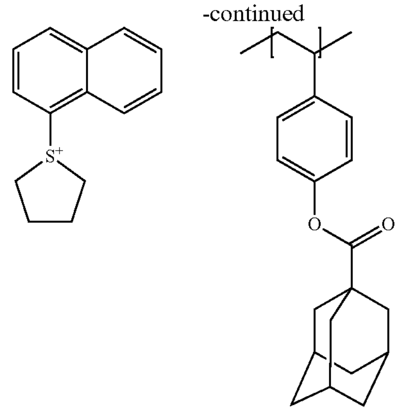
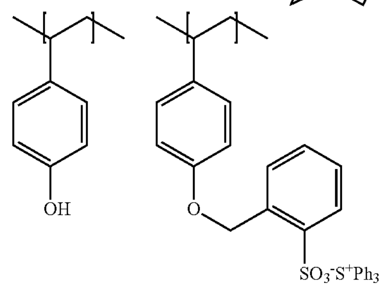
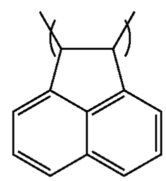
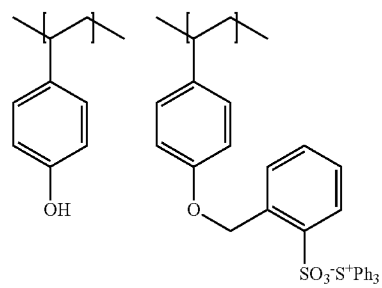
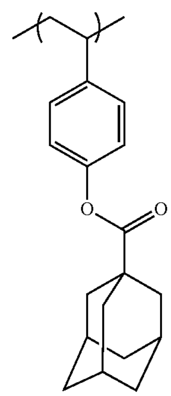
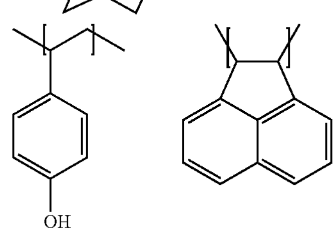

-continued
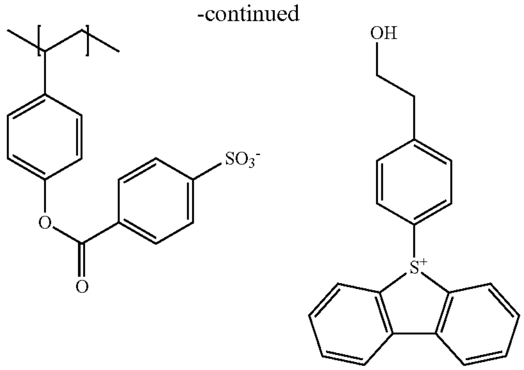
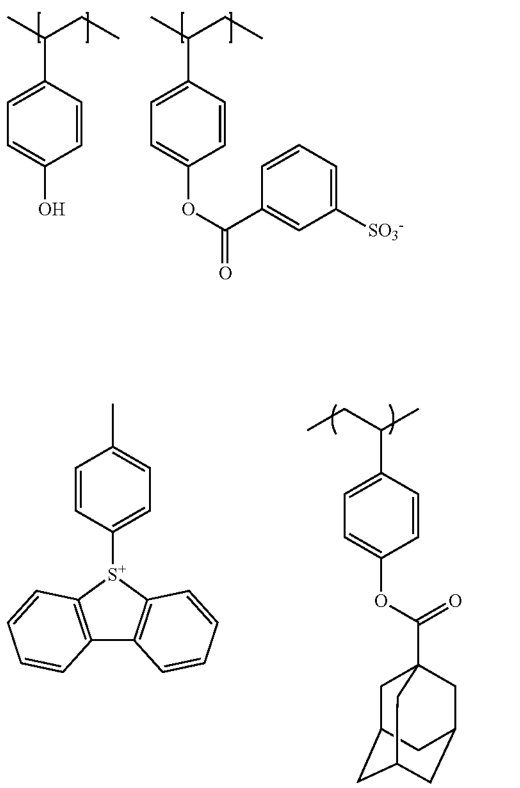
[Chem. 41]
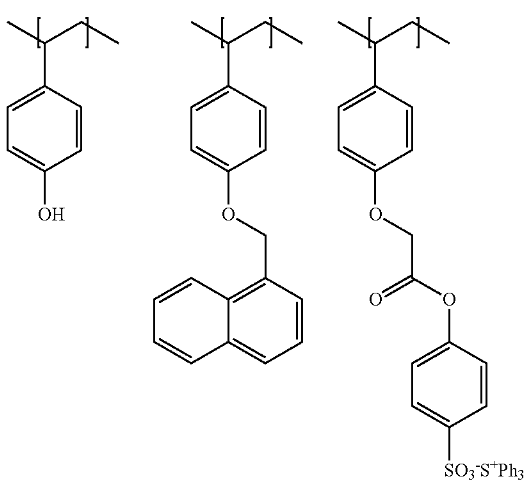
-continued
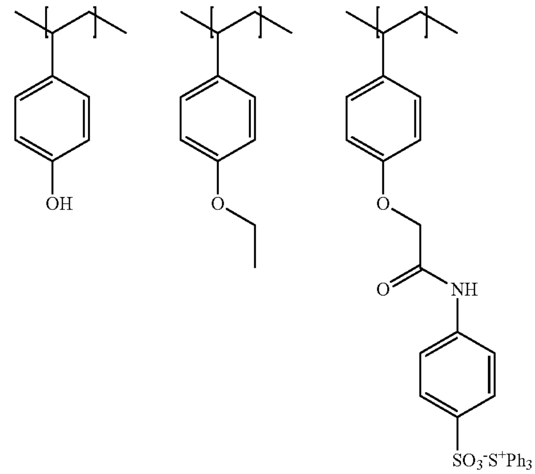
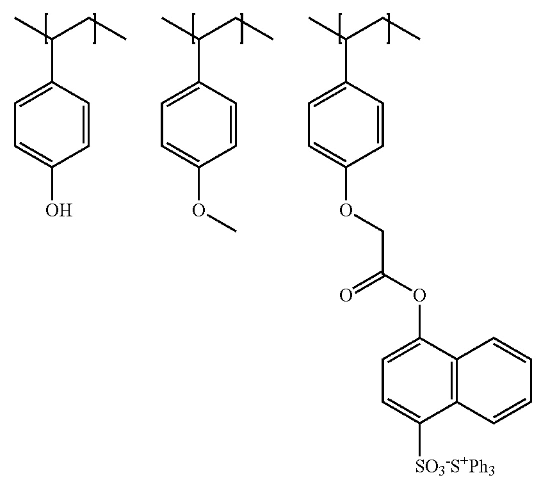
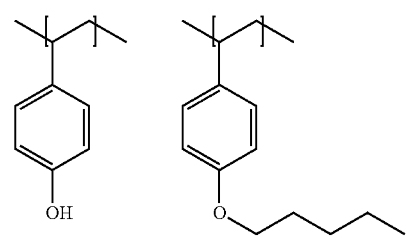
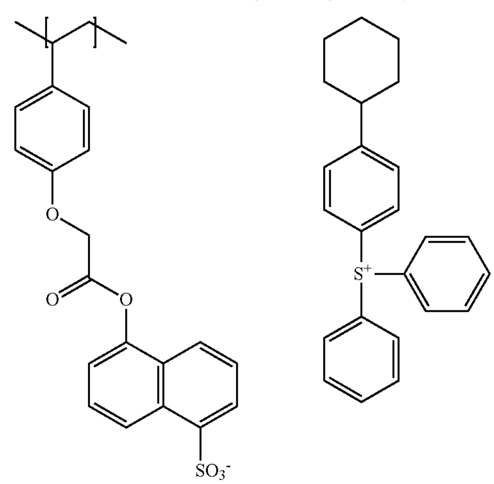

-continued
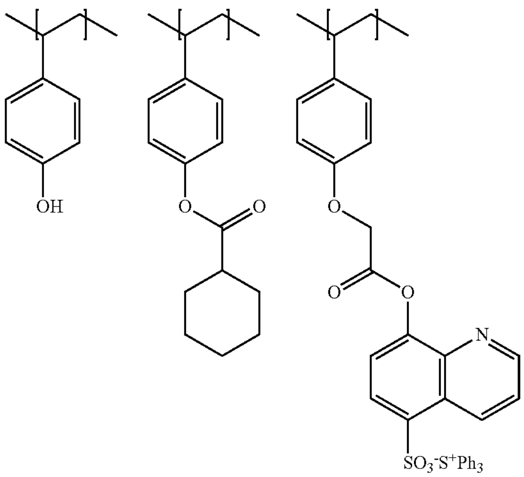
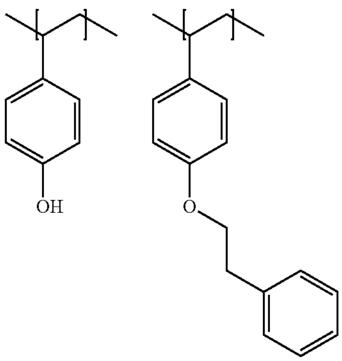
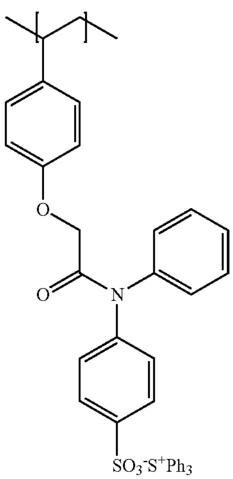
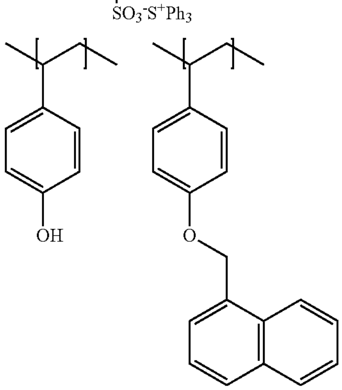
-continued
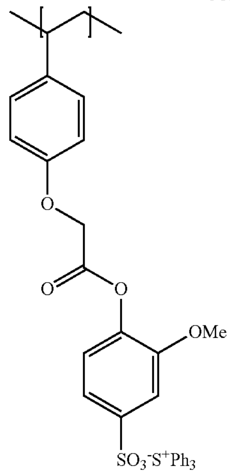
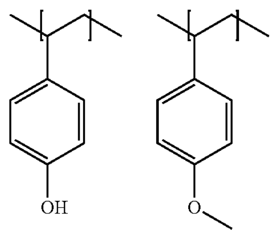
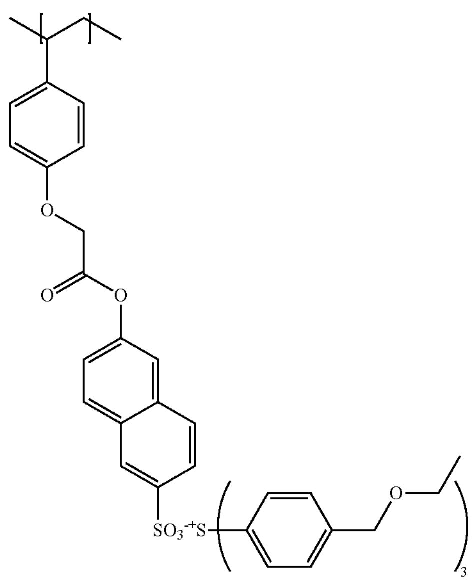
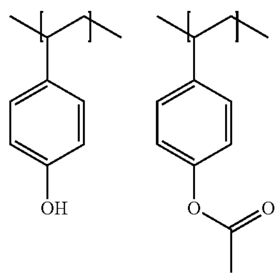

-continued
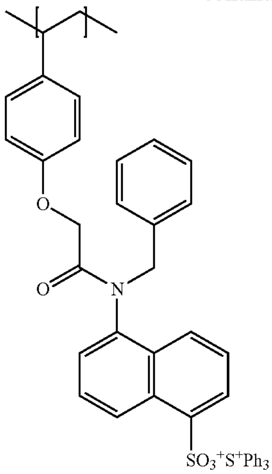
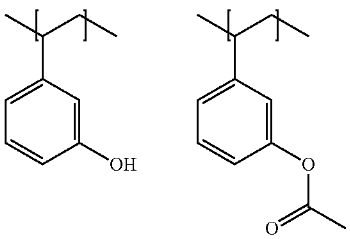
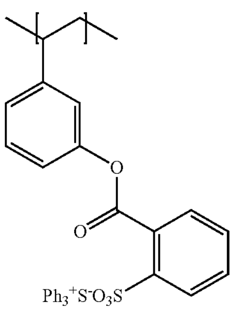
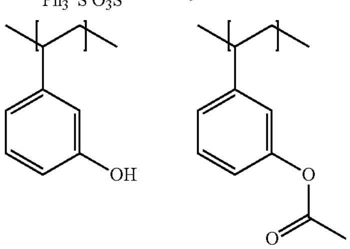
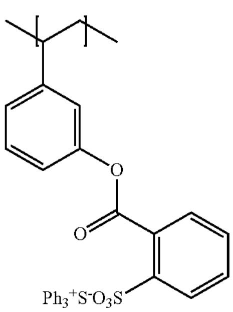
-continued
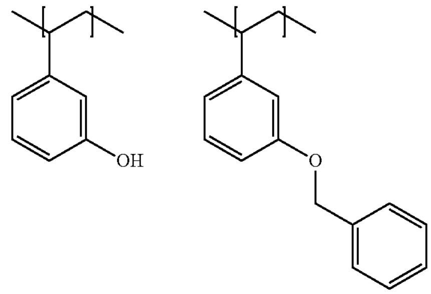
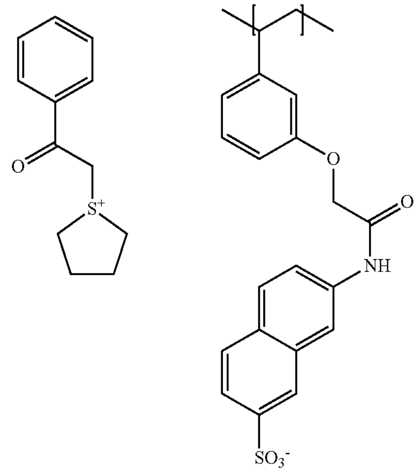
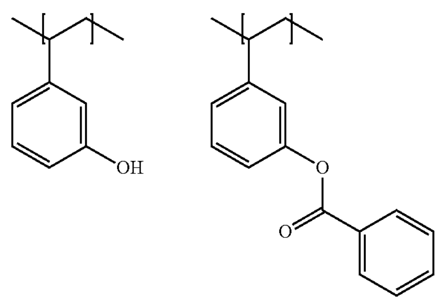
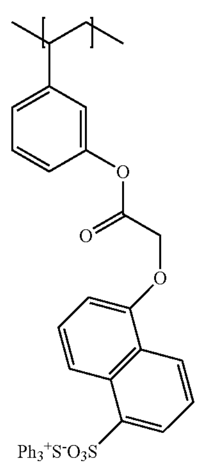

-continued
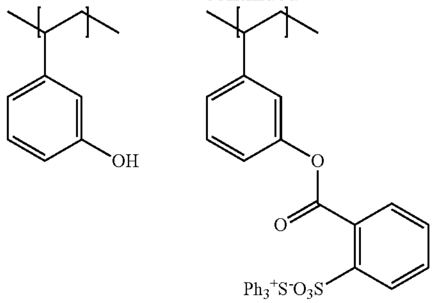
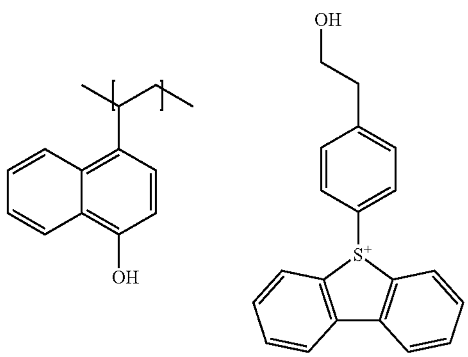
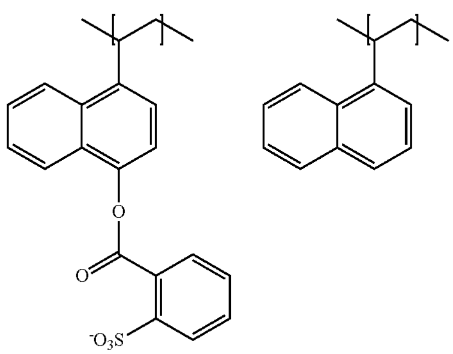
[Chem. 42]
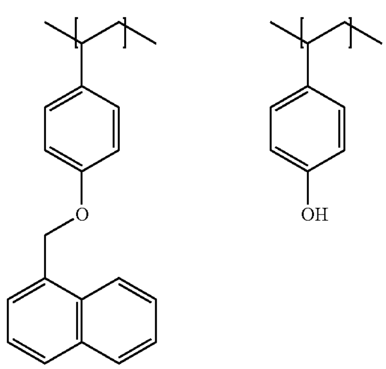
-continued
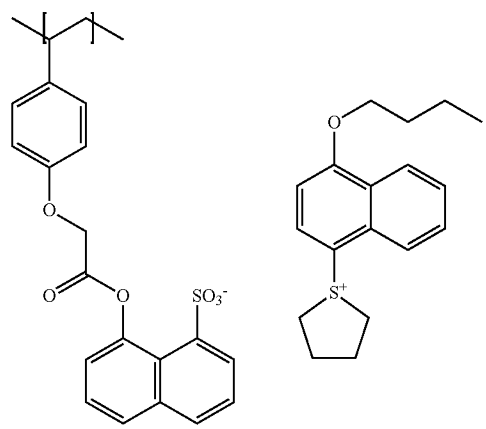
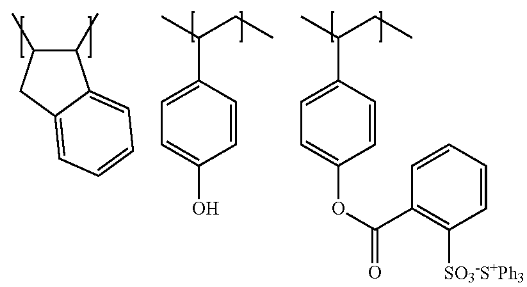
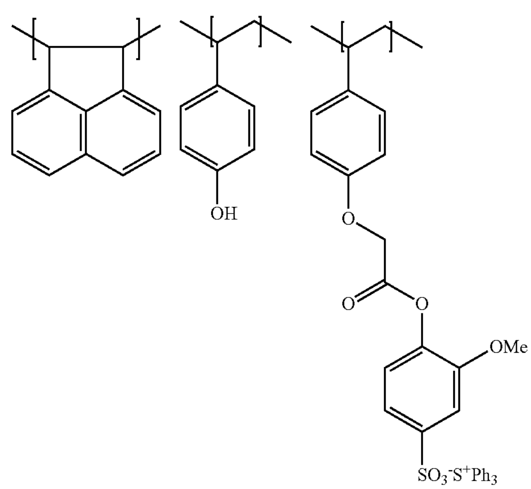
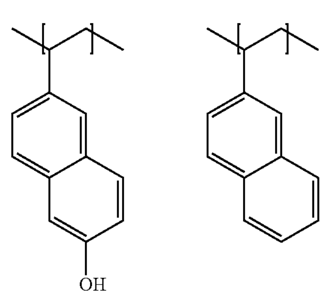

-continued
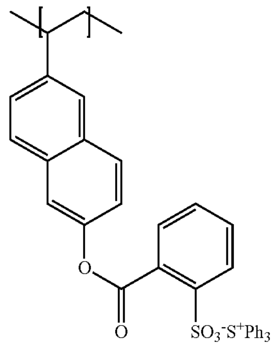
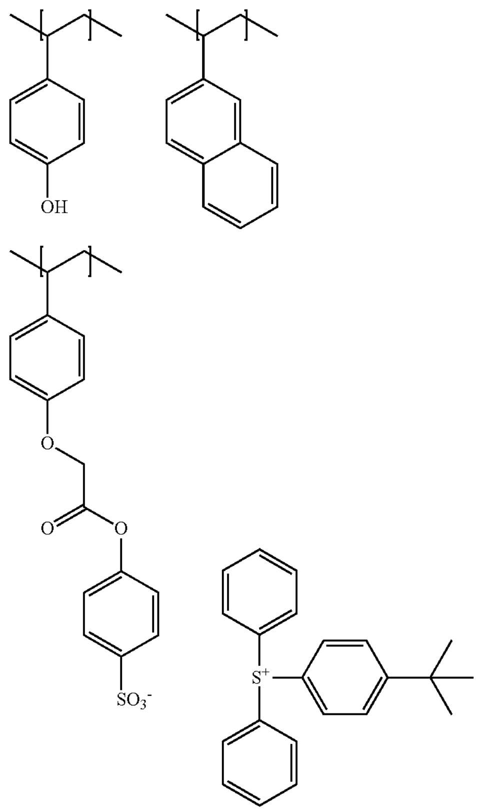
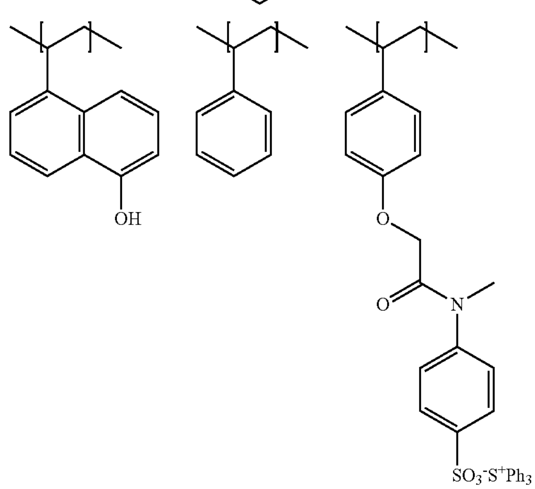
-continued
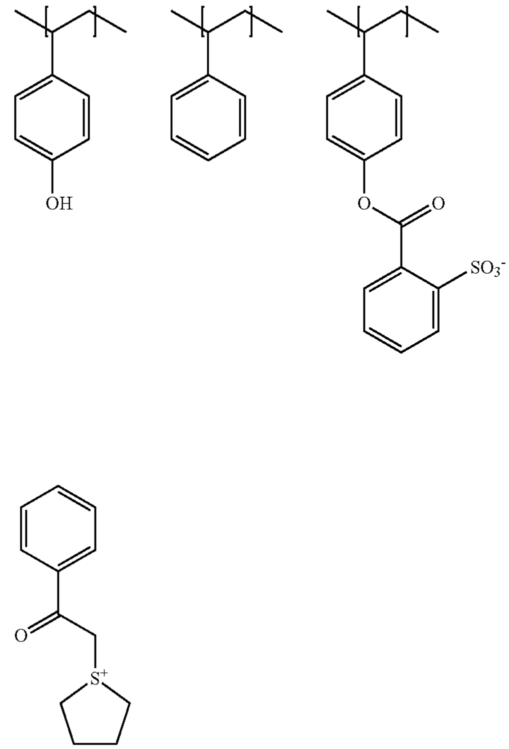
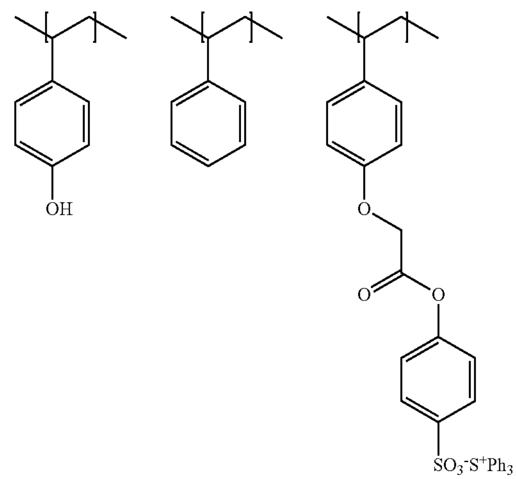
[Chem. 43]
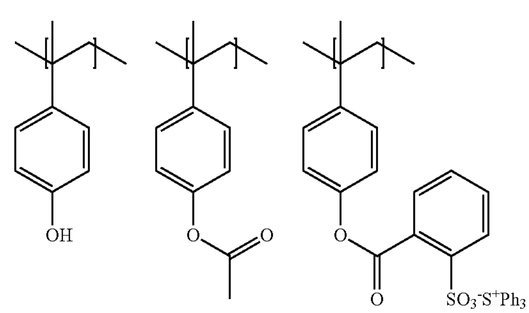

-continued
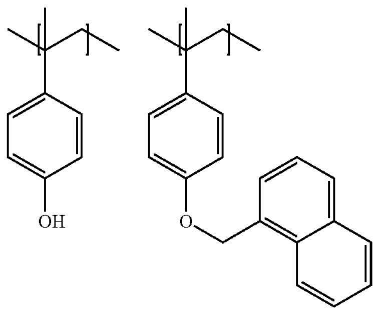
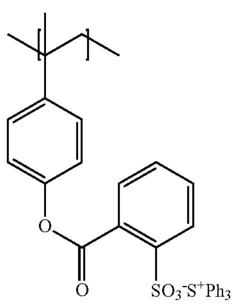
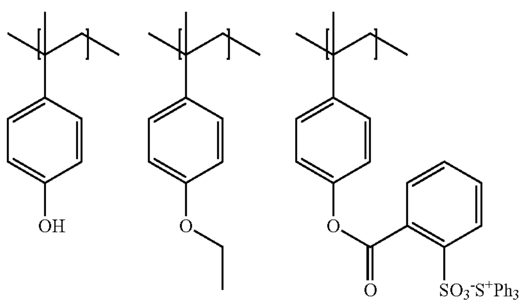
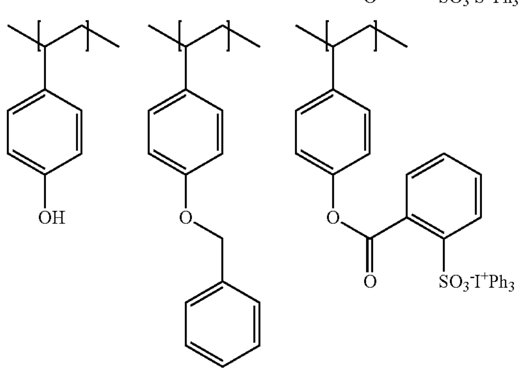
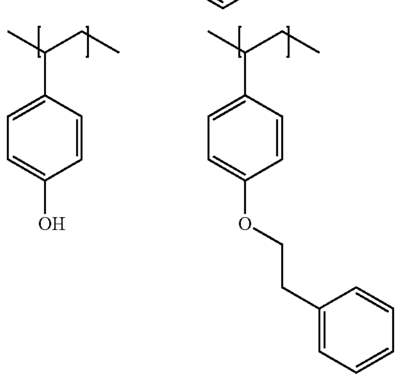
-continued
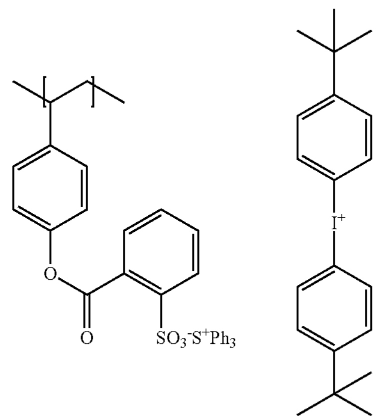
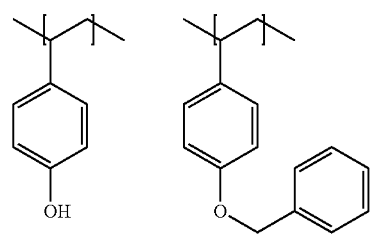
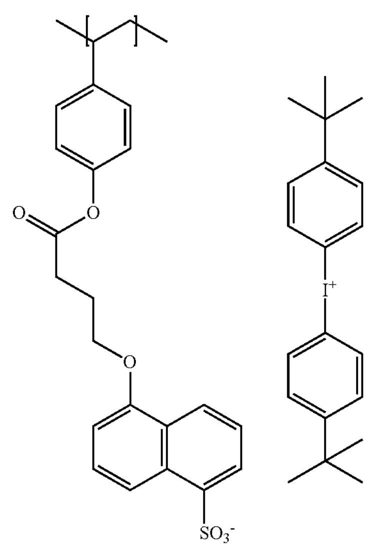
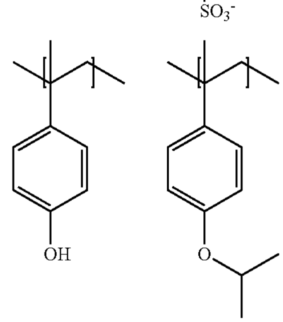

-continued
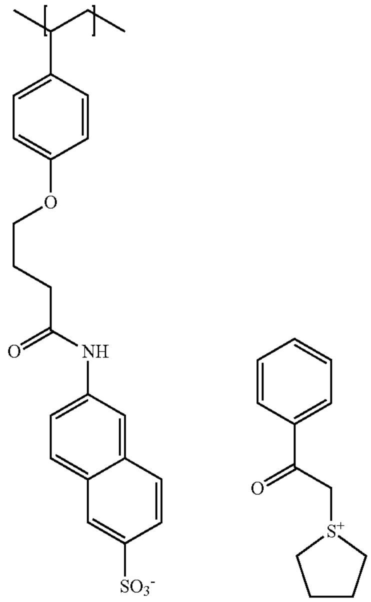
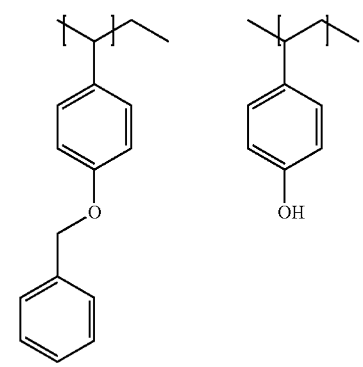
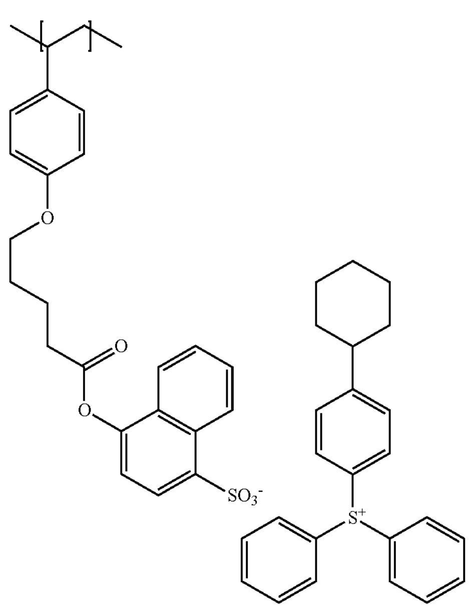
-continued
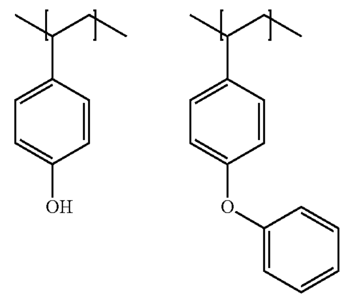
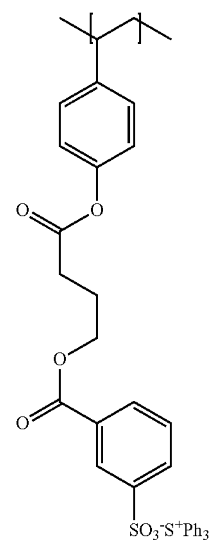
[Chem. 44]
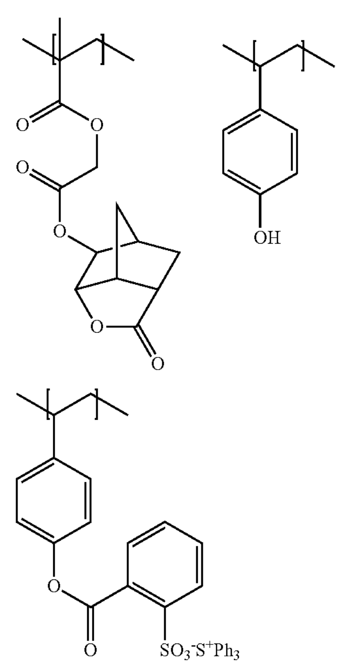

-continued
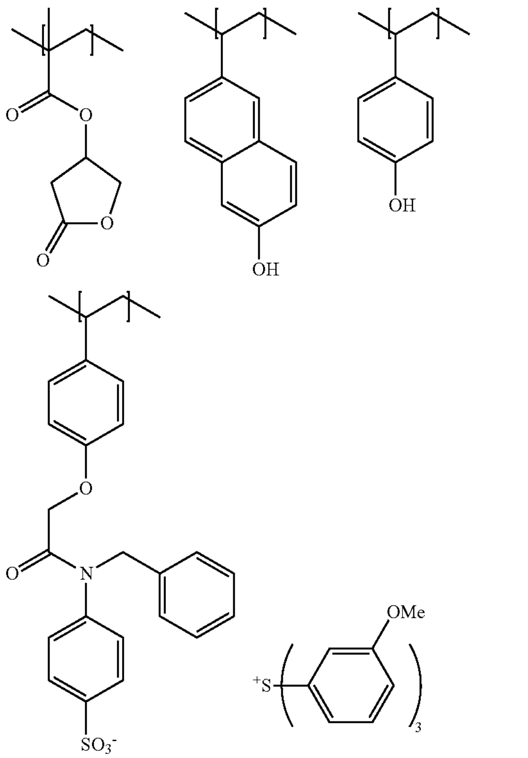
[Chem. 45]
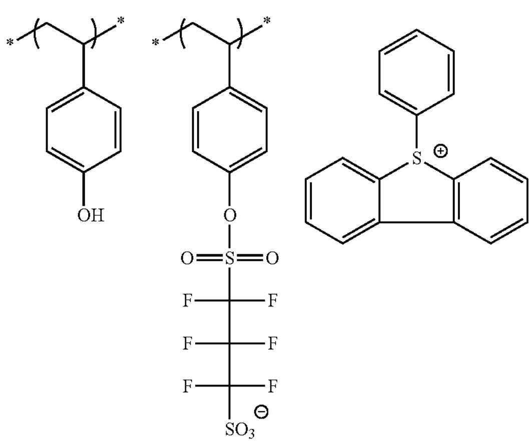
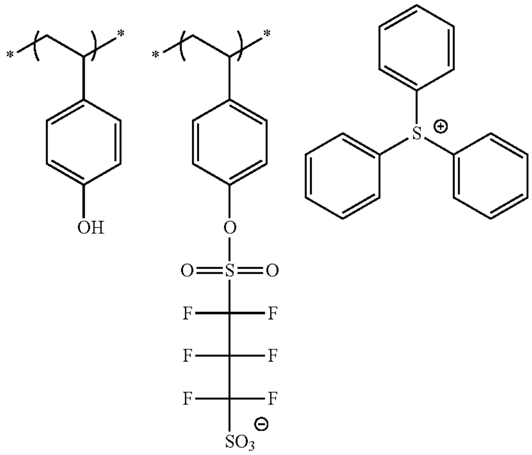
-continued
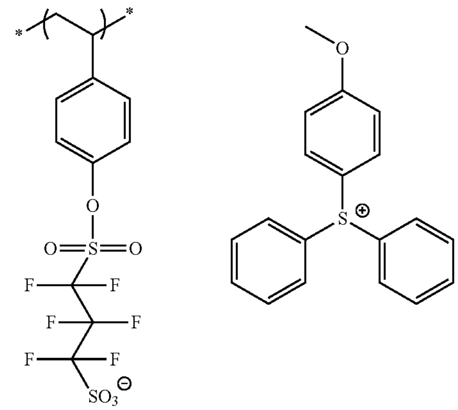
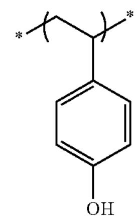
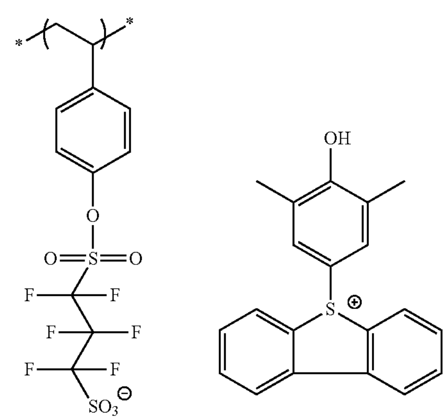
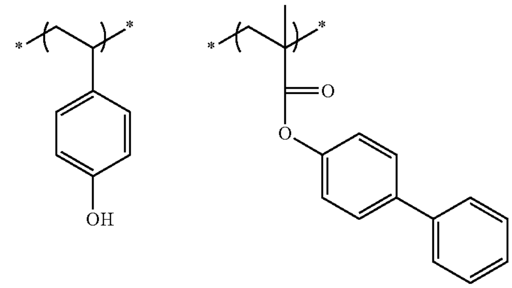

-continued
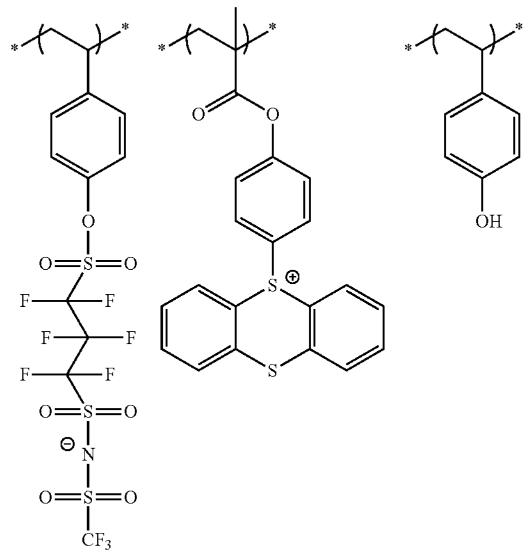
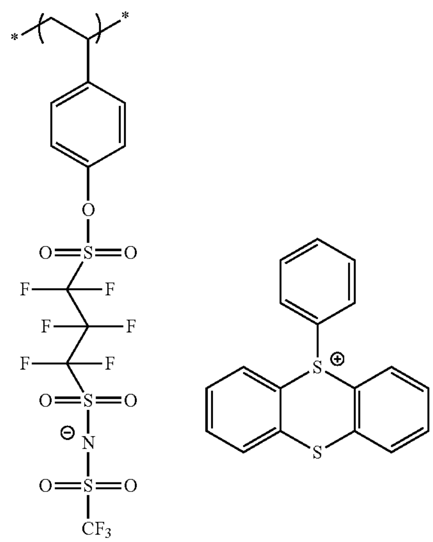
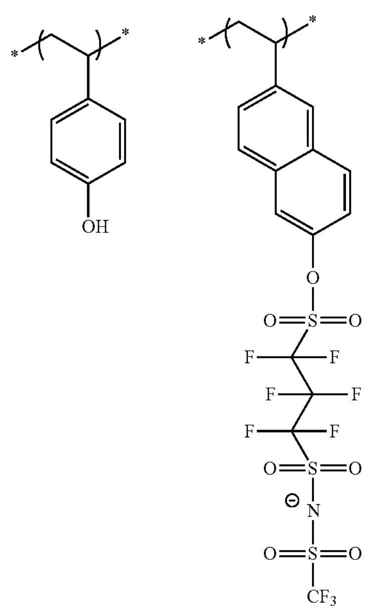
-continued
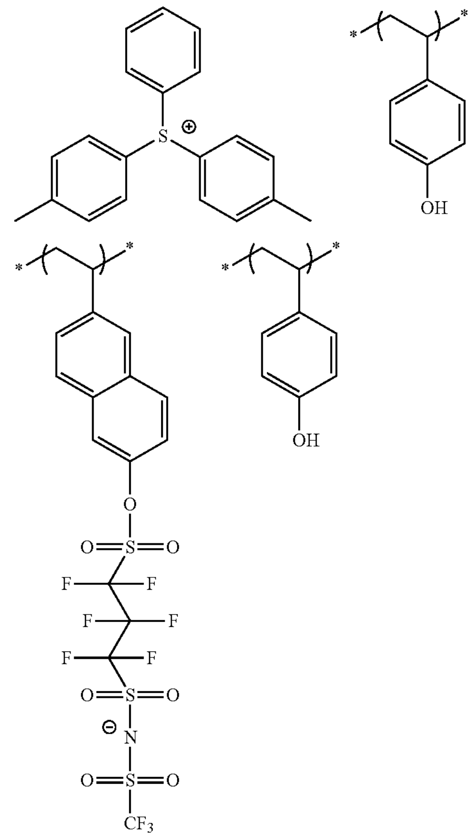
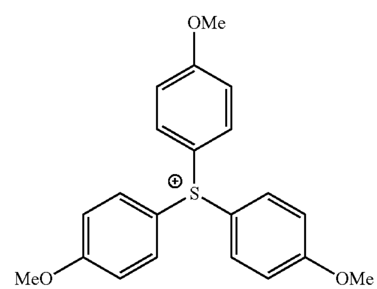
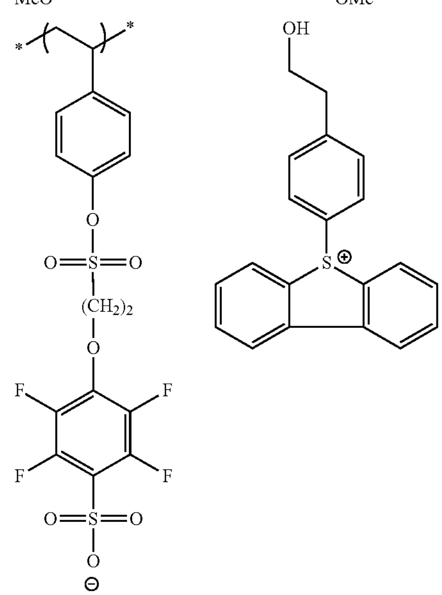

-continued
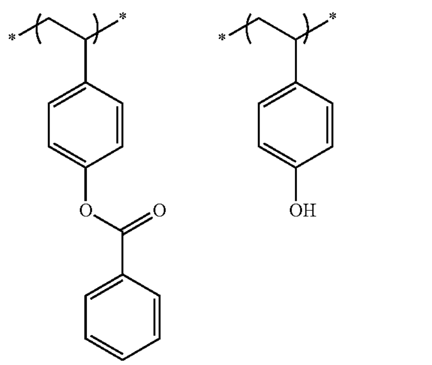
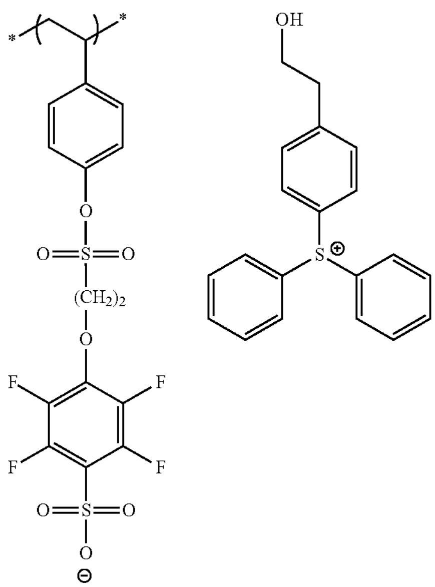
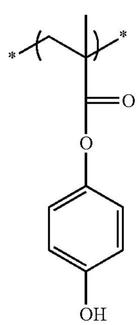
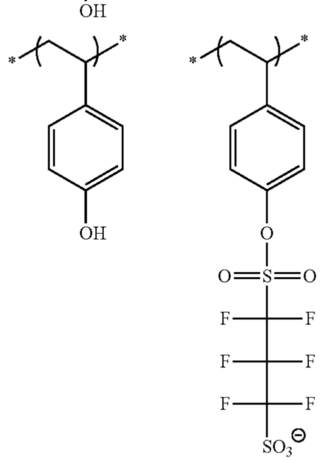
-continued
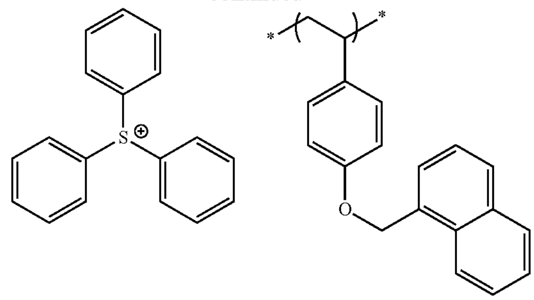
[Chem. 46]
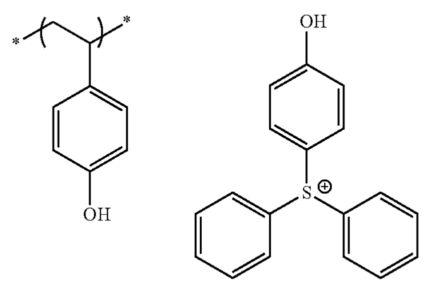
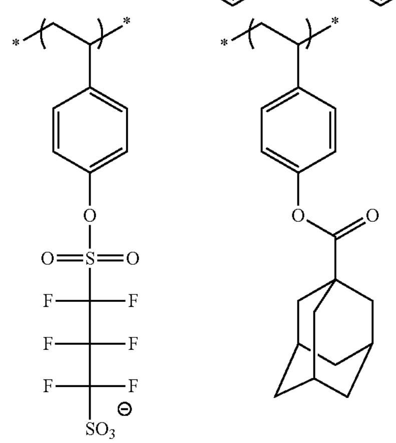
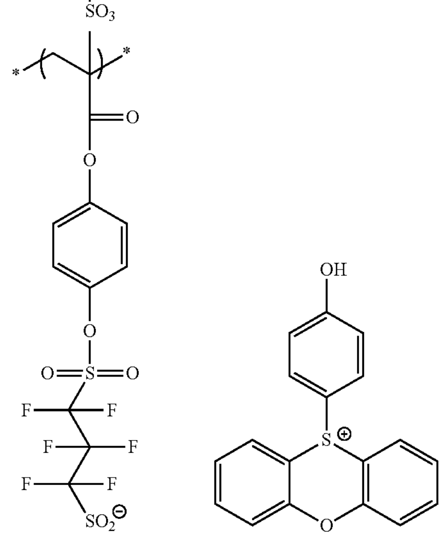

-continued
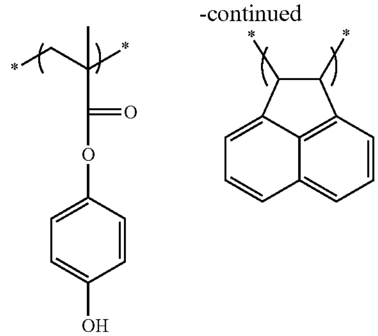
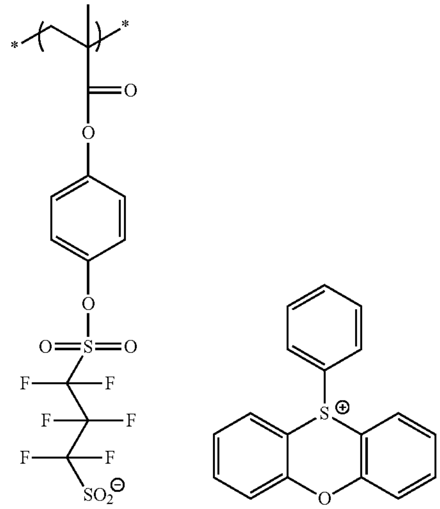
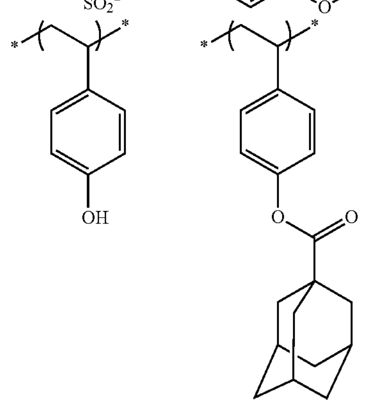
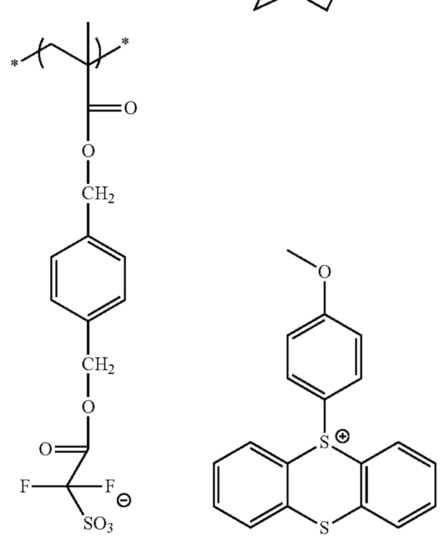
-continued
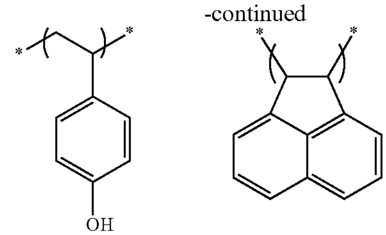
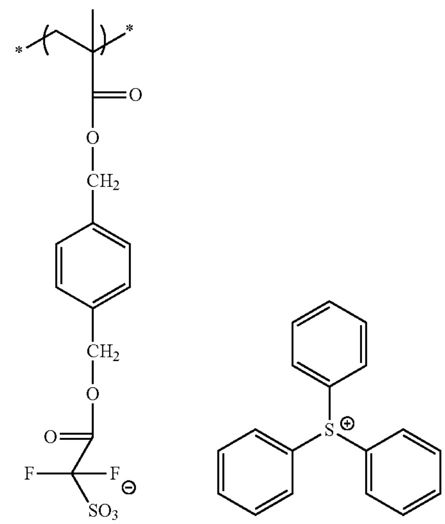
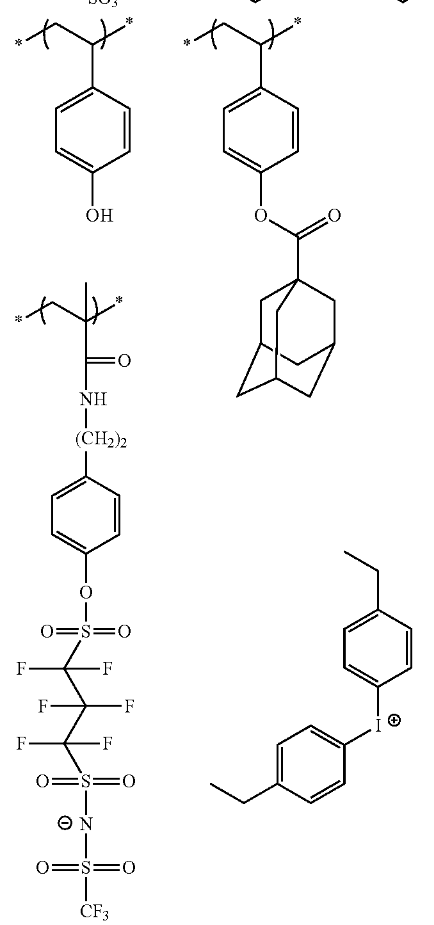

-continued
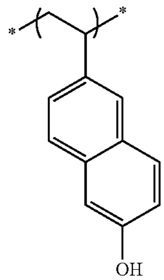
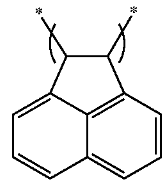
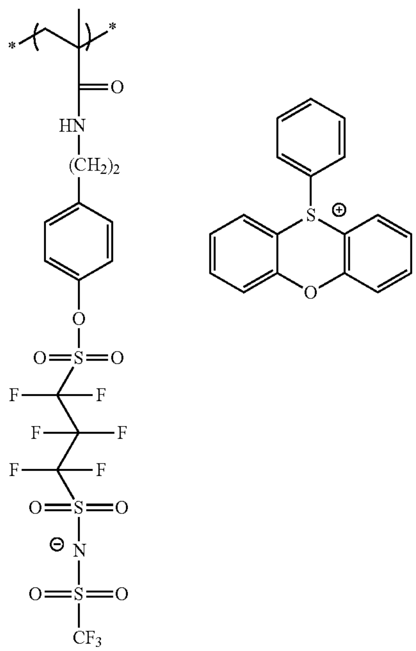
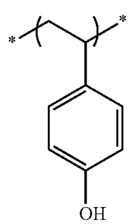
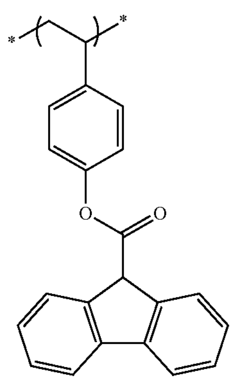
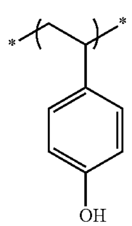
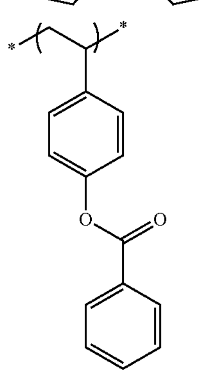
-continued
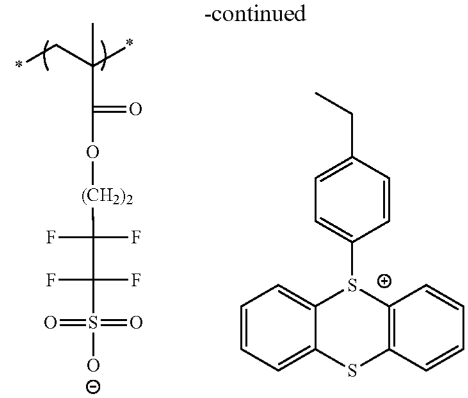
[Chem. 47]
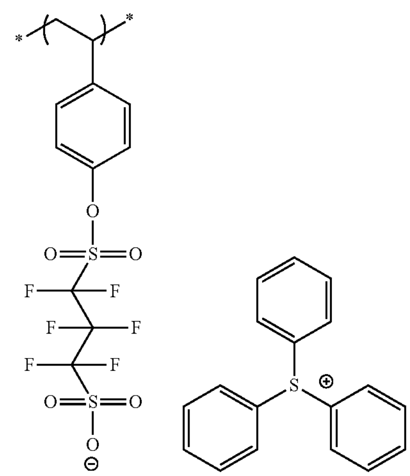
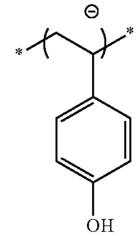
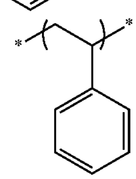
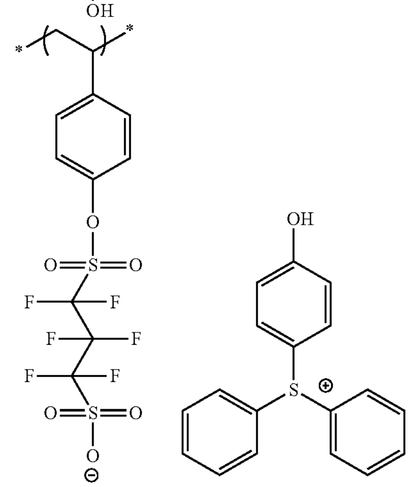

-continued
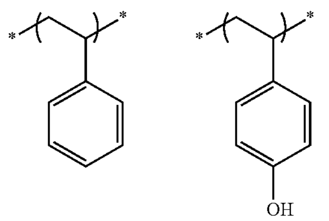
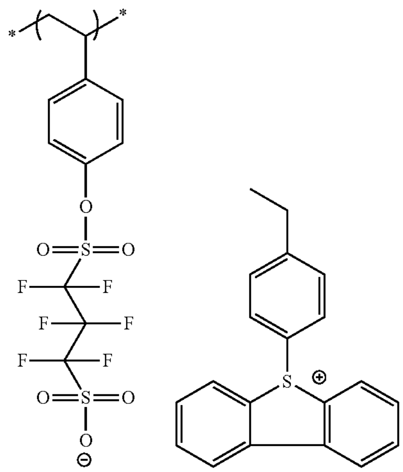
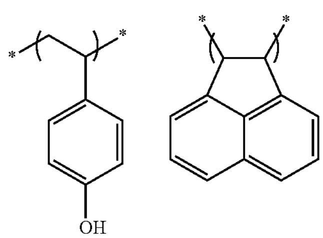
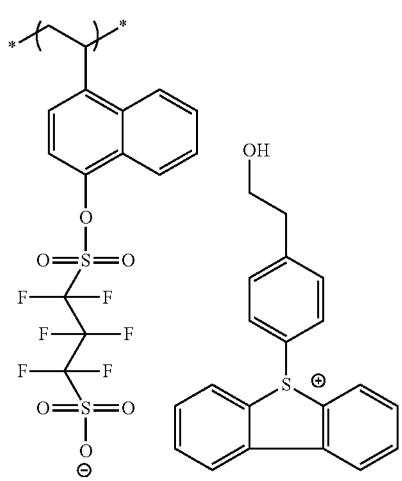
-continued
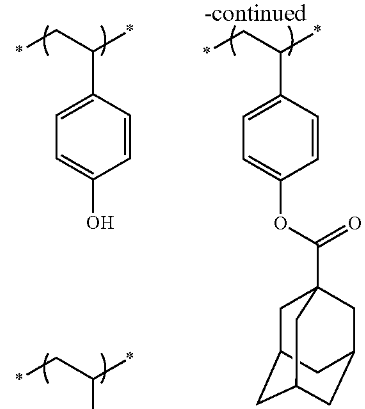
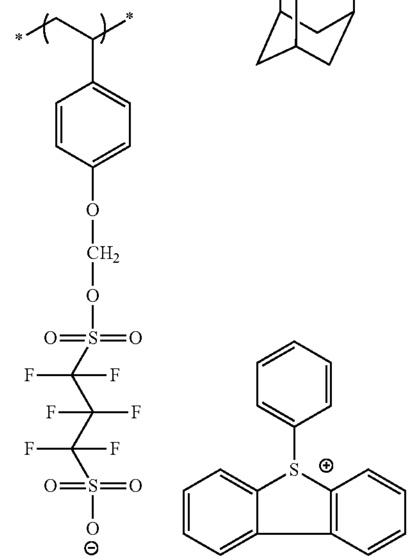
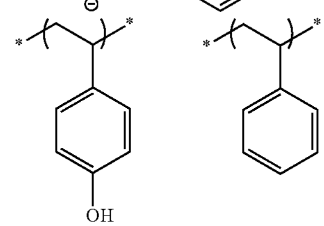
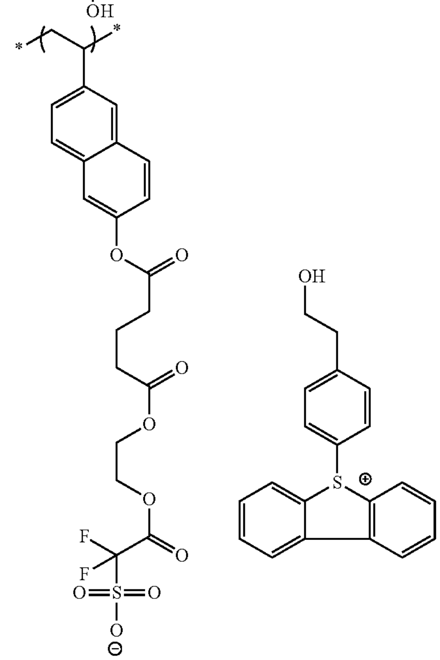

-continued
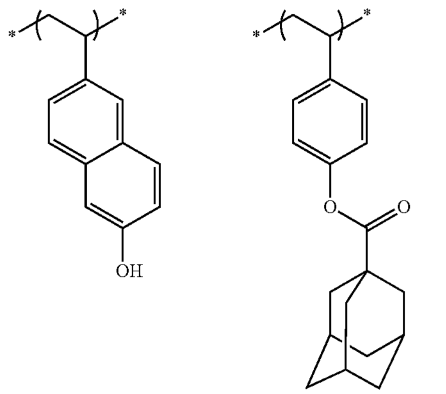
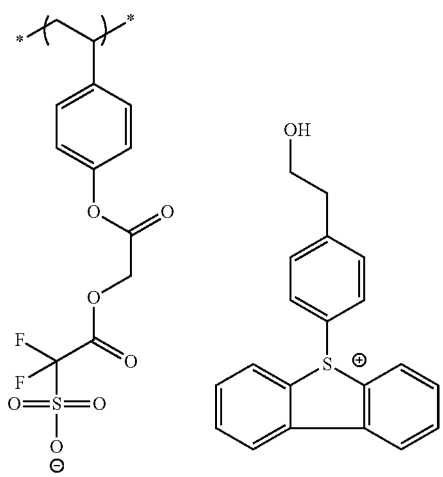
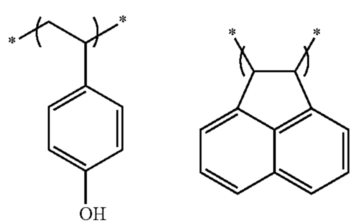
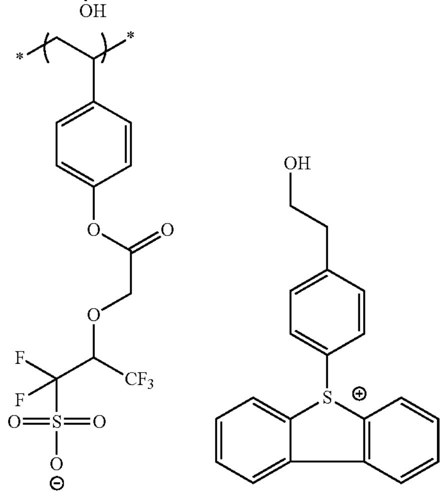
-continued
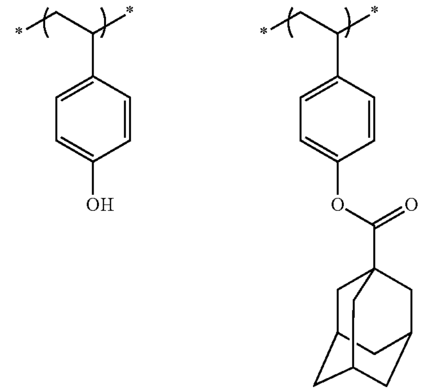
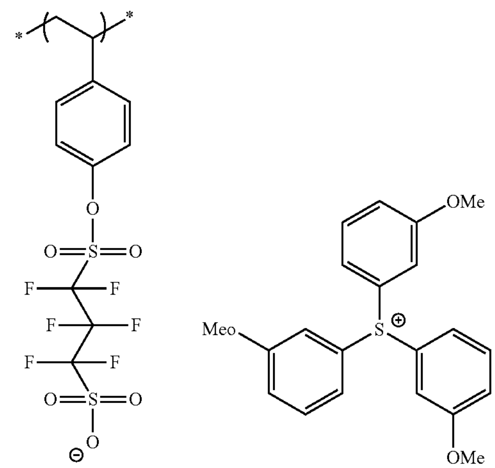
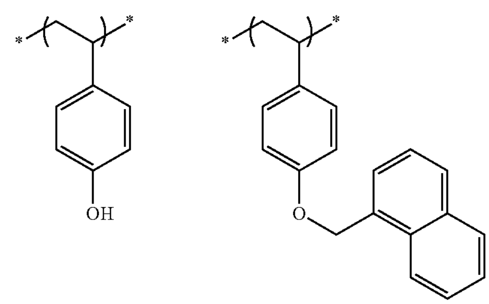
[Chem. 48]
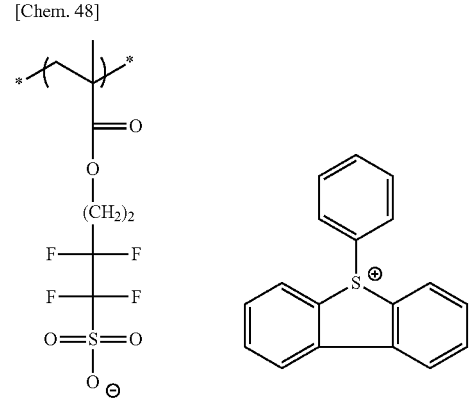

-continued
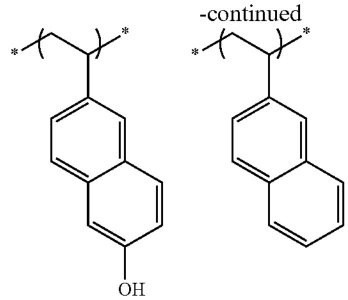
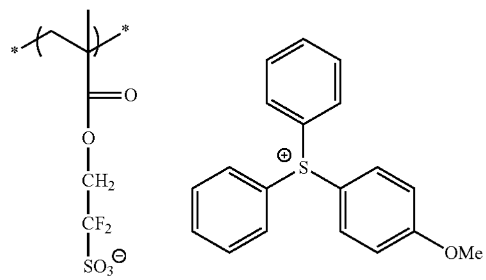
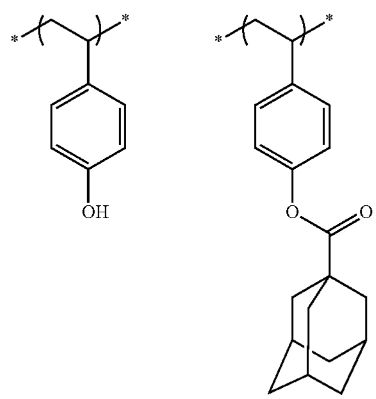
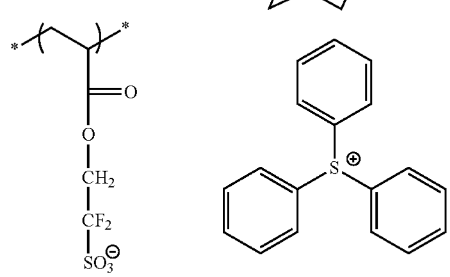
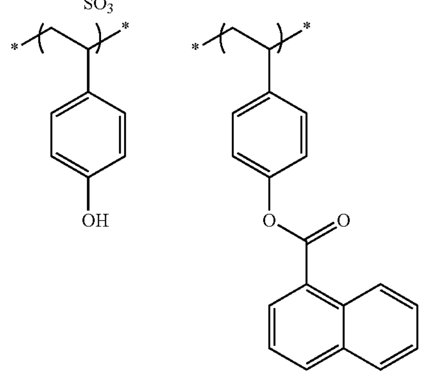
-continued
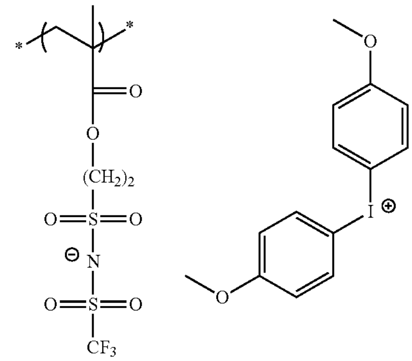
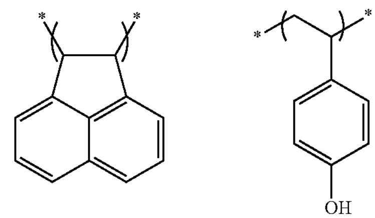
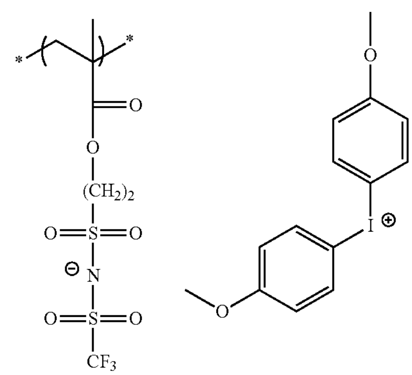
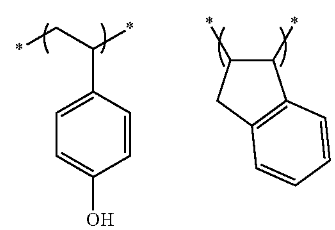
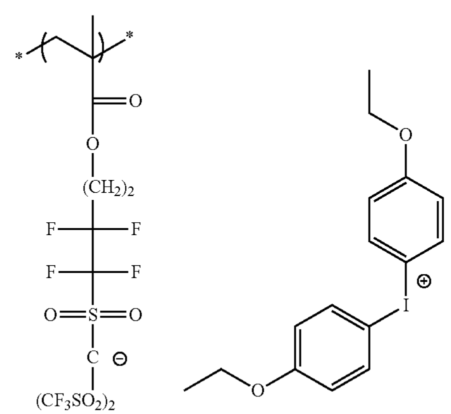

-continued
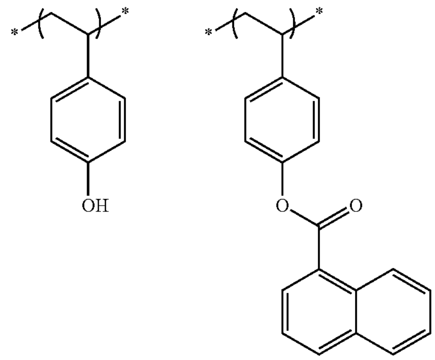
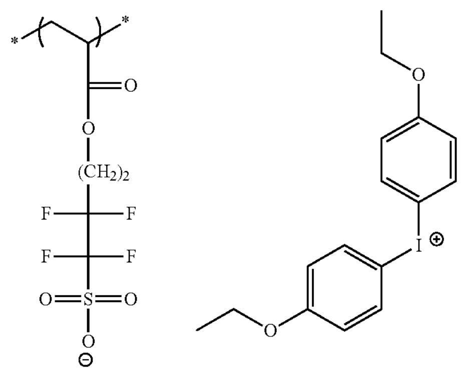
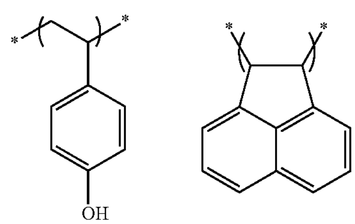
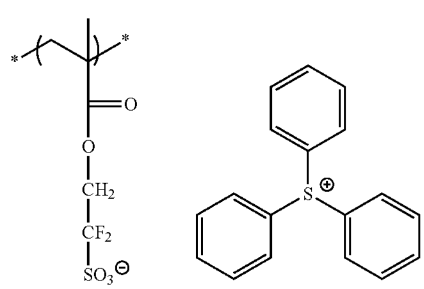
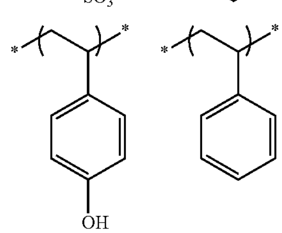
[Chem. 49]
-continued
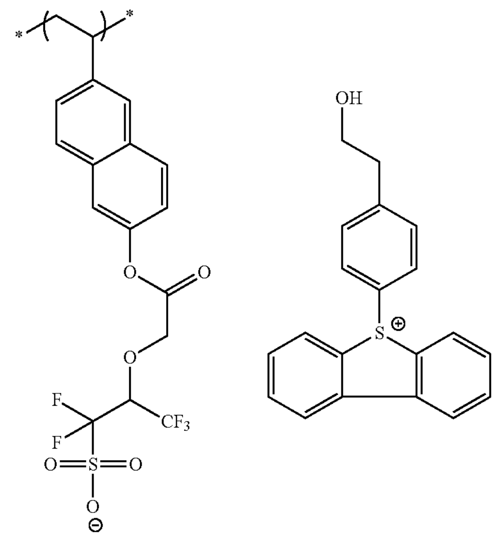
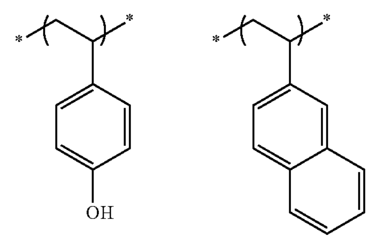
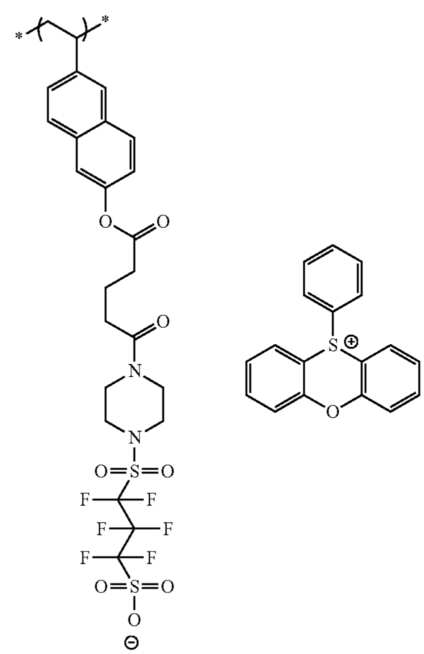
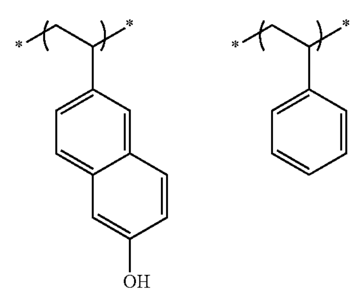

-continued
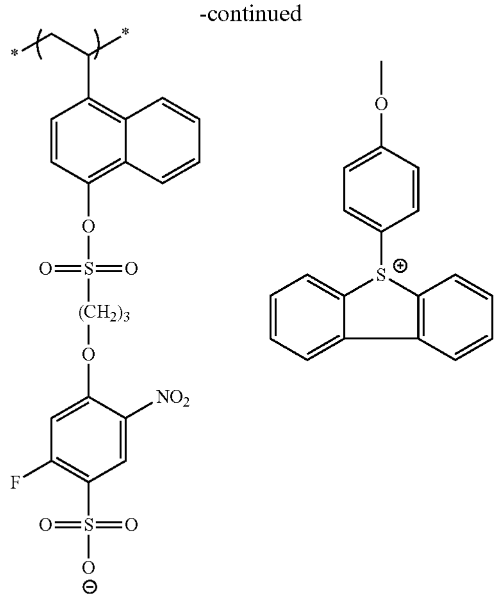
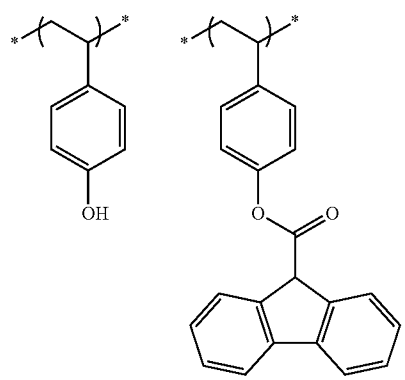
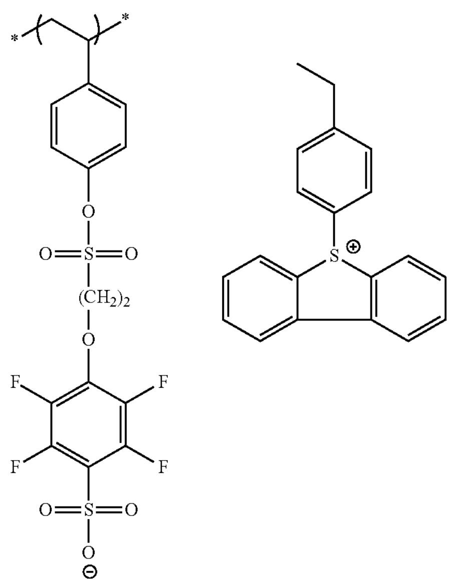
-continued
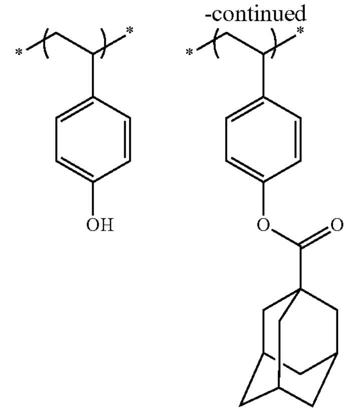
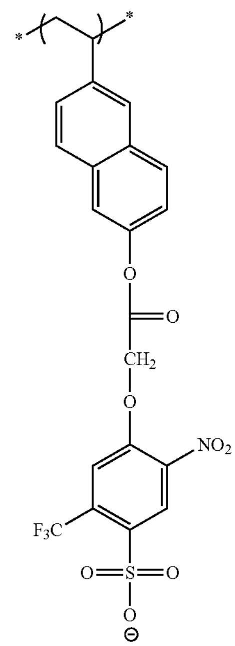
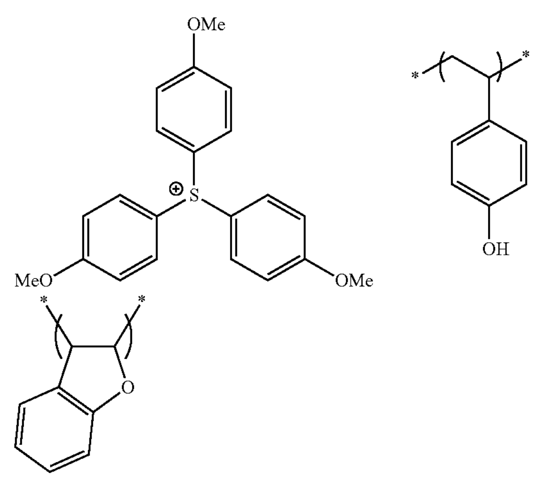

-continued
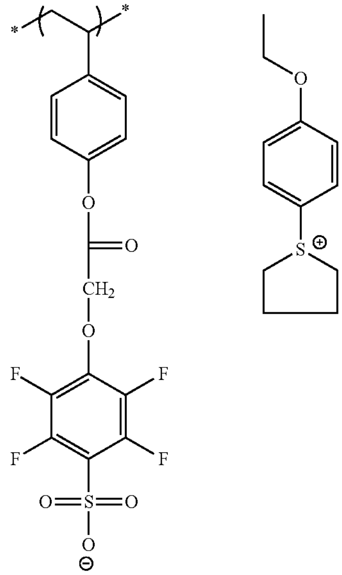
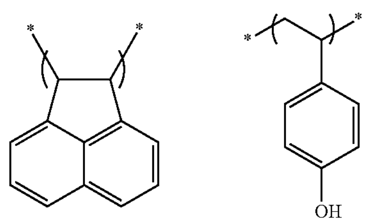
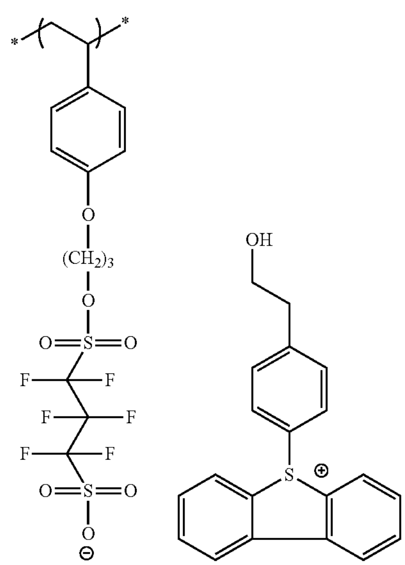
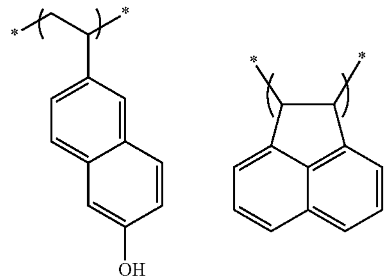
-continued
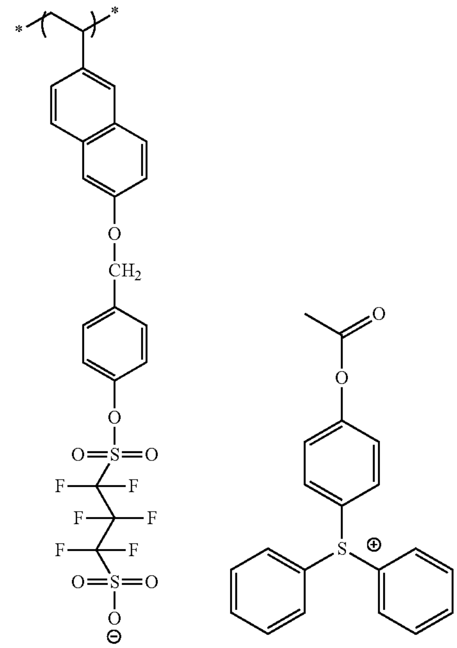
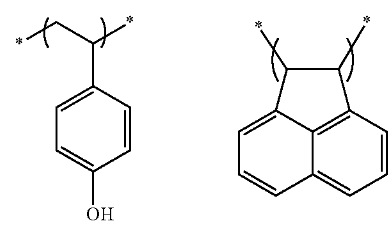
[Chem. 50]
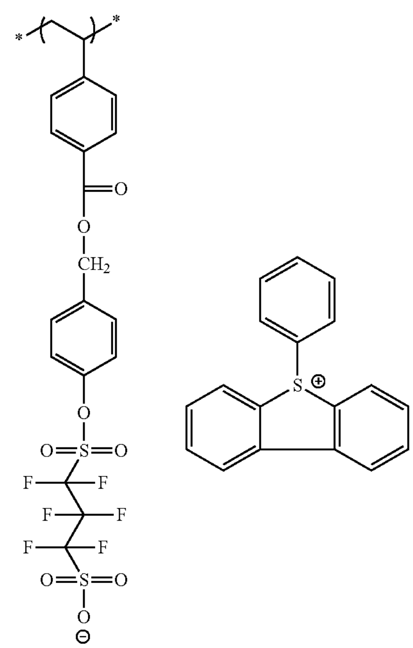

-continued
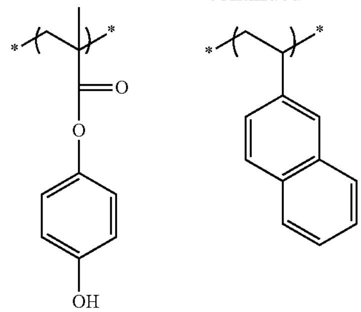
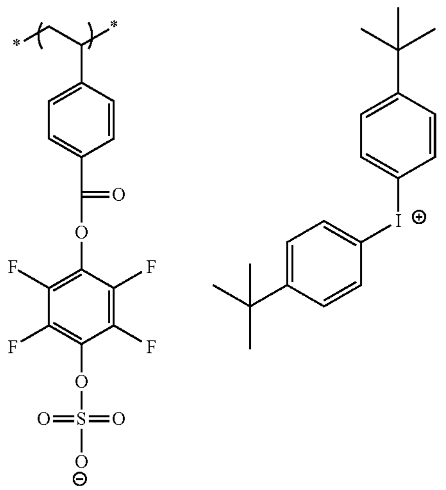
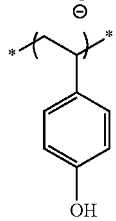
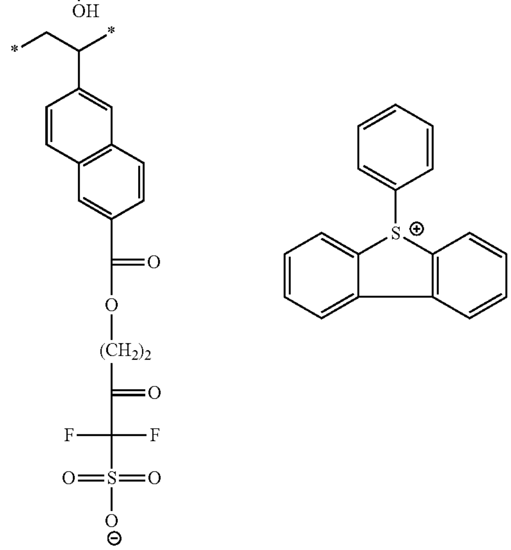
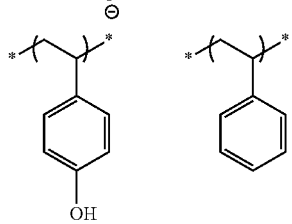
-continued
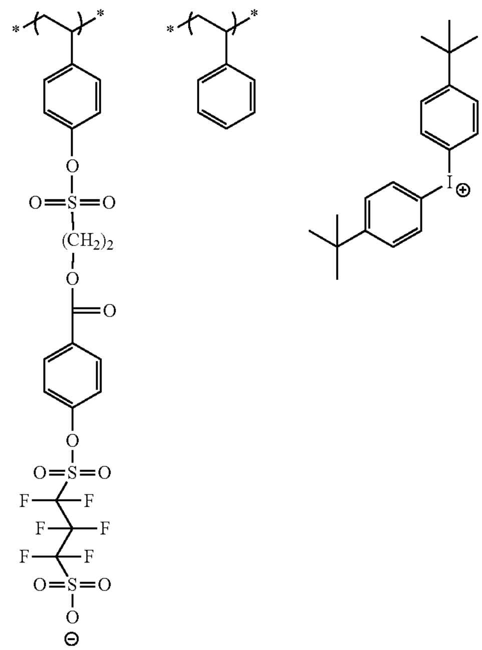
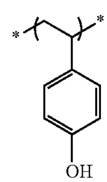
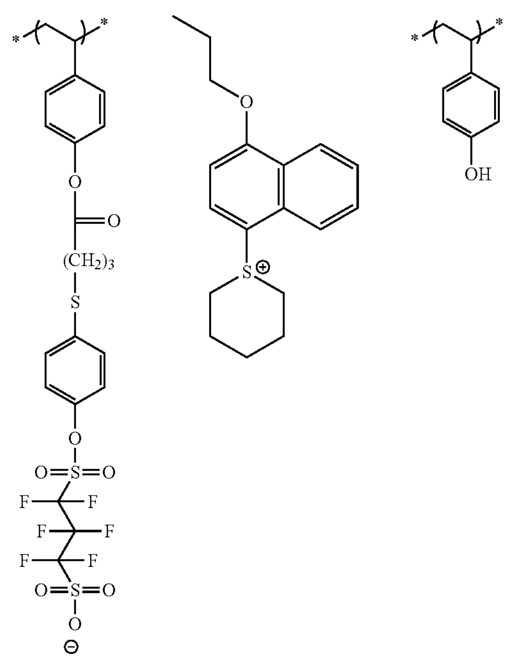

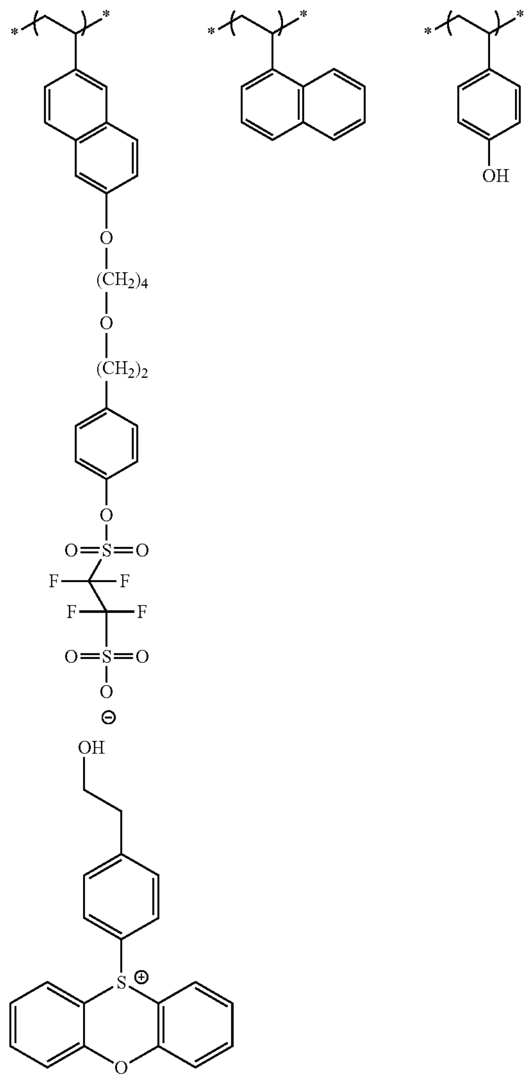
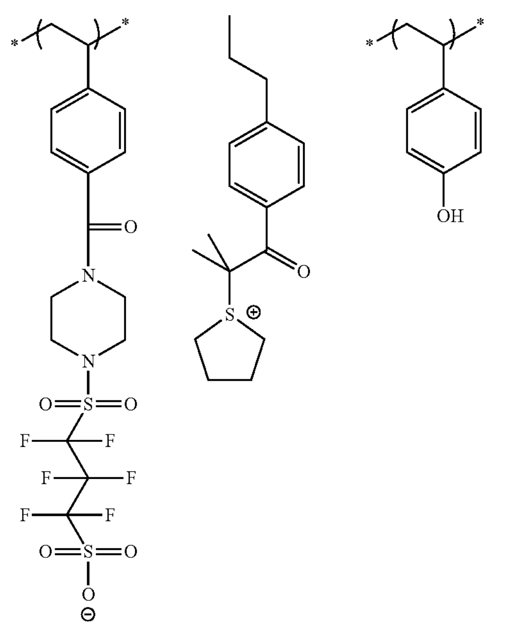
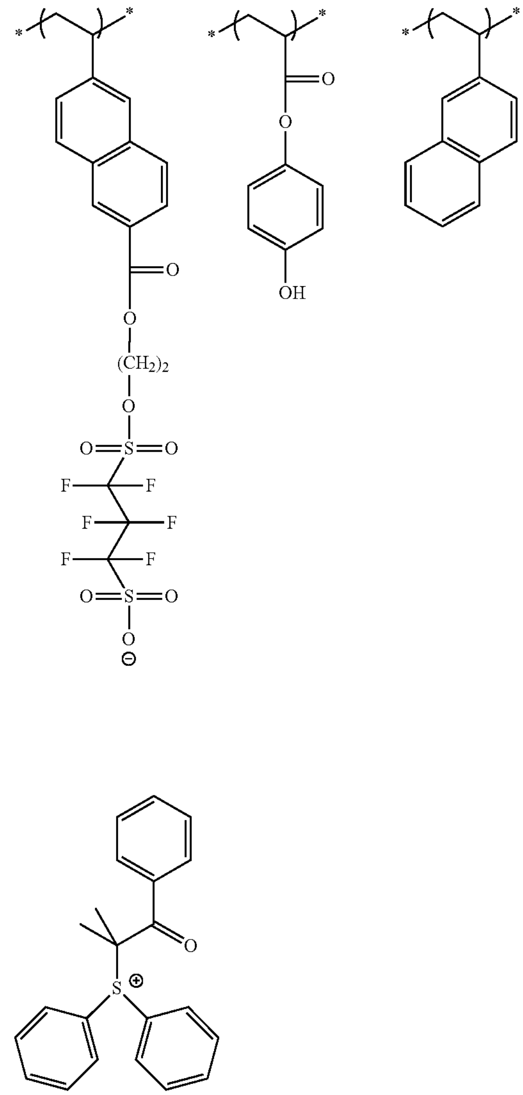
[Chem. 51]
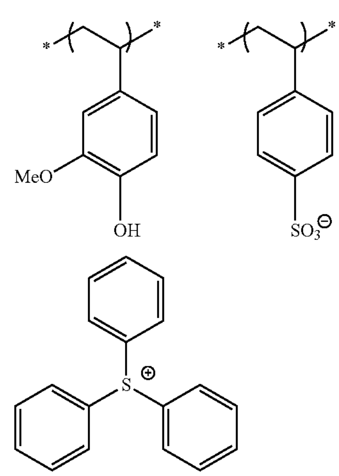

-continued
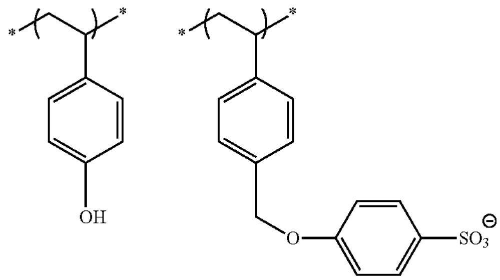
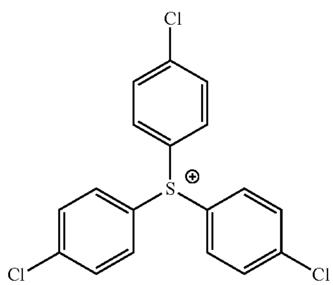
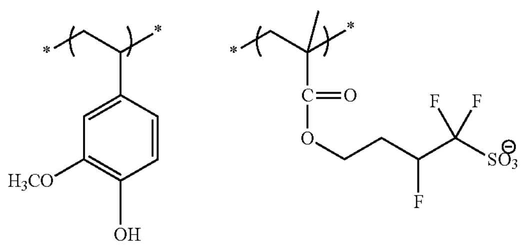
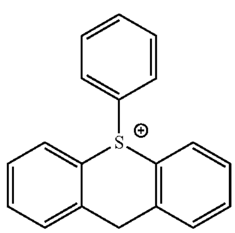
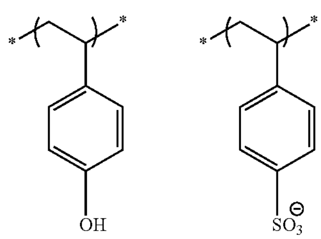
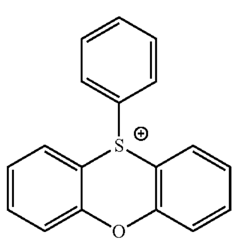
-continued
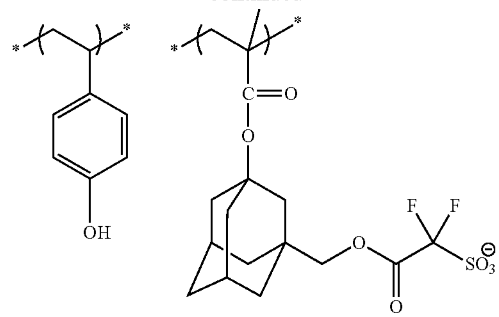
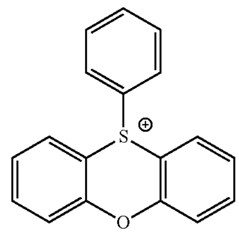
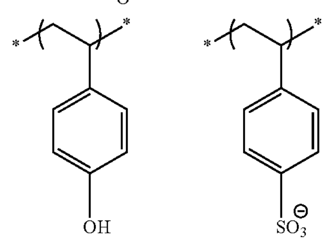
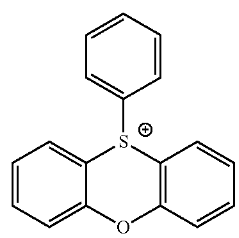
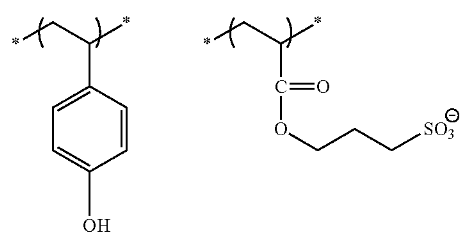
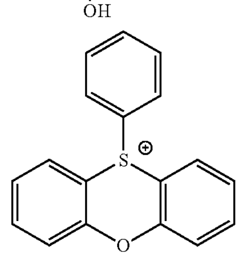
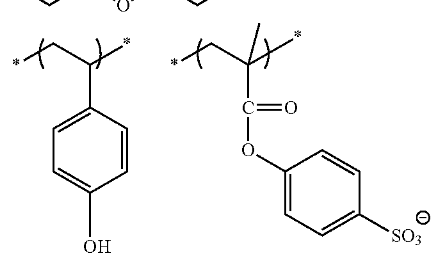

-continued
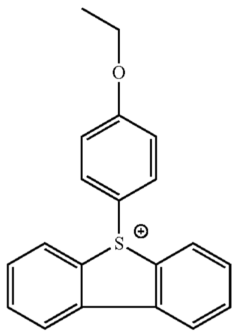
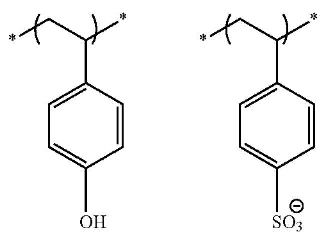
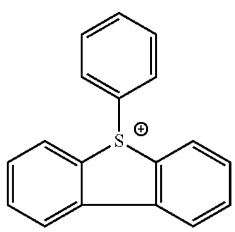
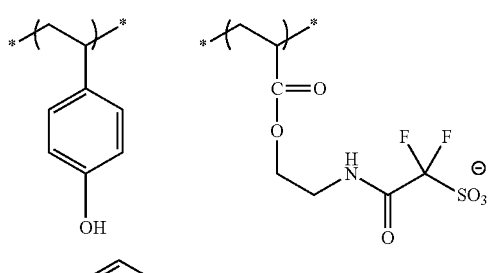
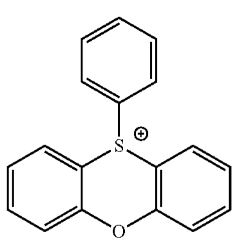
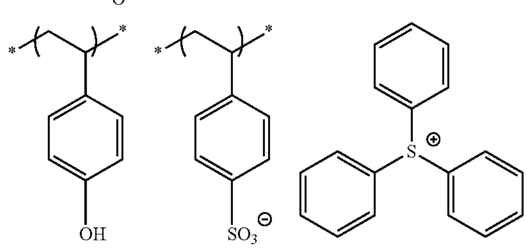
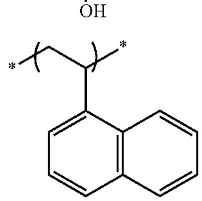
-continued
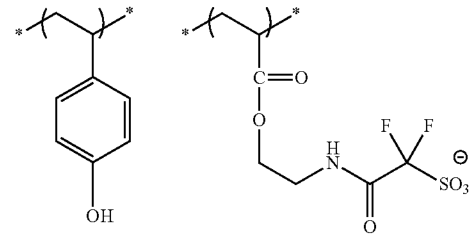
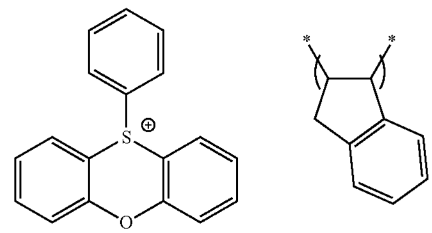
[Chem. 52]
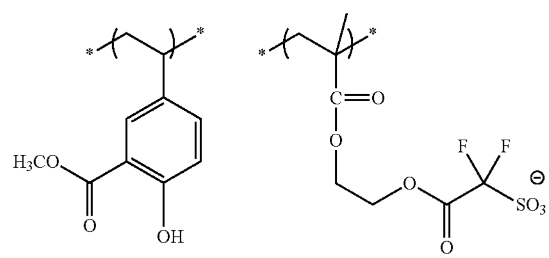
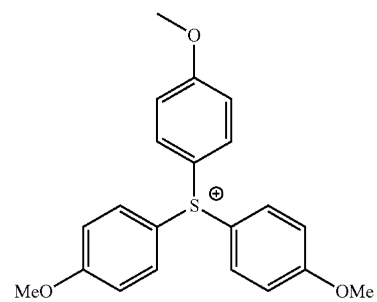
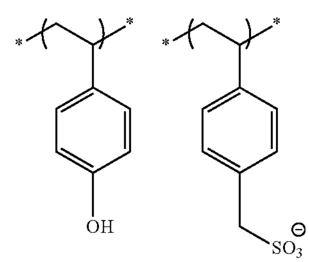
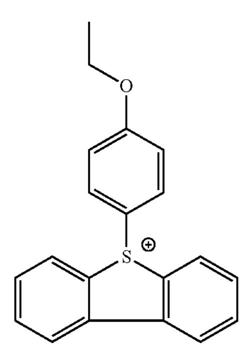

-continued
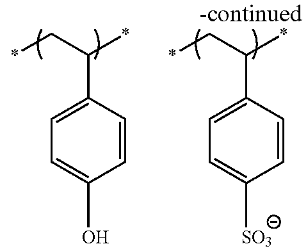
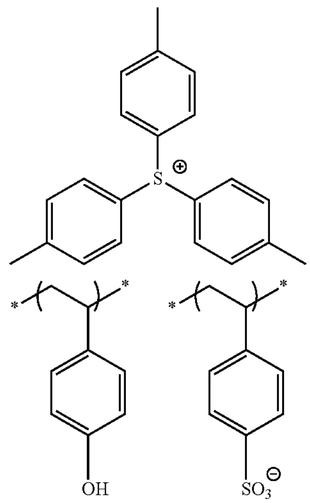
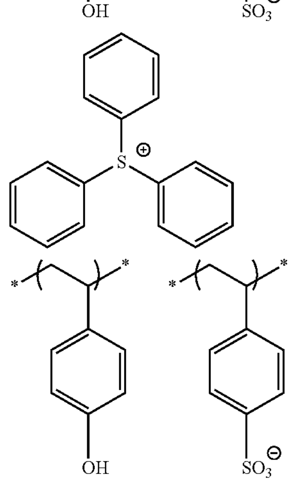
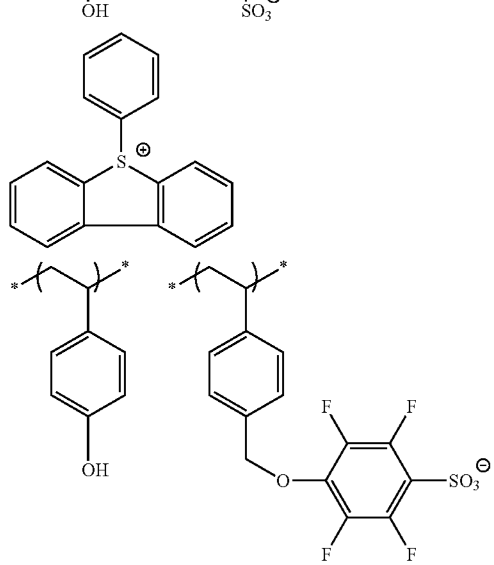
-continued
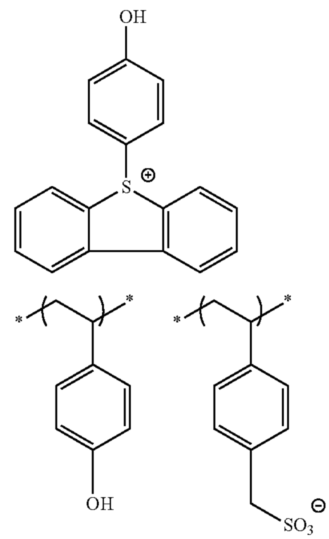
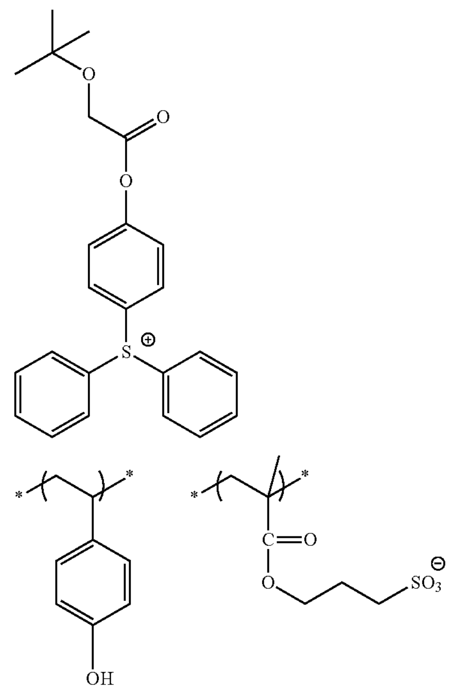
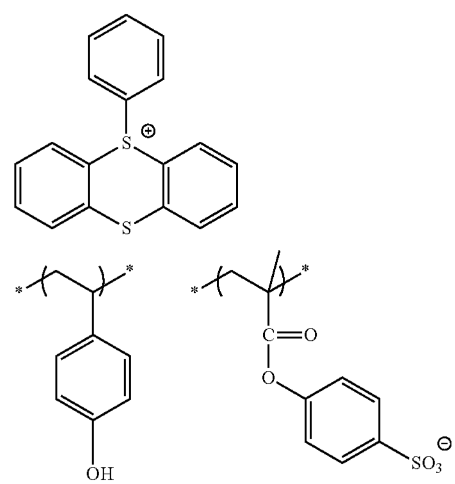

-continued
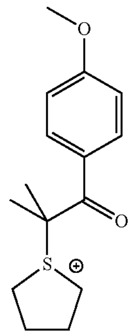
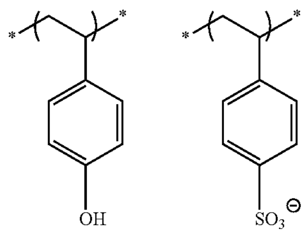
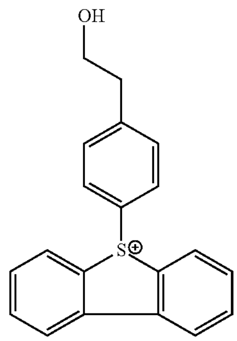
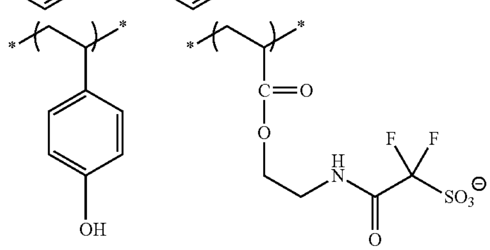
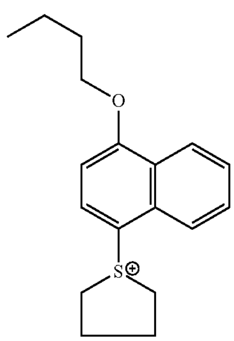
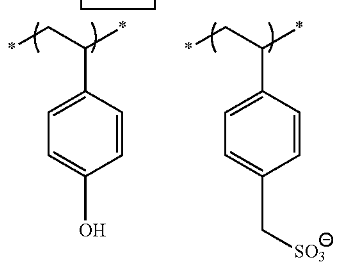
-continued
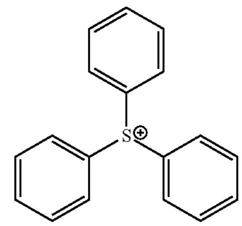
[Chem. 53]
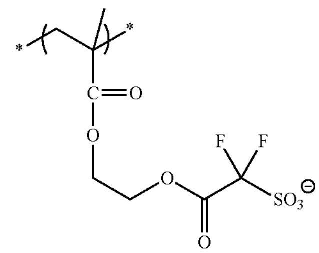
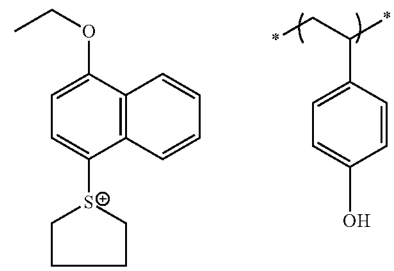
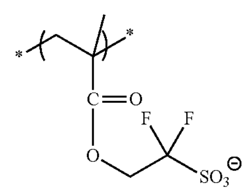
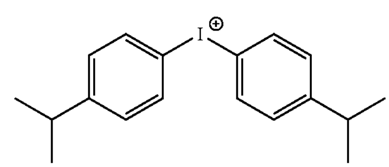
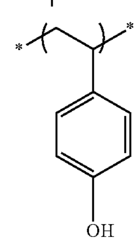
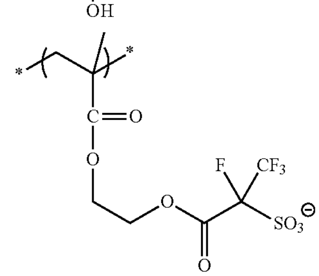

-continued
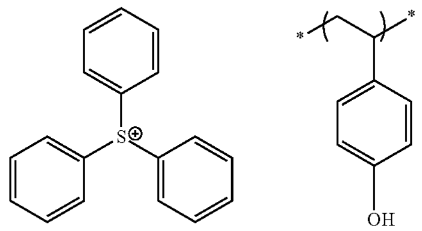
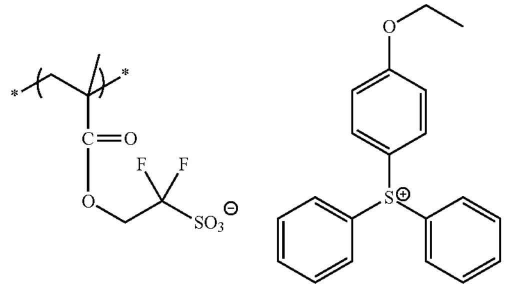
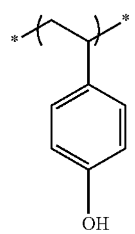
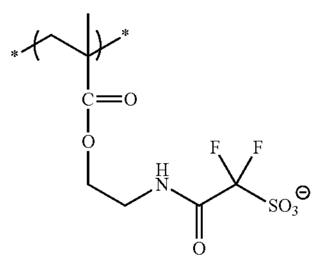
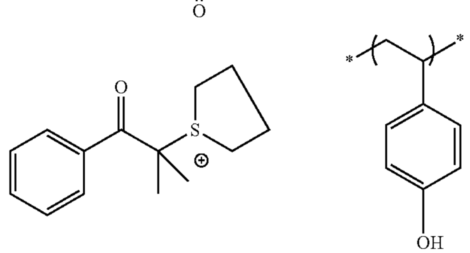
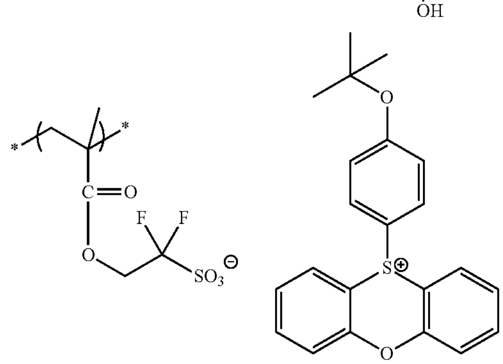
-continued
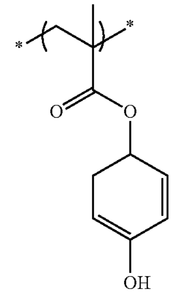
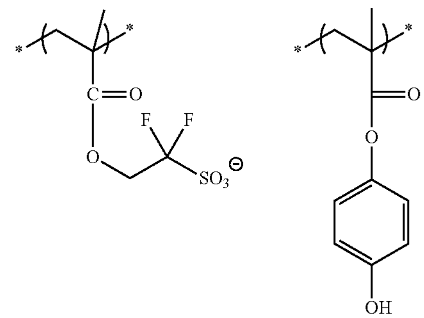
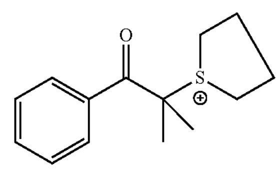
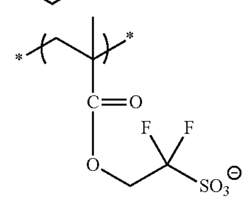
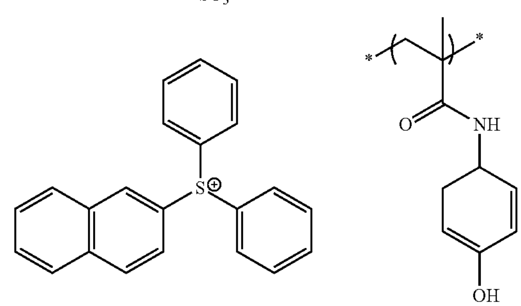
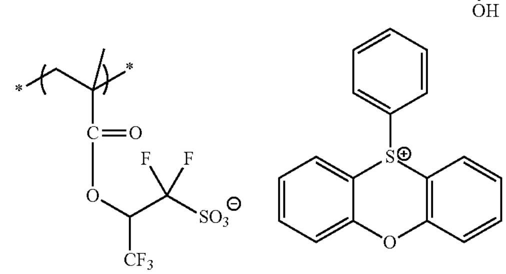

-continued
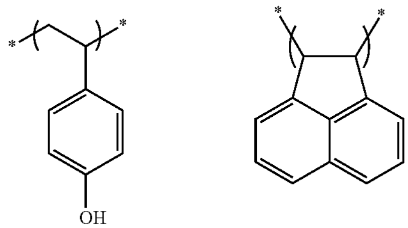
[Chem. 54]
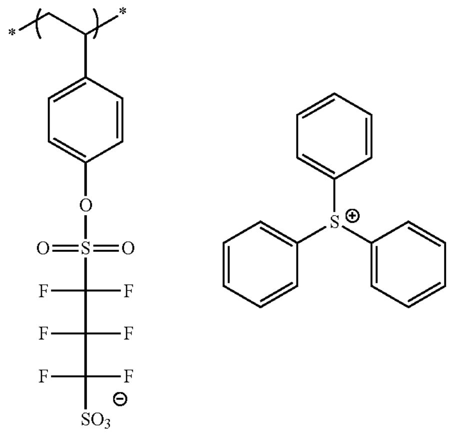
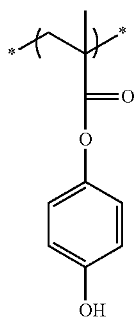
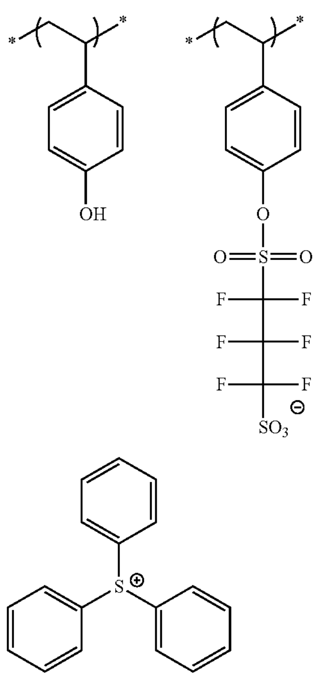
-continued
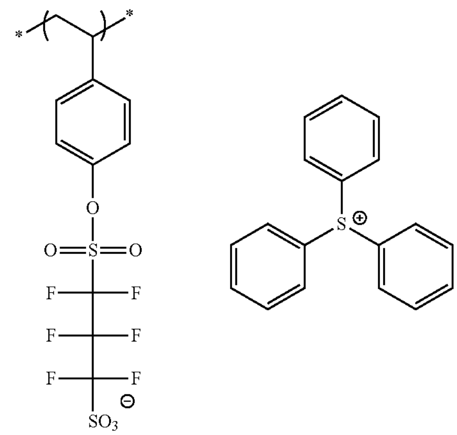
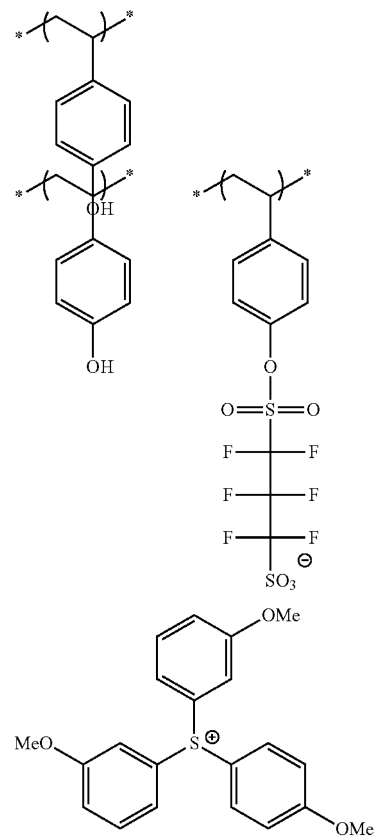
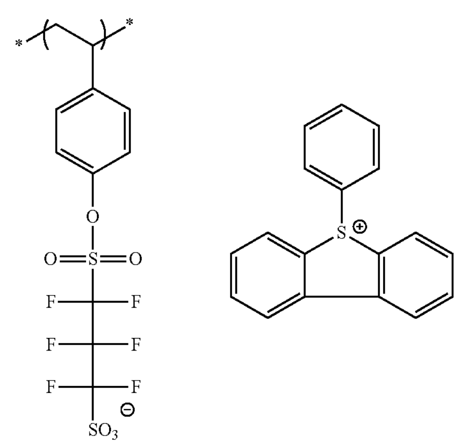

-continued
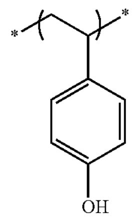
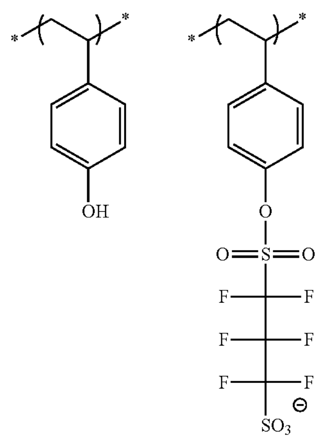
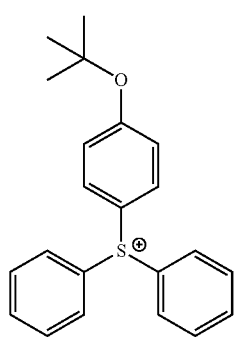
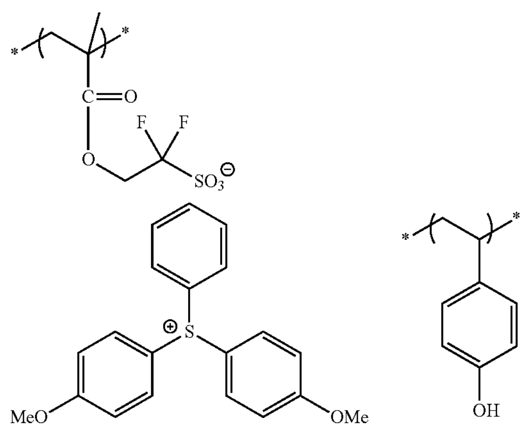
-continued
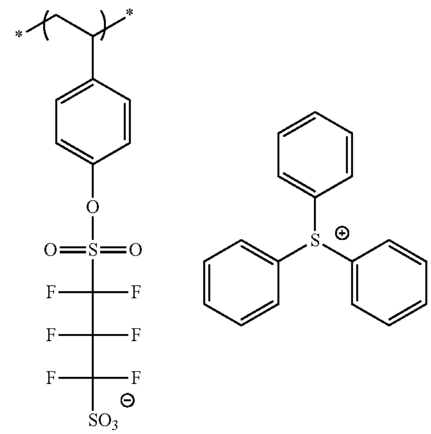
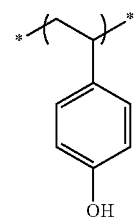
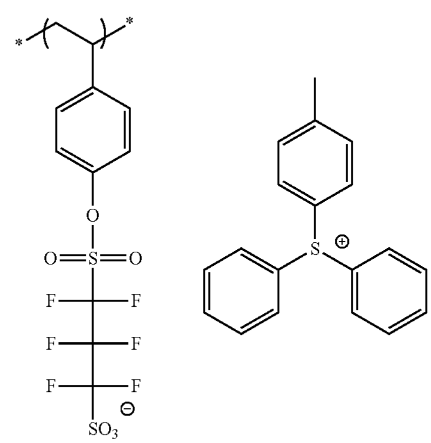
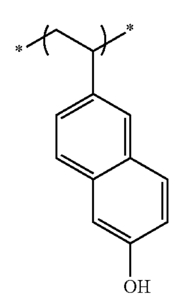

-continued
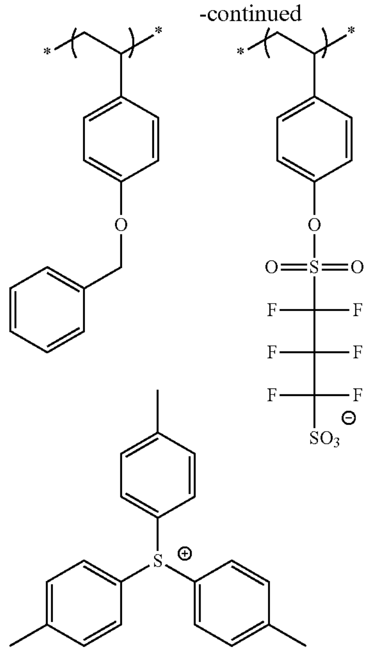
[Chem. 55]
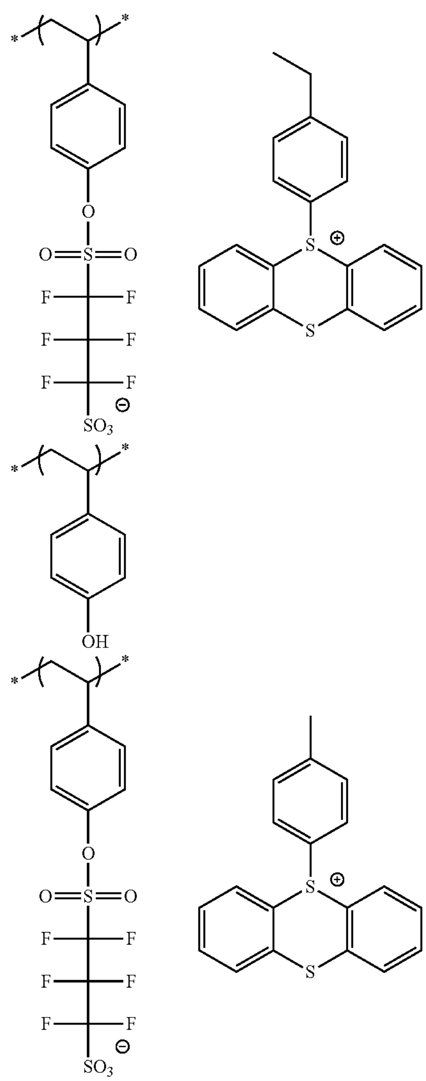
-continued
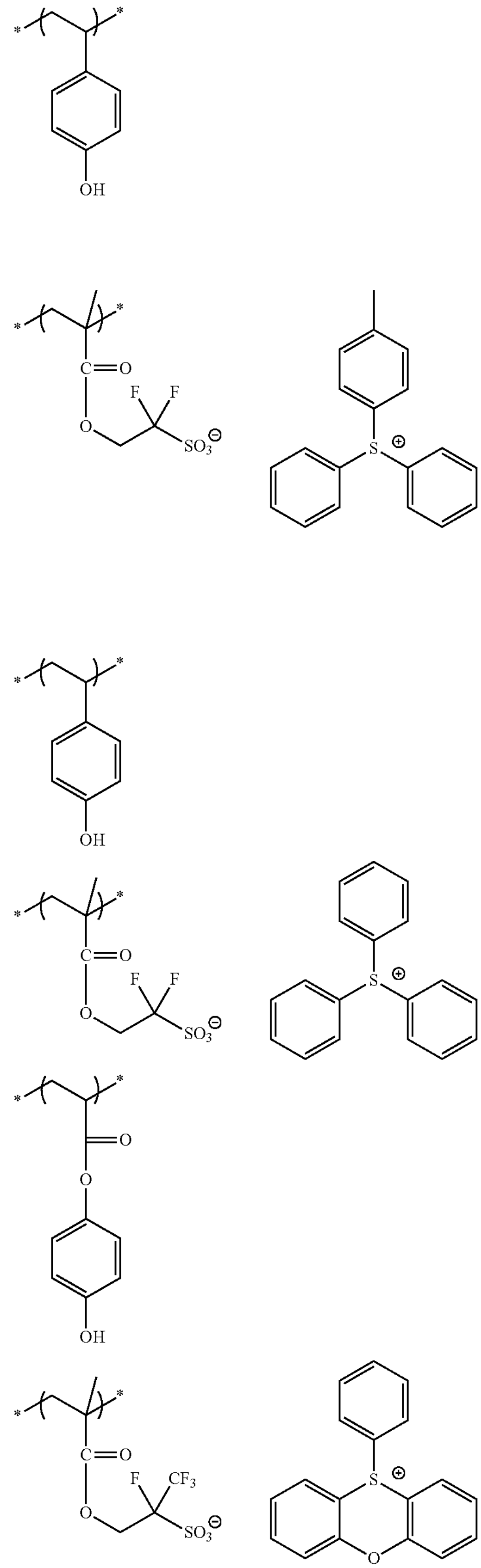

-continued
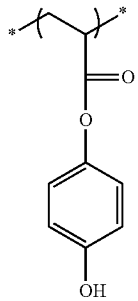
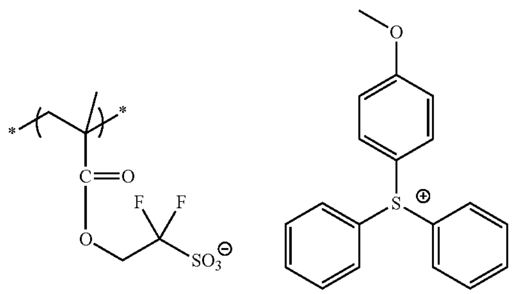
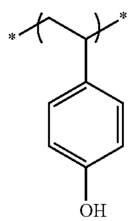
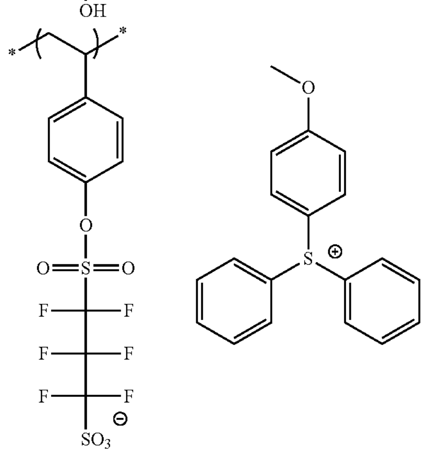
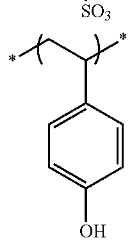
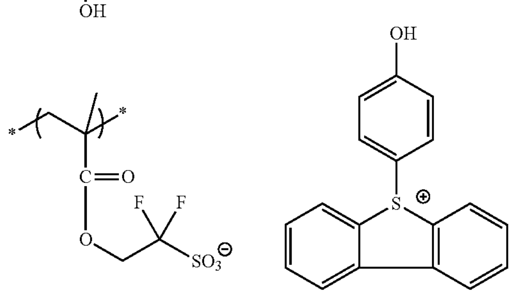
-continued
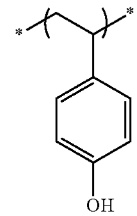
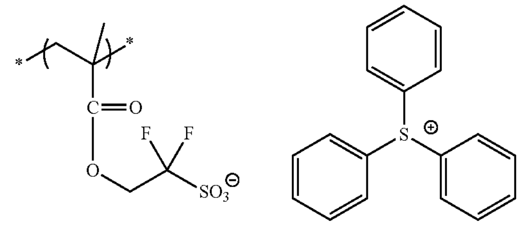
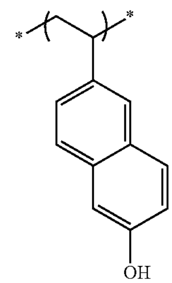
[Chem. 56]
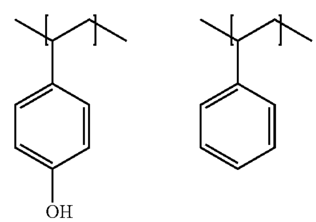
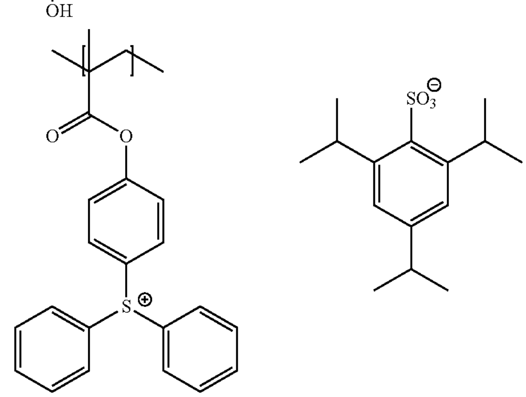
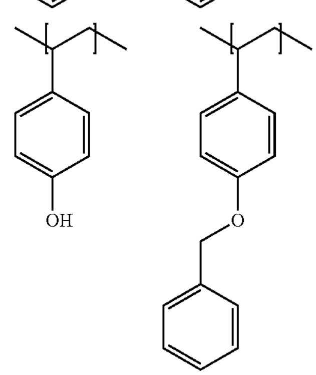

-continued
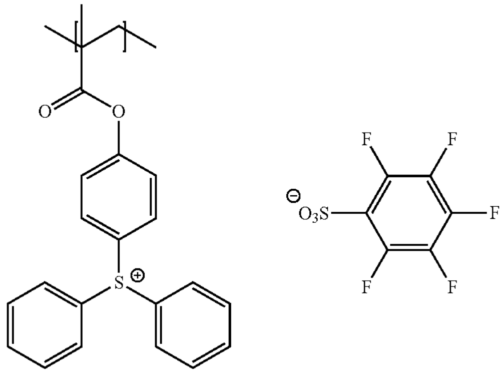
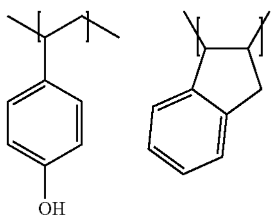
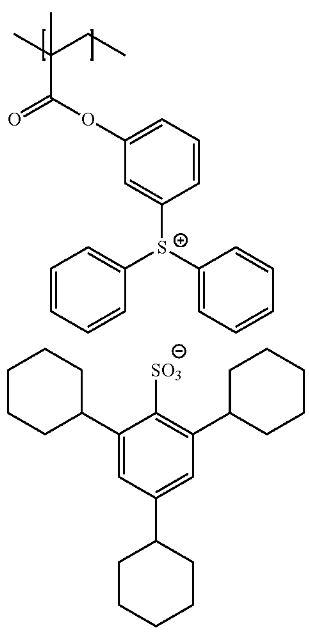
[Chem. 57]
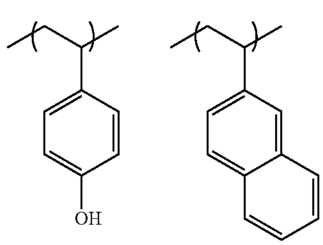
-continued
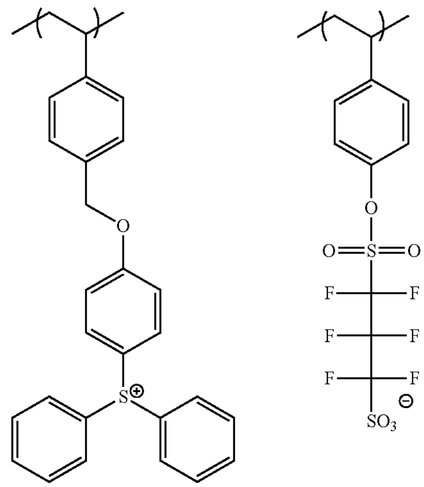
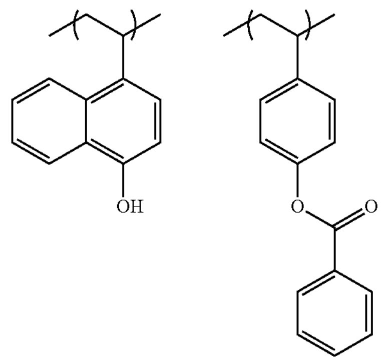
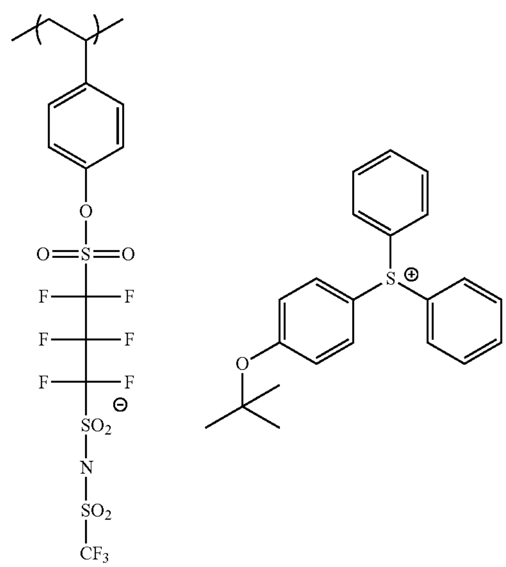
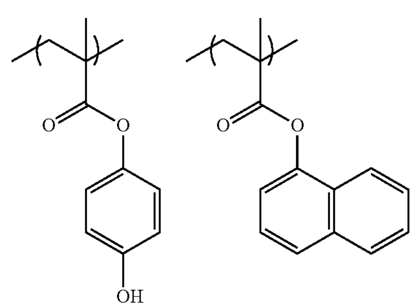

-continued

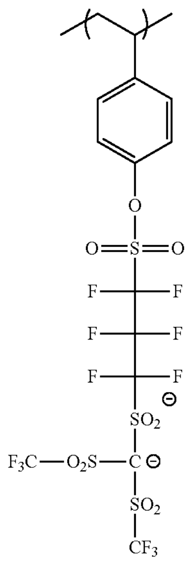

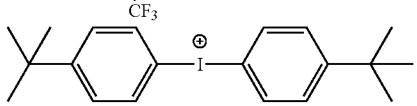

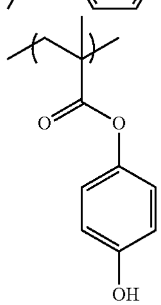

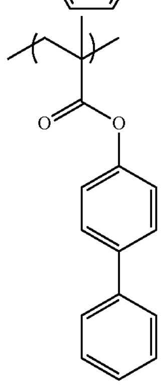

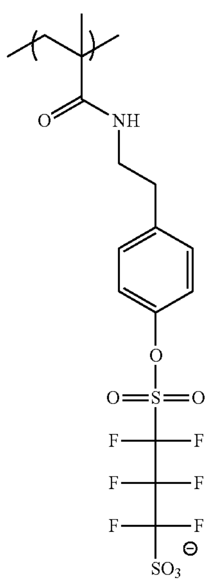

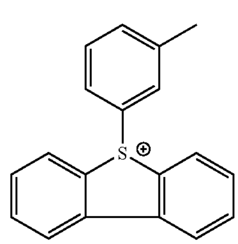

The polymer compound (A) for use in the present invention can be synthesized, for example, by radical, cationic or anionic polymerization of unsaturated monomers corresponding to respective repeating units. The polymer compound may also be synthesized by polymerizing a polymer from unsaturated monomers corresponding to precursors of respective repeating units, and modifying the synthesized polymer with a low molecular compound by a polymer reaction to cause conversion into a desired repeating unit. In either case, living polymerization such as living anionic polymerization is preferably used, because the molecular weight distribution of the obtained polymer compound becomes uniform.

The weight average molecular weight of the polymer compound (A) for use in the present invention is preferably from 1,000 to 200,000, more preferably from 2,000 to 50,000, still more preferably from 2,000 to 15,000. The polydispersity (molecular weight distribution) (Mw/Mn) of the polymer compound (A) is preferably from 1.0 to 1.7, more preferably from 1.0 to 1.3, and in view of sensitivity, still more preferably from 1.0 to 1.2. The weight average molecular weight and polydispersity of the polymer compound (A) are defined as values in terms of polystyrene by GPC measurement.

Two or more of these polymer compounds (A) may be mixed and used.

The amount added of the polymer compound (A) for use in the present invention is preferably from 30 to 95 mass %, more preferably from 50 to 90 mass %, still more preferably from 70 to 90 mass %, based on the total solid content of the composition.

[2](B) Crosslinking Agent

The negative actinic ray-sensitive or radiation-sensitive resin composition of the present contains (B) a crosslinking agent. The negative actinic ray-sensitive or radiation-sensitive resin composition of the present invention preferably contains, as the crosslinking agent (B), a compound capable of crosslinking the polymer compound (A) by the action of an acid (hereinafter, sometimes referred to as "acid crosslinking agent" or simply as "crosslinking agent").

The crosslinking agent is preferably a compound having, as a crosslinking group, two or more hydroxymethyl groups or alkoxymethyl groups in the molecule.

Preferred crosslinking agents include hydroxymethylated or alkoxymethylated phenol compounds, alkoxymethylated melamine-based compounds, an alkoxymethyl glycoluril-based compounds, and acyloxymethylated urea-based compounds. Hydroxymethylated or alkoxymethylated phenol compounds, alkoxymethylated melamine-based compounds and alkoxymethyl glycohluril-based compounds are more preferred, and hydroxymethylated or alkoxymethylated phenol compounds are most preferred in view of pattern profile.

Particularly preferred crosslinking agents (B) include a phenol derivative having a molecular weight of 1,200 or less and containing from 3 to 5 benzene rings in the molecule and a total of two or more hydroxymethyl groups or alkoxymethyl groups, a melamine-formaldehyde derivative having at least two free N-alkoxymethyl groups, and an alkoxymethyl glycoluril derivative.

The alkoxymethyl group is preferably a methoxymethyl group or an ethoxymethyl group.

Out of the crosslinking agents above, the phenol derivative having a hydroxymethyl group can be obtained by reacting a corresponding phenol compound having no hydroxymethyl group with formaldehyde in the presence of a base catalyst. Also, the phenol derivative having an alkoxymethyl group can be obtained by reacting a corresponding phenol derivative having a hydroxymethyl group with an alcohol in the presence of an acid catalyst.

Among the thus-synthesized phenol derivatives, a phenol derivative having an alkoxymethyl group is preferred in view of sensitivity, storage stability and pattern profile.

Other preferred examples of the crosslinking agent include alkoxymethylated melamine-based compounds, alkoxymethyl glycoluril-based compounds, and compounds having an N-hydroxymethyl group or an N-alkoxymethyl group, such as alkoxymethylated urea-based compound.

Such a compound include hexamethoxymethylmelamine, hexacthoxymethylmelamine, tetramethoxymethyl glycoluril, 1,3-bismethoxymethyl-4,5-bismethoxyethyleneurea, bismethoxymethylurea, and the like, and these are disclosed in EP 0,133,216A, German Patents 3,634,671 and U.S. Pat. No. 3,711,264, and EP 0,212,482A.

Among these crosslinking agents, particularly preferred are those illustrated below.

[Chem. 58]

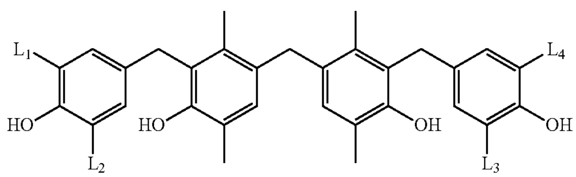
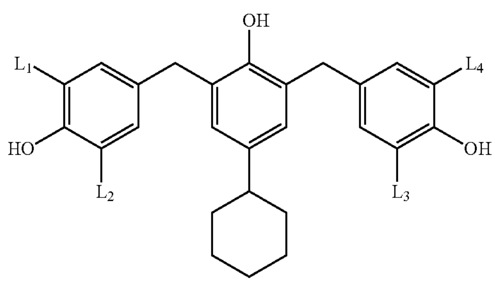
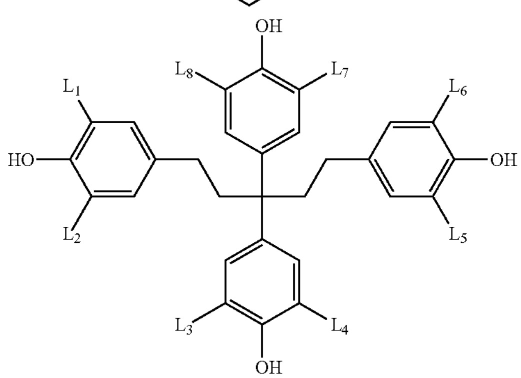
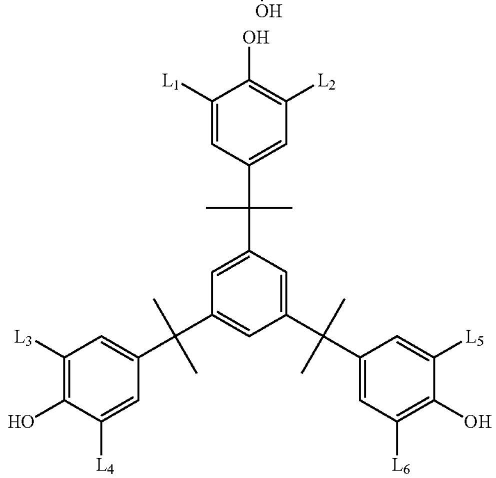

-continued

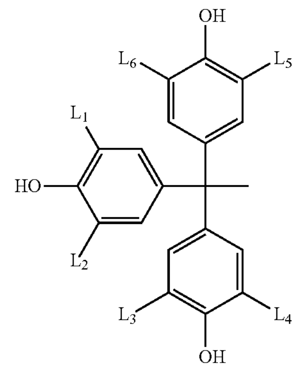
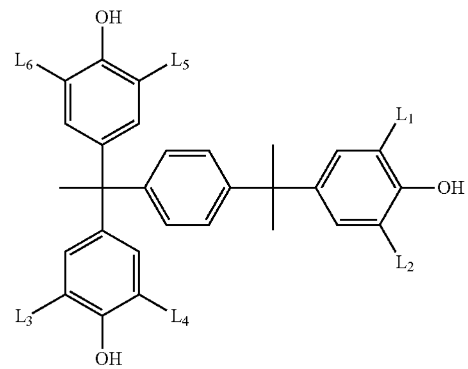
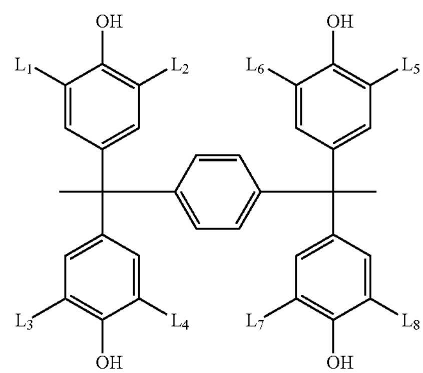
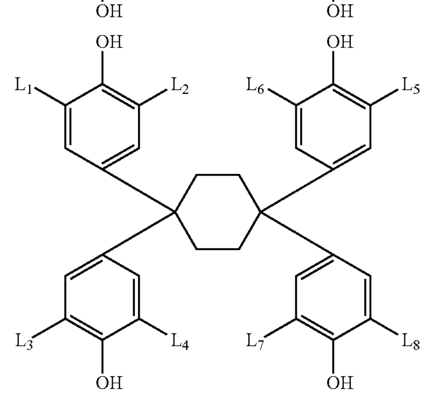
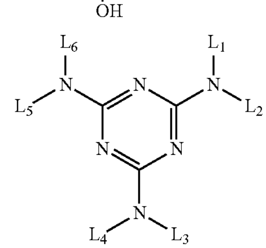
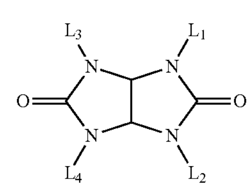

-continued

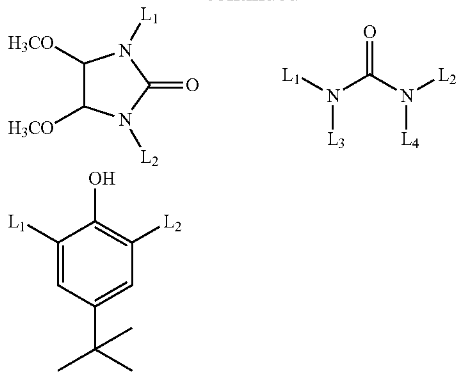

In these formulae, each of $L_1$ to $L_8$ independently represents a hydrogen atom, a hydroxymethyl group, a methoxymethyl group, an ethoxymethyl group, or an alkyl group having a carbon number of 1 to 6.

In the present invention, the crosslinking agent is used in an amount added of preferably from 3 to 40 mass %, more preferably from 5 to 30 mass %, based on the solid content of the negative actinic ray-sensitive or radiation-sensitive resin composition. When the amount of the crosslinking agent added is from 3 to 40 mass %, the residual film ratio and the resolution can be prevented from decreasing and at the same time, good stability can be kept during storage of the resist solution.

In the present invention, one kind of a crosslinking agent may be used alone, or two or more kinds of crosslinking agents may be used in combination and in view of the pattern profile, two or more kinds of crosslinking agents are preferably used in combination.

For example, in the case of using the phenol derivative and additionally using another crosslinking agent, for example, the above-described compound having an N-alkoxymethyl group, in combination, the ratio between the phenol derivative and another crosslinking agent is, in terms of molar ratio, from 100/0 to 20/80, preferably from 90/10 to 40/60, more preferably from 80/20 to 50/50.

It is also preferred to use two or more different phenol derivatives in combination, and from the standpoint of reducing scum, two or more kinds of phenol derivatives having a hydroxymethyl group or an alkoxymethyl group are preferably used in combination, because the dissolution rate can be appropriately adjusted. Furthermore, a combination of two or more kinds of phenol derivatives including at least a phenol derivative having a tetrafunctional or higher functional alkoxymethyl group and a phenol derivative having a bifunctional or higher functional alkoxymethyl group, is most preferred in view of crosslinking efficiency.

[3](C) Compound Capable of Generating an Acid Upon Irradiation with an Actinic Ray or Radiation The negative actinic ray-sensitive or radiation-sensitive resin composition of the present invention may contain (C) a compound capable of generating an acid upon irradiation with an actinic ray or radiation (hereinafter, sometimes referred to as "acid generator (C)"), other than the polymer compound (A) above.

A preferred embodiment of the acid generator (C) is an onium compound. The onium compound includes, for example, a sulfonium salt, an iodonium salt, and a phosphonium salt.

Another preferred embodiment of the acid generator (C) is a compound capable of generating a sulfonic acid, an imide acid or a methide acid upon irradiation with an actinic ray or radiation. The acid generator in this embodiment includes, for example, a sulfonium salt, an iodonium salt, a phosphonium salt, an oxime sulfonate, and an imidosulfonate.

The acid generator (C) usable in the present invention is not limited to a low molecular compound, and a compound where a group capable of generating an acid upon irradiation with an actinic ray or radiation is introduced into the main or side chain of a polymer compound, may also be used.

The acid generator (C) is preferably a compound capable of generating an acid upon irradiation with an electron beam or an extreme-ultraviolet ray.

Preferred onium compounds include a sulfonium compound represented by the following formula (1) and an iodonium compound represented by formula (2):

[Chem. 59]

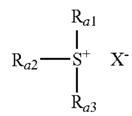

(1)

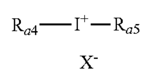

(2)

In formulae (1) and (2), each of $Ra_1$, $Ra_2$, $Ra_3$, $Ra_4$ and $Ra_5$ independently represents an organic group.

X' represents an organic anion.

The sulfonium compound represented by formula (1) and the iodonium compound represented by formula (2) are described in more detail below.

Each of $Ra_1$ to $Ra_3$ in formula (1) and $Ra_4$ and $Ra_5$ in formula (2) independently represents an organic group, but each of at least one of $Ra_1$ to $Ra_3$ and at least one of $Ra_4$ and $Ra_5$ is preferably an aryl group. The aryl group is preferably a phenyl group or a naphthyl group, more preferably a phenyl group.

The organic anion of X' in formulae (1) and (2) includes, for example, a sulfonate anion, a carboxylate anion, a bis(alkylsulfonyl)amide anion, and a tris(alkylsulfonyl)methide anion. The organic anion is preferably an organic anion represented by the following formula (3), (4) or (5), more preferably an organic anion represented by the following formula (3):

[Chem. 60]

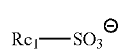

(3)

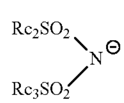

(4)

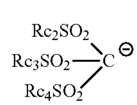

(5)

In formulae (3), (4) and (5), each of $Rc_1$, $Rc_2$, $Rc_3$ and $Rc_4$ represents an organic group.

The organic anion of X' corresponds to a sulfonic acid, an imide acid, a methide acid or the like, which are an acid generated upon irradiation with an actinic ray or radiation such as electron beam and extreme-ultraviolet ray.

The organic group of $Rc_1$ to $Rc_4$ includes, for example, an alkyl group, a cycloalkyl group, an aryl group, and a group formed by combining a plurality of these groups. Among these organic groups, an alkyl group substituted with a fluorine atom or a fluoroalkyl group at the 1-position, a cycloalkyl group substituted with a fluorine atom or a fluoroalkyl group, and a phenyl group substituted with a fluorine atom or a fluoroalkyl group are preferred. A plurality of the organic groups of $R_{c2}$ to $R_{c4}$ may combine with each other to form a ring, and the group formed by combining a plurality of these organic groups is preferably an alkylene group substituted with a fluorine atom or a fluoroalkyl group. By virtue of containing a fluorine atom or a fluoroalkyl group, the acidity of the acid generated upon irradiation with light rises and in turn, the sensitivity is enhanced. However, a fluorine atom is preferably not contained as a substituent in the terminal group.

From the standpoint of improving the resolution and pattern profile by preventing the acid generated upon exposure from diffusing into the unexposed area, the compound (C) capable of generating an acid is preferably a compound capable of generating an acid having a size of 130 $Å^3$ or more in volume (preferably a sulfonic acid), more preferably a compound capable of generating an acid having a size of 190 $Å^3$ or more in volume (preferably a sulfonic acid), still more preferably a compound capable of generating an acid having a size of 230 $Å^3$or more in volume (preferably a sulfonic acid), yet still more preferably a compound capable of generating an acid having a size of 270 $Å^3$ or more in volume (preferably a sulfonic acid), even yet still more preferably a compound capable of generating an acid having a size of 400 $Å^3$ or more in volume (preferably a sulfonic acid). However, in view of sensitivity and solubility in the coating solvent, the volume above is preferably 2,000 $Å^3$ or less, more preferably 1,500 $Å^3$ or less. This volume value is determined using "WinMOPAC" produced by Fujitsu Limited. That is, first, the chemical structure of the acid according to each example is input, and next, using this structure as the initial structure, the most stable conformation of each acid is determined by molecular force field calculation using an MM3 method. Thereafter, with respect to the most stable conformation, molecular orbital calculation using a PM3 method is performed, whereby the "accessible volume" of each acid can be computed.

Particularly preferred examples of the acid generator (C) are illustrated below. In some of these examples, a computed volume value (unit: $Å^3$) is shown together. The computed value determined here is a volume value of an acid in which a proton is bonded to the anion moiety.

[Chem. 61]

(z1)

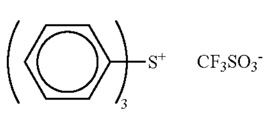

70$Å^3$

-continued (z2)

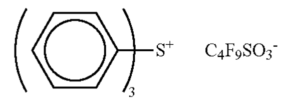

113$Å^3$ (z3)

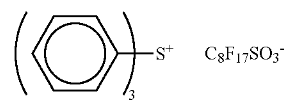

220$Å^3$ (z4)

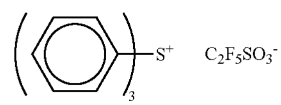

92$Å^3$ (z5)

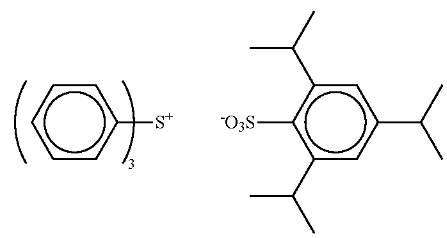

303$Å^3$ (z6)

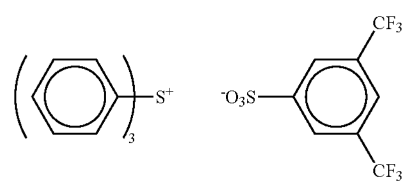

163$Å^3$ (z7)

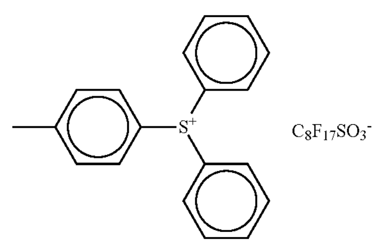

220$Å^3$ (z8)

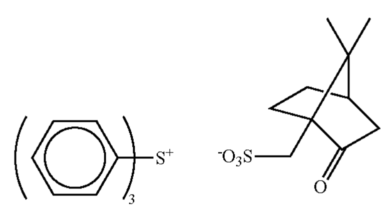

216$Å^3$

-continued
(z9)
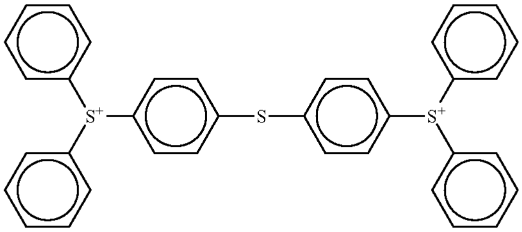
127Å$^3$
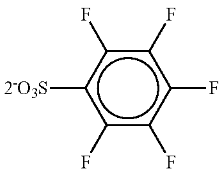
(z10)
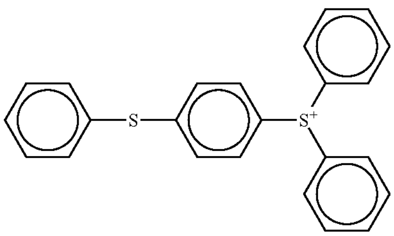
127Å$^3$
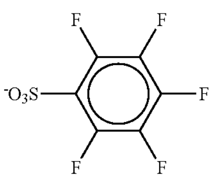
(z11)
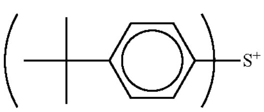
$C_4F_9SO_3^-$
113Å$^3$
(z12)
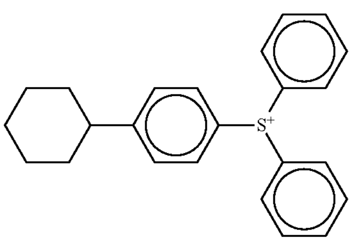
$C_4F_9SO_3^-$
113Å$^3$
(z13)
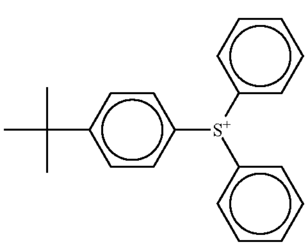
$C_4F_9SO_3^-$
113Å$^3$
-continued
(z14)
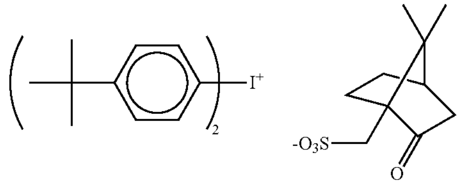
216Å$^3$
(z15)
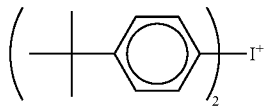
$C_4F_9SO_3^-$
113Å$^3$
(Z16)
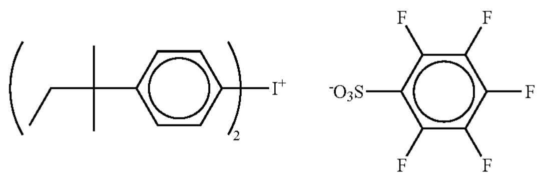
127Å$^3$
(z17)
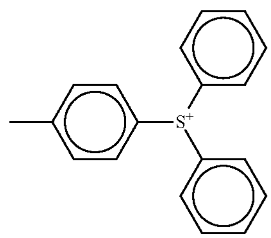
$C_4F_9SO_3^-$
113Å$^3$
[Chem. 62]
(z18)
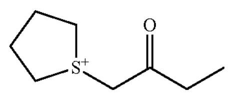
$C_4F_9SO_3^-$
113Å$^3$
(z19)
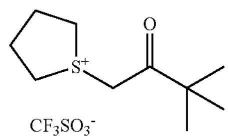
$CF_3SO_3^-$
113Å$^3$
(z20)
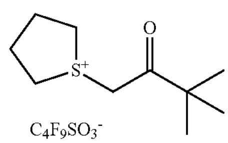
$C_4F_9SO_3^-$
113Å$^3$ -continued
(z21)
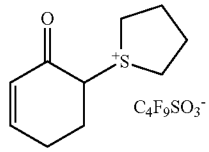
113Å$^3$
(z22)
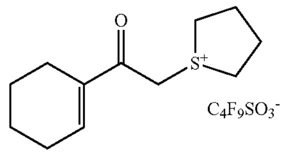
113Å$^3$
(z23)
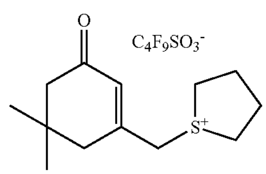
113Å$^3$
(Z24)
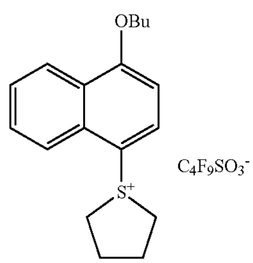
113Å$^3$
(z25)
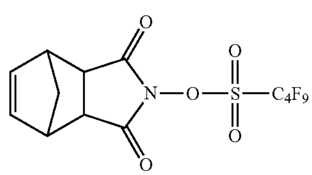
113Å$^3$
(z26)
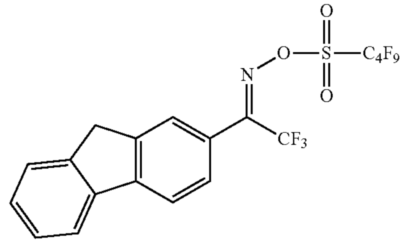
113Å$^3$
-continued
(z27)
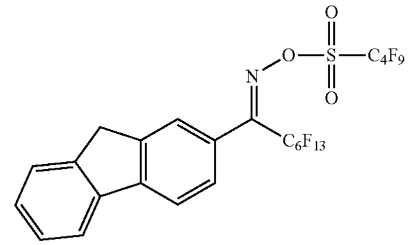
113Å$^3$
(z28)
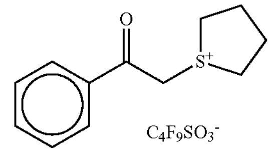
113Å$^3$
(z29)
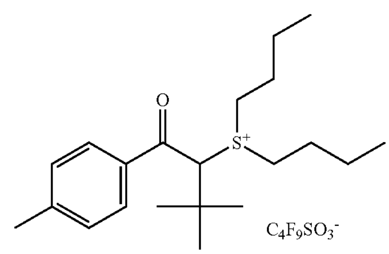
113Å$^3$
(z30)
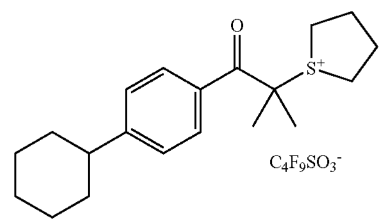
113Å$^3$
(z31)
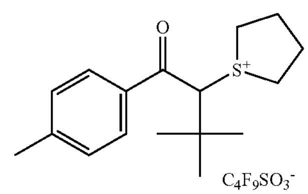
113Å$^3$
(z32)
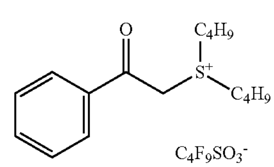
113Å$^3$ (z33)
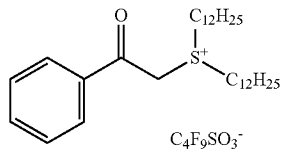
113Å$^3$
(z34)
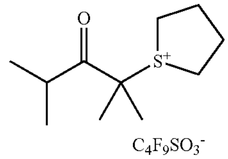
113Å$^3$
(z35)
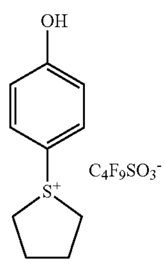
113Å$^3$
(z36)
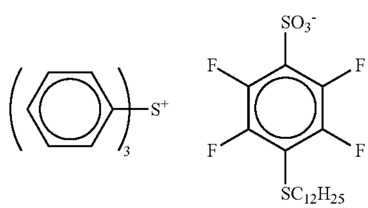
393Å$^3$
(z37)
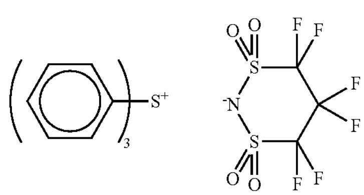
136Å$^3$
(z38)
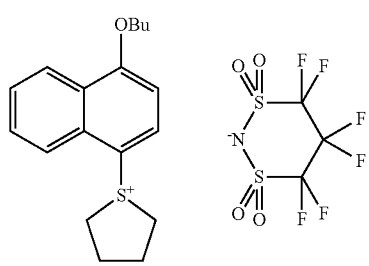
136Å$^3$
(z39)
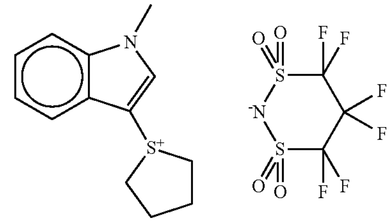
136Å$^3$
(z40)
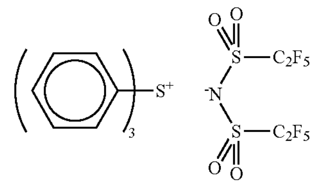
173Å$^3$
(z41)
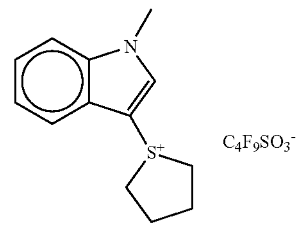
113Å$^3$
(z42)
[Chem. 63]
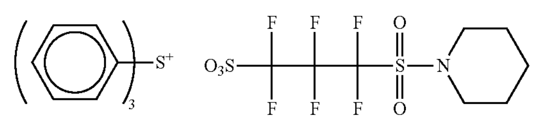
244Å$^3$
(z43)
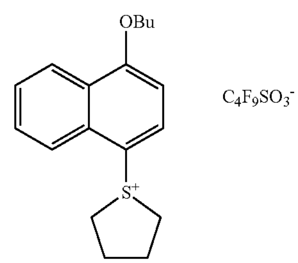
113Å$^3$
(z44)
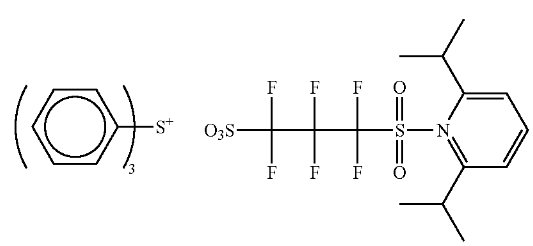
347Å$^3$ -continued
(z45)
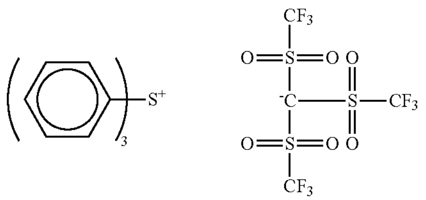
189Å$^3$
(z46)
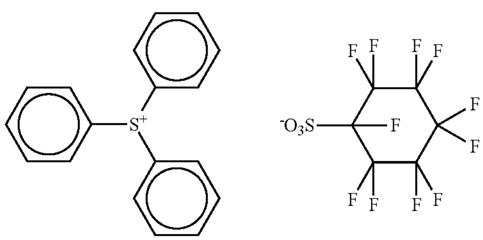
136Å$^3$
(z47)
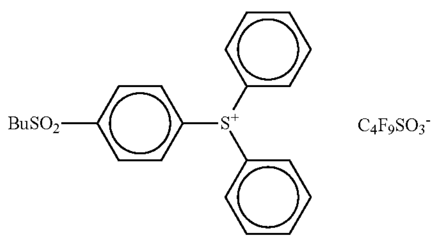
113Å$^3$
(z48)
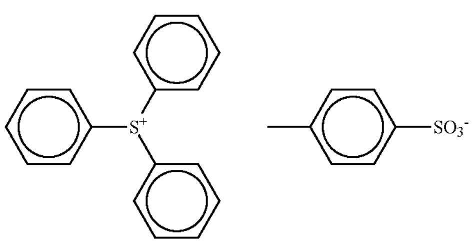
186Å$^3$
(z49)
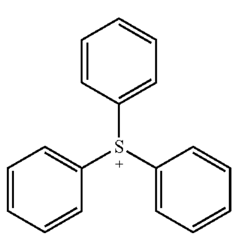
271Å$^3$
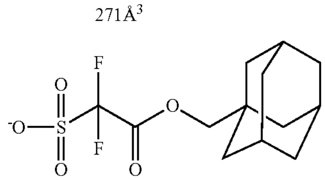
-continued
(z50)
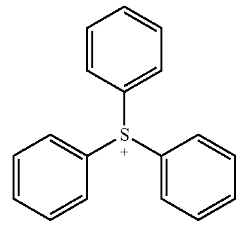
291Å$^3$
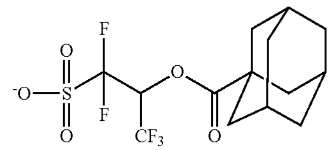
(z51)
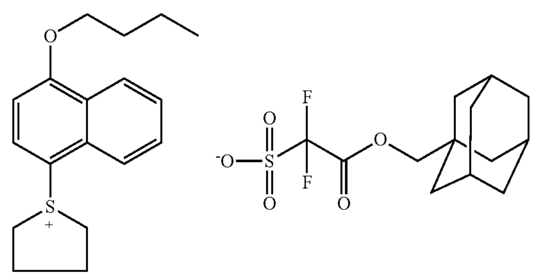
271Å$^3$
(z52)
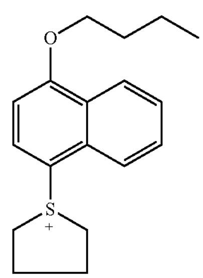
244Å$^3$
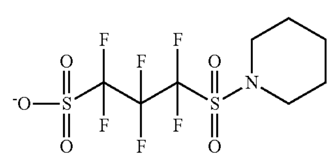
(z53)
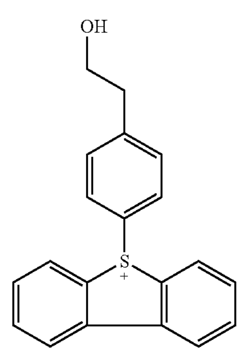
437Å$^3$ -continued
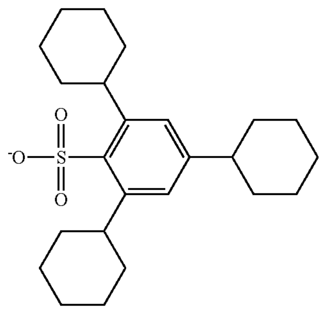
(z54)
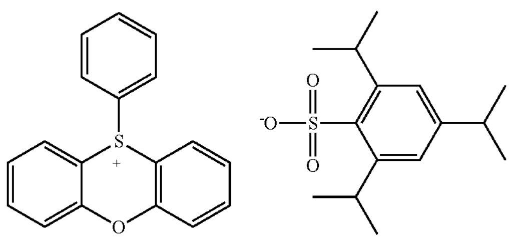
303Å$^3$
(z55)
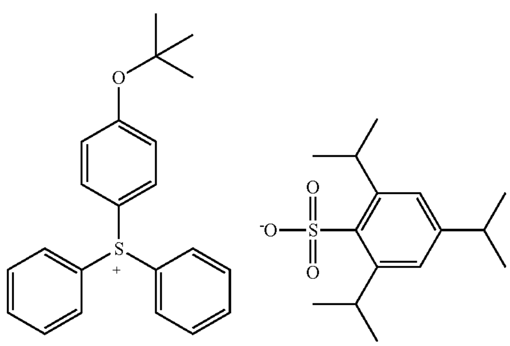
303Å$^3$
[Chem. 64]
(z56)
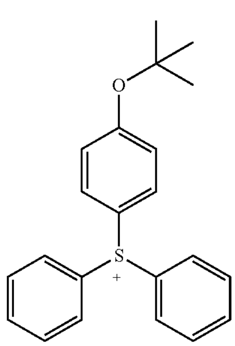
427Å$^3$
-continued
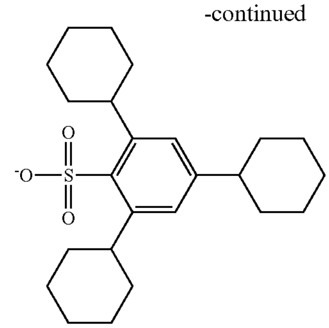
(z57)
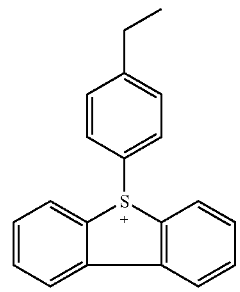
271Å$^3$
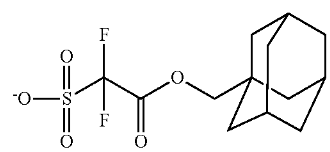
(z58)
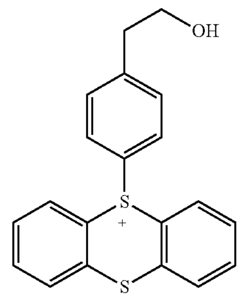
291Å$^3$
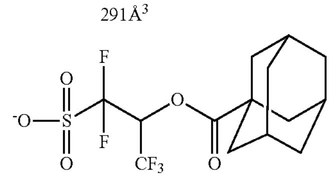
(z59)
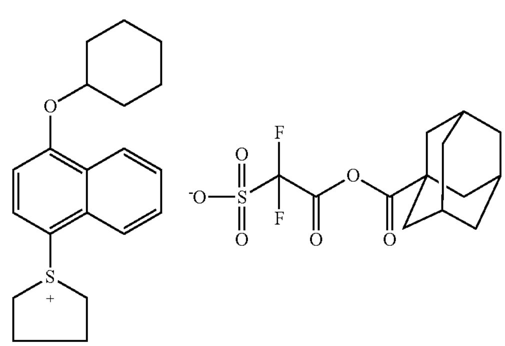
271Å

-continued
(z60)
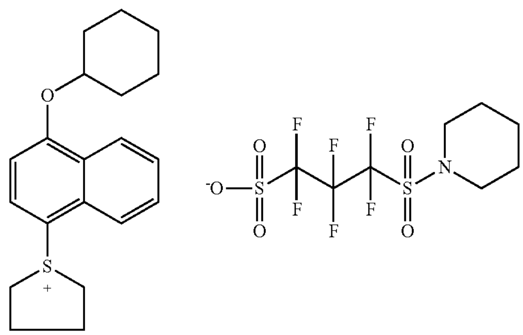
244Å
(z61)
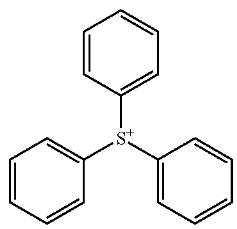
311Å$^3$
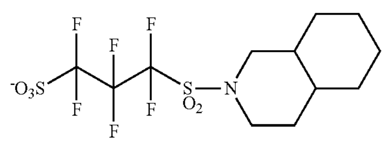
(z62)
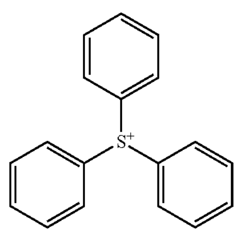
437Å
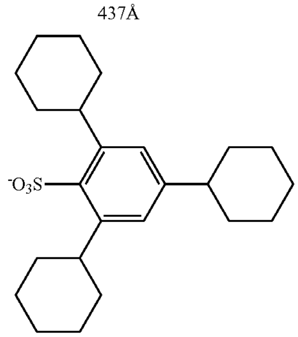
(z63)
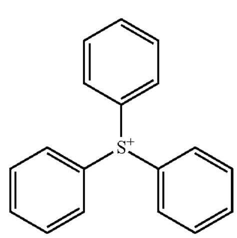
535Å
-continued
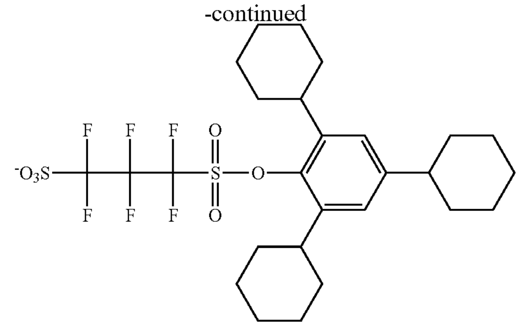
(z64)
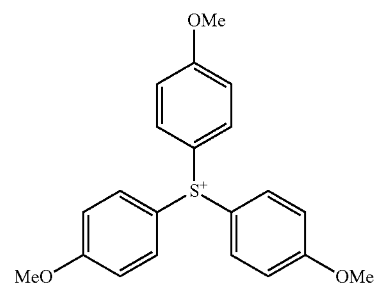
437Å
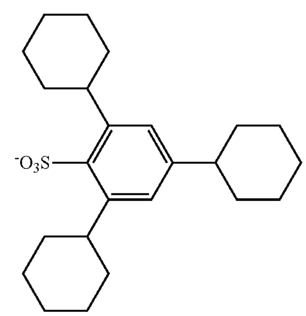
(z65)
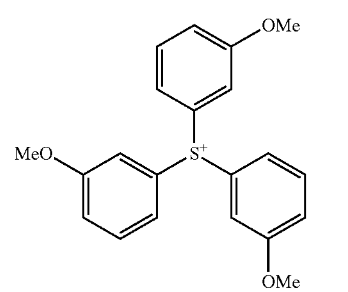
437Å$^3$
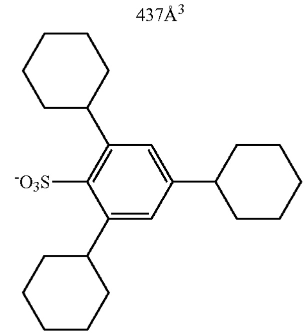

-continued (z66)

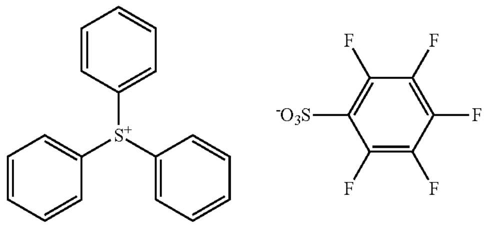

127Å³

(z67)

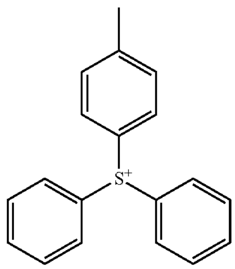

437Å³

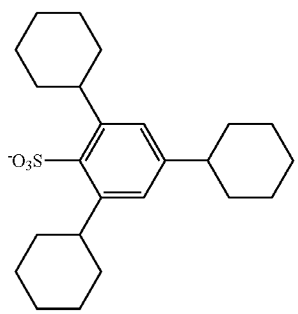

(z68)

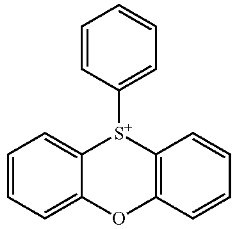

437Å³

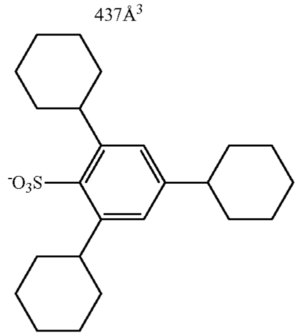

In addition, as the acid generator (C) (preferably an onium compound) usable in the present invention, a polymer-type acid generator where a group capable of generating an acid upon irradiation with an actinic ray or radiation (photoacid generating group) is introduced into the main or side chain of a polymer compound, can be also used, and specific examples thereof include those obtained by removing a repeating unit corresponding to the repeating unit (b) of the present invention from specific examples of the polymer compound (A).

The negative actinic ray-sensitive or radiation-sensitive resin composition according to the present invention may or may not contain the acid generator (C), but in the case of containing the acid generator (C), the content thereof in the composition is preferably from 0.1 to 25 mass %, more preferably from 0.5 to 20 mass %, still more preferably from 1 to 18 mass %, based on the total solid content of the composition.

As for the acid generator (C), one kind may be used alone, or two or more kinds may be used in combination.

[4] Basic Compound

The negative actinic ray-sensitive or radiation-sensitive resin composition of the present invention preferably contains a basic compound as an acid scavenger, in addition to the components described above. By using a basic compound, the change in performance over time from exposure to post-baking can be reduced. The basic compound is preferably an organic basic compound and, more specifically, includes aliphatic amines, aromatic amines, heterocyclic amines, nitrogen-containing compounds having a carboxyl group, nitrogen-containing compounds having a sulfonyl group, nitrogen-containing compounds having a hydroxy group, nitrogen-containing compounds having a hydroxyphenyl group, alcoholic nitrogen-containing compounds, amide derivatives, imide derivatives, and the like. An amine oxide compound (preferably a compound having a methyleneoxy unit and/or an ethyleneoxy unit; for example, the compounds described in JP-A-2008-102383) and an ammonium salt (preferably a hydroxide or a carboxylate; more specifically, a tetraalkylammonium hydroxide typified by tetrabutylammonium hydroxide is preferred in view of LER) are also appropriately used.

Furthermore, a compound capable of increasing the basicity by the action of an acid can be also used as a kind of the basic compound.

Specific examples of the amines include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline, 2,4,6-tri(tert-butyl)aniline, triethanolamine, N,N-dihydroxyethylaniline, tris(methoxyethoxyethyl)amine, compounds recited in column 3, line 60 et seq. of U.S. Pat. No. 6,040,112, 2-[2-{2-(2,2-dimethoxy-phenoxyethoxy)ethyl}-bis-(2-methoxyethyl)]-amine, and Compounds (C1-1) to (C3-3) illustrated in paragraph [0066] of U.S. Patent Application Publication No. 2007/0224539A1. The compound having a nitrogen-containing heterocyclic structure includes 2-phenylbenzimidazole, 2,4,5-triphenylimidazole, N-hydroxyethylpiperidine, bis(1,2,2,6,6-pentamethyl-4-piperidyl) sebacate, 4-dimethylaminopyridine, antipyrine, hydroxyantipyrine, 1,5-diazabicyclo[4.3.0]-non-S-ene, 1,8-diazabicyclo[5.4.0]-undec-7-ene, tetrabutylammonium hydroxide, and the like.

In addition, a photodecomposable basic compound (a compound which initially exhibits basicity due to the action as a base of a basic nitrogen atom but decomposes upon irradiation with an actinic ray or radiation to generate a zwitterionic compound having a basic nitrogen atom and an organic acid moiety and resulting from their neutralization in the molecule, is reduced in or deprived of the basicity; for example, onium salts described in Japanese Patent No. 3,577,743, JP-A-2001-215689, JP-A-2001-166476 and JP-A-2008-102383), and a photobase generator (for example, compounds described in JP-A-2010-243773) are also appropriately used.

Among these basic compounds, an ammonium salt and a photodecomposable basic compound are preferred in view of LER.

In the present invention, one basic compound may be used alone, or two or more basic compounds may be used in combination.

The content of the basic compound for use in the present invention is preferably from 0.01 to 10 mass %, more preferably from 0.03 to 5 mass %, still more preferably from 0.05 to 3 mass %, based on the total solid content of the negative actinic ray-sensitive or radiation-sensitive resin composition.

[5] Surfactant

The negative actinic ray-sensitive or radiation-sensitive resin composition of the present invention may further contain a surfactant so as to enhance the coatability. Examples of the surfactant include, although not particularly limited, a nonionic surfactant such as polyoxyethylene alkyl ethers, polyoxyethylene alkylallyl ethers, polyoxyethylene-polyoxypropylene block copolymers, sorbitan fatty acid esters and polyoxyethylene sorbitan fatty acid esters, a fluorine-containing surfactant such as Megaface F171 (produced by DIC Corp.), Florad FC430 (produced by Sumitomo 3M, Inc.), Surfynol E1004 (produced by Asahi Glass Co., Ltd.), and PF656 and PF6320 produced by OMNOVA, and an organosiloxane polymer.

In the case where the negative actinic ray-sensitive or radiation-sensitive resin composition contains a surfactant, the amount of the surfactant used is preferably from 0.0001 to 2 mass %, more preferably from 0.0005 to 1 mass %, based on the total amount of the composition (excluding the solvent).

[6] Organic Carboxylic Acid

The negative actinic ray-sensitive or radiation-sensitive resin composition of the present invention preferably contains an organic carboxylic acid, in addition to the components described above. The organic carboxylic acid compound includes an aliphatic carboxylic acid, an alicyclic carboxylic acid, an unsaturated aliphatic carboxylic acid, an oxycarboxylic acid, an alkoxycarboxylic acid, a ketocarboxylic acid, a benzoic acid derivative, a phthalic acid, a terephthalic acid, an isophthalic acid, a 2-naphthoic acid, a 1-hydroxy-2-naphthoic acid, a 2-hydroxy-3-naphthoic acid, and the like, but at the time of performing electron beam exposure in vacuum, the organic carboxylic acid may volatilize from the resist film surface to contaminate the lithography chamber and therefore, the preferred compound is an aromatic organic carboxylic acid. Above all, for example, a benzoic acid, a 1-hydroxy-2-naphthoic acid and a 2-hydroxy-3-naphthoic acid are preferred.

The blending amount of the organic carboxylic acid is preferably from 0.01 to 10 parts by mass, more preferably from 0.01 to 5 parts by mass, still more preferably from 0.01 to 3 parts by mass, per 100 parts by mass of the polymer compound (A).

The negative actinic ray-sensitive or radiation-sensitive resin composition of the present invention may further contain, if desired, a dye, a plasticizer, and an acid-increasing agent (described, for example, in International Publication Nos. 95/29968 and 98/24000, JP-A-8-305262, JP-A-9-34106, JP-A-8-248561, JP-T-8-503082, U.S. Pat. No. 5,445,917, JP-T-8-503081, U.S. Pat. Nos. 5,534,393, 5,395,736, 5,741,630, 5,334,489, 5,582,956, 5,578,424, 5,453,345 and 5,445,917, European Patent Nos. 665,960, 757,628 and 665,961, U.S. Pat. No. 5,667,943, JP-A-10-1508, JP-A-10-282642, JP-A-9-512498, JP-A-2000-62337, JP-A-2005-17730 and JP-A-2008-209889). As for all of these compounds, examples thereof include those described for respective compounds in JP-A-2008-268935.

[Onium Carboxylate]

The negative actinic ray-sensitive or radiation-sensitive resin composition of the present invention may contain an onium carboxylate. The onium carboxylate includes sulfonium carboxylate, iodonium carboxylate, ammonium carboxylate, and the like. Among others, iodonium carboxylate and sulfonium carboxylate are preferred as the onium carboxylate. Furthermore, in the present invention, the carboxylate residue of the onium carboxylate preferably contains no aromatic group and no carbon-carbon double bond. As for the particularly preferable anion moiety, a linear or branched, monocyclic or polycyclic alkylcarboxylate anion having a carbon number of 1 to 30 is preferred, and an anion where the alkyl group in the anion above is partially or entirely fluorine-substituted, is more preferred. The alkyl chain may contain an oxygen atom. Thanks to such a configuration, the transparency to light of 220 nm or less is ensured, the sensitivity and resolution are enhanced, and the iso/dense bias and exposure margin are improved.

Preferred solvents for use in the negative actinic ray-sensitive or radiation-sensitive resin composition of the present invention include, for example, ethylene glycol monoethyl ether acetate, cyclohexanone, 2-heptanone, propylene glycol monomethyl ether (PGME, another name: 1-methoxy-2-propanol), propylene glycol monomethyl ether acetate (PGMEA, another name: 1-methoxy-2-acetoxypropane), propylene glycol monomethyl ether propionate, propylene glycol monoethyl ether acetate, methyl 3-methoxypropionate, ethyl 3-ethoxypropionate, methyl β-methoxyisobutyrate, ethyl butyrate, propyl butyrate, methyl isobutyl ketone, ethyl acetate, isoamyl acetate, ethyl lactate, toluene, xylene, cyclohexyl acetate, diacetone alcohol, N-methylpyrrolidone, N,N-dimethylformamide, γ-butyrolactone, N,N-dimethylacetamide, propylene carbonate, and ethylene carbonate. One of these solvents may be used alone, or some may be used in combination.

Solid matters of the negative actinic ray-sensitive or radiation-sensitive resin composition are dissolved in the solvent above and preferably dissolved in a ratio of, in terms of solid content concentration, from 1 to 30 mass %, more preferably from 1 to 20 mass %, still more preferably from 3 to 15 mass %.

The present invention also relates to a resist film formed using the negative actinic ray-sensitive or radiation-sensitive resin composition of the present invention, and the resist film is formed, for example, by coating the negative actinic ray-sensitive or radiation-sensitive resin composition on a support such as substrate. The thickness of the resist film is preferably from 10 to 150 nm, more preferably from 10 to 120 nm. As for the coating method on a substrate, the composition is coated on a substrate by an appropriate coating method such as spin coating, roll coating, flow coating, dip coating, spray coating and doctor coating, but spin coating is preferred, and the spinning speed is preferably from 1,000 to 3,000 rpm. The coated film is pre-baked at 60 to 150° C. for 1 to 20 minutes, preferably at 80 to 120° C. for 1 to 10 minutes, to form a thin film.

As for the materials constituting the substrate to be processed and the outermost surface layer thereof, for example, in the case of a wafer for semiconductor, a silicon wafer can be used, and examples of the material working out to the outermost surface include Si, $SiO_2$, SiN, SiON, TiN, WSi, BPSG, SOG, and an organic antireflection film.

The present invention also relates to a resist-coated mask blanks coated with the resist film obtained as above. In order to obtain such a resist-coated mask blanks, in the case of forming a resist pattern on a photomask blanks for the production of a photomask, the transparent substrate used includes a transparent substrate such as quartz and calcium fluoride. In general, a light-shielding film, an antireflection film, further a phase shift film, and additionally a required functional film such as etching stopper film and etching mask film, are stacked on the substrate. As for the material of the functional film, a film containing silicon or a transition metal such as chromium, molybdenum, zirconium tantalum, tungsten, titanium and niobium is stacked. Examples of the material used for the outermost layer include a material where the main constituent material is a material containing silicon or containing silicon and oxygen and/or nitrogen, a silicon compound material where the main constituent material is the material above which further contains a transition metal, and a transition metal compound material where the main constituent material is a material containing a transition metal, particularly, one or more transition metals selected from chromium, molybdenum, zirconium, tantalum, tungsten, titanium and niobium, or further containing one or more elements selected from oxygen, nitrogen and carbon.

The light-shielding film may have a single-layer structure but preferably has a multilayer structure where a plurality of materials are coated one on another. In the case of a multilayer structure, the film thickness per layer is not particularly limited but is preferably from 5 to 100 nm, more preferably from 10 to 80 nm. The thickness of the entire light-shielding film is not particularly limited but is preferably from 5 to 200 nm, more preferably from 10 to 150 nm.

Out of the materials above, when pattern formation is performed using a negative actinic ray-sensitive or radiation-sensitive resin composition on a photomask black having in the outermost surface layer thereof a material containing chromium and oxygen or nitrogen, a so-called undercut profile waist-shaped near the substrate is liable to be formed in general. However, when the present invention is used, the undercut problem can be improved as compared with conventional mask blanks.

Subsequently, this resist film is irradiated with an actinic ray or radiation (e.g., electron beam), preferably baked (usually at 80 to 150° C., preferably from 90 to 130° C., usually for 1 to 20 minutes, preferably from 1 to 10 minutes), and then developed, whereby a good pattern can be obtained. Etching, ion implantation or the like is appropriately performed by using this pattern as the mask to produce, for example, a semiconductor fine circuit, an imprint mold structure or a photomask.

Incidentally, the process when preparing an imprint mold by using the composition of the present invention is described, for example, in Japanese Patent 4,109,085, JP-A-2008-162101 and Yoshihiko Hirai (compiler), Nanoimprint no Kiso to Gijutsu Kaihatsu•Oyo Tenkai-Nanoimprint no Kiban Gijutsu to Saishin no Gijutsu Tenkai (Basic and Technology Expansion•Application Development of Nanoimprint-Substrate Technology of Nanoimprint and Latest Technology Expansion), Frontier Shuppan.

The use mode of the negative actinic ray-sensitive or radiation-sensitive resin composition of the present invention and the pattern forming method are described below.

The present invention also relates to a resist pattern forming method involving exposing the above-described resist film or resist-coated mask blanks and developing the exposed resist film or resist-coated mask blanks. In the present invention, the exposure is preferably performed using an electron beam or an extreme-ultraviolet ray.

In the production or the like of a precision integrated circuit device, the exposure of resist film (pattern forming step) is preferably performed by patternwise irradiating the resist film of the present invention with an electron beam or an extreme-ultraviolet ray (EUV). The exposure is performed with an exposure dose of, in the case of an electron beam, approximately from 0.1 to 20 μC/cm$^2$, preferably on the order of 3 to 15 μC/cm$^2$, and in the case of an extreme-ultraviolet ray, approximately from 0.1 to 20 mJ/cm$^2$, preferably on the order of 3 to 15 mJ/cm$^2$. Thereafter, heating after development (post-exposure baking) is performed on a hot plate at 60 to 150° C. for 1 to 20 minutes, preferably at 80 to 120° C. for 1 to 10 minutes, and subsequently, the resist film is developed, rinsed and dried, whereby a resist pattern is formed. The developer is an aqueous alkali in a concentration of preferably from 0.1 to 5 mass %, more preferably from 2 to 3 mass %, such as tetramethylammonium hydroxide (TMAH) and tetrabutylammonium hydroxide (TBAH), and the development is performed by a conventional method such as dip method, puddle method and spray method for preferably from 0.1 to 3 minutes, more preferably from 0.5 to 2 minutes. In the alkali developer, alcohols and/or a surfactant may be added each in an appropriate amount. The pH of the alkali developer is usually from 10.0 to 15.0, and among others, an aqueous 2.38 mass % tetramethylammonium hydroxide solution is preferred.

In the developer, alcohols and/or a surfactant may be added each in an appropriate amount.

The surfactant is not particularly limited but, for example, ionic or nonionic fluorine-containing and/or silicon-containing surfactants can be used. The fluorine containing and/or silicon-containing surfactants include, for example, surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988 and U.S. Pat. Nos. 5,405,720, 5,360,692, 5,529,881, 5,296,330, 5,436,098, 5,576,143, 5,294,511 and 5,824,451. A nonionic surfactant is preferred. The nonionic surfactant is not particularly limited, but use of a fluorine-containing surfactant or a silicon-containing surfactant is more preferred.

The amount of the surfactant used is usually from 0.001 to 5 mass %, preferably from 0.005 to 2 mass %, more preferably from 0.01 to 0.5 mass %, based on the total amount of the developer.

As the developing method, for example, a method of dipping the substrate in a bath filled with the developer for a fixed time (dipping method), a method of raising the developer on the substrate surface by the effect of a surface tension and keeping it still for a fixed time, thereby performing development (puddling method), a method of spraying the developer on the substrate surface (spraying method), and a method of continuously ejecting the developer on the substrate spinning at a constant speed while scanning with a developer ejecting nozzle at a constant rate (dynamic dispense method) can be applied.

In the case where the above-described various developing methods involve a step of ejecting the developer toward the resist film from a development nozzle of a developing apparatus, the ejection pressure of the developer ejected (the flow velocity per unit area of the developer ejected) is preferably 2 mL/sec/mm$^2$ or less, more preferably 1.5 mL/sec/mm$^2$ or less, still more preferably 1 mL/sec/mm$^2$ or less. The flow velocity has no particular lower limit but in view of throughput, is preferably 0.2 m/sec/mm$^2$ or more.

By setting the ejection pressure of the ejected developer to the range above, pattern defects attributable to the resist scum after development can be greatly reduced.

Details of this mechanism are not clearly known, but it may be considered that thanks to the ejection pressure in the above-described range, the pressure imposed on the resist film by the developer becomes small and the resist film or resist pattern is kept from inadvertent chipping or collapse.

Here, the ejection pressure (mL/sec/mm$^2$) of the developer is a value at the outlet of a development nozzle in a developing apparatus.

The method for adjusting the ejection pressure of the developer includes, for example, a method of adjusting the ejection pressure by a pump or the like, and a method of supplying the developer from a pressurized tank and adjusting its pressure to change the ejection pressure.

After the step of developing the resist film by using a developer, a step of stopping the development by replacing the solvent with another solvent may be practiced.

As for the rinsing solution in the rinsing treatment performed after the alkali development, pure water is used, and the pure water may also be used after adding thereto a surfactant in an appropriate amount.

With respect to the resist film thus formed from the negative actinic ray-sensitive or radiation-sensitive resin composition of the present invention, the developer dissolves the unexposed area of the resist film and hardly dissolves the exposed area because of the polymer compound being crosslinked, and a target pattern is thereby formed on the substrate.

The present invention also relates to a photomask obtained by exposing and developing the resist-coated mask blanks. As for the exposure and development, the above-described steps are applied. The photomask is suitably used for the production of a semiconductor.

The photomask of the present invention may be a light transmitting mask used with an ArF excimer laser and the like or may be a reflective mask used for reflective lithography using EUV light as the light source.

EXAMPLES

The embodiments of the present invention are described in greater detail below by referring to Examples, but the present invention is not limited to these Examples. In the following Synthesis Examples and Examples, the structure of compound was confirmed by $^1$H-NMR measurement.

(I) Example as Negative Resist (Electron Beam, Alkali Development)

1. Synthesis Example of Polymer Compound (A) (Component (A))

Synthesis Example 1

Synthesis of Polymer Compound (A1)

9.5 Parts by mass of propylene glycol monomethyl ether was heated at 85° C. in a nitrogen stream, and while stirring this solution, a mixed solution containing 3.69 parts by mass of Monomer (B-1) having a structure shown below, 14.42 parts by mass of Monomer (B-2) having a structure shown below, 2.34 parts by mass of Monomer (B-3) having a structure shown below, 38.2 parts by mass of propylene glycol monomethyl ether and 2.42 parts by mass of dimethyl 2,2'-azobisisobutyrate [V-601, produced by Wako Pure Chemical Industries, Ltd.] was added dropwise over 2 hours. After the completion of dropwise addition, the solution was further stirred at 85° C. for 4 hour. The reaction solution was allowed to cool and reprecipitated from a large amount of heptane/ethyl acetate (=90/10 (ratio by volume)), and the obtained solid was again dissolved in acetone and then reprecipitated from a large amount of water/methanol (=90/10 (ratio by volume)) and vacuum-dried to obtain 15.5 parts by mass of Polymer Compound (A1) of the present invention.

The weight average molecular weight (Mw, in terms of polystyrene) of the obtained polymer compound as determined by GPC (carrier: N-methyl-2-pyrrolidone (NMP)) was Mw=7,500, and the polydispersity (Mw/Mn) was 1.31.

Polymer Compounds (A2) to (A5), (A8) and (A10) to (A15) were synthesized in the same manner.

Synthesis Example 2

Synthesis of Polymer Compound (A6)

In 120 g of N,N-dimethylformamide (DMF), 45 g of Polymer (C-1) having a structure shown below was dissolved, and 19.75 g of pyridine, 2.76 g of 2-sulfobenzoic acid anhydride as a sulfonating agent, and 366 mg of N,N-dimethylaminopyridine were added thereto, followed by stirring at room temperature for 5 hours. The reaction solution was transferred to a separatory funnel containing 300 mL of ethyl acetate, and the organic layer was washed with 300 mL of saturated brine solution 5 times. Thereafter, the organic layer was concentrated on an evaporator, and ethyl acetate was removed.

The obtained polymer was dissolved in 90 mL of tetrahydrofuran (THF) and 30 mL of methanol, and 5.14 g of triphenylsulfonium bromide as a PAG precursor was added thereto, followed by stirring at room temperature for 3 hours. The reaction solution was concentrated on an evaporator and again dissolved in 300 mL of ethyl acetate, and the organic layer was washed with 300 mL of distilled water 5 times. The organic layer was concentrated and then dissolved in 150 mL of acetone and thereafter, the solution was added dropwise to 2 L of a mixed solution of distilled water:methanol=15:1 (ratio by volume). The solid obtained by removing the supernatant was dissolved in 150 mL of ethyl acetate, and the solution was added dropwise to 2 L of hexane. The precipitate obtained by removing the supernatant was vacuum-dried to obtain 46.5 g of Polymer Compound (A6) of the present invention.

Polymer Compounds (A7) and (A9) were synthesized in the same manner.

With respect to the obtained polymer compounds, the compositional ratio (molar ratio) of the polymer compound was calculated by $^1$H-NMR measurement. Also, the weight average molecular weight (Mw, in terms of polystyrene), number average molecular weight (Mn, in terms of polystyrene) and dispersity (Mw/Mn, hereinafter sometimes referred to as "PDI") of the polymer compound were calculated by GPC (solvent: THF) measurement. These results are shown in Table 1 below.

As the polymer compound for comparison, Comparative Polymer Compounds (A1) and (A2) having the structure, compositional ratio, weight average molecular weight (Mw) and polydispersity (Mw/Mn) shown in Table 1 were prepared.

TABLE 1
| Polymer Compound | Polymerization of Monomer, or Polymer Reaction | Compositional Ratio (molar ratio) | Weight Average Molecular Weight | Poly-dispersity |
|---|---|---|---|---|
| Polymer Compound (A1) | 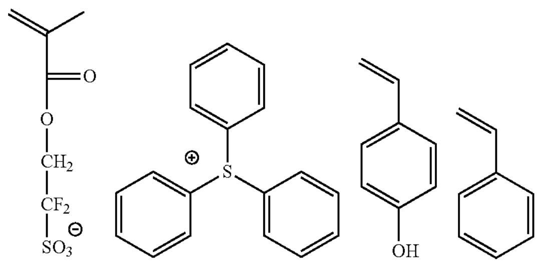 (B-1) (B-2) (B-3) | 5/80/15 | 7500 | 1.31 |
| Polymer Compound (A2) | 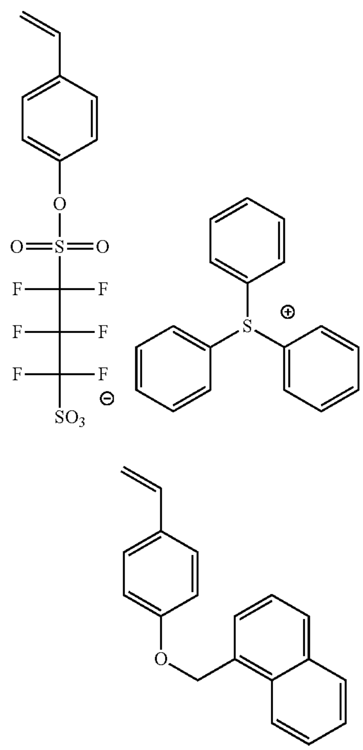 | 5/75/20 | 6600 | 1.32 |
| Polymer Compound (A3) | 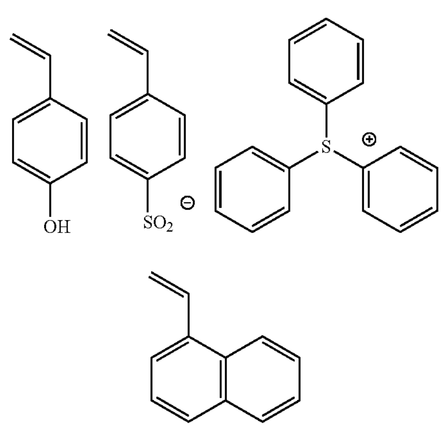 | 75/5/20 | 5500 | 1.25 |

TABLE 1-continued
| Polymer Compound | Polymerization of Monomer, or Polymer Reaction | Compositional Ratio (molar ratio) | Weight Average Molecular Weight | Polydispersity |
|---|---|---|---|---|
| Polymer Compound (A4) | 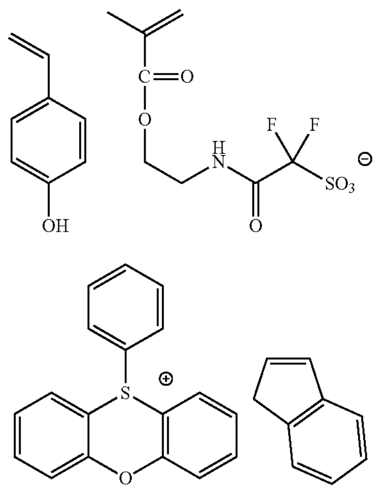 | 75/10/15 | 4400 | 1.44 |
| Polymer Compound (A5) | 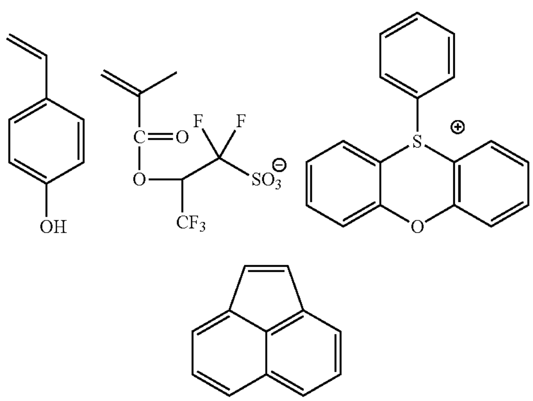 | 70/10/20 | 6500 | 1.45 |
| Polymer Compound (A6) | 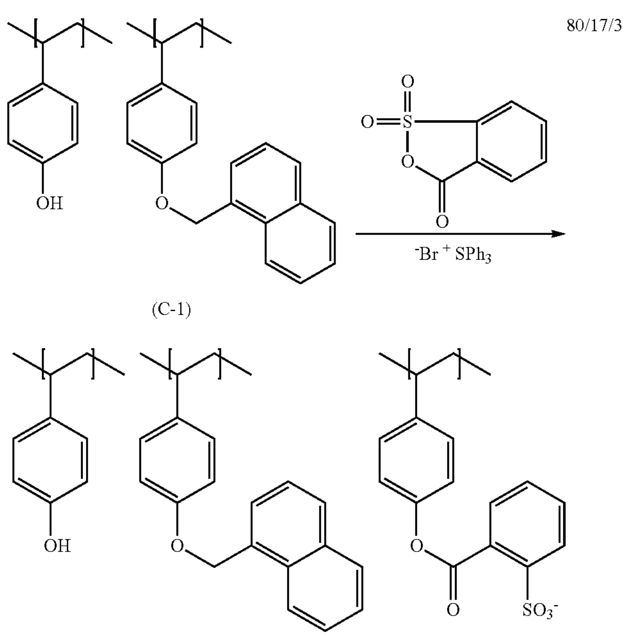 | 80/17/3 | 3500 | 1.13 |

TABLE 1-continued
| Polymer Compound | Polymerization of Monomer, or Polymer Reaction | Compositional Ratio (molar ratio) | Weight Average Molecular Weight | Polydispersity |
|---|---|---|---|---|
| Polymer Compound (A7) | 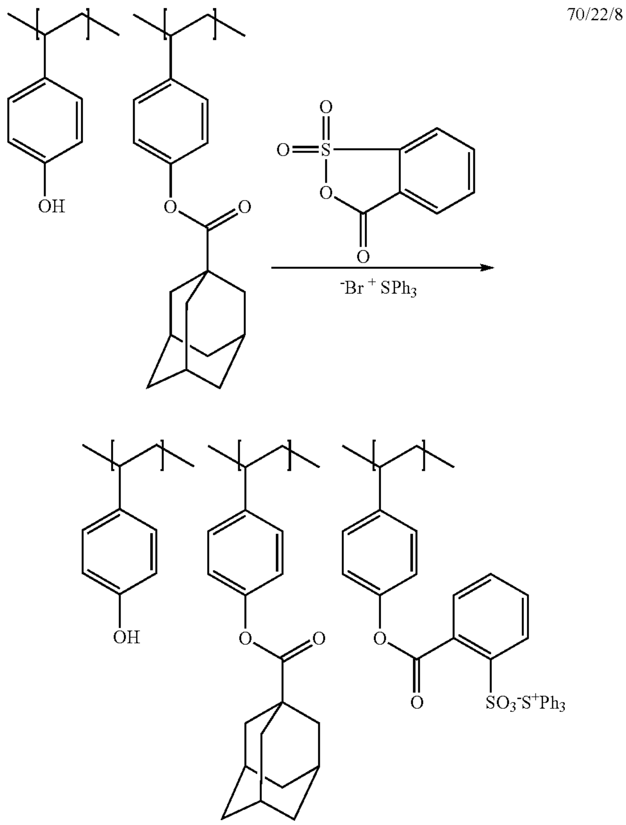 | 70/22/8 | 3700 | 1.13 |
| Polymer Compound (A8) | 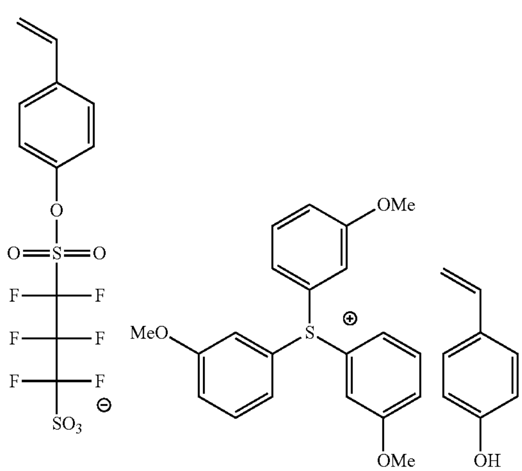 | 5/75/20 | 5500 | 1.32 |

TABLE 1-continued
| Polymer Compound | Polymerization of Monomer, or Polymer Reaction | Compositional Ratio (molar ratio) | Weight Average Molecular Weight | Polydispersity |
|---|---|---|---|---|
| | 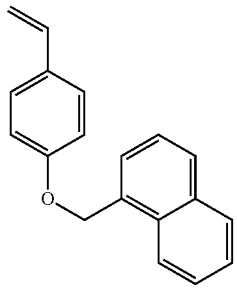 [SMILES: C=Cc1ccc(OCc2cccc3ccccc23)cc1] | | | |
| Polymer Compound (A9) | 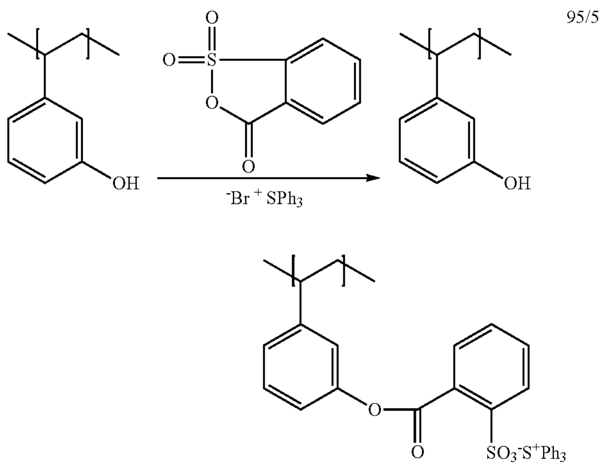 | 95/5 | 5000 | 1.15 |
| Polymer Compound (A10) | 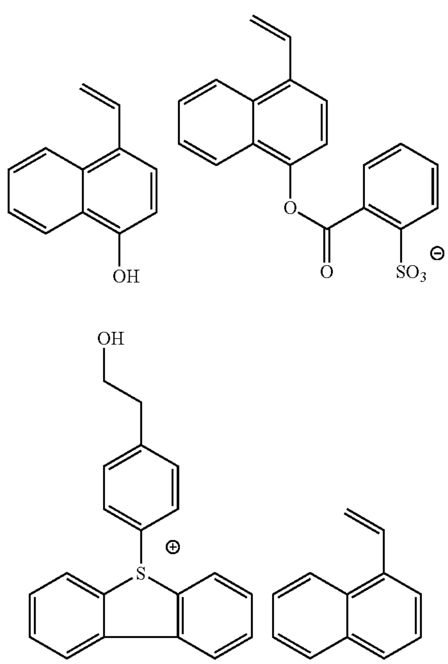 | 80/5/15 | 6400 | 1.44 |

TABLE 1-continued
| Polymer Compound | Polymerization of Monomer, or Polymer Reaction | Compositional Ratio (molar ratio) | Weight Average Molecular Weight | Poly-dispersity |
|---|---|---|---|---|
| Polymer Compound (A11) | 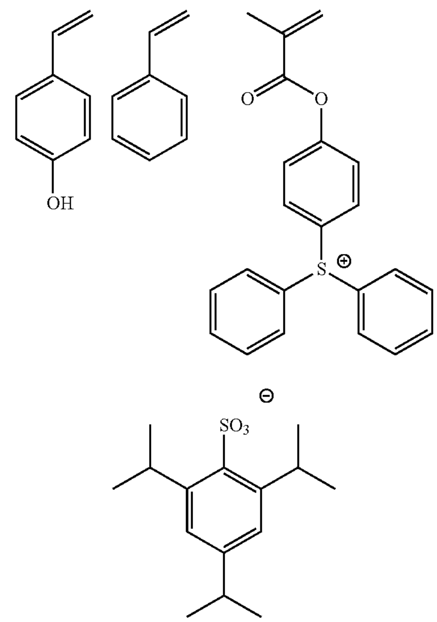 | 70/25/5 | 6400 | 1.30 |
| Polymer Compound (A12) | 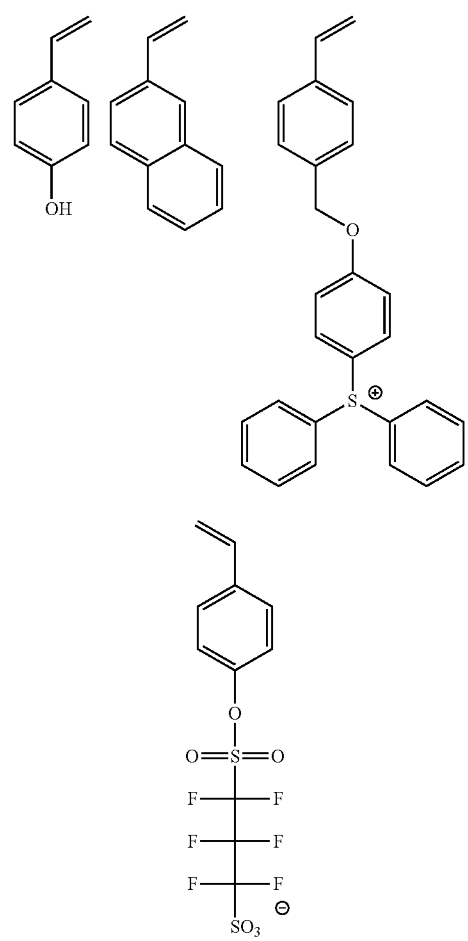 | 70/20/5/5 | 6000 | 1.35 |

TABLE 1-continued
| Polymer Compound | Polymerization of Monomer, or Polymer Reaction | Compositional Ratio (molar ratio) | Weight Average Molecular Weight | Polydispersity |
|---|---|---|---|---|
| Polymer Compound (A13) | 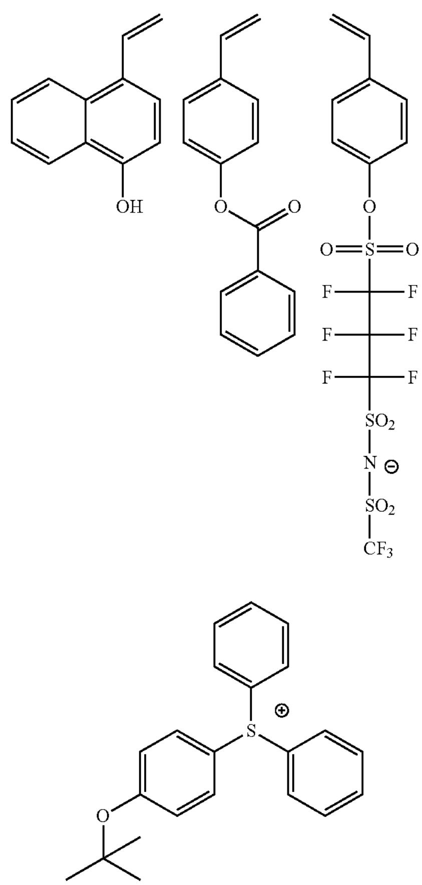 | 70/25/5 | 6200 | 1.41 |
| Polymer Compound (A14) | 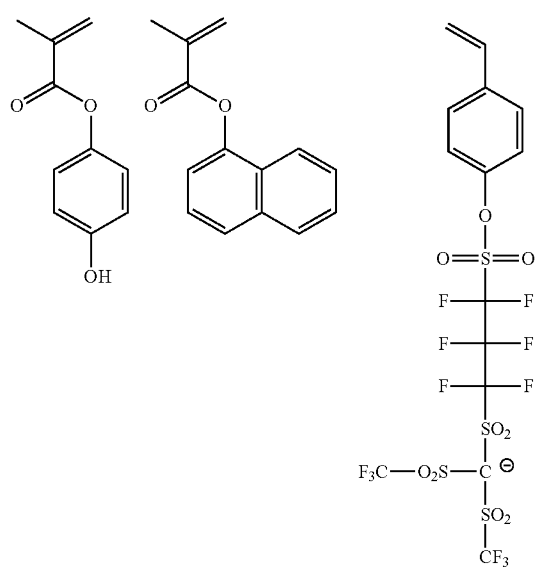 [SMILES: C=C(C)C(=O)Oc1ccc(O)cc1 ; C=C(C)C(=O)Oc1cccc2ccccc12 ; C=Cc1ccc(OS(=O)(=O)C(F)(F)C(F)(F)C(F)(F)S(=O)(=O)[C-](S(=O)(=O)C(F)(F)F)S(=O)(=O)C(F)(F)F)cc1] | 70/25/5 | 6300 | 1.38 |

TABLE 1-continued
| Polymer Compound | Polymerization of Monomer, or Polymer Reaction | Compositional Ratio (molar ratio) | Weight Average Molecular Weight | Polydispersity |
|---|---|---|---|---|
| | 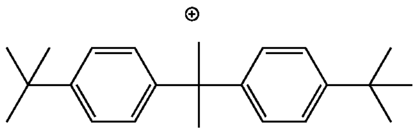 [SMILES: CC(C)(C)c1ccc(C(C)(C)c2ccc(C(C)(C)C)cc2)cc1] | | | |
| Polymer Compound (A15) | 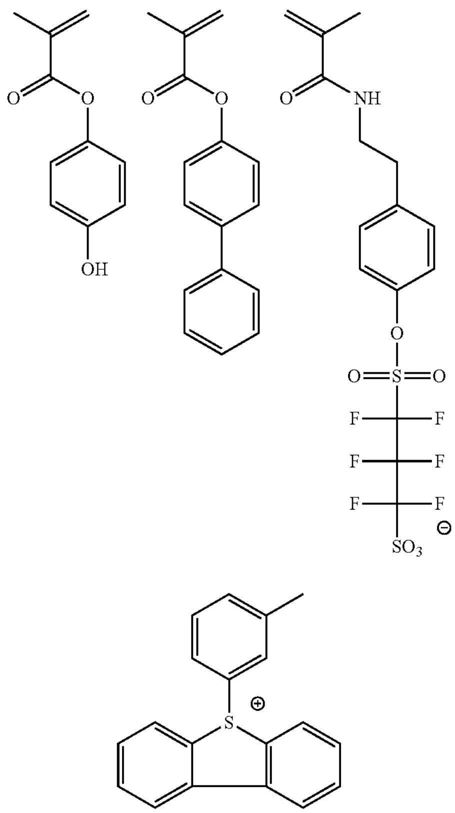 | 70/25/5 | 6500 | 1.23 |
| Polymer Compound (A1) | 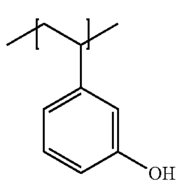 | 100 | 4500 | 1.13 |
| Polymer Compound (A2) | 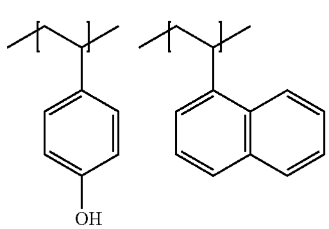 | 90/100 | 8000 | 1.51 |

2. Example [Example 1E]

(1) Preparation of Support

A Cr oxide-deposited 6-inch wafer (a wafer subjected to a shielding film treatment, which is used for normal photomask blanks) was prepared.

(2) Preparation of Resist Coating Solution (Formulation of Coating Solution of Negative Resist Composition N1)

| | |
|---|---|
| Polymer Compound (A1) | 0.72 g |
| Crosslinking Agent CL-1 (having a structural formula shown below) | 0.08 g |
| Crosslinking Agent CL-4 (having structural formula shown below) | 0.04 g |
| Tetrabutylammonium hydroxide (basic compound) | 0.002 g |
| 2-Hydroxy-3-naphthoic acid (organic carboxylic acid) | 0.012 g |
| Surfactant PF6320 (produced by OMNOVA) | 0.001 g |
| Propylene glycol monomethyl ether acetate (solvent) | 4.0 g |
| Propylene glycol monomethyl ether (solvent) | 5.0 g |

[Chem. 65]

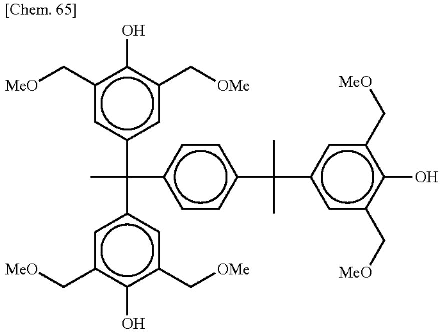

CL-1

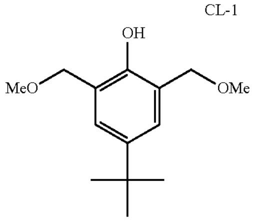

CL-4

The solution of the composition above was microfiltered through a membrane filter having a pore size of 0.04 μm to obtain a resist coating solution.

(3) Preparation of Resist Film

The resist coating solution was coated on the 6-inch wafer by using a spin coater, Mark 8, manufactured by Tokyo Electron Ltd. and dried at 110° C. for 90 seconds on a hot plate to obtain a resist film having a thickness of 100 nm. That is, a resist-coated mask blanks was obtained.

(4) Production of Negative Resist Pattern

This resist film was patternwise irradiated using an electron beam lithography apparatus (ELS-7500, manufactured by Elionix Inc., accelerating voltage: 50 keV). After the irradiation, the resist film was heated at 120° C. for 90 seconds on a hot plate, dipped in an aqueous 238 mass % tetramethylammonium hydroxide (TMAH) solution for 60 seconds, rinsed with water for 30 seconds and dried.

(5) Evaluation of Resist Pattern

The obtained pattern was evaluated for the sensitivity, resolution (LS resolution and IS resolution), pattern profile, line edge roughness (LER), scum and development defect by the following methods.

[Sensitivity]

The cross-sectional profile of the pattern obtained was observed using a scanning electron microscope (S-4300, manufactured by Hitachi, Ltd.), and the exposure dose (dose of electron beam irradiation) when resolving a resist pattern with a line width of 100 nm (line:space-1:1) was taken as the sensitivity. A smaller value indicates higher sensitivity.

[LS Resolution]

The limiting resolution (the minimum line width below which the line and the space (line:space=1:1) were not separated and resolved) at the exposure dose (dose of electron beam irradiation) giving the sensitivity above was taken as the LS resolution (nm).

[IS Resolution]

The limiting resolution (the minimum line width below which the line and the space (space:line-1:>100) were not separated and resolved) at the minimum irradiation dose when resolving an isolated space pattern with a line width of 100 nm (space:line=1:>100) was taken as the IS resolution (nm).

[Pattern Profile]

The cross-sectional profile of a line pattern (L/S=1/1) with a line width of 100 nm at the exposure dose (dose of electron beam irradiation) giving the sensitivity above was observed using a scanning electron microscope (S-4300, manufactured by Hitachi, Ltd.). The cross-sectional profile of the line pattern was rated "reverse tapered" when the ratio represented by [line width in the top part (surface part) of line pattern/line width in the middle of line pattern (the position of half the height of line pattern)] is 1.5 or more, rated "slightly reverse tapered" when the ratio above is from 12 to less than 1.5, and rated "rectangular" when the ratio is less than 1.2.

[Line Edge Roughness (LER)]

A line pattern (L/S=1/1) having a line width of 100 nm was formed with the irradiation dose (dose of electron beam irradiation) giving the sensitivity above. At arbitrary 30 points included in its longitudinal 50 μm region, the distance from the reference line where the edge should be present was measured using a scanning electron microscope (S-9220, manufactured by Hitachi, Ltd.). The standard deviation of measured distances was determined, and 3σ was computed. A smaller value indicates better performance.

[Evaluation of Scum]

A line pattern was formed by the same method as in [Pattern Profile] above. Thereafter, its cross-sectional SEM was obtained using a scanning electron microscope S4800 (manufactured by Hitachi High-Technologies Corporation), and the scum in the space portion was observed and evaluated as follows.

C: Scum was observed and patterns were partially not connected.

B: Scum was observed but patterns were not connected.

A: Scum was not observed.

[Development Defect]

A line pattern formed by the same method as in [Pattern Profile] above was measured for the number of defects by using KLA 2112 (manufactured by KLA-Tencor Corp.) (Threshold=20, pixel size=0.16). The evaluation result was shown by the number of defects per unit area (1 $cm^2$).

[Example 2E] to [Example 22E], [Comparative Example 1E] and [Comparative Example 2E]

Preparation of resist solution (Negative Resist Compositions N2 to N22, Negative Resist Comparative Compositions N1 and N2), negative pattern formation and evaluation thereof were performed in the same manner as in Example 1E except that the components shown in Table 2 blow were used in the formulation of resist solution.

TABLE 2

| Composition | Polymer Compound | Acid Generator | Basic Compound | Crosslinking Agent | Solvent |
|---|---|---|---|---|---|
| N1 | A1 (0.72 g) | none | B1 (0.002 g) | CL-1/CL-4 (0.08 g/0.04 g) | S2/S1 (5.0 g/4.0 g) |
| N2 | A2 (0.72 g) | none | B1 (0.002 g) | CL-1/CL-4 (0.08 g/0.04 g) | S1/S3 (5.0 g/4.0 g) |
| N3 | A3 (0.72 g) | one | B1 (0.002 g) | CL-1/CL-4 (0.08 g/0.04 g) | S2/S3 (5.0 g/4.0 g) |
| N4 | A4 (0.72 g) | none | B1 (0.002 g) | CL-1/CL-4 (0.08 g/0.04 g) | S2/S7 (5.0 g/4.0 g) |
| N5 | A5 (0.72 g) | none | B1 (0.002 g) | CL-1/CL-4 (0.08 g/0.04 g) | S2/S1 (5.0 g/4.0 g) |
| N6 | A6 (0.72 g) | none | B1 (0.002 g) | CL-1/CL-4 (0.08 g/0.04 g) | S2/S1 (5.0 g/4.0 g) |
| N7 | A7 (0.72 g) | none | B1 (0.002 g) | CL-1/CL-4 (0.08 g/0.04 g) | S1/S2/S6 (4.0 g/4.0 g/1.0 g) |
| N8 | A8 (0.72 g) | none | B1 (0.002 g) | CL-1/CL-4 (0.08 g/0.04 g) | S1/S2/S5 (4.0 g/4.0 g/1.0 g) |
| N9 | A9 (0.72 g) | none | B1 (0.002 g) | CL-1/CL-4 (0.08 g/0.04 g) | S1/S2/S4 (4.0 g/4.0 g/1.0 g) |
| N10 | A10 (0.72 g) | none | B1 (0.002 g) | CL-1/CL-4 (0.08 g/0.04 g) | S2/S1 (5.0 g/4.0 g) |
| N11 | A11 (0.72 g) | none | B1 (0.002 g) | CL-1/CL-4 (0.08 g/0.04 g) | S2/S1 (5.0 g/4.0 g) |
| N12 | A10/A2 (0.42 g/0.3 g) | none | B1 (0.002 g) | CL-1/CL-4 (0.08 g/0.04 g) | S2/S1 (5.0 g/4.0 g) |
| N13 | A6 (0.72 g) | none | B1/B6 (0.001 g/0.001 g) | CL-1/CL-4 (0.08 g/0.04 g) | S2/S1 (5.0 g/4.0 g) |
| N14 | A1 (0.6 g) | z61 (0.12 g) | B1 (0.002 g) | CL-1/CL-4 (0.08 g/0.04 g) | S2/S1 (5.0 g/4.0 g) |
| N15 | A2 (0.6 g) | z5 (0.12 g) | B4 (0.002 g) | CL-1/CL-4 (0.08 g/0.04 g) | S2/S1 (5.0 g/4.0 g) |
| N16 | A7 (0.72 g) | none | B3 (0.002 g) | CL-2/CL-3 (0.08 g/0.04 g) | S2/S1 (5.0 g/4.0 g) |
| N17 | A7 (0.72 g) | none | B2/B5 (0.001 g/0.001 g) | CL-1 (0.12 g) | S2/S1 (5.0 g/4.0 g) |
| N18 | A7 (0.72 g) | none | B1/B6 (0.001 g/0.001 g) | CL-3 (0.12 g) | S2/S1 (5.0 g/4.0 g) |
| N19 | A12 (0.72 g) | none | B1 (0.002 g) | CL-1/CL-4 (0.08 g/0.04 g) | S2/S1 (5.0 g/4.0 g) |
| N20 | A13 (0.72 g) | none | B1 (0.002 g) | CL-1/CL-4 (0.08 g/0.04 g) | S2/S1 (5.0 g/4.0 g) |
| N21 | A14 (0.72 g) | none | B1 (0.002 g) | CL-1/CL-4 (0.08 g/0.04 g) | S2/S1 (5.0 g/4.0 g) |
| N22 | A15 (0.72 g) | none | B1 (0.002 g) | CL-1/CL-4 (0.08 g/0.04 g) | S2/S1 (5.0 g/4.0 g) |
| Comparative Composition N1 | Comparative Polymer Compound (A1) (0.6 g) | z48 (0.12 g) | B2 (0.002 g) | CL-3 (0.12 g) | S2/S1 (5.0 g/4.0 g) |
| Comparative Composition N2 | Comparative Polymer Compound (A2) (0.6 g) | z48 (0.12 g) | B2 (0.002 g) | CL-3 (0.12 g) | S2/S1 (5.0 g/4.0 g) |

Abbreviations of materials other than those indicated above, which were used in Examples/Comparative Examples above and later, are set forth below.

[Crosslinking Agent (B)]

[Chem. 66]

CL-2

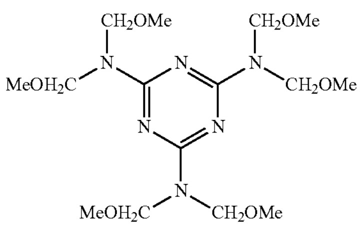

CL-3

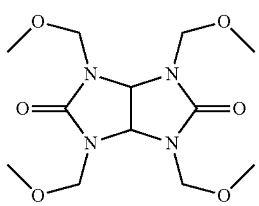

[Acid Generator (C)]

[Chem. 67]

(z5)

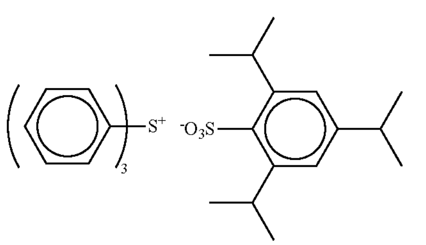

303 $A^3$ (z48)

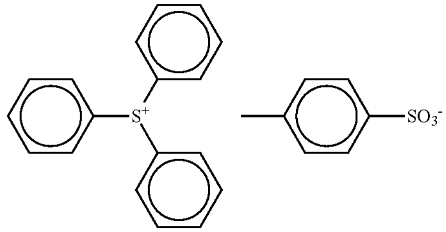

186 $A^3$

-continued (z61)

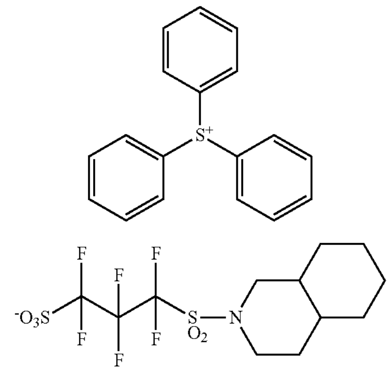

311 $A^3$

[Basic Compound]

B1: Tetrabutylammonium hydroxide
B2: Tri(n-octyl)amine
B3: 2,4,5-Triphenylimidazole

[Chem. 68]

B4

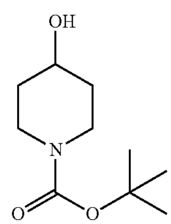

B5

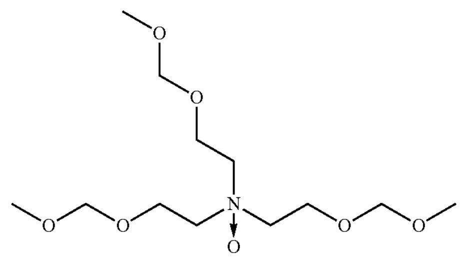

B6

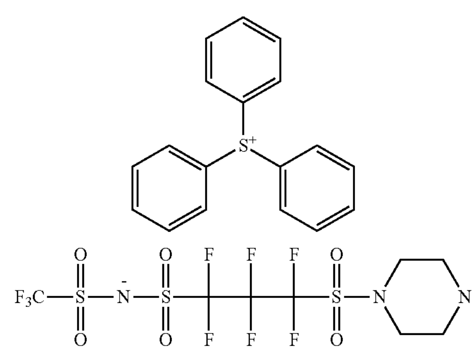

[Solvent]

S1 Propylene glycol monomethyl ether acetate (1-methoxy-2-acetoxypropane)
S2: Propylene glycol monomethyl ether (1-methoxy-2-propenol)
S3: 2-Heptanone
S4: Ethyl lactate S5: Cyclohexanone
S6: γ-Butyrolactone
S7: Propylene carbonate
Evaluation results are shown in Table 3.

TABLE 3

(Electro Beam Exposure; Negative; Alkali Development)

| Example | Composition | Sensitivity ($\mu C/cm^2$) | LS Resolution (nm) | IS Resolution (nm) | Pattern Profile | LER (nm) | Scum | Development Defect (number of defects) |
|---|---|---|---|---|---|---|---|---|
| 1E | N1 | 10.2 | 40 | 45 | rectangular | 4.5 | A | 3 |
| 2E | N2 | 10.0 | 40 | 40 | rectangular | 4.5 | A | 1 or less |
| 3E | N3 | 10.2 | 40 | 45 | rectangular | 4.5 | A | 3 |
| 4E | N4 | 10.2 | 40 | 45 | rectangular | 4.5 | A | 2 |
| 5E | N5 | 10.2 | 40 | 45 | rectangular | 4.5 | A | 2 |
| 6E | N6 | 9.2 | 40 | 40 | rectangular | 4.5 | A | 1 or less |
| 7E | N7 | 9.3 | 40 | 40 | rectangular | 4.5 | A | 1 or less |
| 8E | N8 | 10.2 | 40 | 40 | rectangular | 4.5 | A | 1 or less |
| 9E | N9 | 9.3 | 40 | 40 | rectangular | 4.5 | A | 1 or less |
| 10E | N10 | 10.3 | 40 | 40 | rectangular | 4.5 | A | 1 or less |
| 11E | N11 | 10.3 | 55 | 55 | rectangular | 4.5 | A | 2 |
| 12E | N12 | 10.2 | 40 | 40 | rectangular | 4.5 | A | 1 or less |
| 13E | N13 | 9.1 | 40 | 40 | rectangular | 4.5 | A | 1 or less |
| 14E | N14 | 10.2 | 45 | 45 | rectangular | 4.5 | A | 3 |
| 15E | N15 | 10.3 | 40 | 40 | rectangular | 5.0 | A | 1 or less |
| 16E | N16 | 9.2 | 40 | 40 | slightly reverse tapered | 5.0 | B | 1 or less |
| 17E | N17 | 9.1 | 40 | 40 | rectangular | 5.0 | B | 1 or less |
| 18E | N18 | 9.5 | 40 | 40 | slightly reverse tapered | 4.5 | B | 1 or less |
| 19E | N19 | 9.5 | 40 | 40 | rectangular | 4.5 | A | 1 or less |
| 20E | N20 | 9.6 | 40 | 40 | rectangular | 4.5 | A | 3 |
| 21E | N21 | 9.7 | 40 | 40 | rectangular | 4.5 | A | 3 |
| 22E | N22 | 9.8 | 40 | 40 | rectangular | 4.5 | A | 3 |
| Comparative Example 1E | Comparative Composition N1 | 11.8 | 55 | 60 | slightly reverse tapered | 5.5 | C | 8 |
| Comparative Example 2E | Comparative Composition N2 | 11.6 | 55 | 60 | slightly reverse tapered | 5.5 | C | 9 |

As seen from the results shown in Table 3, the composition according to the present invention is excellent in the sensitivity, pattern profile, line edge roughness (LER) performance, reduction in scum and reduction in development defect. In addition, it is seen that the composition using a polymer compound containing a repeating unit corresponding to the repeating unit (a1) is excellent also in the LS resolution and IS resolution.

(II) Example as Negative Resist (EUV, Alkali Development)

Examples 1F to 6F and Comparative Examples 1F and 2F

Preparation of Resist Solution

The negative resist composition shown in Table 4 below was filtered through a polytetrafluoroethylene filter having a pore size of 0.04 μm to prepare a negative resist solution.

(Evaluation of Resist)

The prepared negative resist solution was uniformly coated on a hexamethyldisilazane-treated silicon substrate by using a spin coater and heated/dried at 100° C. for 60 seconds on a hot plate to form a resist film having a thickness of 0.05 μm.

With respect to the resist film obtained, the sensitivity, LS resolution, IS resolution, pattern profile, line edge roughness (LER), scum and development defect were evaluated.

[Sensitivity]

The obtained resist film was exposed using EUV light (wavelength: 13 nm) through a reflective mask having a 1:1 line-and-space pattern with a line width of 100 nm by changing the exposure dose in steps of 0.1 $mJ/cm^2$ in the range of 0 to 20.0 $mJ/cm^2$, then baked at 110° C. for 90 seconds and thereafter, developed with an aqueous 2.38 mass % tetramethylammonium hydroxide (TMAH) solution.

The exposure dose for reproducing the line-and-space (L/S=1/1) mask pattern with a line width of 100 nm was taken as the sensitivity. A smaller value indicates higher sensitivity.

[LS Resolution]

The limiting resolution (the minimum line width below which the line and the space (line:space=1:1) were not separated and resolved) at the exposure dose giving the sensitivity above was taken as the LS resolution (nm).

[IS Resolution]

The limiting resolution (the minimum line width below which the line and the space (space:line=1:>100) were not separated and resolved) at the minimum irradiation dose when resolving an isolated space pattern with a line width of 100 nm (space:line=1:>100) was taken as the IS resolution (nm).

[Pattern Profile]

The cross-sectional profile of a line pattern (L/S=1/1) with a line width of 100 nm at the exposure dose giving the sensitivity above was observed using a scanning electron microscope (S-4300, manufactured by Hitachi, Ltd.). The cross-sectional profile of the line pattern was rated "reverse tapered" when the ratio represented by [line width in the top part (surface part) of line pattern/line width in the middle of line pattern (the position of half the height of line pattern)] is 1.5 or more, rated "slightly reverse tapered" when the ratio above is from 1.2 to less than 1.5, and rated "rectangular" when the ratio is less than 1.2.

[Line Edge Roughness (LER)]

A line pattern (L/S=1/1) having a line width of 100 nm was formed with the exposure dose giving the sensitivity above. At arbitrary 30 points in its longitudinal 50 pun region, the distance from the reference line where the edge should be present was measured using a scanning electron microscope (S-9220, manufactured by Hitachi, Ltd.). The standard deviation of measured distances was determined, and 3σ was computed. A smaller value indicates better performance.

[Evaluation of Scum]

A line pattern was formed by the same method as in [Pattern Profile] above. Thereafter, its cross-sectional SEM was obtained using a scanning electron microscope S4800 (manufactured by Hitachi High-Technologies Corporation), and the scum in the space portion was observed and evaluated as follows.

C: Scum was observed and patterns were partially not connected.

B: Scum was observed but patterns were not connected.

A: Scum was not observed.

[Evaluation of Development Defect]

A line pattern formed by the same method as in [Pattern Profile] above was measured for the number of defects by using KLA 2112 (manufactured by KLA-Tencor Corp.) (Threshold=20, pixel size=0.16). The evaluation result was shown by the number of defects per unit area (1 $cm^2$).

These evaluations results are shown in Table 4.

TABLE 4

(EUV Exposure; Negative; Alkali Development)

| Example | Composition | Sensitivity ($mJ/cm^2$) | LS Resolution (nm) | IS Resolution (nm) | Pattern Profile | LER (nm) | Scum | Development Defect (number of defects) |
|---|---|---|---|---|---|---|---|---|
| 1F | N1 | 12.8 | 45 | 45 | rectangular | 4.5 | A | 2 |
| 2F | N2 | 12.6 | 40 | 40 | rectangular | 4.5 | A | 1 or less |
| 3F | N3 | 12.3 | 45 | 45 | rectangular | 4.5 | A | 2 |
| 4F | N4 | 12.5 | 45 | 45 | rectangular | 4.5 | A | 1 |
| 5F | N6 | 10.5 | 40 | 40 | rectangular | 4.5 | A | 1 or less |
| 6F | N7 | 11.0 | 40 | 40 | rectangular | 4.5 | A | 1 or less |
| Comparative Example 1F | Comparative Compound N1 | 14.8 | 55 | 55 | slightly reverse tapered | 5.5 | C | 10 |
| Comparative Example 2F | Comparative Compound N2 | 14.8 | 55 | 55 | slightly reverse tapered | 5.5 | C | 10 |

As seen from the results shown in Table 4, also in EUV exposure, the composition according to the present invention is excellent in the sensitivity, pattern profile, line edge roughness (LER) performance, reduction in scum and reduction in development defect. In addition, it is seen that the composition using a polymer compound containing a repeating unit corresponding to the repeating unit (a1) is excellent also in the LS resolution and IS resolution.

INDUSTRIAL APPLICABILITY

According to the present invention, a negative actinic ray-sensitive or radiation-sensitive resin composition capable of forming a pattern satisfying all of high sensitivity, high resolution (for example, excellent pattern profile and small line edge roughness (LER)), reduction in scum and reduction in development defect at the same time, a resist film using the same, a resist-coated mask blanks, a resist pattern forming method, and a photomask can be provided.

While the invention has been described in detail and with reference to specific embodiments thereof, it will be apparent to one skilled in the art that various changes and modifications can be made therein without departing from the spirit and scope of the invention.

This application is based on Japanese Patent Application (Patent Application No. 2011-191955) filed on Sep. 2, 2011, the contents of which are incorporated herein by way of reference.

The invention claimed is:

1. A negative actinic ray-sensitive or radiation-sensitive resin composition comprising:

(A) a polymer compound containing (a) a repeating unit capable of generating an acid upon irradiation with an actinic ray or radiation and (b) a repeating unit having a phenolic hydroxyl group, and (B) a crosslinking agent, wherein the polymer compound (A) further contains (c) an alkali-insoluble repeating unit represented by formula (XIV):

(XIV)

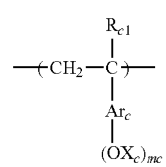

wherein $R_{C1}$ represents a hydrogen atom or a methyl group, $X_C$ represents a group having a non-acid-decomposable polycyclic alicyclic hydrocarbon structure, $Ar_C$ represents a benzene ring, and $m_C$ is an integer of 1 or more.

2. The negative actinic ray-sensitive or radiation-sensitive resin composition according to claim 1, wherein the repeating unit represented by formula (XIV) is a repeating unit represented by formula (XV):

(XV)

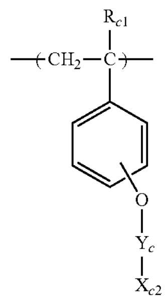

wherein $R_{C1}$ represents a hydrogen atom or a methyl group, $Y_C$ represents a single bond or a divalent linking group, and $X_{C2}$ represents a non-acid-decomposable polycyclic alicyclic hydrocarbon group.

3. The negative actinic ray-sensitive or radiation-sensitive resin composition as claimed in claim 1, wherein the content of the alkali-insoluble repeating unit (c) is from 3 to 50 mol % based on all repeating units in the polymer compound (A).

4. The negative actinic ray-sensitive or radiation-sensitive resin composition as claimed in claim 1, wherein the polymer compound (A) contains, as the (a) repeating unit capable of generating an acid upon irradiation with an actinic ray or radiation, (a1) a repeating unit having an ionic structural moiety capable of producing an acid anion in the side chain upon irradiation with an actinic ray or radiation.

5. The negative actinic ray-sensitive or radiation-sensitive resin composition as claimed in claim 1, wherein the crosslinking agent (B) is a compound having two or more hydroxymethyl groups or alkoxymethyl groups in a molecule.

6. The negative actinic ray-sensitive or radiation-sensitive resin composition as claimed in claim 1, wherein (a) the repeating unit capable of generating an acid upon irradiation with an actinic ray or radiation is a repeating unit represented by the following formula (I), and (b) the repeating unit having a phenolic hydroxyl group is a repeating unit represented by the following formula (II):

(I)

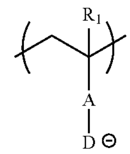

(II)

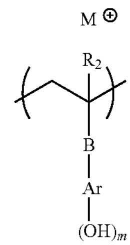

wherein each of $R_1$ and $R_2$ independently represents a hydrogen atom, an alkyl group or a halogen atom, A represents a divalent linking group, D represents a sulfonate anion, a sulfonimidate anion or a sulfonemethidate anion, M represents an onium cation, B represents a single bond or a divalent organic group, Ar represents an aromatic ring group, and m represents an integer of 1 or more.

7. A resist film formed from the negative actinic ray-sensitive or radiation-sensitive resin composition as claimed in claim 1.

8. The resist film as claimed in claim 7, wherein the film thickness is from 10 to 150 nm.

9. A resist-coated mask blanks coated with the resist film claimed in claim 7.

10. A resist pattern forming method, comprising exposing the resist-coated mask blanks claimed in claim 9, and developing the exposed mask blanks.

11. A photomask obtained by exposing and developing the resist-coated mask blanks claimed in claim 9.

12. A resist pattern forming method, comprising exposing the resist film claimed in claim 7, and developing the exposed film.

13. The resist pattern forming method as claimed in claim 12, wherein the exposure is performed using an electron beam or an extreme-ultraviolet ray.

* * * * *